(12) United States Patent
Koshiishi et al.

(10) Patent No.: US 10,546,727 B2
(45) Date of Patent: *Jan. 28, 2020

(54) PLASMA PROCESSING APPARATUS AND METHOD

(71) Applicant: TOKYO ELECTRON LIMITED, Minato-ku (JP)

(72) Inventors: Akira Koshiishi, Nirasaki (JP); Masaru Sugimoto, Nirasaki (JP); Kunihiko Hinata, Nirasaki (JP); Noriyuki Kobayashi, Nirasaki (JP); Chishio Koshimizu, Nirasaki (JP); Ryuji Ohtani, Nirasaki (JP); Kazuo Kibi, Nirasaki (JP); Masashi Saito, Nirasaki (JP); Naoki Matsumoto, Nirasaki (JP); Yoshinobu Ohya, Nirasaki (JP); Manabu Iwata, Nirasaki (JP); Daisuke Yano, Minami-Alps (JP); Yohei Yamazawa, Nirasaki (JP); Hidetoshi Hanaoka, Nirasaki (JP); Toshihiro Hayami, Nirasaki (JP); Hiroki Yamazaki, Nirasaki (JP); Manabu Sato, Nirasaki (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 225 days.

This patent is subject to a terminal disclaimer.

(21) Appl. No.: 15/258,607

(22) Filed: Sep. 7, 2016

(65) Prior Publication Data
US 2016/0379805 A1 Dec. 29, 2016

Related U.S. Application Data

(60) Continuation of application No. 14/070,190, filed on Nov. 1, 2013, now Pat. No. 9,490,105, which is a
(Continued)

(30) Foreign Application Priority Data

Jun. 21, 2004 (JP) .................................. 2004-183093
Jan. 21, 2005 (JP) .................................. 2005-013912
Feb. 22, 2005 (JP) .................................. 2005-045095

(51) Int. Cl.
*C23F 1/00* (2006.01)
*H01L 21/306* (2006.01)
(Continued)

(52) U.S. Cl.
CPC .. *H01J 37/32422* (2013.01); *H01J 37/32018* (2013.01); *H01J 37/3244* (2013.01);
(Continued)

(58) Field of Classification Search
USPC .................................................... 156/345.44
See application file for complete search history.

(56) References Cited

U.S. PATENT DOCUMENTS

| 3,477,935 A | 11/1969 | Hall |
| 4,333,814 A | 6/1982 | Kuyel |

(Continued)

FOREIGN PATENT DOCUMENTS

| CN | 1228196 A | 9/1999 |
| CN | 1459125 A | 11/2003 |

(Continued)

OTHER PUBLICATIONS

Japanese Office Action dated Mar. 27, 2012 in Patent Application No. 2005-181132 (with English translation).
(Continued)

*Primary Examiner* — Keath T Chen
(74) *Attorney, Agent, or Firm* — Oblon, McClelland, Maier & Neustadt, L.L.P.

(57) ABSTRACT

A plasma etching apparatus includes an upper electrode and a lower electrode, between which plasma of a process gas is
(Continued)

generated to perform plasma etching on a wafer W. The apparatus further comprises a cooling ring disposed around the wafer, a correction ring disposed around the cooling ring, and a variable DC power supply directly connected to the correction ring, the DC voltage being preset to provide the correction ring with a negative bias, relative to ground potential, for attracting ions in the plasma and to increase temperature of the correction ring to compensate for a decrease in temperature of a space near the edge of the target substrate due to the cooling ring.

9 Claims, 82 Drawing Sheets

Related U.S. Application Data continuation of application No. 13/186,145, filed on Jul. 19, 2011, now Pat. No. 8,603,293, which is a division of application No. 11/157,061, filed on Jun. 21, 2005, now Pat. No. 7,988,816.

(60) Provisional application No. 60/662,344, filed on Mar. 17, 2005, provisional application No. 60/650,957, filed on Feb. 9, 2005, provisional application No. 60/589,831, filed on Jul. 22, 2004.

(51) Int. Cl.
H01J 37/32 (2006.01)
H01L 21/67 (2006.01)

(52) U.S. Cl.
CPC .. *H01J 37/32091* (2013.01); *H01J 37/32522* (2013.01); *H01J 37/32834* (2013.01); *H01L 21/67069* (2013.01); *H01J 2237/2001* (2013.01); *H01J 2237/334* (2013.01); *H01J 2237/3344* (2013.01); *Y10S 156/915* (2013.01)

(56) References Cited

U.S. PATENT DOCUMENTS

| | | |
|---|---|---|
| 4,496,448 A | 1/1985 | Tai et al. |
| 4,512,283 A | 4/1985 | Bonifield et al. |
| 4,812,712 A | 3/1989 | Ohnishi et al. |
| 4,816,638 A | 3/1989 | Ukai et al. |
| 5,102,496 A | 4/1992 | Savas |
| 5,110,438 A | 5/1992 | Ohmi et al. |
| 5,405,491 A | 4/1995 | Shahvandi et al. |
| 5,451,754 A | 9/1995 | Reale |
| 5,569,350 A | 10/1996 | Osada et al. |
| 5,573,597 A | 11/1996 | Lantsman |
| 5,661,093 A | 8/1997 | Ravi et al. |
| 5,721,021 A | 2/1998 | Tobe et al. |
| 5,812,361 A | 9/1998 | Jones et al. |
| 5,891,348 A | 4/1999 | Ye et al. |
| 5,919,332 A | 7/1999 | Koshiishi et al. |
| 5,968,379 A | 10/1999 | Zhao et al. |
| 6,048,435 A | 4/2000 | DeOrnellas |
| 6,074,518 A | 6/2000 | Imafuku et al. |
| 6,110,287 A | 8/2000 | Arai et al. |
| 6,187,685 B1 | 2/2001 | Hopkins et al. |
| 6,214,162 B1 | 4/2001 | Koshimizu |
| 6,221,221 B1 | 4/2001 | Al-Shaikh et al. |
| 6,222,321 B1 | 4/2001 | Scholl et al. |
| 6,239,403 B1 | 5/2001 | Dible et al. |
| 6,261,408 B1 | 7/2001 | Schneider et al. |
| 6,287,943 B1 | 9/2001 | Fujioka et al. |
| 6,333,272 B1 | 12/2001 | McMillin |
| 6,504,307 B1 | 1/2003 | Malik et al. |
| 6,554,979 B2 | 4/2003 | Stimson |
| 6,617,255 B2 | 9/2003 | Arase |
| 6,635,117 B1 | 10/2003 | Kinnard et al. |
| 6,663,748 B2 | 12/2003 | Kodama |
| 6,744,212 B2 | 6/2004 | Fischer et al. |
| 6,805,779 B2 | 10/2004 | Chistyakov |
| 6,878,234 B2 | 4/2005 | Ogasawara et al. |
| 7,022,616 B2 | 4/2006 | Mimura et al. |
| 7,141,504 B1 | 11/2006 | Bhardwaj |
| 7,415,940 B2 | 8/2008 | Koshimizu et al. |
| 7,537,672 B1 | 5/2009 | Koshiishi et al. |
| 7,601,241 B2 | 10/2009 | Tetsuka et al. |
| 7,740,737 B2 | 6/2010 | Koshiishi et al. |
| 7,951,262 B2 | 5/2011 | Koshiishi et al. |
| 7,988,816 B2 | 8/2011 | Koshiishi et al. |
| 8,080,126 B2 | 12/2011 | Koshiishi et al. |
| 8,137,471 B2 | 3/2012 | Koshiishi |
| 8,603,293 B2 | 12/2013 | Koshiishi |
| 2001/0009139 A1 | 7/2001 | Shan et al. |
| 2001/0022293 A1 | 9/2001 | Maeda et al. |
| 2001/0035132 A1 | 11/2001 | Kent et al. |
| 2001/0037770 A1 | 11/2001 | Otsubo |
| 2002/0005252 A1 | 1/2002 | Masuda et al. |
| 2002/0061654 A1 | 5/2002 | Kanegae et al. |
| 2002/0103563 A1 | 8/2002 | Izawa et al. |
| 2002/0134308 A1 | 9/2002 | Amano |
| 2002/0139665 A1 | 10/2002 | DeOrnellas et al. |
| 2003/0029567 A1 | 2/2003 | Dhindsa et al. |
| 2003/0086840 A1 | 5/2003 | Himori et al. |
| 2003/0094135 A1 | 5/2003 | Komiya et al. |
| 2003/0129835 A1 | 7/2003 | Kholodenko et al. |
| 2003/0148611 A1 | 8/2003 | Dhindsa et al. |
| 2003/0164142 A1 | 9/2003 | Koshimizu |
| 2003/0164226 A1 | 9/2003 | Kanno et al. |
| 2004/0025791 A1 | 2/2004 | Chen et al. |
| 2004/0097079 A1 | 5/2004 | Mimura et al. |
| 2004/0106293 A1 | 6/2004 | Igarashi |
| 2004/0112536 A1 | 6/2004 | Quon |
| 2004/0112540 A1 | 6/2004 | Larson |
| 2004/0149216 A1 | 8/2004 | Osada et al. |
| 2004/0261946 A1 | 12/2004 | Endoh et al. |
| 2005/0039773 A1* | 2/2005 | Moriya ............... C23C 16/4401 134/1.2 |
| 2005/0051273 A1 | 3/2005 | Maeda et al. |
| 2005/0103275 A1 | 5/2005 | Sasaki et al. |
| 2005/0103442 A1 | 5/2005 | Chen et al. |
| 2005/0112879 A1 | 5/2005 | Fujimoto et al. |
| 2005/0145176 A1 | 7/2005 | Wicker |
| 2005/0164513 A1 | 7/2005 | DeOrnellas et al. |
| 2005/0172904 A1 | 8/2005 | Koshimizu et al. |
| 2005/0205412 A1 | 9/2005 | Rohrmann |
| 2005/0257743 A1 | 11/2005 | Koshiishi et al. |
| 2005/0264219 A1 | 12/2005 | Dhindsa et al. |
| 2006/0019031 A1 | 1/2006 | Furuta et al. |
| 2006/0043067 A1 | 3/2006 | Kadkhodayan et al. |
| 2006/0086458 A1 | 4/2006 | Kim et al. |
| 2008/0308041 A1 | 12/2008 | Koshiish et al. |

FOREIGN PATENT DOCUMENTS

| | | |
|---|---|---|
| CN | 1461494 A | 12/2003 |
| CN | 1585997 A | 2/2005 |
| EP | 1 193 746 A1 | 4/2002 |
| EP | 1 446 825 A1 | 8/2004 |
| JP | 60-245213 A | 12/1985 |
| JP | 61-199078 A | 9/1986 |
| JP | 63-253628 | 10/1988 |
| JP | 1-183123 A | 7/1989 |
| JP | 2-183533 | 7/1990 |
| JP | 4-279044 A | 10/1992 |
| JP | 4-315797 | 11/1992 |
| JP | 03/068442 A1 | 5/1994 |
| JP | 06-279044 | 10/1994 |
| JP | 6-333849 A | 12/1994 |
| JP | 2000-299198 | 12/1994 |
| JP | 7-207471 A | 8/1995 |
| JP | 07-211489 | 8/1995 |
| JP | 07-254588 | 10/1995 |
| JP | 08-124902 | 5/1996 |
| JP | 8-172034 A | 7/1996 |
| JP | 08-264515 A | 10/1996 |
| JP | 8-319588 A | 12/1996 |

(56) References Cited

FOREIGN PATENT DOCUMENTS

| | | |
|---|---|---|
| JP | 9-326383 | 12/1997 |
| JP | 10-12597 | 1/1998 |
| JP | 11-106916 A | 4/1999 |
| JP | 2000-36490 | 2/2000 |
| JP | 2000-40695 A | 2/2000 |
| JP | 6-124998 | 6/2000 |
| JP | 2000-164583 A | 6/2000 |
| JP | 2000-173993 | 6/2000 |
| JP | 2000-306891 A | 11/2000 |
| JP | 2000-323460 | 11/2000 |
| JP | 2000-323460 A | 11/2000 |
| JP | 2000-328248 | 11/2000 |
| JP | 2001-210627 | 8/2001 |
| JP | 2003-264170 | 11/2001 |
| JP | 2002-16126 | 1/2002 |
| JP | 2002-110650 A | 4/2002 |
| JP | 2002-270586 | 9/2002 |
| JP | 2003-77896 A | 3/2003 |
| JP | 6-338476 | 9/2003 |
| JP | 2004-087875 | 3/2004 |
| JP | 2004-95663 A | 3/2004 |
| JP | 2004-515910 A | 5/2004 |
| JP | 2004-165460 A | 6/2004 |
| JP | 2006-501631 A | 1/2006 |
| JP | 2010-50485 A | 3/2010 |
| JP | 4750359 B2 | 8/2011 |
| JP | 4831853 B2 | 12/2011 |
| JP | 5546216 B2 | 7/2014 |
| KR | 10-2005-0044437 A | 5/2005 |
| KR | 10-2009-0125217 A | 12/2009 |
| TW | 200305354 A | 10/2003 |
| TW | I271124 B | 1/2007 |
| WO | WO 00/68985 | 11/2000 |
| WO | WO 02/27755 A2 | 4/2002 |
| WO | 02093631 | 11/2002 |
| WO | WO 02/097855 A1 | 12/2002 |
| WO | WO 03/043061 A1 | 5/2003 |
| WO | 2001-308080 | 8/2003 |
| WO | WO 2004/049420 A1 | 6/2004 |

OTHER PUBLICATIONS

Combined Taiwanese Office Action and Search Report dated Feb. 23, 2013 in Patent Application No. 094120663 (with English translation of categories of cited documents).
Japanese Office Action dated May 20, 2014 in Patent Application No. 2013-089519.
Japanese Office Action dated May 26, 2015 in Patent Application No. 2014-148506.
Office Action dated Nov. 30, 2015 in co-pending U.S. Appl. No. 14/070,190.
Combined Chinese Office Action and Search Report dated Jul. 22, 2013 in Patent Application No. 201110206162.7 (with English translation of categories of cited documents).
Extended European Search Report dated Dec. 16, 2016 in Patent Application No. 16189429.0.
Korean Office Action issued in Patent Application No. 10-2006-7026949 dated Jun. 29, 2011 (w/ English translation).
Korean Office Action issued in Patent Application No. 2006-7026949 dated Feb. 22, 2012 (w/ English translation).
Japanese Office Action issued in Application No. 2011-8112 dated Mar. 27, 2012 (w/ English translation).
U.S. Office Action issued in co-pending U.S. Appl. No. 13/113,330 dated Aug. 28, 2012.
Chinese Office Action issued in Chinese Patent Application No. 200710004236.2 dated Apr. 13, 2010 (w/English translation).
Japanese Office Action issued in Patent Application No. 2005-181133 dated Sep. 7, 2010(w/ English translation).
Japanese Office Action issued in Patent Application No. 2005-181132 dated Sep. 7, 2010 (w/ English translation).
Japanese Office Action issued in Patent Application No. 2005-181131 dated Sep. 7, 2010 (w/English translation).
Japanese Office Action issued in Patent Application No. 2010-249961 dated Feb. 19, 2013.
Japanese Office Action issued in Patent Application No. 2010-249962 dated Feb. 19, 2013.
Japanese Office Action issued in Patent Application No. 2015-145789 dated Mar. 29, 2016.
Chinese Office Action and Search Report issued in Patent Application No. 201110206176.9 dated May 29, 2013 (w/ English translation of categories of cited documents).
Chinese Office Action issued in Patent Application No. 201110206202.8 dated Jun. 3, 2013.
Chinese Office Action issued in Patent Application No. 201110206125.6 dated Jul. 17, 2013.
Chinese Office Action and Search Report issued in Patent Application No. 201110206223.X dated Jul. 19, 2013 (w/ English translation of categories of cited documents).
Japanese Office Action issued in Patent Application No. 2010-249961 dated Aug. 20, 2013.
U.S. Office Action issued in co-pending U.S. Appl. No. 13/113,330 dated Sep. 6, 2013.
Extended European Search Report issued in Patent Application No. 12159425.3 dated Jul. 29, 2014.
Taiwanese Office Action and Search Report issued in Patent Application No. 102126893 dated Apr. 9, 2015 (w/ English translation of categories of cited documents).
Japanese Office Action issued in Patent Application No. 2014-148506 dated Jan. 26, 2016.
Office Action dated Nov. 1, 2018 in co-pending U.S. Appl. No. 15/238,526, 35 pages.
Office Action dated Feb. 27, 2019, in co-pending U.S. Appl. No. 15/238,526.
Office Action dated Jul. 23, 2019, in co-pending U.S. Appl. No. 15/238,526.

* cited by examiner

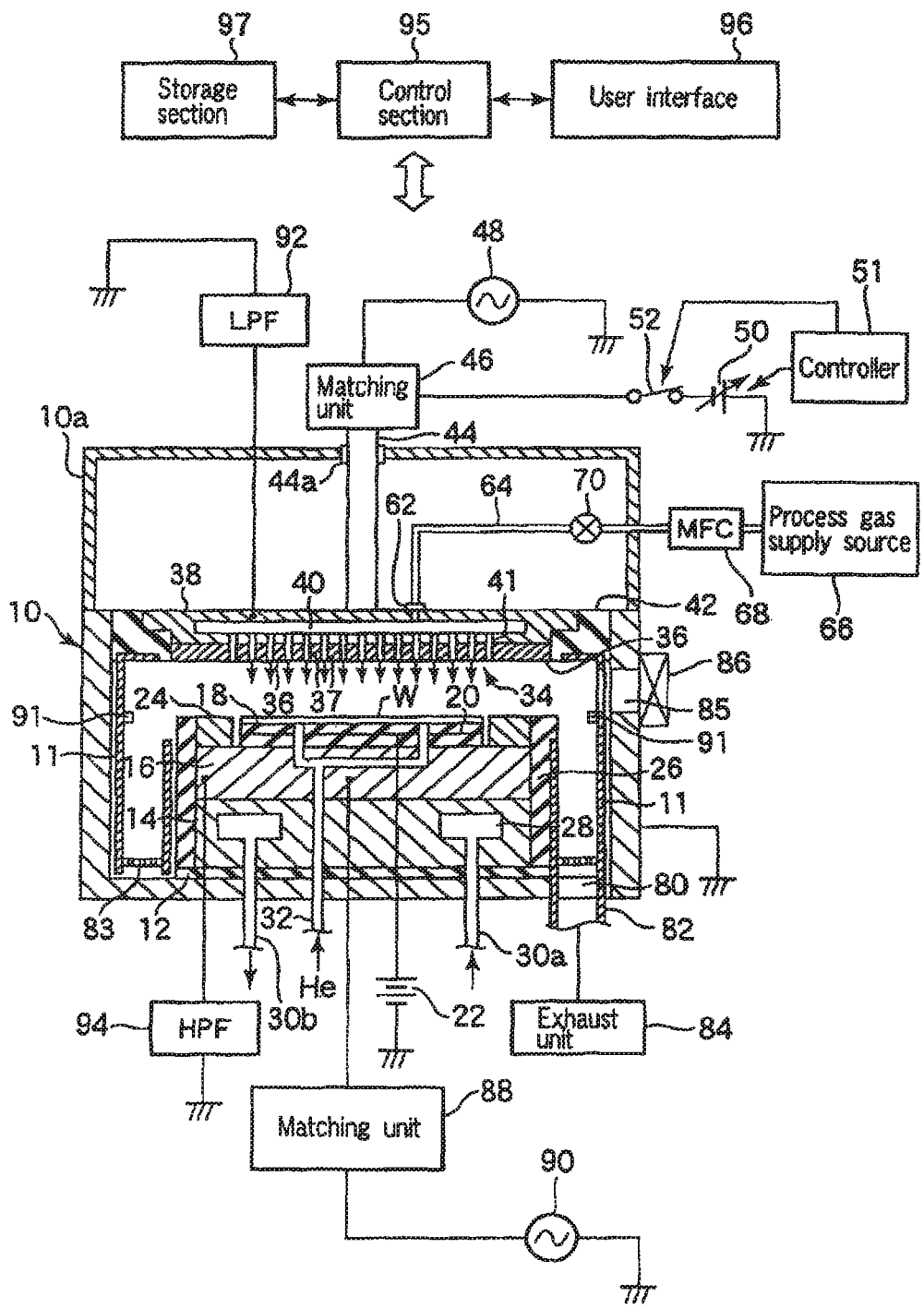
F I G. 1

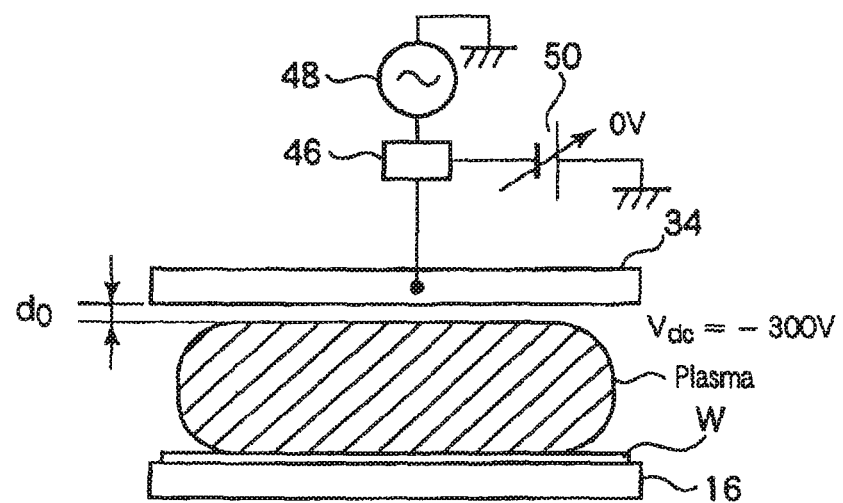
F I G. 4A
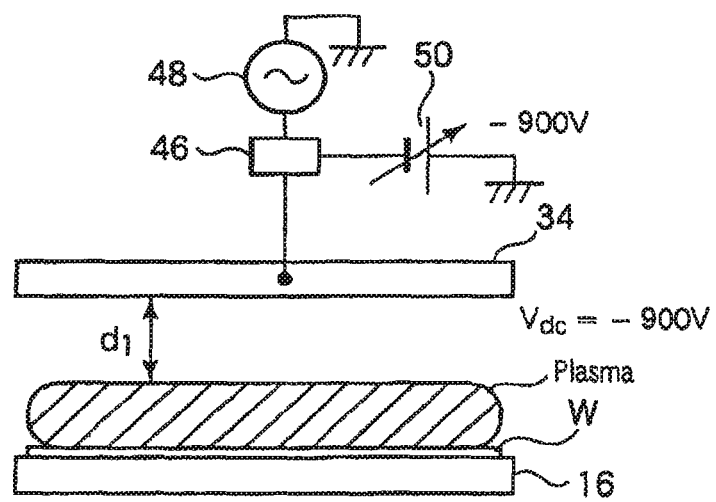
F I G. 4B

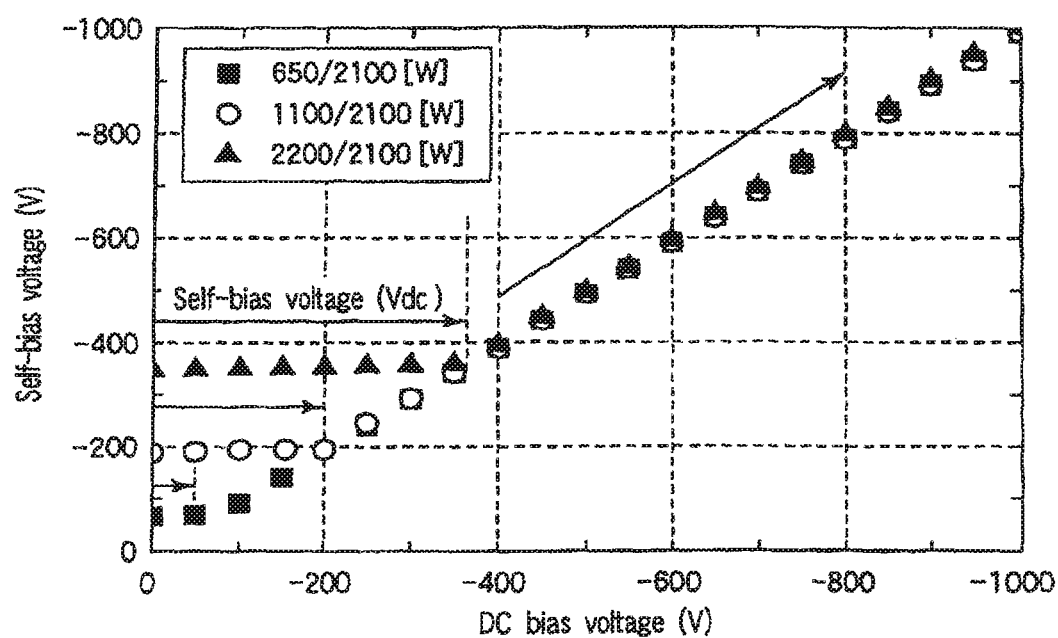
F I G. 11

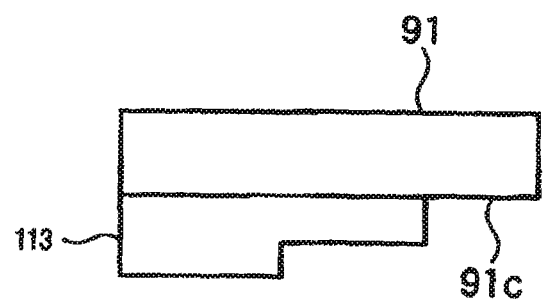
F I G. 24A
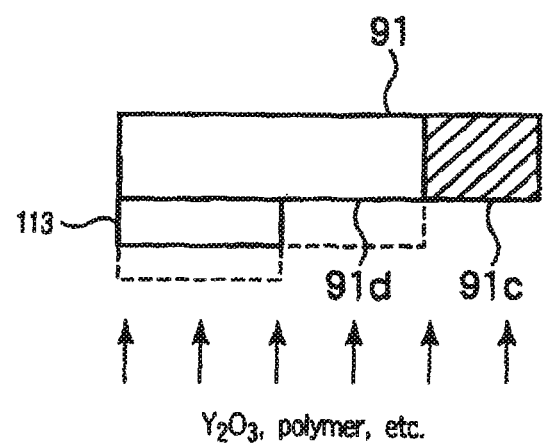
F I G. 24B

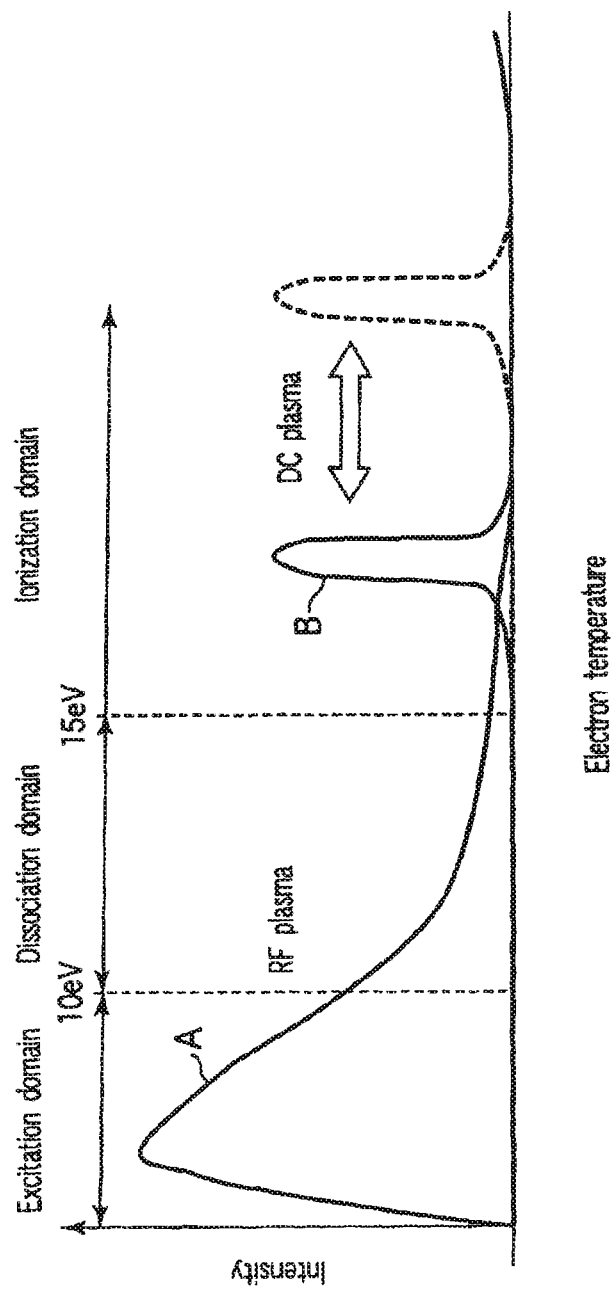
F I G. 28

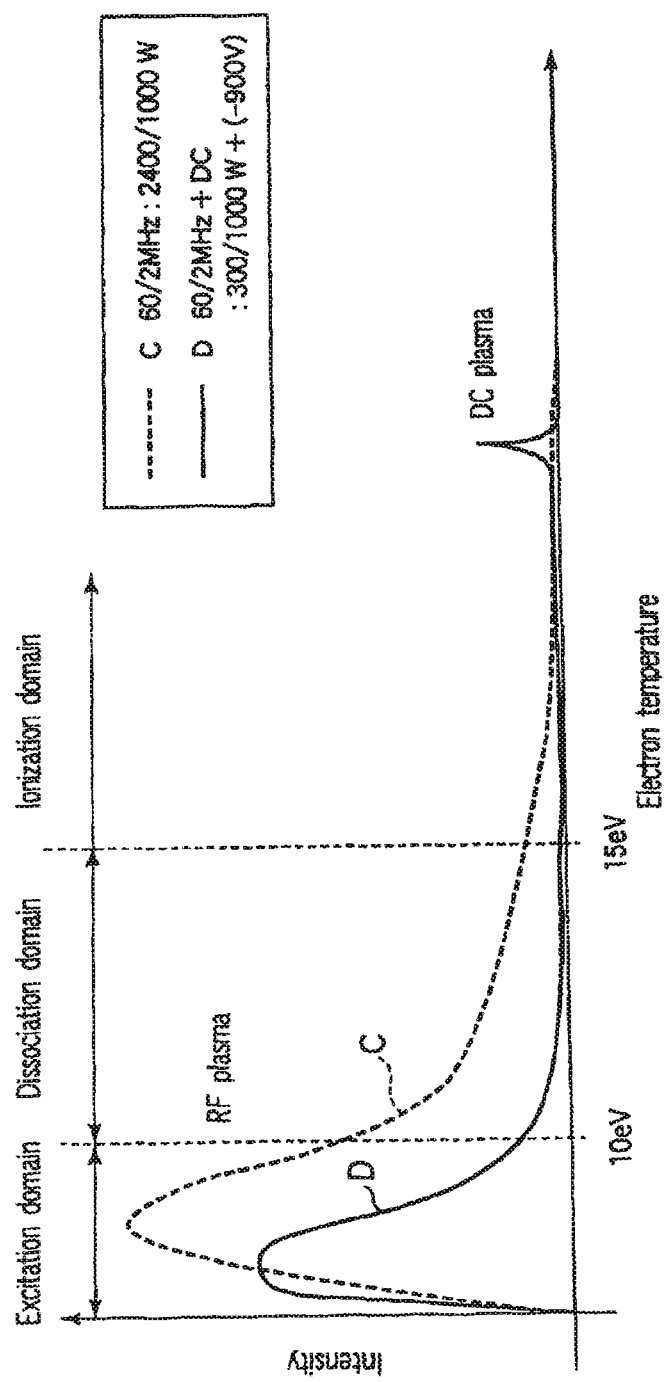
F I G. 29

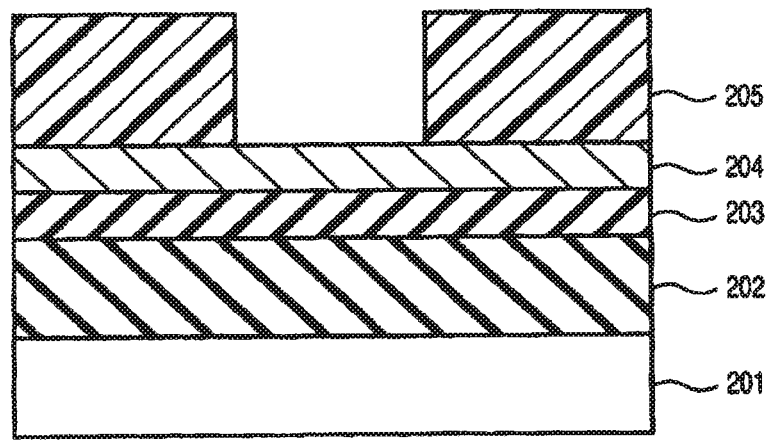
F I G. 32A
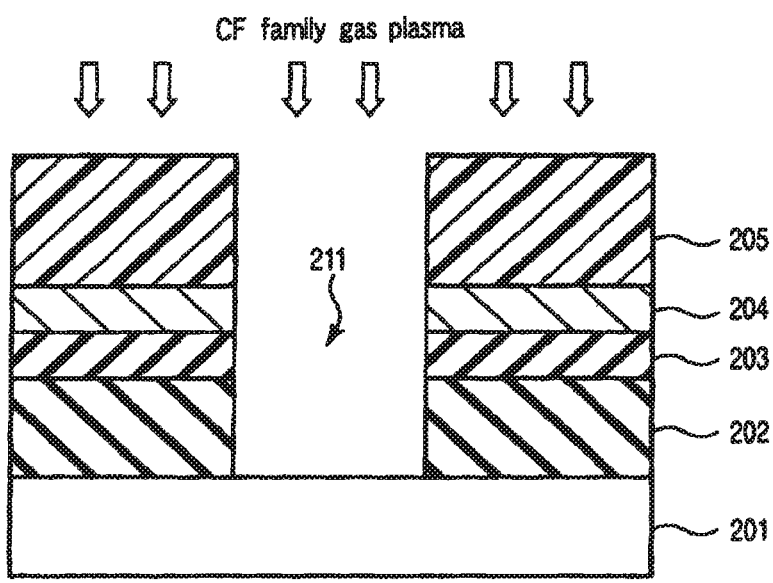
F I G. 32B

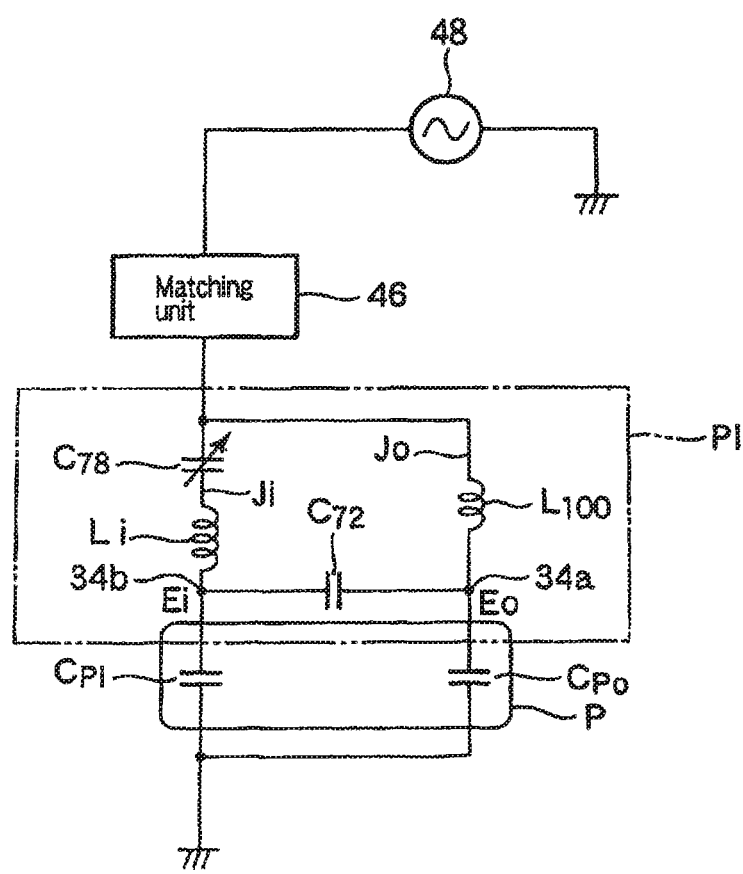
F I G. 36

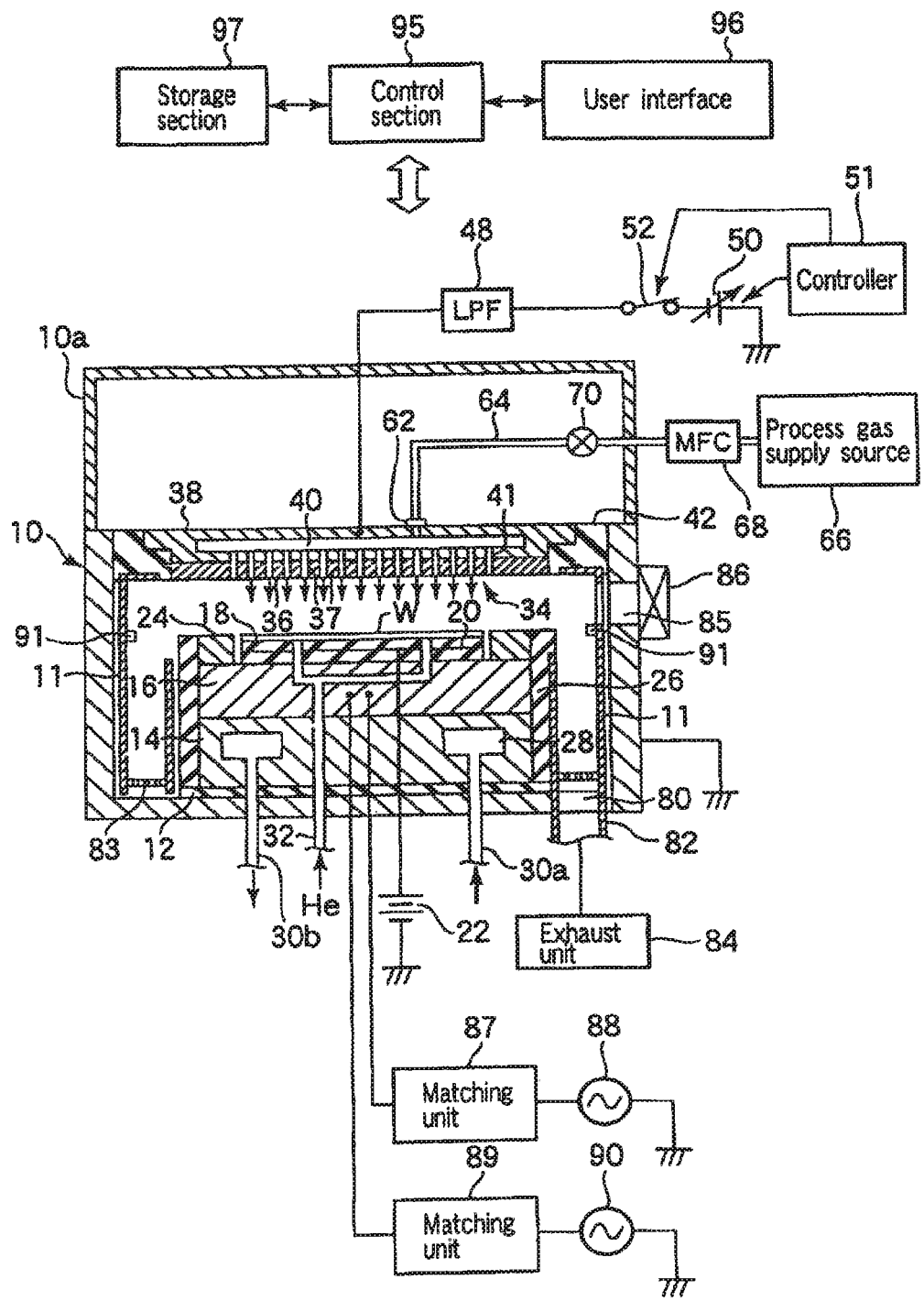
F I G. 41

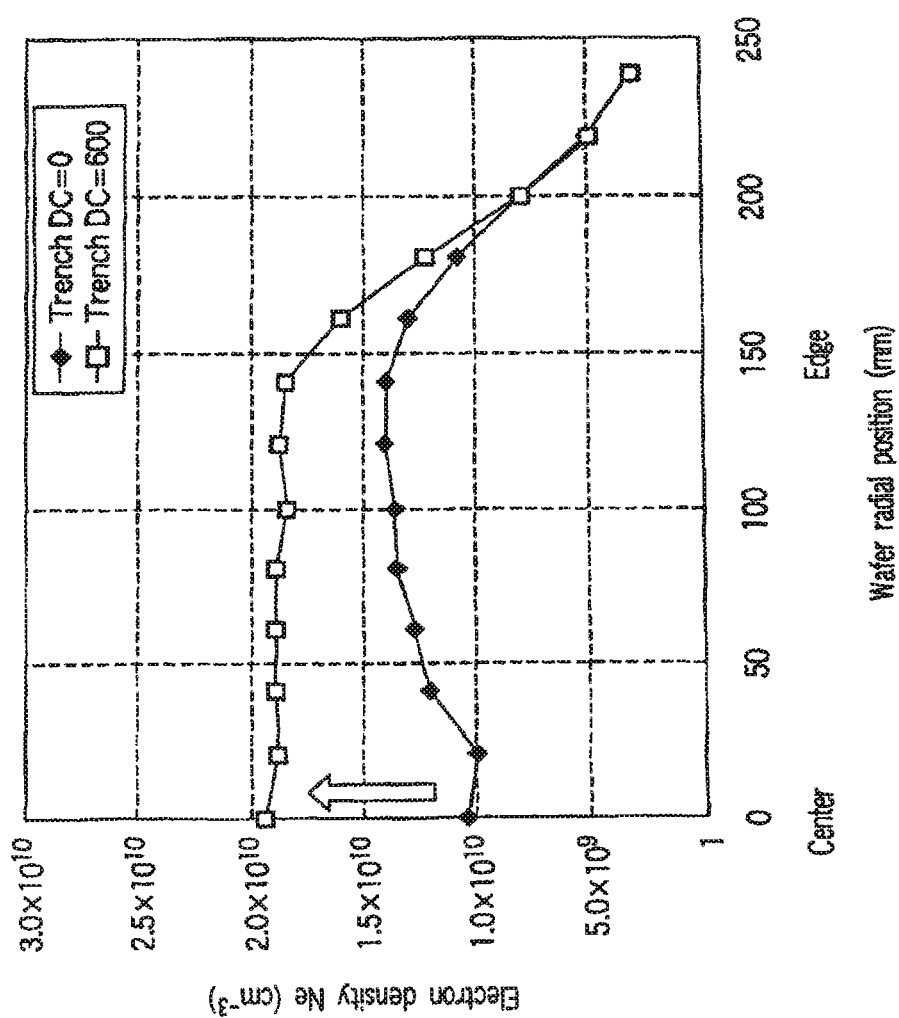
F I G. 46

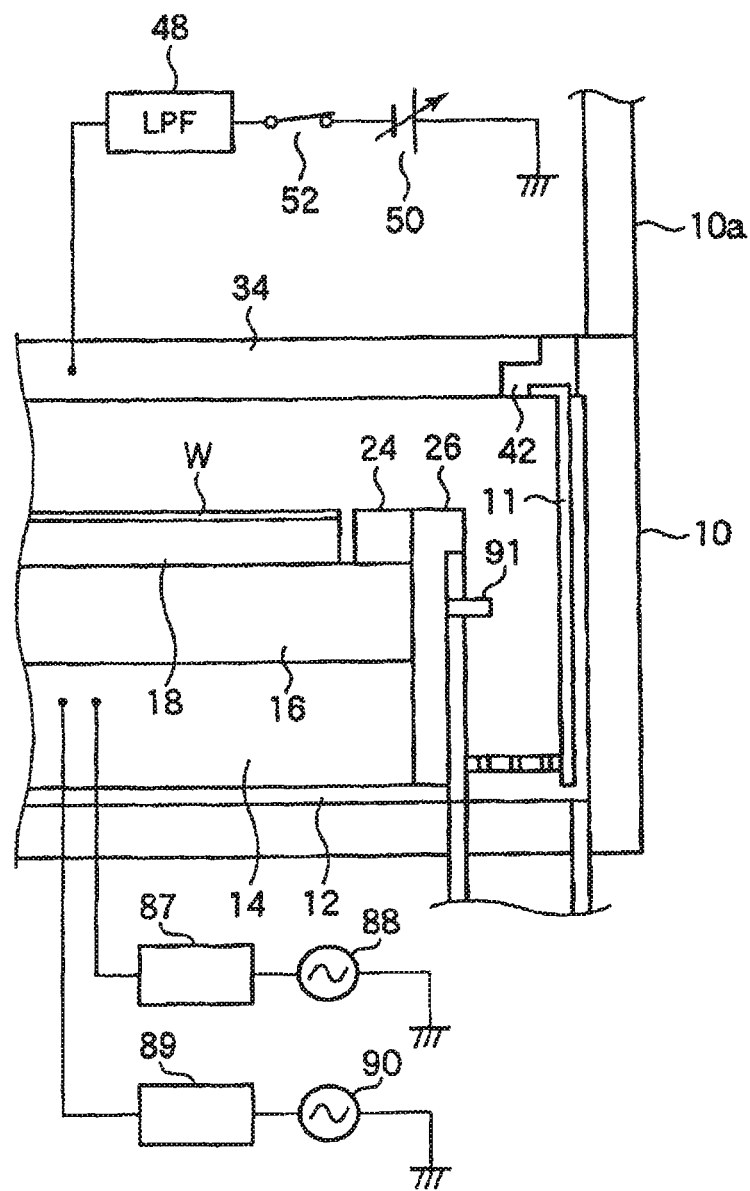
F I G. 51

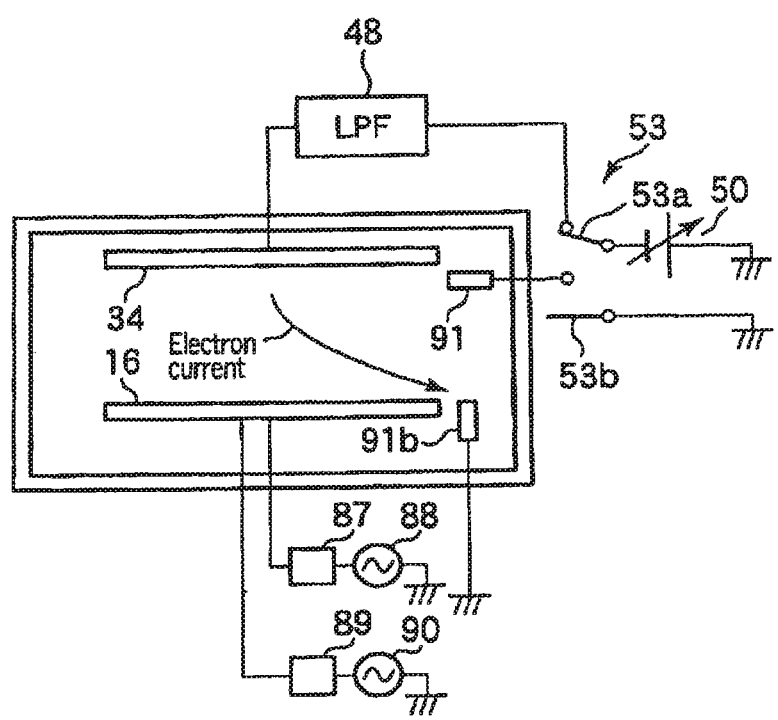
F I G. 55

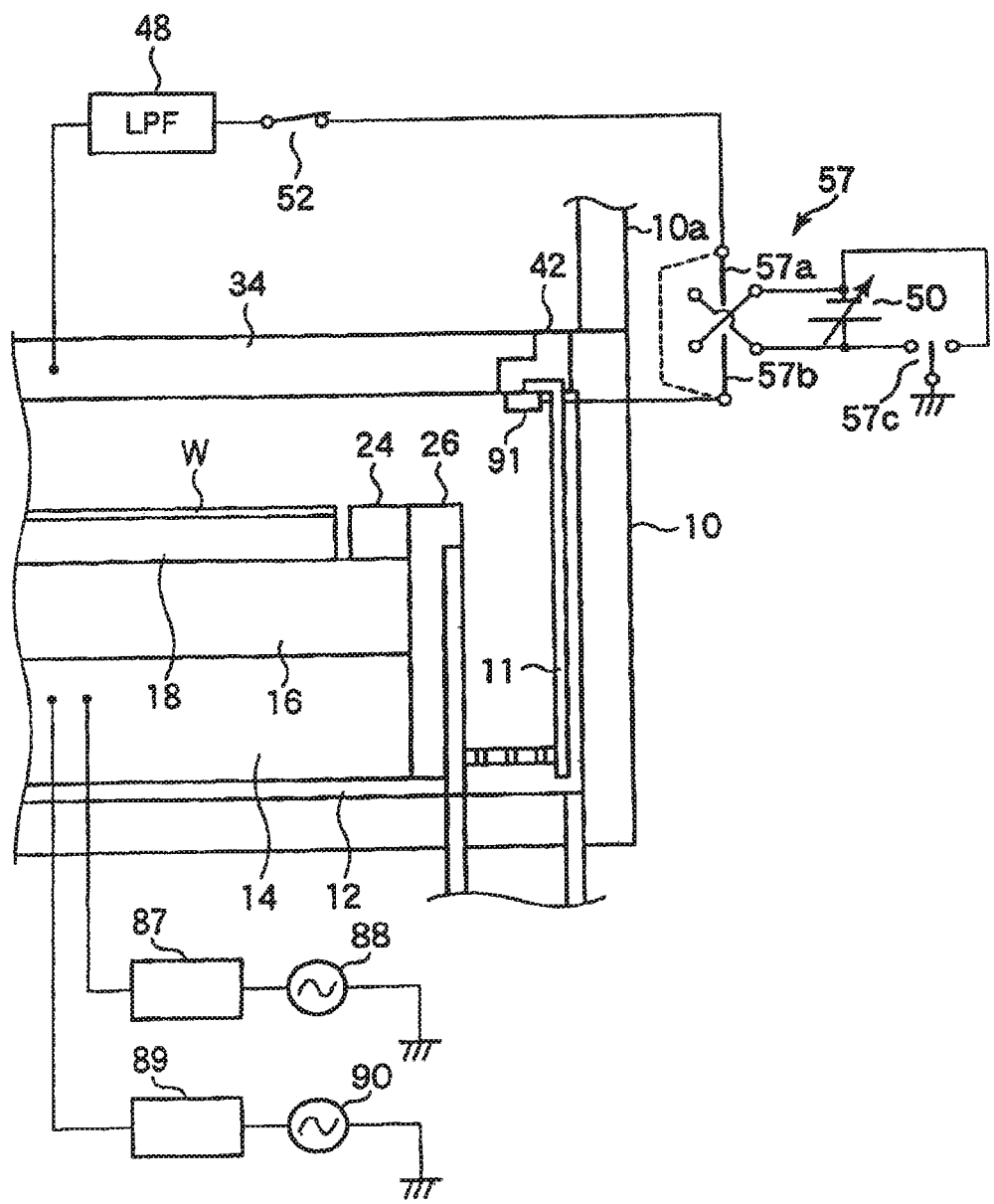
F I G. 56

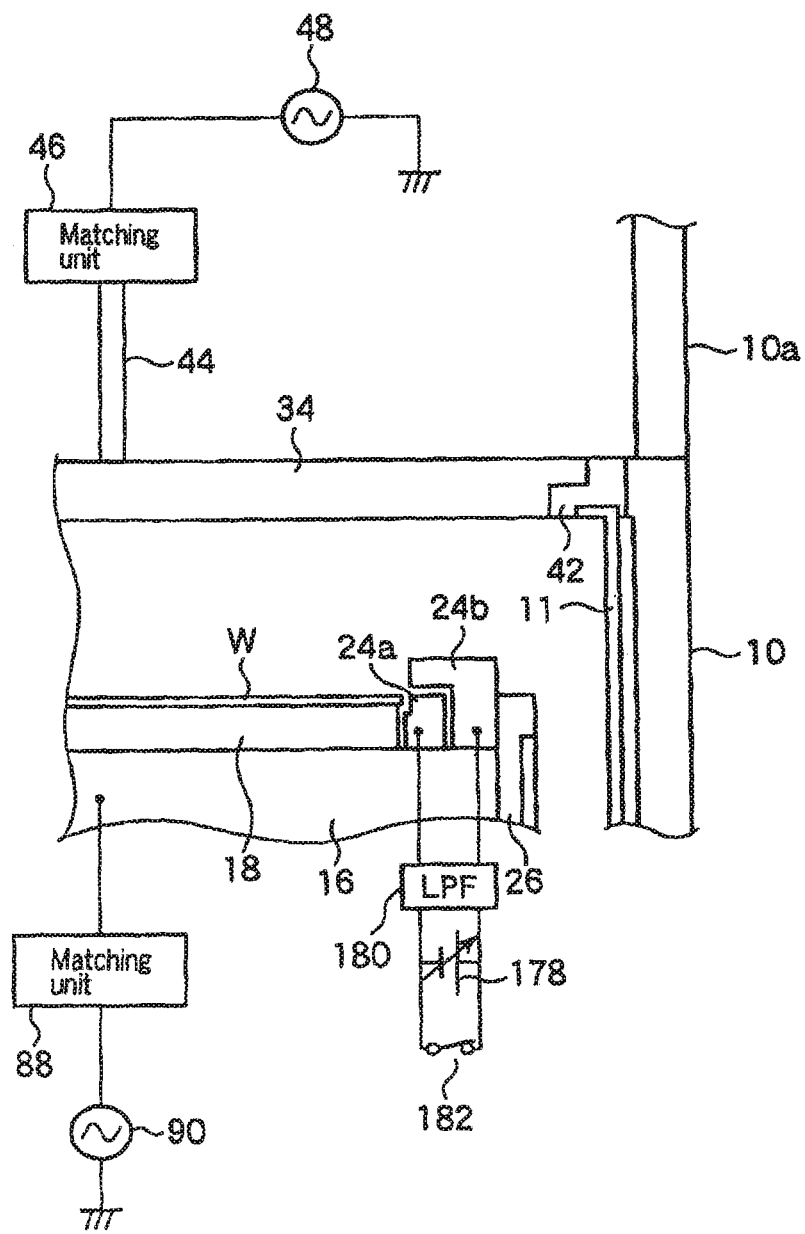
F I G. 75

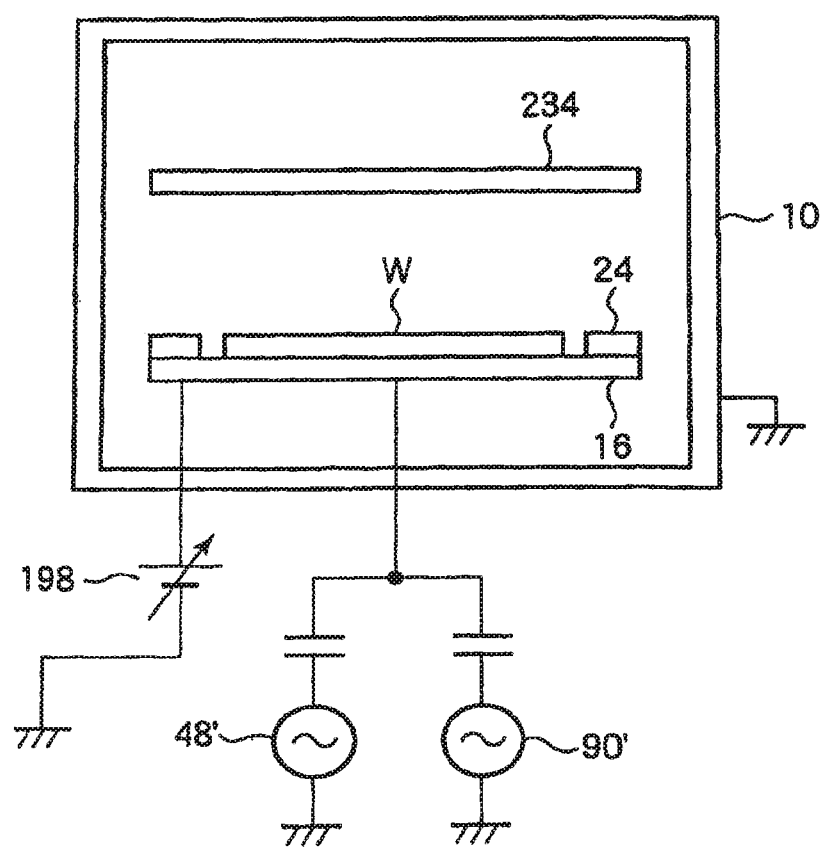
F I G. 81

PLASMA PROCESSING APPARATUS AND METHOD

CROSS-REFERENCE TO RELATED APPLICATIONS

This application is a continuation of U.S. application Ser. No. 14/070,190 filed Nov. 1, 2013, which is a continuation of U.S. application Ser. No. 13/186,145 filed Jul. 19, 2011 (now U.S. Pat. No. 8,603,293), which is a division of U.S. application Ser. No. 11/157,061 filed Jun. 21, 2005 (Now U.S. Pat. No. 7,988,816), which claims the benefit of priority under 35 U.S.C. § 119(e) for U.S. Provisional Application No. 60/589,831 filed Jul. 22, 2004; 60/650,957 filed Feb. 9, 2005; and 60/662,344 filed Mar. 17, 2005, and claims the benefit of priority under 35 U.S.C. § 119 from Japanese Patent Application Nos. 2004-183093 filed Jun. 21, 2004; 2005-013912 filed Jan. 21, 2005; and 2005-045095 filed Feb. 22, 2005, the entire contents of each of which are incorporated herein by reference.

BACKGROUND OF THE INVENTION

1. Field of the Invention

The present invention relate to a plasma processing apparatus, plasma processing method, and computer readable storage medium, used for performing a plasma process on a target substrate, such as a semiconductor substrate.

2. Description of the Related Art

For example, in manufacturing semiconductor devices, plasma etching processes, which utilize plasma to etch a layer through a resist mask, are often used for forming a predetermined pattern on a predetermined layer disposed on a target substrate or semiconductor wafer.

There are various plasma etching apparatuses for performing such plasma etching, but parallel-plate plasma processing apparatuses of the capacitive coupling type are the ones in mainstream use.

In general, a parallel-plate plasma etching apparatus of the capacitive coupling type includes a chamber with parallel-plate electrodes (upper and lower electrodes) disposed therein. While a process gas is supplied into the chamber, an RF (radio frequency) is applied to one of the electrodes to form an electric field between the electrodes. The process gas is turned into plasma by the RF electric field, thereby performing plasma etching on a predetermined layer disposed on a semiconductor wafer.

More specifically, there is known a plasma etching apparatus in which an RF for plasma generation is applied to the upper electrode to generate plasma, while an RF for ion attraction is applied to the lower electrode (for example, Jpn. Pat. Appln. KOKAI Publication No. 2000-173993 (Patent publication 1)). This plasma etching apparatus can form a suitable plasma state and realize an etching process with high selectivity and high reproducibility.

In recent years, owing to the demands of increased micro-fabrication, the thickness of photo-resist films used as masks is reduced, while the type of photo-resist is shifted from KrF photo-resist (i.e., a photo-resist to be exposed with a laser beam emitted from KrF gas) to ArF photo-resist (i.e., a photo-resist to be exposed with a shorter-wavelength laser beam emitted from ArF gas), which allows formation of pattern opening portions of about 0.13 μm or less.

However, since the ArF photo-resist has poor plasma resistance properties, its surface becomes rough during etching, which is scarcely caused in the KrF resist. Accordingly, problems arise in that vertical lines (striation) are formed on the inner wall of opening portions, or opening portions are expanded (increase in CD). These problems prevent, along with a small thickness of the photo-resist, etching holes from being formed with good etching selectivity.

On the other hand, in etching apparatuses of this kind, if the power level of an RF power for plasma generation applied to the upper electrode is too low, deposited substances (deposition) may remain on the upper electrode after etching, thereby varying process characteristics or producing particles. By contrast, if the power level is too high, the electrode may be etched, thereby bringing about process characteristics different from those obtained by a lower power level. The suitable range of power from the RF power supply depends on the process, and the process should not be fluctuated by the power. Further, in serial etching processes, deposition sticking to the chamber wall causes a memory effect in that a previous process leaves some effect that affects a subsequent process. Accordingly, it is preferable to reduce deposition on the chamber wall.

Furthermore, in parallel-plate etching apparatuses of the capacitive coupling type, where the pressure in the chamber is high and the etching gas in use is a negative gas (for example, $C_xF_y$ or $O_2$), the plasma density becomes low at the chamber central portion, which makes it difficult to control the plasma density.

On the other hand, owing to the demands of increased miniaturization and higher speed through interconnection lines in semiconductor devices, use of inter-level insulating films having a low dielectric constant proceeds to reduce the parasitic capacitance of interconnection lines. Of the low dielectric constant films (Low-k films) of this kind, SiOC family films have attracted particularly attention.

Where plasma etching is performed on an organic Low-k film, such as an SiOC family film, it is important to ensure a sufficient selectivity between the organic Low-k film and a mask layer or an underlying film of, e.g., silicon nitride. In general, a mixture gas based on a fluorocarbon gas is used as a process gas to provide a relatively high selectivity relative to an underlying film, but it is insufficient as regards selectivity. For this reason, an etching method described below has been proposed in etching an SiOC family film to improve the selectivity relative to a silicon nitride film (for example, Jpn. Pat. Appln. KOKAI Publication No. 2002-270586 (Patent publication 2)). Specifically, plasma etching is performed on an SiOC family inter-level insulating film while a nitride film used as a barrier layer of a Cu interconnection line is utilized as an underlying etching-stopper layer. In this method, $C_4F_8/Ar/N_2$ is used as a process gas with the flow-rate ratio of Ar set to be 80% or more, thereby improving the selectivity relative to the underlying film.

Further, similarly to Patent publication 2, an etching method described below has been proposed (for example, Jpn. Pat. Appln. KOKAI Publication No. 2004-87875 (Patent publication 3)). Specifically, plasma etching is performed on an SiOC family inter-level insulating film while a silicon nitride film is utilized as an underlying etching-stopper layer. This method comprises a first etching step of using $CHF_3/Ar/N_2$ as a process gas and a second etching step of using $C_4F_8/Ar/N_2$ as a process gas, thereby improving the selectivity relative to both of the mask and silicon nitride film.

However, as described above, silicon nitride used for a barrier layer of a Cu interconnection line has good barrier properties, but has a high dielectric constant of 7.0. Accordingly, in order to sufficiently utilize the low dielectric constant property of a Low-k film, such as an SiOC family film, a barrier layer having a still lower dielectric constant is required, the representative of which is silicon carbide (SiC) having a dielectric constant of 3.5.

Where an SiC barrier layer having a low dielectric constant is used as an underlying etching-stopper layer, it is also necessary to ensure a sufficient etching selectivity to etch a Low-k film or etching target layer disposed thereon. However, according to plasma etching using a fluorocarbon family process gas, as described in Patent publication 2 and Patent publication 3, it is difficult to ensure a sufficient etching selectivity between the Low-k film and SiC layer.

BRIEF SUMMARY OF THE INVENTION

The present invention has been made in consideration of the problems described above, and has an object to provide a plasma processing apparatus and plasma processing method, which can realize high selectivity etching while maintaining the plasma resistance properties of a resist layer or organic mask layer at a high level, or can effectively prevent deposition on an electrode, or can realize high rate etching, or can realize uniform etching on a target substrate.

Another object is to provide a plasma processing method which can realize etching on a Low-k film with high etching selectivity relative to an underlying SiC layer used as an etching-stopper layer.

According to a first aspect of the present invention, there is provided a plasma processing apparatus comprising: a process chamber configured to accommodate a target substrate and to be vacuum-exhausted; a first electrode and a second electrode disposed opposite each other within the process chamber; a first RF power supply unit configured to apply a first RF power for plasma generation to the first electrode or second electrode; and a process gas supply unit configured to supply a process gas into the process chamber, so as to generate plasma of the process gas between the first electrode and second electrode to perform a plasma process on a predetermined layer of the target substrate, wherein the apparatus further comprises a power supply configured to apply a DC voltage or AC voltage to the first electrode or second electrode, and one of application voltage, application current, and application power from the power supply is controlled to cause an absolute value of a self-bias voltage $V_{dc}$ on a surface of an application electrode to be large enough to obtain a predetermined sputtering effect on the surface, to increase plasma sheath length on an application electrode side to generate pressed plasma on an electrode side opposite the application electrode, to irradiate the target substrate with electrons generated near an application electrode, to control plasma potential to be a predetermined value, to increase plasma density, or to cause plasma density distribution to be sufficiently uniform to obtain a predetermined etching uniformity.

In this apparatus, it is preferable that the DC voltage or AC voltage is pulsed or modulated. The apparatus may further comprise a control unit configured to control one of application voltage, application current, and application power from the power supply. The apparatus may further comprise a detector configured to detect a plasma state, wherein the control unit controls one of application voltage, application current, and application power from the power supply, based on information from the detector.

According to a second aspect of the present invention, there is provided a plasma processing apparatus comprising: a process chamber configured to accommodate a target substrate and to be vacuum-exhausted; a first electrode and a second electrode disposed opposite each other within the process chamber; a first RF power supply unit configured to apply a first RF power for plasma generation to the first electrode or second electrode; and a process gas supply unit configured to supply a process gas into the process chamber, so as to generate plasma of the process gas between the first electrode and second electrode to perform a plasma process on a predetermined layer of the target substrate, wherein the apparatus further comprises a power supply configured to apply a DC voltage or AC voltage to the first electrode or second electrode, the power supply has one terminal connected to the first electrode or second electrode, and another terminal connected to a predetermined member within the process chamber, and one of application voltage, application current, and application power from the power supply is controlled.

In this apparatus, it is preferable that the predetermined member is a conductive body embedded in an insulating member present within the process chamber, a member forming a wall of the process chamber, or a correction ring disposed around the target substrate on the second electrode. The apparatus may further comprise an additional DC power supply, where the additional DC power supply has one terminal connected to one of the first electrode and the second electrode, to which the DC power supply is not connected, and another terminal connected to the predetermined member or a different predetermined member insulated from the predetermined member. It is preferable that the different predetermined member connected to the additional DC power supply is a conductive body embedded in an insulating member present within the process chamber, a member forming a wall of the process chamber, or a correction ring disposed around the target substrate on the second electrode.

According to a third aspect of the present invention, there is provided a plasma processing apparatus comprising: a process chamber configured to accommodate a target substrate and to be vacuum-exhausted; a first electrode and a second electrode disposed opposite each other within the process chamber; a first RF power supply unit configured to apply a first RF power for plasma generation to the first electrode or second electrode; and a process gas supply unit configured to supply a process gas into the process chamber, so as to generate plasma of the process gas between the first electrode and second electrode to perform a plasma process on a predetermined layer of the target substrate, wherein the apparatus further comprises a power supply configured to apply a DC voltage or AC voltage to a predetermined member within the process chamber.

In this apparatus, it may be adopted that the DC voltage or AC voltage is pulsed or modulated. It is preferable that the predetermined member is a conductive body embedded in an insulating member present within the process chamber, or a member forming a wall of the process chamber. It may be adopted that the power supply has one terminal connected to the predetermined member, and another terminal connected to a different predetermined member insulated from the predetermined member within the process chamber. It is preferable that each of the predetermined member and the different predetermined member is a conductive body embedded in an insulating member present within the process chamber, or a member forming a wall of the process chamber.

In the third aspect of the present invention, it is preferable that the apparatus further comprises an additional power supply, wherein the additional power supply is connected to a different predetermined member insulated from the predetermined member within the process chamber, and configured to apply a DC voltage or AC voltage. In this case, it may be adopted that the DC voltage or AC voltage applied to the different predetermined member is pulsed or modulated.

In the third aspect of the present invention, it is preferable that the predetermined member connected to the power supply is disposed near the first electrode, and the different predetermined member connected to the additional DC power supply is disposed near the second electrode. In this case, it is preferable that each of the predetermined member and the different predetermined member is a conductive body embedded in an insulating member present within the process chamber, or a member forming a wall of the process chamber.

In the third aspect of the present invention, it may be adopted that the first electrode is an upper electrode, and the second electrode is a lower electrode on which a target substrate is placed, and wherein the apparatus comprises a cooling ring configured to be cooled and disposed near and around the target substrate on the second electrode, and a correction ring disposed around or above the cooling ring and functioning as the predetermined member to which the DC voltage or AC voltage is applied. In this case, it is preferable that the cooling ring is cooled, while a heat radiating member is disposed between the cooling ring and the second electrode, or a heat transfer gas is supplied between the cooling ring and the second electrode. It is preferable that the apparatus further comprises a temperature measuring mechanism configured to measure temperature of the cooling ring, a cooling portion configured to cool the cooling ring, and a cooling control section configured to control the cooling portion in cooling the cooling ring. It may be adopted that the second electrode is supplied with an RF power, the correction ring is supplied with electricity through the second electrode, and a dielectric body member is disposed between the cooling ring and the second electrode.

In the third aspect of the present invention, it may be adopted that the first electrode is an upper electrode, and the second electrode is a lower electrode on which a target substrate is placed, and wherein the apparatus comprises a first correction ring disposed near and around the target substrate on the second electrode, and a second correction ring disposed around or above the first correction ring, and the first and second correction rings function as the predetermined member to which the DC voltage or AC voltage is applied. In this case, it may be adopted that voltages applied to the first correction ring and the second correction ring are variable independently of each other. It may be adopted that the first correction ring and the second correction ring are supplied with voltages from respective power supplies. It may be adopted that the first correction ring and the second correction ring are respectively connected to one terminal and another terminal of a single power supply. It may be adopted that the first correction ring is configured to be cooled.

According to a fourth aspect of the present invention, there is provided a plasma processing apparatus comprising: a process chamber configured to accommodate a target substrate and to be vacuum-exhausted; a first electrode and a second electrode disposed opposite each other within the process chamber, the second electrode being configured to support the target substrate; a first RF power application unit configured to apply a first RF power for plasma generation to the second electrode; a DC power supply configured to apply a DC voltage to the first electrode; and a process gas supply unit configured to supply a process gas into the process chamber.

According to a fifth aspect of the present invention, there is provided a plasma processing apparatus comprising: a process chamber configured to accommodate a target substrate and to be vacuum-exhausted; a first electrode and a second electrode disposed opposite each other within the process chamber, the second electrode being configured to support the target substrate; a first RF power application unit configured to apply a first RF power for plasma generation to the first electrode; a second RF power application unit configured to apply a second RF power to the second electrode; a third RF power application unit configured to apply a third RF power to the second electrode; a DC power supply configured to apply a DC voltage to the first electrode; and a process gas supply unit configured to supply a process gas into the process chamber.

According to a sixth aspect of the present invention, there is provided a plasma processing method using a plasma processing apparatus, the apparatus comprising a process chamber configured to accommodate a target substrate and to be vacuum-exhausted, a first electrode and a second electrode disposed opposite each other within the process chamber, a first RF power supply unit configured to apply a first RF power for plasma generation to the first electrode or second electrode, and a process gas supply unit configured to supply a process gas into the process chamber, so as to generate plasma of the process gas between the first electrode and second electrode to perform a plasma process on a predetermined layer of the target substrate, the method comprising: applying a DC voltage or AC voltage to the first electrode or second electrode when generating plasma; and at this time, controlling one of application voltage, application current, and application power of the DC voltage or AC voltage to cause an absolute value of a self-bias voltage $V_{dc}$ on a surface of an application electrode to be large enough to obtain a predetermined sputtering effect on the surface, to increase plasma sheath length on an application electrode side to generate pressed plasma on an electrode side opposite the application electrode, to irradiate the target substrate with electrons generated near an application electrode, to control plasma potential to be a predetermined value, to increase plasma density, or to cause plasma density distribution to be sufficiently uniform to obtain a predetermined etching uniformity.

According to a seventh aspect of the present invention, there is provided a plasma processing method using a plasma processing apparatus, the apparatus comprising a process chamber configured to accommodate a target substrate and to be vacuum-exhausted, a first electrode and a second electrode disposed opposite each other within the process chamber, an RF power supply unit configured to apply an RF power for plasma generation to the first electrode or second electrode, and a process gas supply unit configured to supply a process gas into the process chamber, so as to generate plasma of the process gas between the first electrode and second electrode to perform a plasma process on a predetermined layer of the target substrate, the method comprising: applying a DC voltage or AC voltage to a predetermined member within the process chamber when generating plasma.

According to an eighth aspect of the present invention, there is provided a plasma processing method using a process chamber with a first electrode and a second electrode disposed opposite each other therein, the second electrode being configured to support a target substrate, the method comprising supplying a process gas into the process chamber, while applying a first RF power for plasma generation to the second electrode, to generate plasma of the process gas, thereby performing a plasma process on a target substrate supported by the second electrode, wherein the method comprises: applying a DC voltage to the first electrode; and performing the plasma process on the target substrate while the applying the DC voltage to the first electrode.

According to a ninth aspect of the present invention, there is provided a plasma processing method using a process chamber with a first electrode and a second electrode disposed opposite each other therein, the second electrode being configured to support a target substrate, the method comprising supplying a process gas into the process chamber, while applying a first RF power for plasma generation to the first electrode, and applying a second RF power and a third RF power to the second electrode, to generate plasma of the process gas, thereby performing a plasma process on a target substrate supported by the second electrode, wherein the method comprises: applying a DC voltage to the first electrode; and performing the plasma process on the target substrate while the applying the DC voltage to the first electrode.

According to a tenth aspect of the present invention, there is provided a computer storage medium storing a control program for execution on a computer, wherein the control program, when executed, controls a plasma processing apparatus to perform the plasma processing method according to the sixth aspect.

According to an eleventh aspect of the present invention, there is provided a computer storage medium storing a control program for execution on a computer, wherein the control program, when executed, controls a plasma processing apparatus to perform the plasma processing method according to the seventh aspect.

According to a twelfth aspect of the present invention, there is provided a computer storage medium storing a control program for execution on a computer, wherein the control program, when executed, controls a plasma processing apparatus to perform the plasma processing method according to the eighth aspect.

According to a thirteenth aspect of the present invention, there is provided a computer storage medium storing a control program for execution on a computer, wherein the control program, when executed, controls a plasma processing apparatus to perform the plasma processing method according to the ninth aspect.

According to the first, second, fourth to sixth, eighth to tenth, twelfth, and thirteenth aspects of the present invention, it is possible to exercise at least one of (1) the effect of increasing the absolute value of a self-bias voltage to the first electrode to sputter the first electrode surface, (2) the effect of expanding the plasma sheath on the first electrode side to press the plasma, (3) the effect of irradiating the target substrate with electrons generated near the first electrode, (4) the effect of controlling the plasma potential, (5) the effect of increasing the electron (plasma) density, and (6) the effect of increasing the plasma density at the central portion.

With the effect (1) described above, even if polymers derived from a process gas and a photo-resist are deposited on the surface of the first electrode, the polymers are sputtered, thereby cleaning up the surface of the first electrode. Further, an optimum quantity of polymers can be supplied onto the substrate, thereby canceling the surface roughness of the photo-resist film. Further, since the body of the electrode is sputtered, the electrode material can be supplied onto the substrate, thereby reinforcing an organic mask made of, e.g., a photo-resist film.

With the effect (2) described above, the effective residence time above the target substrate is decreased, and the plasma concentrates above the target substrate with less diffusion, thereby reducing the dissociation space. In this case, dissociation of a fluorocarbon family process gas is suppressed for an organic mask made of, e.g., a photo-resist film to be less etched. Further, with the effect (3) described above, the composition of a mask on the target substrate is reformed and the roughness of the photo-resist film is cancelled. Further, since the target substrate is irradiated with electrons at a high velocity, the shading effect is suppressed and micro-fabrication is thereby improved on the target substrate.

With the effect (4) described above, the plasma potential can be suitably controlled to prevent etching by-products from being deposited on members inside the process chamber, such as the electrodes, chamber wall (e.g., deposition shield), and insulating members.

With the effect (5) described above, the etching rate (etching speed) on the target substrate is improved. With the effect (6) described above, even where the pressure inside the process chamber is high and the etching gas employed is a negative gas, the plasma density is prevented from being lower at the central portion than at the peripheral portion within the process chamber (suppressing generation of negative ions), so as to control the plasma density to be more uniform.

As a consequence, the plasma resistance property of an organic mask layer made of, e.g., a resist layer remains high, so that the etching can be performed with high selectivity. Alternatively, the electrodes can be effectively free from deposited substances. Alternatively, the etching can be performed on the target substrate at a high rate or uniformly.

According to the third, seventh, and eleventh aspects of the present invention, it is possible to obtain the effect of controlling the plasma potential. As a consequence, the plasma potential can be suitably controlled to prevent etching by-products from being deposited on members inside the process chamber, such as the electrodes, chamber wall (e.g., deposition shield), and insulating members.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view schematically showing a plasma etching apparatus according to an embodiment 1 of the present invention:

FIGS. 4A and 4B are views showing plasma states where a DC voltage is applied to the upper electrode and where no DC voltage is applied to the upper electrode, respectively, in the plasma etching apparatus shown in FIG. 1;

FIG. 11 is a view showing the relationship between the self-bias voltage on the upper electrode surface and the DC voltage applied;

FIGS. 24A and 24B are schematic views each showing another example of the GND block having a function to prevent it from losing the grounding performance in the sense of DC:

FIG. 28 is a view showing the electron temperature distribution of RF plasma and DC plasma;

FIG. 29 is a view showing an electron temperature distribution of plasma obtained by solely using an RF power, in comparison with that obtained by applying a DC voltage along with an RF power;

FIGS. 32A and 32B are schematic views showing an example of a wafer sectional structure, which can be etched by the plasma etching apparatus shown in FIG. 1;

FIG. 36 is a circuit diagram showing an equivalent circuit of a main portion of plasma generating means in the plasma etching apparatus shown in FIG. 34:

FIG. 41 is a sectional view schematically showing a plasma etching apparatus according to the embodiment 3 of the present invention:

FIG. 46 is a view showing electron density distributions in the wafer radial direction where a DC voltage is applied and where no DC voltage is applied, under trench etching conditions;

FIG. 51 is a schematic view showing another layout of a GND block;

FIG. 55 is a schematic view showing another state in plasma etching of the device shown in FIG. 53;

FIG. 56 is a schematic view showing another example of a device that can remove deposition on the GND block;

FIG. 75 is a sectional view schematically showing a main portion of a modification of the plasma etching apparatus according to the embodiment 14 of the present invention:

FIG. 81 is a sectional view showing a plasma etching apparatus of another type to which the present invention is applicable.

DETAILED DESCRIPTION OF THE INVENTION

Figure 2:
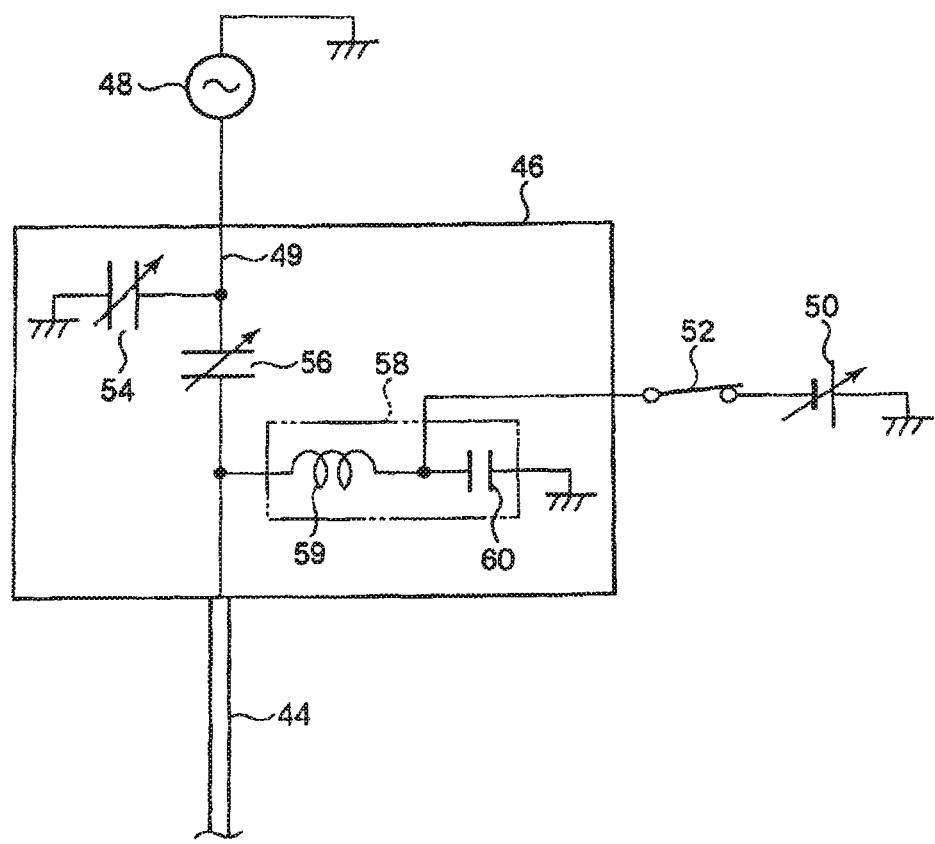
FIG. 2 is a view showing a matching unit connected to a first RF power supply in the plasma etching apparatus shown in FIG. 1.

Embodiments of the present invention will be described hereinafter with reference to the accompanying drawings.

Embodiment 1

An embodiment 1 will be explained first. FIG. 1 is a sectional view schematically showing a plasma etching apparatus according to the embodiment 1 of the present invention.

This plasma etching apparatus is structured as a parallel-plate plasma etching apparatus of the capacitive coupling type. The apparatus includes a cylindrical chamber (process chamber) 10, which is made of, e.g., aluminum with an anodization-processed surface. The chamber 10 is protectively grounded.

A columnar susceptor pedestal 14 is disposed on the bottom of the chamber 10 through an insulating plate 12 made of, e.g., a ceramic. A susceptor 16 made of, e.g., aluminum is disposed on the susceptor pedestal 14. The susceptor 16 is used as a lower electrode, on which a target substrate, such as a semiconductor wafer W, is placed.

The susceptor 16 is provided with an electrostatic chuck 18 on the top, for holding the semiconductor wafer W by an electrostatic attraction force. The electrostatic chuck 18 comprises an electrode 20 made of a conductive film, and a pair of insulating layers or insulating sheets sandwiching the electrode 20. The electrode 20 is electrically connected to a direct current (DC) power supply 22. The semiconductor wafer W is attracted and held on the electrostatic chuck 18 by an electrostatic attraction force, e.g., a Coulomb force, generated by a DC voltage applied from the DC power supply 22.

A conductive focus ring (correction ring) 24 made of, e.g., silicon is disposed on the top of the susceptor 16 to surround the electrostatic chuck 18 (and the semiconductor wafer W) to improve etching uniformity. A cylindrical inner wall member 26 made of, e.g., quartz is attached to the side of the susceptor 16 and susceptor pedestal 14.

The susceptor pedestal 14 is provided with a cooling medium space 28 formed therein and annularly extending therethrough. A cooling medium set at a predetermined temperature, such as cooling water, is circulated within the cooling medium space 28 from a chiller unit (not shown) through lines 30a and 30b. The temperature of the cooling medium is set to control the process temperature of the semiconductor wafer W placed on the susceptor 16.

Further, a heat transmission gas, such as He gas, is supplied from a heat transmission gas supply unit (not shown), through a gas supply line 32, into the interstice between the top surface of the electrostatic chuck 18 and the bottom surface of the semiconductor wafer W.

An upper electrode 34 is disposed above the lower electrode or susceptor 16 in parallel with the susceptor. The space between the electrodes 16 and 34 is used as a plasma generation space. The upper electrode 34 defines a surface facing the semiconductor wafer W placed on the lower electrode or susceptor 16, and thus this facing surface is in contact with the plasma generation space.

The upper electrode 34 is supported at the top of the chamber 10 by an insulating shield member 42. The upper electrode 34 includes an electrode plate 36 defining the facing surface opposite the susceptor 16 and having a number of gas delivery holes 37, and an electrode support 38 detachably supporting the electrode plate 36. The electrode support 38 is made of a conductive material, such as aluminum with an anodization-processed surface, and has a water-cooling structure. The electrode plate 36 is preferably made of a conductor or semiconductor having a low resistivity and thus generating less Joule heat. Further, in order to reinforce a resist film, as described later, the electrode plate 36 is preferably made of a silicon-containing substance. In light of these factors, the electrode plate 36 is preferably made of silicon or SiC. The electrode support 38 has a gas diffusion cell 40 formed therein, which is connected to the gas delivery holes 37 through a number of gas flow channels 41 extending downward.

Further, the electrode support 38 has a gas feed port 62 formed therein for feeding a process gas into the gas diffusion cell 40. The gas feed port 62 is connected to a process gas supply source 66 through a gas supply line 64. The gas supply line 64 is provided with a mass-flow controller (MFC) 68 and a switching valve 70 disposed thereon in this order from the upstream (an FCN may be used in place of the MFC). A process gas for etching, such as a fluorocarbon gas (CxFy), e.g., $C_4F_8$ gas, is supplied from the process gas supply source 66 through the gas supply line 64 into the gas diffusion cell 40. Then, the process gas flows through the gas flow channels 41 and is delivered from the gas delivery holes 37 into the plasma generation space, as in a shower device. Accordingly, in other words, the upper electrode 34 functions as a showerhead for supplying a process gas.

The upper electrode 34 is electrically connected to a first RF power supply 48 through a matching unit 46 and a feed rod 44. The first RF power supply 48 outputs an RF power with a frequency of 13.56 MHz or more, such as 60 MHz. The matching unit 46 is arranged to match the load impedance with the internal (or output) impedance of the first RF power supply 48. When plasma is generated within the chamber 10, the matching unit 44 performs control for the load impedance and the output impedance of the first RF power supply 48 to apparently agree with each other. The output terminal of the matching unit 46 is connected to the top of the feed rod 44.

Further, the upper electrode 34 is electrically connected to a variable DC power supply 50 in addition to the first RF power supply 48. The variable DC power supply 50 may be formed of a bipolar power supply. Specifically, the variable DC power supply 50 is connected to the upper electrode 34 through the matching unit 46 and feed rod 44, and the electric feeding can be set on/off by an on/off switch 52. The polarity, current, and voltage of the variable DC power supply 50, and the on/off of the on/off switch 52 are controlled by a controller (control unit) 51.

As shown in FIG. 2, the matching unit 46 includes a first variable capacitor 54 branched from a feed line 49 of the first RF power supply 48, and a second variable capacitor 56 disposed on the feed line 49 downstream from the branch point, so as to exercise the function described above. The matching unit 46 also includes a filter 58 configured to trap the RF (for example, 60 MHz) from the first RF power supply 48 and the RF (for example, 2 MHz) from a second RF power supply described later, so that a DC voltage current (which will be simply referred to as a DC voltage) is effectively supplied to the upper electrode 34. As a consequence, a DC current is connected from the variable DC power supply 50 through the filter 58 to the feed line 49. The filter 58 is formed of a coil 59 and a capacitor 60 arranged to trap the RF from the first RF power supply 48 and the RF from the second RF power supply described later.

The sidewall of the chamber 10 extends upward above the height level of the upper electrode 34 and forms a cylindrical grounded conductive body 10a. The top wall of the cylindrical grounded conductive body 10a is electrically insulated from the upper feed rod 44 by a tube-like insulating member 44a.

The susceptor 16 used as a lower electrode is electrically connected to a second RF power supply 90 through a matching unit 88. The RF power supplied from the second RF power supply 90 to the lower electrode or susceptor 16 is used for attracting ions toward the semiconductor wafer W. The second RF power supply 90 outputs an RF power with a frequency of 300 kHz to 13.56 MHz, such as 2 MHz. The matching unit 88 is arranged to match the load impedance with the internal (or output) impedance of the second RF power supply 90. When plasma is generated within the chamber 10, the matching unit 88 performs control for the load impedance and the internal impedance of the second RF power supply 90 to apparently agree with each other.

The upper electrode 34 is electrically connected to a low-pass filter (LPF) 92, which prevents the RF (60 MHz) from the first RF power supply 48 from passing through, while it allows the RF (2 MHz) from the second RF power supply 98 to pass through to ground. The low-pass filter (LPF) 92 is preferably formed of an LR filter or LC filter. On the other hand, the lower electrode or susceptor 16 is electrically connected to a high-pass filter (HPF) 94, which allows the RF (60 MHz) from the first RF power supply 48 to pass through to ground.

An exhaust port 80 is formed at the bottom of the chamber 10, and is connected to an exhaust unit 84 through an exhaust line 82. The exhaust unit 84 includes a vacuum pump, such as a turbo molecular pump, to reduce the pressure inside the chamber 10 to a predetermined vacuum level. A transfer port 85 for a semiconductor wafer W is formed in the sidewall of the chamber 10, and is opened/closed by a gate valve 86 attached thereon. A deposition shield 11 is detachably disposed along the inner wall of the chamber 10 to prevent etching by-products (deposition) from being deposited on the wall. In other words, the deposition shield 11 constitutes a chamber wall. A deposition shield 11 is also disposed around the inner wall member 26. An exhaust plate 83 is disposed at the bottom of the chamber 10 between the deposition shield 11 on the chamber wall and the deposition shield 11 on the inner wall member 26. The deposition shield 11 and exhaust plate 83 are preferably made of an aluminum body covered with a ceramic, such as $Y_2O_3$.

A conductive member (GND block) 91 is disposed on a portion of the deposition shield 11 that constitutes the chamber inner wall, at a height essentially the same as the wafer W, and is connected to ground in the sense of DC. This arrangement provides the effect of preventing abnormal electric discharge, as described later.

Respective portions of the plasma etching apparatus are connected to and controlled by a control section (overall control unit) 95. The control section 95 is connected to a user interface 96 including, e.g., a keyboard and a display, wherein the keyboard is used for a process operator to input commands for operating the plasma etching apparatus, and the display is used for showing visualized images of the operational status of the plasma processing apparatus.

Further, the control section 95 is connected to a storage section 97 that stores control programs for the control section 95 to control the plasma etching apparatus so as to perform various processes, and programs or recipes for respective components of the plasma etching apparatus to perform processes in accordance with process conditions. Recipes may be stored in a hard disk or semiconductor memory, or stored in a computer readable portable storage medium, such as a CDROM or DVD, to be attached to a predetermined position in the storage section 97.

A required recipe is retrieved from the storage section 97 and executed by the control section 95 in accordance with an instruction or the like through the user interface 96. As a consequence, the plasma etching apparatus can perform a predetermined process under the control of the control section 95. It should be noted that each of the plasma processing apparatuses (plasma etching apparatuses) according to embodiments of the present invention includes such a control section 95.

When an etching process is performed in the plasma etching apparatus described above, the gate valve 86 is first opened, and a semiconductor wafer W to be etched is transferred into the chamber 10 and placed on the susceptor 16. Then, a process gas for etching is supplied from the process gas supply source 66 into the gas diffusion cell 40 at a predetermined flow rate, and then supplied into the chamber 10 through the gas flow channels 41 and gas delivery holes 37. At the same time, the interior of the chamber 10 is exhausted by the exhaust unit 84 to set the pressure inside the chamber 10 to be a predetermined value within a range of, e.g., 0.1 to 150 Pa. The process gas may be selected from various gases conventionally employed, and preferably is a gas containing a halogen element, a representative of which is a fluorocarbon gas (CxFy), such as $C_4F_8$ gas. Further, the process gas may contain another gas, such as Ar gas or $O_2$ gas.

While the etching gas is supplied into the chamber 10, an RF power for plasma generation is applied from the first RF power supply 48 to the upper electrode 34 at a predetermined power level. At the same time, an RF for ion attraction is applied from the second RF power supply 90 to the lower electrode or susceptor 16 at a predetermined power level. Also, a predetermined DC voltage is applied from the variable DC power supply 50 to upper electrode 34. Further, a DC voltage is applied from the DC power supply 22 to the electrode 20 of the electrostatic chuck 18 to fix the semiconductor wafer W on the susceptor 16.

The process gas delivered from the gas delivery holes 37 formed in the electrode plate 36 of the upper electrode 34 is turned into plasma by glow discharge caused by the RF power applied across the upper electrode 34 and the lower electrode or susceptor 16. Radicals and ions generated in this plasma are used to etch the target surface of the semiconductor wafer W.

As described above, a first RF power for plasma generation is applied to the upper electrode 34 to adjust the plasma density. At the same time, a second RF power for ion attraction is applied to the lower electrode or susceptor 16 to adjust the voltage. As a consequence, the plasma control margin can be set broader.

In this embodiment, when plasma is generated, the upper electrode 34 is supplied with an RF power within a range covering high frequencies (for example, 10 MHz or more). As a consequence, the plasma density is increased with a preferable state, so that high density plasma is generated even under a low pressure condition.

When the plasma is thus generated, a DC voltage with a predetermined polarity and value is applied from the variable DC power supply 50 to the upper electrode 34. At this time, the application electrode or upper electrode 34 is preferably set to have a self bias voltage $V_{dc}$ on the surface, at a level for obtaining a predetermined (moderate) sputtering effect onto the surface, i.e., the surface of the electrode plate 36. In other words, the application voltage from the variable DC power supply 50 is preferably controlled by the controller 51 to increase the absolute value of $V_{dc}$ on the surface of the upper electrode 34. Where the RF power applied from the first RF power supply 48 is low, polymers are deposited on the upper electrode 34. However, since a suitable DC voltage is applied from the variable DC power supply 50, polymers deposited on the upper electrode 34 are sputtered, thereby cleaning up the surface of the upper electrode 34. Further, an optimum quantity of polymers can be supplied onto the semiconductor wafer W, thereby canceling the surface roughness of the photo-resist film. Where the voltage applied from the variable DC power supply 50 is adjusted to sputter the body of the upper electrode 34, the electrode material can be supplied onto the surface of the semiconductor wafer W. In this case, the photo-resist film is provided with carbide formed on the surface, and is thereby reinforced. Further, the sputtered electrode material reacts with F contained in a fluorocarbon family process gas and is exhausted, thereby reducing the F ratio in plasma for the photo-resist film to be less etched. Particularly, where the electrode plate 36 is made of a silicon-containing material, such as silicon or SiC, sputtered silicon from the surface of the electrode plate 36 reacts with polymers, so the photo-resist film is provided with SiC formed on the surface, and is thereby remarkably reinforced. In addition to this, Si is highly reactive with F, and the effects described above are enhanced. Accordingly, a silicon-containing material is preferably used as a material of the electrode plate 36. It should be noted that, in this case, the application current or application power may be controlled in place of the application voltage from the variable DC power supply 50.

Figure 3:
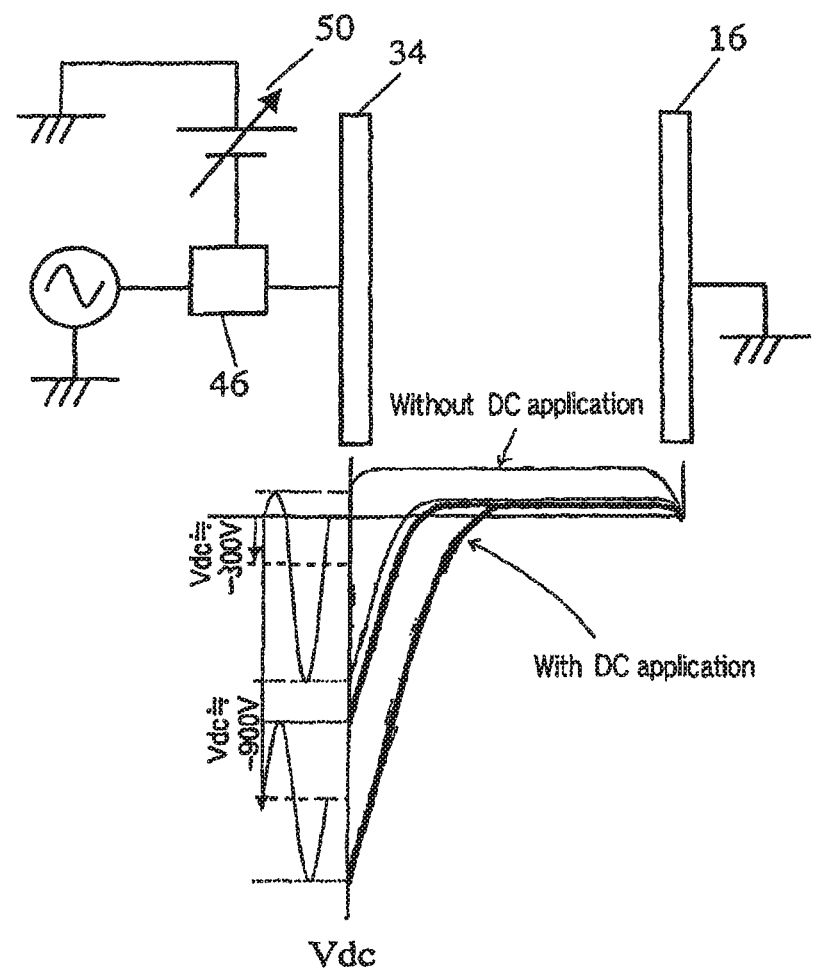
FIG. 3 is a view showing change in $V_{dc}$ and plasma sheath length where a DC voltage is applied to the upper electrode in the plasma etching apparatus shown in FIG. 1.

The DC voltage thus applied to the upper electrode 34 to make a deep self bias voltage $V_{dc}$, as described above, increases the length of a plasma sheath formed on the upper electrode 34, as shown in FIG. 3. As the length of the plasma sheath is increased, the plasma is further pressed by that much. For example, where no DC voltage is applied to the upper electrode 34, $V_{dc}$ on the upper electrode side becomes, e.g., −300V. In this case, the plasma sheath has a small length do, as shown in FIG. 4A. On the other hand, where a DC voltage of −900V is applied to the upper electrode 34, $V_{dc}$ on the upper electrode side becomes −900V. In this case, since the length of the plasma sheath is in proportion to ¾ of the absolute value of $V_{dc}$, the plasma sheath has a larger length $d_1$, and the plasma is pressed by that much, as shown in FIG. 4B. Where the length of the plasma sheath is thus increased to suitably press the plasma, the effective residence time above the semiconductor wafer W is decreased. Further, the plasma concentrates above the wafer W with less diffusion, thereby reducing the dissociation space. In this case, dissociation of a fluorocarbon family process gas is suppressed for the photo-resist film to be less etched. Accordingly, the application voltage from the variable DC power supply 50 is preferably controlled by the controller 51, such that the length of the plasma sheath on the upper electrode 34 is increased to a level for forming desired pressed plasma. It should be noted that, also in this case, the application current or application power may be controlled in place of the application voltage from the variable DC power supply 50.

Further, when the plasma is formed, electrons are generated near the upper electrode 34. When a DC voltage is applied from the variable DC power supply 50 to the upper electrode 34, electrons are accelerated in the vertical direction within the process space due to the potential difference between the applied DC voltage value and plasma potential. In other words, the variable DC power supply 50 can be set at a desired polarity, voltage value, and current value, to irradiate the semiconductor wafer W with electrons. The radiated electrons reform the composition of the mask or photo-resist film to reinforce the film. Accordingly, the application voltage value and application current value from the variable DC power supply 50 can be used to control the quantity of electrons generated near the upper electrode 34 and the acceleration voltage for accelerating the electrons toward the wafer W, so that the photo-resist film is reinforced in a predetermined manner.

Particularly, where the photo-resist film on the semiconductor wafer W is a photo-resist film (which will be referred to as an ArF resist film) for an ArF excimer laser (with a wavelength of 193 nm), the ArF resist film changes its polymer structure through reactions shown in the following chemical formulas (1) and (2), and is then irradiated with electrons, thereby arriving at the structure shown on the right side of the following chemical formula (3). In this case, by the irradiation with electrons, the composition of the ArF resist film is reformed (resist cross-linkage reaction), as shown in a portion 4 of the chemical formula (3). Since this portion 4 has a function of greatly enhancing the etching resistance property (plasma resistance property), the etching resistance property of the ArF resist film remarkably increases. As a consequence, the surface roughness of the ArF resist film is suppressed, and the etching selectivity of an etching target layer relative to the ArF resist film is increased.

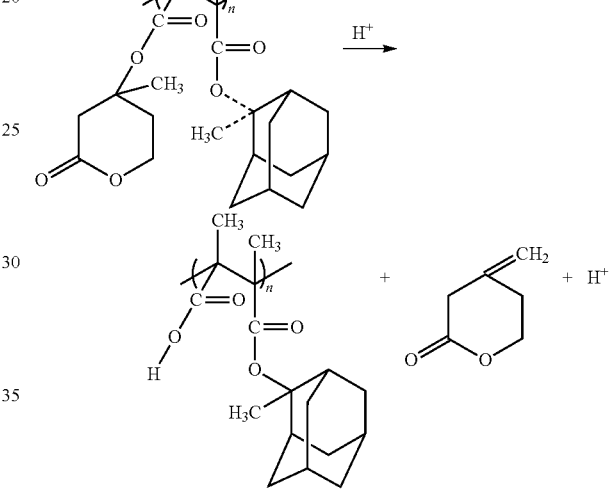

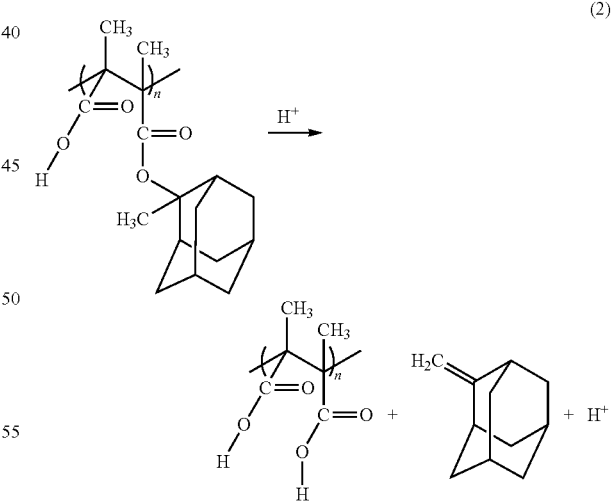

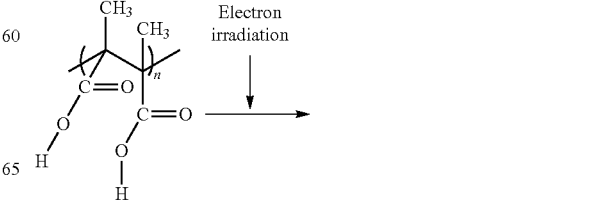

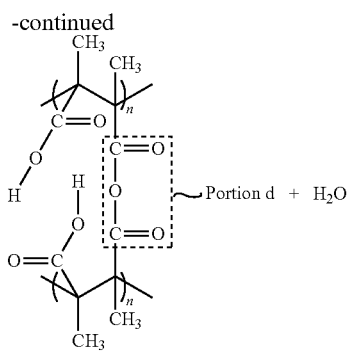

Accordingly, the application voltage value or current value from the variable DC power supply 50 is preferably controlled by the controller 51 to enhance the etching resistance property of the photo-resist film (particularly, ArF resist film) by irradiation with electrons.

Further, as described above, when a DC voltage is applied to the upper electrode 34, electrons generated near the upper electrode 34 in plasma generation are accelerated in the vertical direction within the process space. The polarity, voltage value, and current value of the variable DC power supply 50 can be set at predetermined conditions, so that electrons reach into holes formed on the semiconductor wafer W. As a consequence, the shading effect is suppressed to obtain a good processed shape without bowing, while improving the uniformity of the processed shape.

It is assumed that electron current amount $I_{DC}$ due to the DC voltage is used as the quantity of electrons incident on the wafer W, where the acceleration voltage of electrons is controlled. In this case, where $I_{ion}$ is ion current amount incident on the wafer from plasma, it is preferable to satisfy $I_{DC} > (1/2) I_{ion}$. Since $I_{ion} = Z \rho v_{ion} e$ (where, Z is charge number, $\rho$ is current velocity density, $v_{ion}$ is ion velocity, and e is electron charge amount $1.6 \times 10^{-19}$ C), and $\rho$ is in proportion to electron density Ne, $I_{ion}$ is in proportion to Ne.

As described above, the DC voltage applied to the upper electrode 34 can be controlled, so as to exercise the sputtering function onto the upper electrode 34 and the plasma pressing function, as well as the supply function of supplying a large quantity of electrons generated at the upper electrode 34 to the semiconductor wafer W, as described above. This arrangement makes it possible to reinforce the photo-resist film, supply optimum polymers, and suppress dissociation of the process gas. As a consequence, the surface roughness of the photo-resist is suppressed, and the etching selectivity of an etching target layer relative to the photo-resist film is increased. Further, the CD of an opening portion formed in the photo-resist film is prevented from expanding, thereby realizing pattern formation with high accuracy. Particularly, these effects are more enhanced by controlling the DC voltage to suitably exercise the three functions described above, i.e., the sputtering function, plasma pressing function, and electron supply function.

It should be noted that, it depends on process conditions or the like to determine which one of the functions described above is predominant. The voltage applied from the variable DC power supply 50 is preferably controlled by the controller 51 to exercise one or more of the functions to effectively obtain the corresponding effects.

Figure 5:
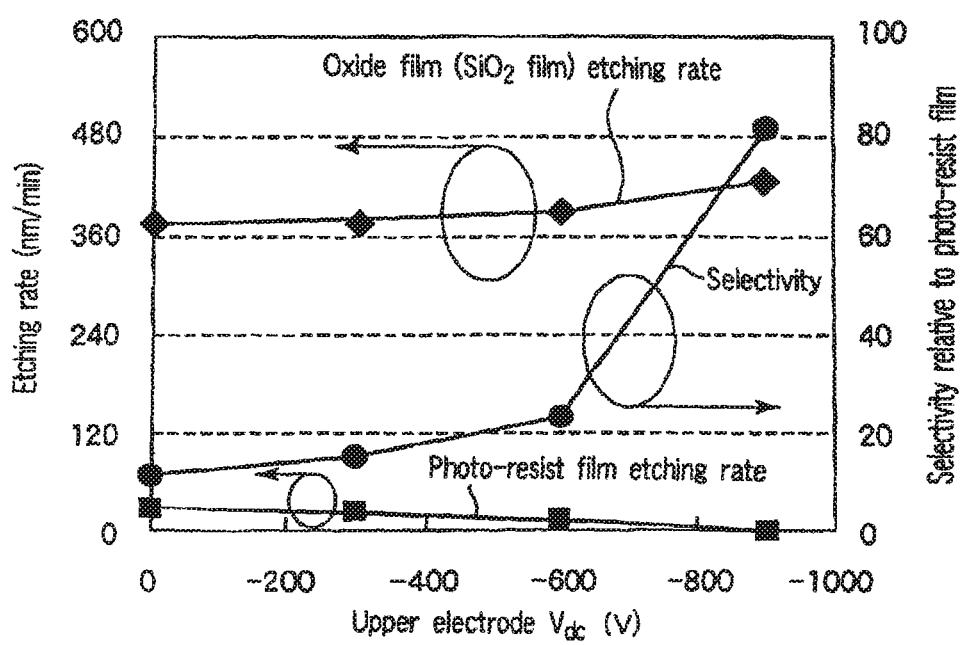
FIG. 5 is a graph showing an etching rate for a photo-resist film, an etching rate for an $SiO_2$ film, and selectivity of the $SiO_2$ film relative to the photo-resist film, where etching is performed on the $SiO_2$ film while the DC voltage applied to the upper electrode is set at different values in the plasma etching apparatus shown in FIG. 1.

Next, an explanation will be give of the result of a case where the functions described above were utilized to improve the selectivity of an $SiO_2$ film disposed as an etching target film relative to a photo-resist film. In this case, the electrode plate 36 of the upper electrode 34 was made of silicon, an RF power with a frequency of 60 MHz was applied at 100 to 3,000 W from the first RF power supply 48 to the upper electrode 34, an RF power with a frequency of 2 MHz was applied at 4,500 W from the second RF power supply 90 to the lower electrode or susceptor 16, and the etching gas was $C_4F_6/Ar/O_2$. Under these conditions, the application voltage from the variable DC power supply 50 was set at different values to measure change in etching rates for the photo-resist film and $SiO_2$ film and change in selectivity of the $SiO_2$ film relative to the photo-resist film. FIG. 5 shows the results. As shown in FIG. 5, as the absolute value of the negative DC voltage applied to the upper electrode 34 increases, the selectivity of the $SiO_2$ film relative to the photo-resist film becomes higher. Where the absolute value is larger than that of −600V, the selectivity rapidly increases. Accordingly, it has been confirmed that the selectivity of the $SiO_2$ film relative to the photo-resist film is remarkably improved where a negative DC voltage with an absolute value larger than that of −600V is applied to the upper electrode 34.

The DC voltage applied to the upper electrode 34 can be adjusted to control the plasma potential. In this case, etching by-products can be prevented from being deposited on the upper electrode 34, the deposition shield 11 forming a part of the chamber wall, the inner wall member 26, and the insulating shield member 42.

Figure 6:
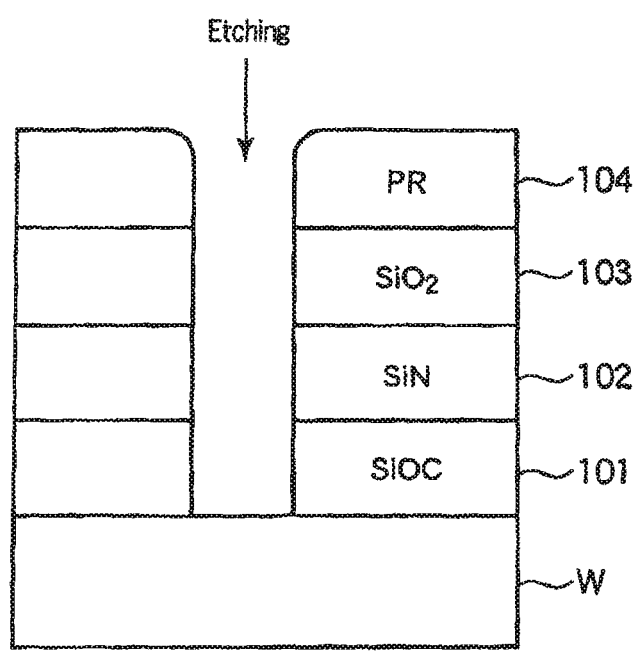
FIG. 6 is a view showing a multi-layer film to which serial etching processes are applied.

If etching by-products are deposited on the upper electrode 34 or the deposition shield 11 forming the chamber wall, a problem may arise in that the process characteristics change or particles are generated. Particularly, there is involving sequentially etching a multi-layered film, such as that shown in FIG. 6, in which an Si-organic film (SiOC) 101, SiN film 102. $SiO_2$ film 103, and photo-resist 104 are laminated on a semiconductor wafer W in this order. In this case, since suitable etching conditions are different for the respective films, a memory effect may occur in that a previous process leaves some effect that affects a subsequent process.

The amount of deposition of etching by-products described above depends on the potential difference between the plasma and the upper electrode 34, chamber wall, or the like. Accordingly, deposition of etching products can be suppressed by controlling the plasma potential.

Figure 7:
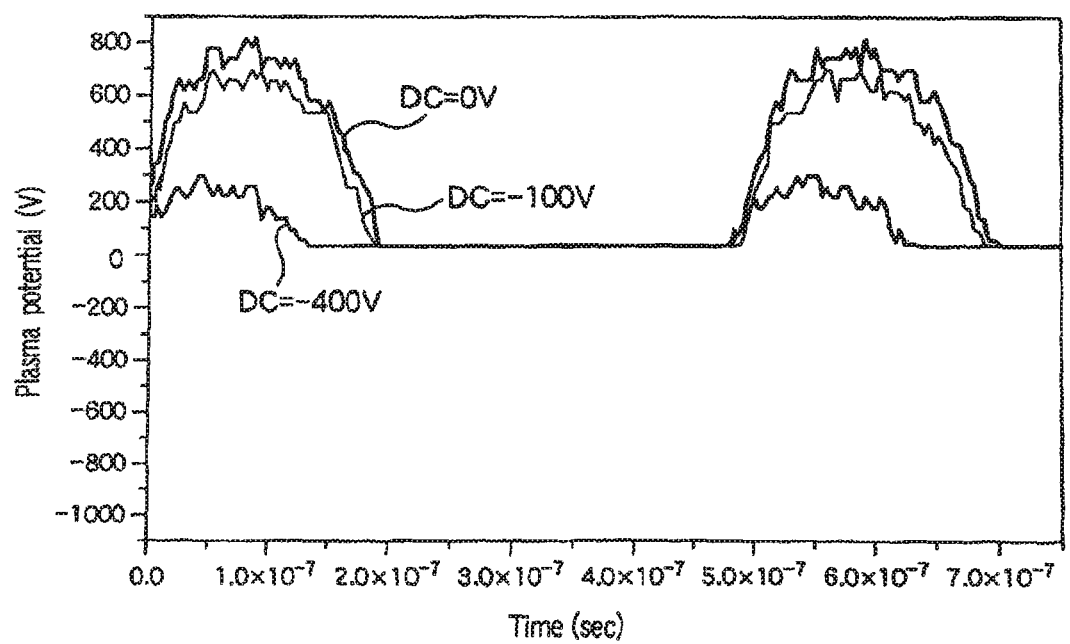
FIG. 7 is a view showing change in plasma potential waveforms where a DC voltage is applied to the upper electrode in the plasma etching apparatus shown in FIG. 1.
Figure 8:
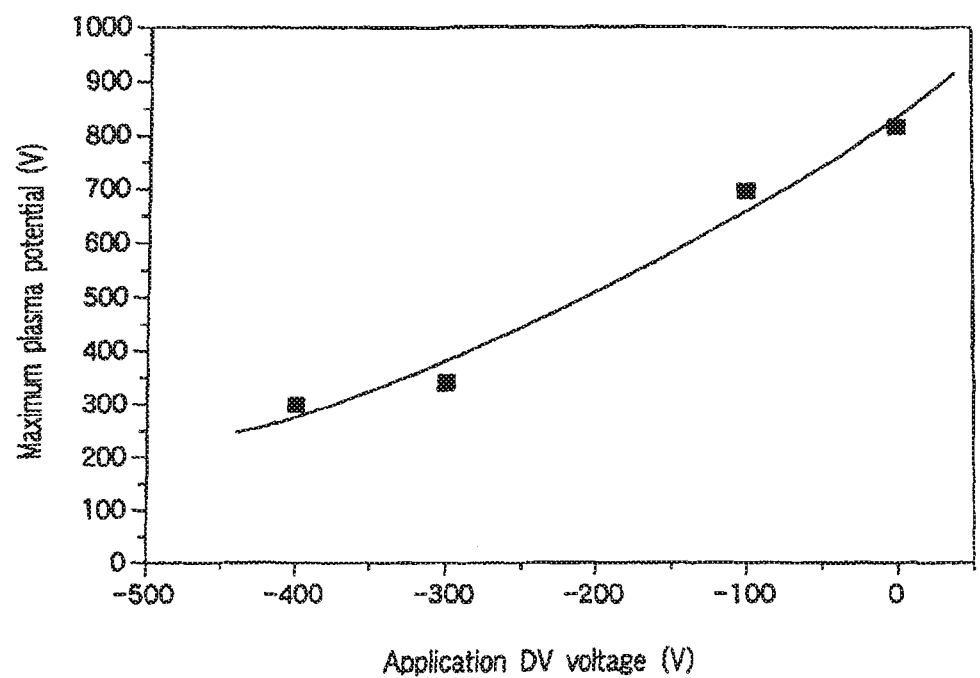
FIG. 8 is a view showing the relationship between the DC voltage applied to the upper electrode and the maximum value of the plasma potential in the plasma etching apparatus shown in FIG. 1.

FIG. 7 is a view showing change in plasma potential waveforms where a DC voltage is applied to the upper electrode 34. FIG. 8 is a view showing the relationship between the DC voltage value applied to the upper electrode and the maximum value of the plasma potential. As shown in FIGS. 7 and 8, where a negative DC voltage is applied to the upper electrode 34, the maximum value of the plasma potential becomes lower with increase in the absolute value of the voltage. Accordingly, the plasma potential can be controlled by the DC voltage applied to the upper electrode 34. This is so, because, where the upper electrode 34 is supplied with a DC voltage with an absolute value larger than a self bias ($V_{dc}$) obtained by an RF power applied to the upper electrode 34, the absolute value of $V_{dc}$ becomes larger, thereby lowering the plasma potential. More specifically, the value of the plasma potential has been determined by raise given by the upper electrode to the plasma potential. However, where a negative voltage with a high absolute value is applied to the upper electrode, the entire voltage amplitude on the upper electrode comes into the negative potential side. In this case, the plasma potential is determined by the potential of the wall, and thus becomes lower.

As described above, the voltage applied from the variable DC power supply 50 to the upper electrode 34 can be controlled to lower the plasma potential. As a consequence, etching by-products can be prevented from being deposited on the upper electrode 34, the deposition shield 11 forming a part of the chamber wall, and the insulating members (members 26 and 42) inside the chamber 10. The plasma potential Vp is preferably set at a value within a range of 80V≤Vp≤200V.

Further, the DC voltage applied to the upper electrode 34 can be controlled to effectively exercise the plasma potential control function, in addition to the sputtering function onto upper electrode 34, plasma pressing function, and electron supply function, as described above.

Further, the applied DC voltage contributes to formation of plasma, as another effect obtained by the DC voltage applied to the upper electrode 34. In this case, the plasma density can be higher and the etching rate is thereby increased.

This is so, because, the negative DC voltage applied to the upper electrode hinders electrons from entering the upper electrode and thus suppresses extinction of electrons. Further, where the negative DC voltage accelerates ions onto the upper electrode, electrons are emitted from the electrode. These electrons are accelerated at a high velocity due to the difference between the plasma potential and application voltage value, and ionize neutral gas (turn the gas into plasma), thereby increasing the electron density (plasma density).

Further, when plasma is generated, the DC voltage applied to the upper electrode 34 from the variable DC power supply 50 relatively increases the plasma density at the central portion due to plasma diffusion. Where the pressure inside the chamber 10 is high and the etching gas is a negative gas, the plasma density tends to be lower at the central portion of the chamber 10. However, since the DC voltage applied to the upper electrode 34 increases the plasma density at the central portion, the plasma density can be controlled to perform uniform etching. It should be noted that, since the etching characteristics cannot be defined only by the plasma density, a plasma density with higher uniformity does not necessarily improve the etching uniformity.

The reason for this will be explained, with reference to experiments.

Figure 9:
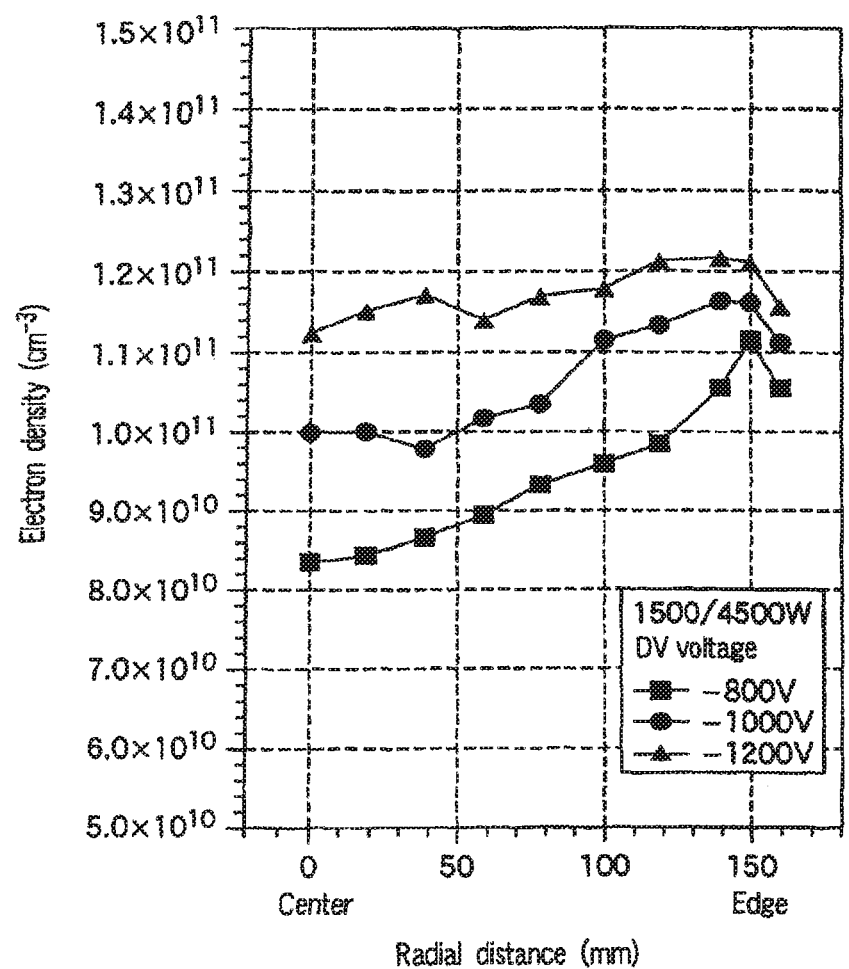
FIG. 9 is a view showing change in electron density and distribution thereof where the DC voltage applied is set at different values in the plasma etching apparatus shown in FIG. 1.
Figure 10C:
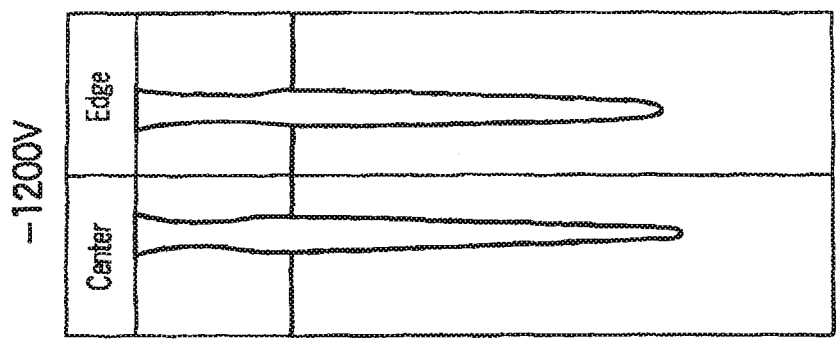
FIGS. 10A to 10C are views schematically showing etched states at the center and edge obtained by respective values of the DC voltage used in the etching of FIG. 9.
Figure 10B:
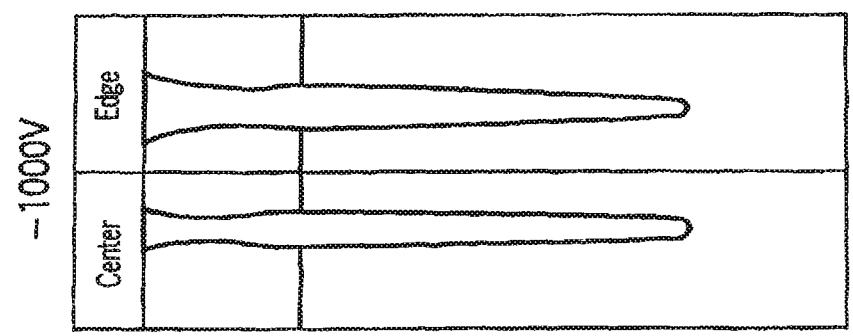
Figure 10A:
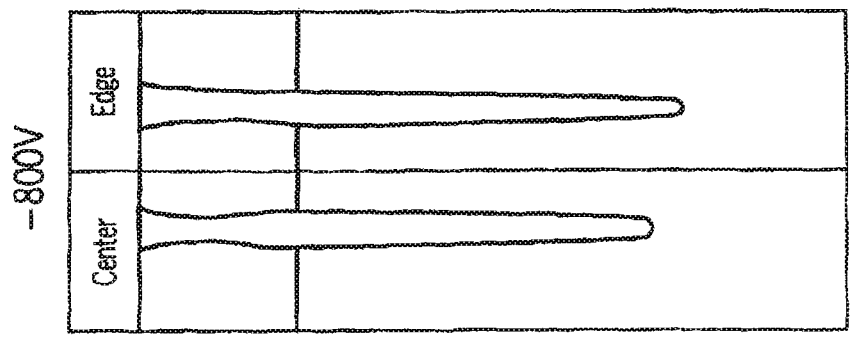

In the apparatus shown in FIG. 1, a semiconductor wafer was loaded into the chamber and placed on the susceptor, and a BARC (organic anti-reflection film) and an etching target film were etched. When the BARC was etched, the first RF power was set at 2,500 W, the second RF power was set at 2,000 W, and the process gas employed was $CH_2F_2$, $CHF_3$, Ar, and $O_2$. When the etching target film was etched to form a hole, the first RF power was set at 1,500 W, the second RF power was set at 4,500 W, and the process gas employed was $CH_4F_6$. $CF_4$. Ar, and $O_2$. At this time, the DC voltage applied to the upper electrode was set at different values of −800V, −1,000V, and −1,200V. FIG. 9 shows distributions of electron density (plasma density) in the radial direction obtained in this case. As shown in FIG. 9, as the absolute value of the DC voltage increases from −800V to −1,200V, the electron density increases at the center, which improves the plasma density uniformity. FIGS. 10A to 10C schematically show etched shapes at the center and edge obtained in this case. As shown in FIGS. 10A to 10C, as the DC voltage changes from −800V to −1,000V, the etching uniformity is improved. On the other hand, as the DC voltage changes from −1,000V to −1,200V, although the electron density uniformity is improved, the etching performance becomes too high at the center and thus the etching uniformity is deteriorated. Accordingly, it has been confirmed that the etching uniformity is the best at −1,000V. In any case, the DC voltage can be adjusted to perform uniform etching.

As described above, the DC voltage applied to the upper electrode 34 can be controlled to effectively exercise at least one of the above-described sputtering function onto the upper electrode 34, plasma pressing function, electron supply function, plasma potential control function, electron density (plasma density) increase function, and plasma density control function.

The variable DC power supply 50 may be formed of the one that can apply a voltage within a range of −2,000 to +1,000V. In order to effectively exercise the various functions described above, the application DC voltage from the variable DC power supply 50 is preferably set to have an absolute value of 500V or more.

Further, the application DC voltage is preferably a negative voltage with an absolute value larger than the self-bias voltage generated on the surface of the upper electrode by the first RF power applied to the upper electrode 34.

An explanation will be given of an experiment performed to confirm this matter. FIG. 11 is a graph showing the relationship between the self-bias voltage $V_{dc}$ generated on the surface of the upper electrode 34 and the DC voltage applied to the upper electrode 34, where the RF power for plasma generation (60 MHz) applied from the first RF power supply 48 to the upper electrode 34 is set at different power values. In this case, the self-bias voltage $V_{dc}$ generated on the surface of the upper electrode 34 was measured while plasma was generated under the following conditions. Specifically, the pressure inside the chamber was set at 2.7 Pa, the RF power applied to the upper electrode 34 at different values of 650 W, 1,100 W, and 2,200 W, the RF power applied to the lower electrode or susceptor 16 at 2,100 W, the process gas flow rates of $C_4F_6/Ar/O_2$ at 25/700/26 mL/min, the distance between the upper and lower electrodes at 25 mm, the back pressure (central portion/edge portion) at 1,333/4,666 Pa, the temperature of the upper electrode 34 at 60° C., the sidewall temperature of the chamber 10 at 50° C., and the temperature of the susceptor 16 at 0° C.

As shown in the graph of FIG. 11, the application DC voltage is effective where it is higher than the self-bias voltage $V_{dc}$ on the upper electrode 34, and, as the RF power applied to the upper electrode 34 is higher, the generated negative self-bias voltage $V_{dc}$ is larger. Accordingly, the application DC voltage is required to be a negative voltage with an absolute value larger than the self-bias voltage $V_{dc}$ generated by the RF power. To reiterate, it has been confirmed that the DC voltage applied to the upper electrode 34 is preferably set to have an absolute value at least larger than the self-bias voltage $V_{dc}$ generated on the upper electrode.

Figure 12:
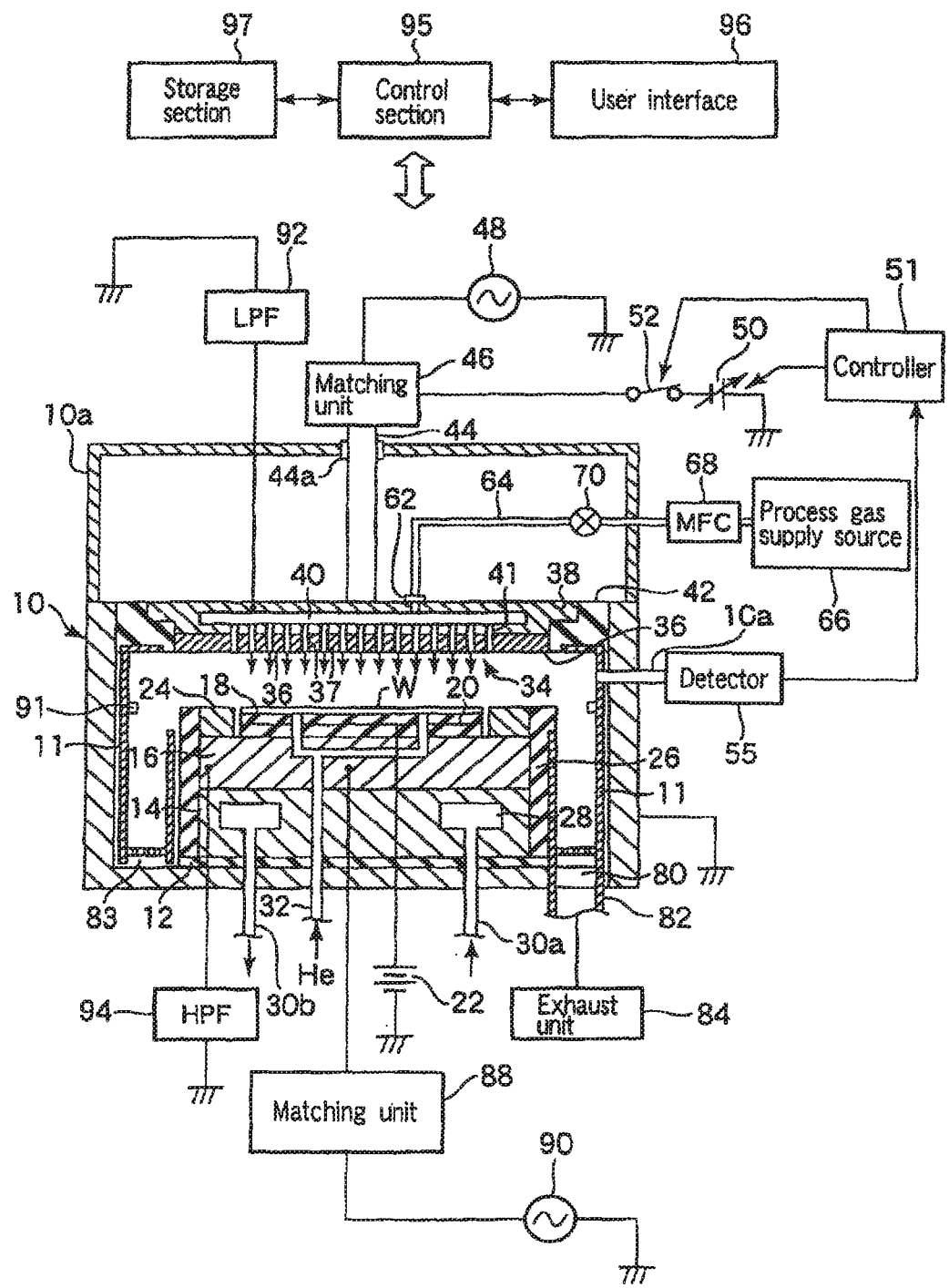
FIG. 12 is a sectional view showing a modification of the plasma etching apparatus shown in FIG. 1, provided with a detector for detecting plasma.

Further, as shown in FIG. 12, a detector 55 for detecting the state of plasma through, e.g., a plasma detection window 10a may be disposed for the controller 51 to control the variable DC power supply 50 based on the detection signal, so that the DC voltage applied to the upper electrode 34 can be automatically adjusted to effectively exercise the functions described above. Furthermore, a detector for detecting the sheath length or a detector for detecting the electron density may be disposed for the controller 51 to control the variable DC power supply 50 based on the detection signal.

Where the plasma etching apparatus according to this embodiment is used to etch an insulating film (for example, a Low-k film) disposed on a wafer W, the following combination of gases is particularly preferably used as a process gas.

Specifically, where over etching is performed under via-etching conditions, a combination of $C_5F_8$, Ar, and $N_2$ may be preferably used as a process gas. In this case, the selectivity of an insulating film relative to an underlying film (SiC, SiN, etc.) can become larger.

Alternatively, where trench etching conditions are used, $CF_4$ or a combination of ($C_4F_8$, $CF_4$, Ar, $N_2$, and $O_2$) may be preferably used as a process gas. In this case, the selectivity of an insulating film relative to a mask can become larger.

Alternatively, where HARC etching conditions are used, a combination of ($C_4F_6$, $CF_4$, Ar, and $O_2$), ($C_4F_6$, $C_3F_8$, Ar, and $O_2$), or ($C_4F_6$, $CH_2F_2$, Ar, and $O_2$) may be preferably used as a process gas. In this case, the etching rate of an insulating film can become higher.

The process gas is not limited to the examples described above, and another combination of (CxHyFz gas/an additive gas such as $N_2$ or $O_2$/a dilution gas) may be used.

Incidentally, where a DC voltage is applied to the upper electrode 34, electrons may accumulate on the upper electrode 34 and thereby cause abnormal electric discharge between the upper electrode 34 and the inner wall of the chamber 10. In order to suppress such abnormal electric discharge, this embodiment includes the GND block (conductive member) 91 as a part grounded in the sense of DC, which is disposed on the deposition shield 11 that constitutes the chamber wall. The GND block 91 is exposed to plasma, and is electrically connected to a conductive portion in the deposition shield 11. The DC voltage current applied from the variable DC power supply 50 to the upper electrode 34 flows through the process space to the GND block 91, and is then grounded through the deposition shield 11. The GND block 91 is made of a conductor, and preferably a silicon-containing substance, such as Si or SiC. The GND block 91 may be preferably made of C. The GND block 91 allows electrons accumulated in the upper electrode 34 to be released, thereby preventing abnormal electric discharge. The GND block 91 preferably has a protruding length of 10 mm or more.

Figure 13:
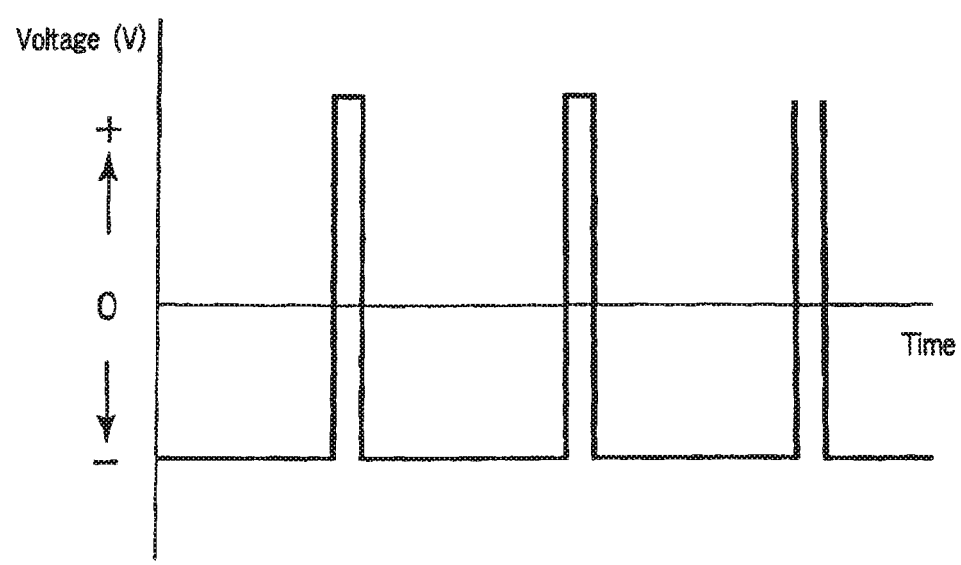
FIG. 13 is a view showing a waveform for suppressing abnormal electric discharge where a DC voltage is applied to the upper electrode in the plasma etching apparatus shown in FIG. 1.

Further, in order to prevent abnormal electric discharge, it may be effective to use a method of superposing very short periodic pulses of the opposite polarity, as shown in FIG. 13, by a suitable means, with the DC voltage applied to the upper electrode 34, so as to neutralize electrons.

Figure 14:
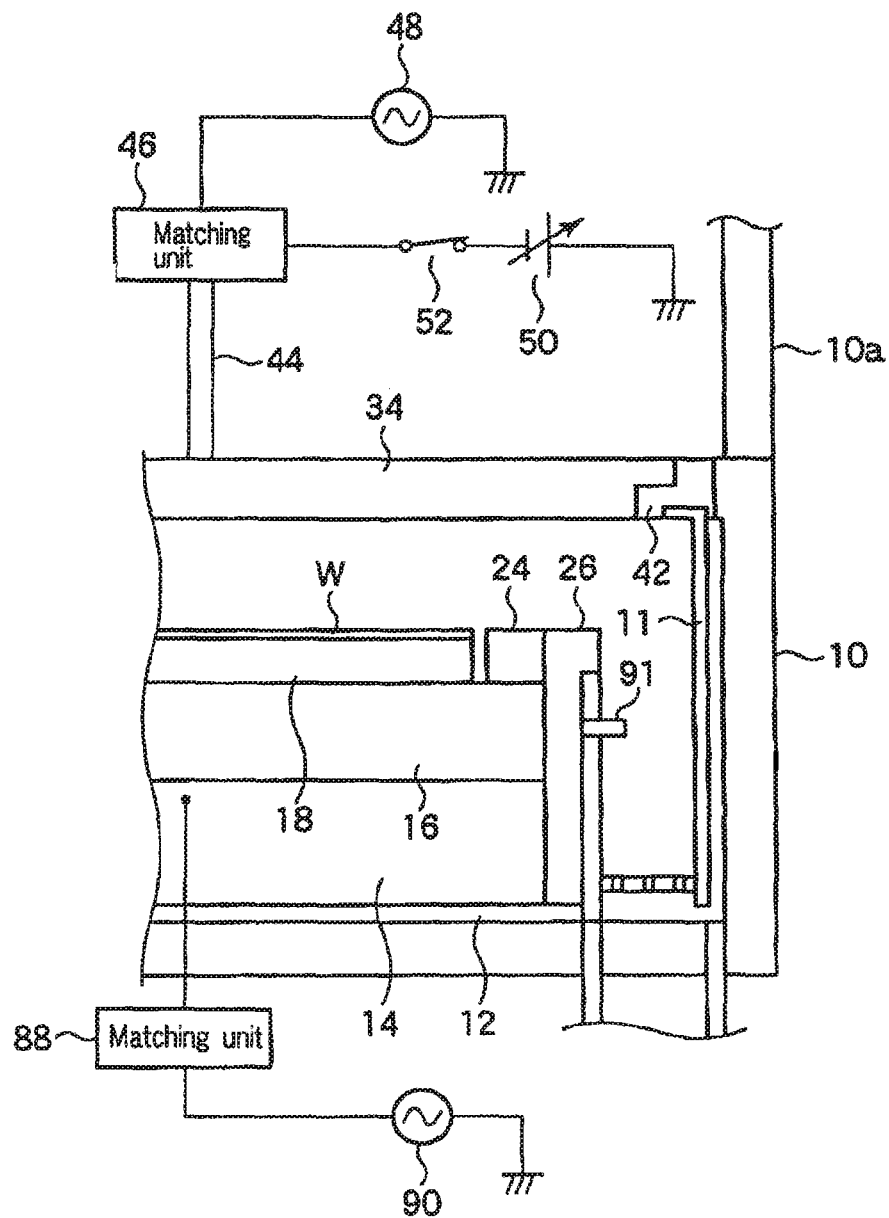
FIG. 14 is a schematic view showing another layout of a GND block.
Figure 15:
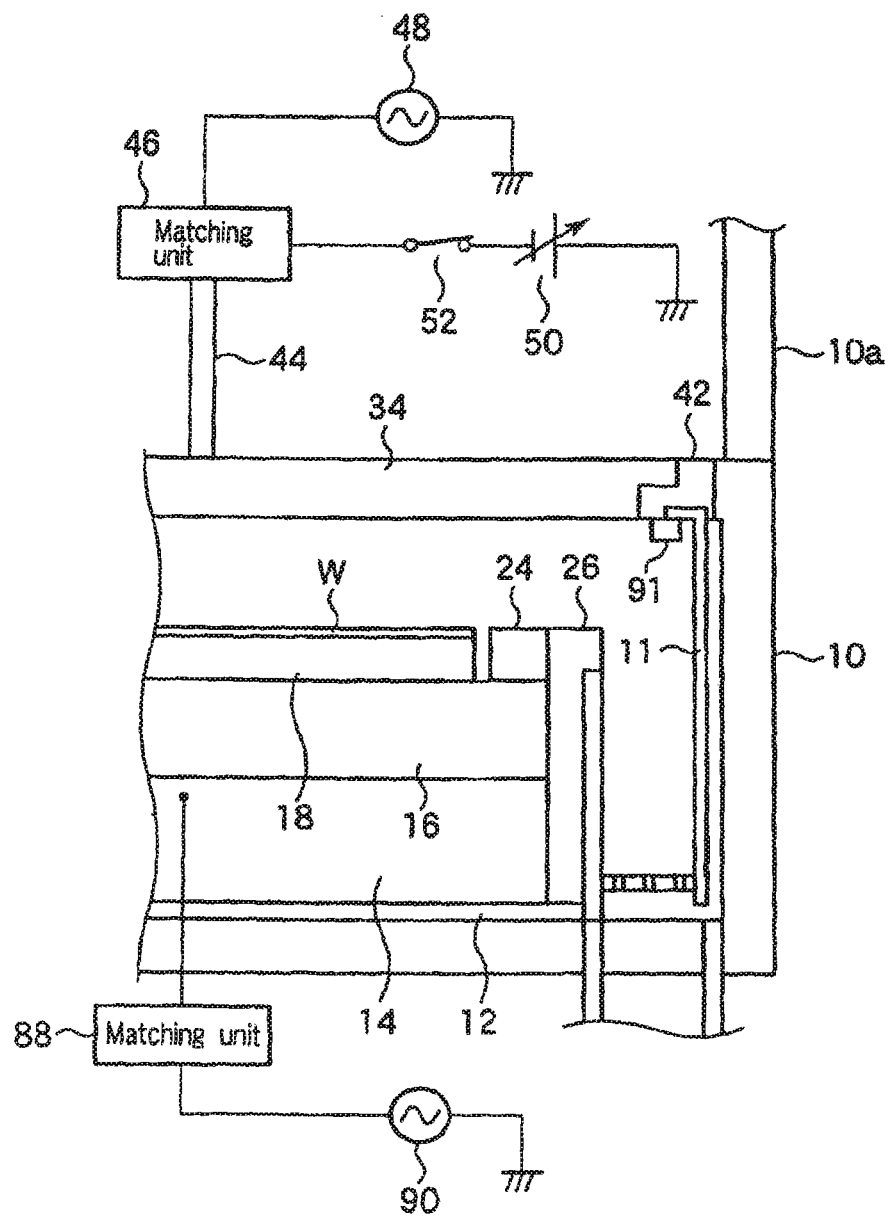
FIG. 15 is a schematic view showing another layout of the GND block.
Figure 16A:
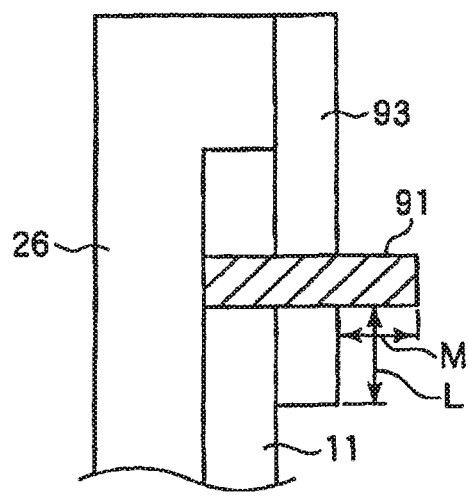
FIGS. 16A and 16B are views showing structures for preventing deposition on the GND block.
Figure 16B:
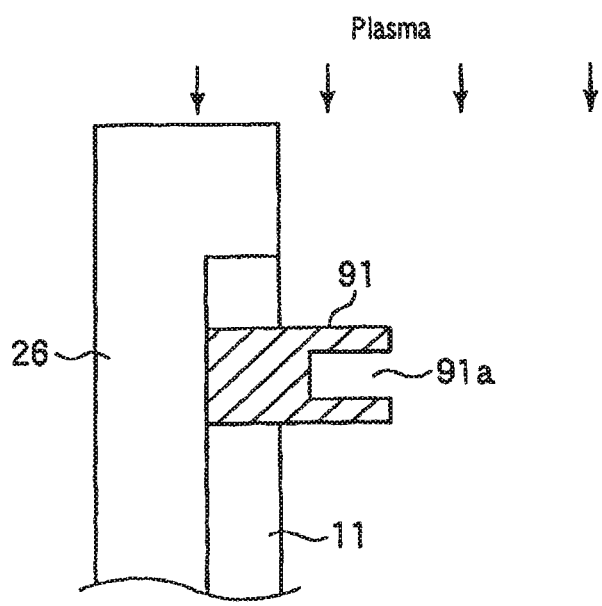

The position of the GND block 91 is not limited to that shown in FIG. 1, as long as it is disposed in the plasma generation area. For example, as shown in FIG. 14, the GND block 91 may be disposed on the susceptor 16 side, e.g., around the susceptor 16. Alternatively, as shown in FIG. 15, the GND block 91 may be disposed near the upper electrode 34, e.g., as a ring disposed outside the upper electrode 34. However, when plasma is generated, $Y_2O_3$ or a polymer that covers the deposition shield 11 or the like flies out and may be deposited on the GND block 91. In this case, the GND block 91 cannot maintain the grounding performance any more in the sense of DC, and thus hardly exercises the effect of preventing abnormal electric discharge. Accordingly, it is important to prevent such deposition. For this reason, the GND block 91 is preferably located at a position remote from members covered with $Y_2O_3$ or the like, but preferably near parts made of an Si-containing substance, such as Si or quartz ($SiO_2$). For example, as shown in FIG. 16A, an Si-containing member 93 is preferably disposed near the GND block 91. In this case, the length L of a portion of the Si-containing member 93 below the GND block 91 is preferably set to be equal to or longer than the protruding length M of the GND block 91. Further, in order to prevent the function from being deteriorated due to deposition of $Y_2O_3$ or a polymer, as shown in FIG. 16B, it is effective to form a recess 91a in the GND block 91 where flying substances are hardly deposited. It is also effective to increase the surface are of the GND block 91, so that it cannot be entirely covered with $Y_2O_3$ or a polymer. Further, in order to suppress deposition, it is effective to increase the temperature. In this respect, the upper electrode 34 is supplied with an RF power for plasma generation, and thus increases the temperature around it. Accordingly, the GND block 91 is preferably disposed near the upper electrode 34, as shown in FIG. 15, to increase the temperature and thereby prevent deposition. Particularly in this case, the GND block 91 is preferably disposed as a ring outside the upper electrode 34, as shown in FIG. 15.

Figure 17:
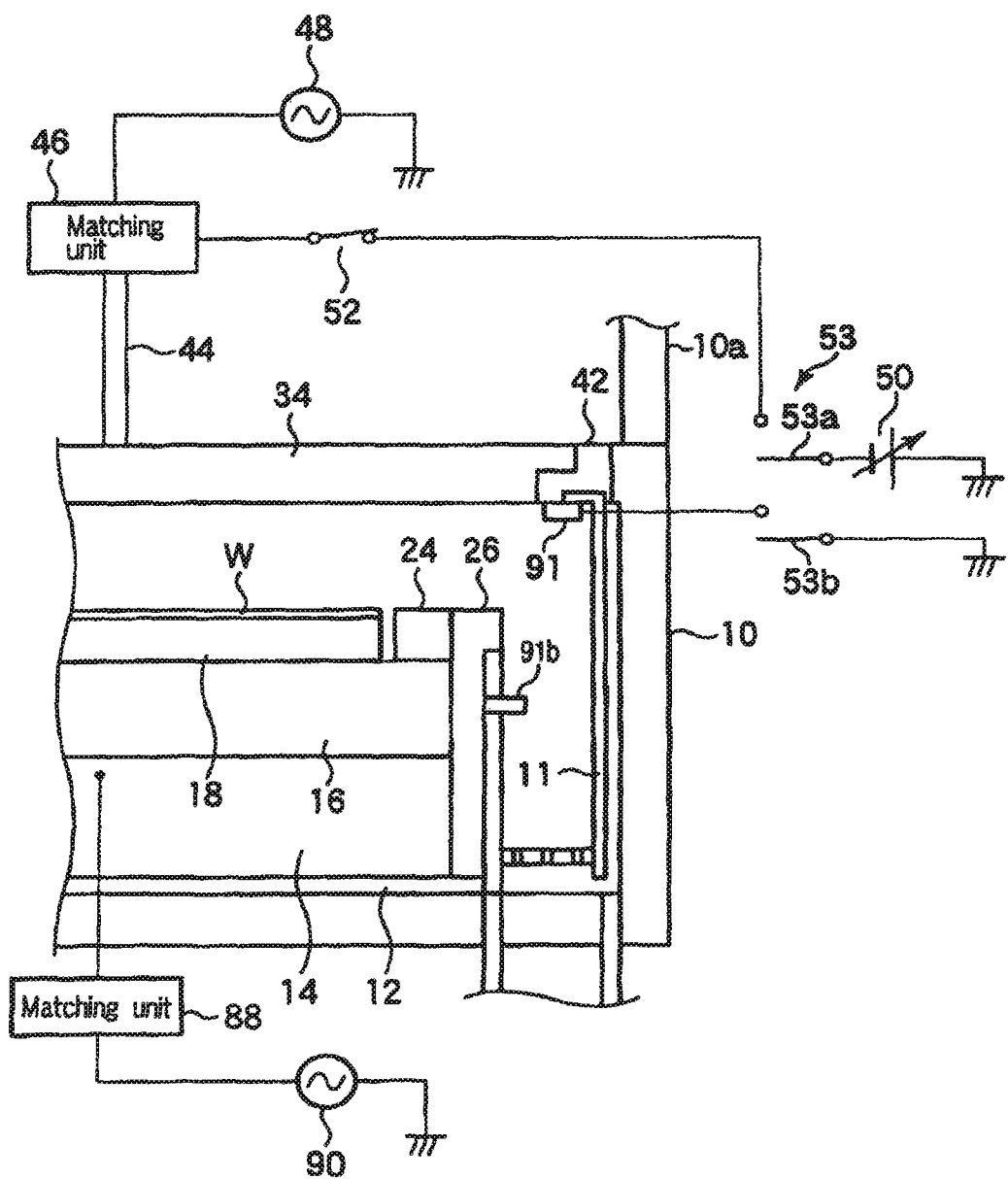
FIG. 17 is a schematic view showing an example of a device that can remove deposition on the GND block.

In order to more effectively remove the influence of deposition on the GND block 91, due to $Y_2O_3$ or a polymer flying out from the deposition shield 11 and so forth, it is effective to make a negative DC voltage applicable to the GND block 91, as shown in FIG. 17. Specifically, where a negative DC voltage is applied to the GND block 91, deposition sticking thereto is sputtered or etched, so as to clean the surface of the GND block 91. In the structure shown in FIG. 17, a switching mechanism 53 is configured to switch the connection of the GND block 91 between the variable DC power supply 50 and a ground line, so that a voltage can be applied to the GND block 91 from the variable DC power supply 50. Further, a grounded conductive auxiliary member 91b is disposed to receive flow of a DC electron current generated by a negative DC voltage applied to the GND block 91. The switching mechanism 53 includes a first switch 53a to switch the connection of the variable DC power supply 50 between the matching unit 46 and GND block 91, and a second switch 53b to turn on/off the connection of the GND block 91 to the ground line. In the structure shown in FIG. 17, the GND block 91 is disposed as a ring outside the upper electrode 34, while the conductive auxiliary member 91b is disposed around the susceptor 16. Although this arrangement is preferable, another arrangement may be adopted.

Figure 18A:
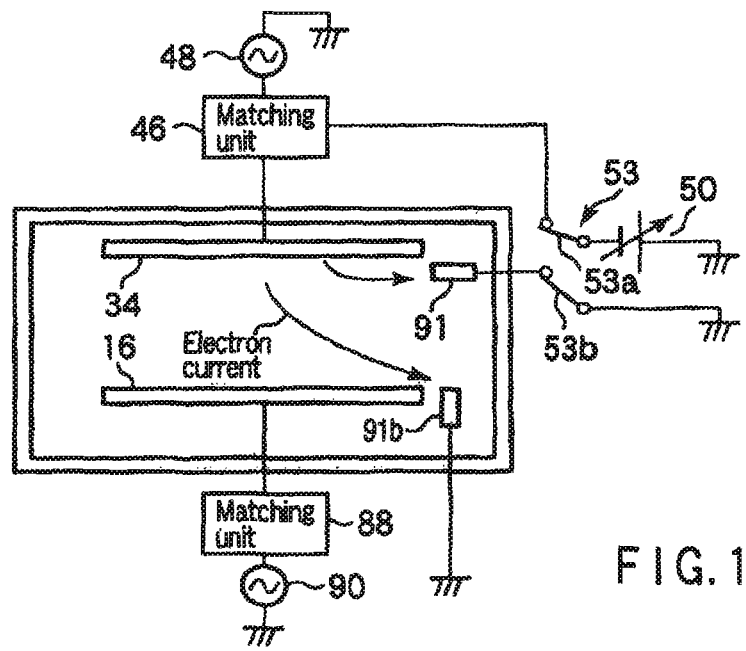
FIGS. 18A and 18B are schematic views showing a state in plasma etching and a state in cleaning, respectively, of the device shown in FIG. 1.

During plasma etching, the structure shown in FIG. 17 is typically set as shown in FIG. 18A, in which the first switch 53a of the switching mechanism 53 is connected to the upper electrode 34, so the variable DC power supply 50 is connected to the upper electrode 34, while the second switch 53b is in the ON-state, so the GND block 91 is connected to the ground line. In this state, the first RF power supply 48 and variable DC power supply 50 are electrically connected to the upper electrode 34, and plasma is thereby generated. At this time, a DC electron current flows from the upper electrode 34 through plasma into the grounded GND block 91 and conductive auxiliary member 91b (a positive ion current flows in the opposite direction). In this case, the surface of the GND block 91 may be covered with deposition of $Y_2O_3$ or a polymer, as described above.

Figure 18B:
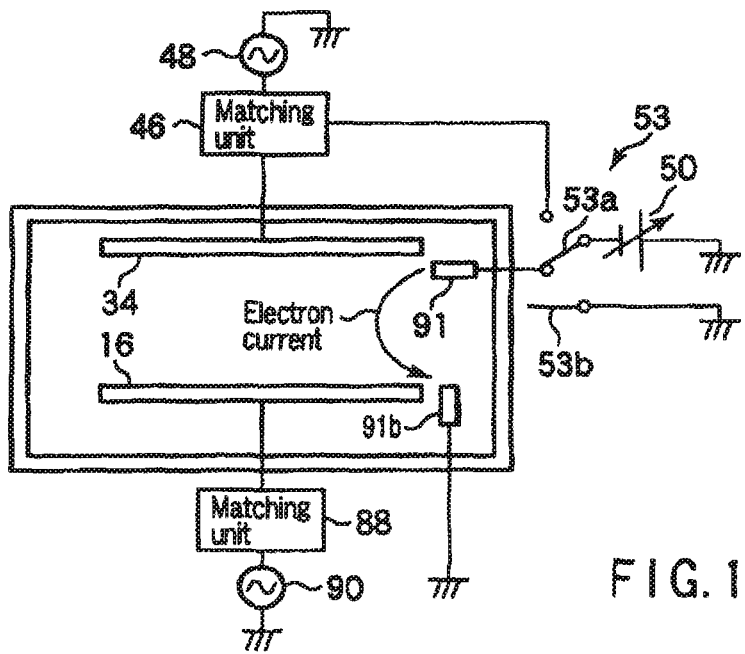

Accordingly, cleaning is then performed to remove this deposition. For this cleaning, as shown in FIG. 18B, the first switch 53a of the switching mechanism 53 is switched to the GND block 91, and the second switch 53b is turned off. In this state, the first RF power supply 48 is electrically connected to the upper electrode 34, and cleaning plasma is thereby generated, while a negative DC voltage is applied from the variable DC power supply 50 to the GND block 91. As a consequence, a DC electron current flows from the GND block 91 into the conductive auxiliary member 91b.

On the other hand, positive ions flow into the GND block 91. Accordingly, the DC voltage can be adjusted to control the energy of positive ions incident on the GND block 91, so that the surface of the GND block 91 is sputtered by ions to remove deposition sticking to the surface of the GND block 91.

Figure 19:
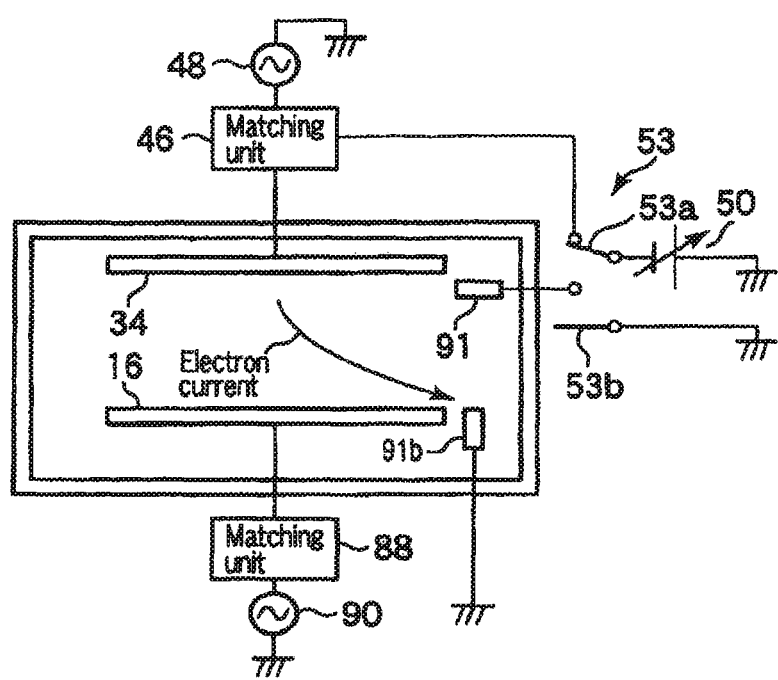
FIG. 19 is a schematic view showing another state in plasma etching of the device shown in FIG. 17.

Further, as shown in FIG. 19, the second switch 53b may be set in the OFF state during a partial period of plasma etching, so that the GND block 91 is in a floating state. At this time, a DC electron current flows from the upper electrode 34 through plasma into the conductive auxiliary member 91b (a positive ion current flows in the opposite direction). In this case, the GND block 91 is given a self bias voltage, which provides energy for positive ions to be incident on the GND block 91, thereby cleaning the GND block 91.

During the cleaning described above, the application DC voltage can be small, and thus the DC electron current is also small at this time. Accordingly, in the structure shown in FIG. 17, where electric charges due to leakage current can be prevented from accumulating in the GND block 91, the conductive auxiliary member 91b is not necessarily required.

Figure 20:
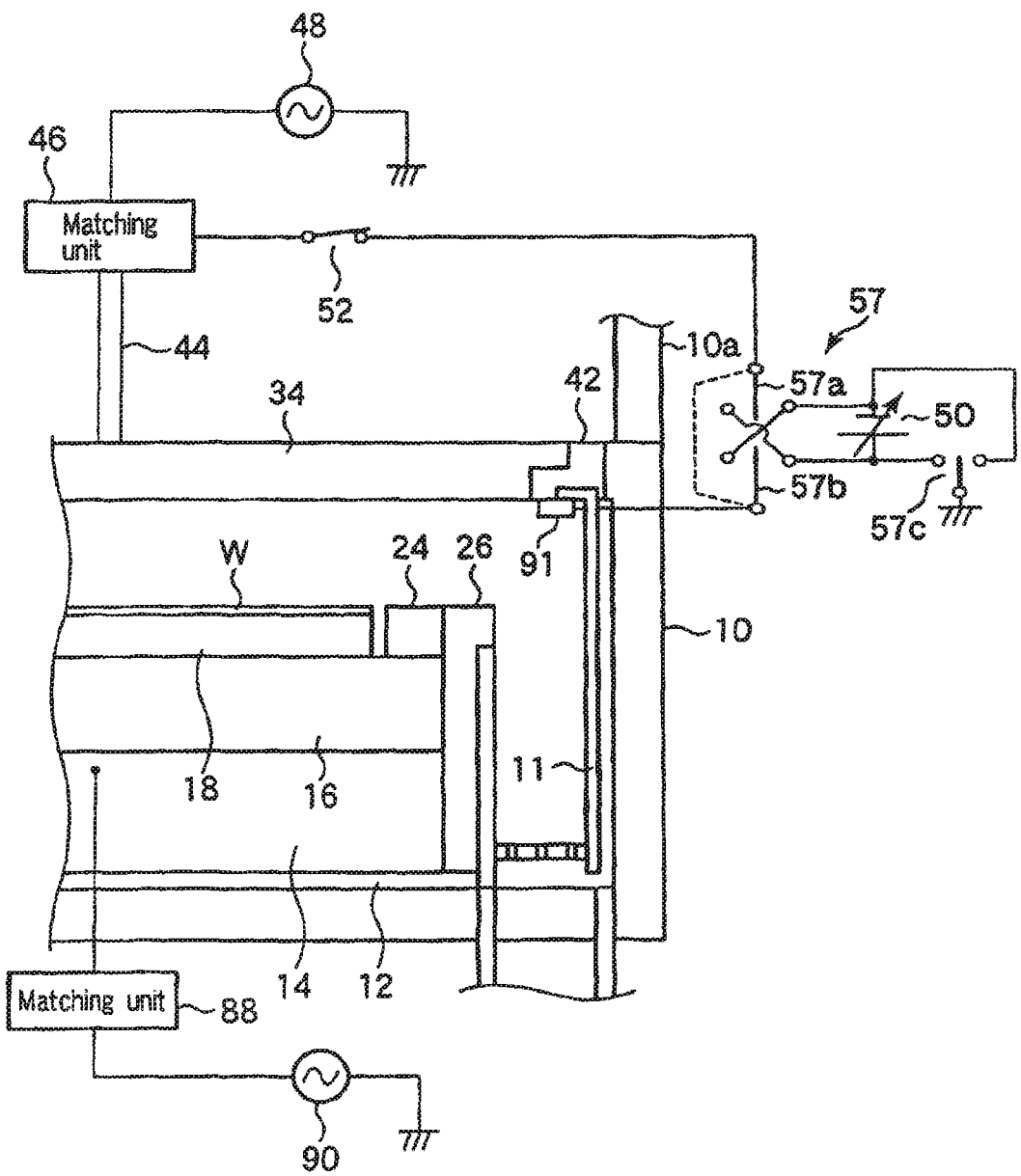
FIG. 20 is a schematic view showing another example of a device that can remove deposition on the GND block.

In the structure shown in FIG. 17, for cleaning, the connection of the variable DC power supply 50 is switched from the upper electrode 34 to the GND electrode 91, so that a DC electron current due to application of a DC voltage flows from the GND block 91 to the conductive auxiliary member 91b. Alternatively, it may be adopted that the positive terminal of the variable DC power supply 50 is connected to the upper electrode 34, while the negative terminal is connected to the GND block 91, so that a DC electron current due to application of a DC voltage flows from the GND block 91 to the upper electrode 34. In this case, the conductive auxiliary member is not necessary. FIG. 20 shows such a structure. The structure shown in FIG. 20 includes a connection switching mechanism 57, which is configured to perform connection switching such that, during plasma etching, the negative terminal of the variable DC power supply 50 is connected to the upper electrode 34, while the GND block 91 is connected to the ground line. Further, in this switching, during cleaning, the positive terminal of the variable DC power supply 50 is connected to the upper electrode 34, while the negative terminal is connected to the GND block 91. This connection switching mechanism 57 includes a first switch 57a to switch the connection of the variable DC power supply 50 to the upper electrode 34 between the positive terminal and negative terminal, a second switch 57b to switch the connection of the variable DC power supply 50 to the GND block 91 between the positive terminal and negative terminal, and a third switch 57c to set the positive terminal or negative terminal of the variable DC power supply 50 to be grounded. The first switch 57a and second switch 57b are arranged to form an interlock switch structure. Specifically, when the first switch 57a is connected to the positive terminal of the variable DC power supply 50, the second switch 57b is connected to the negative terminal of the DC power supply. Further, when the first switch 57a is connected to the negative terminal of the variable DC power supply 50, the second switch 57b is set in the OFF state.

Figure 21A:
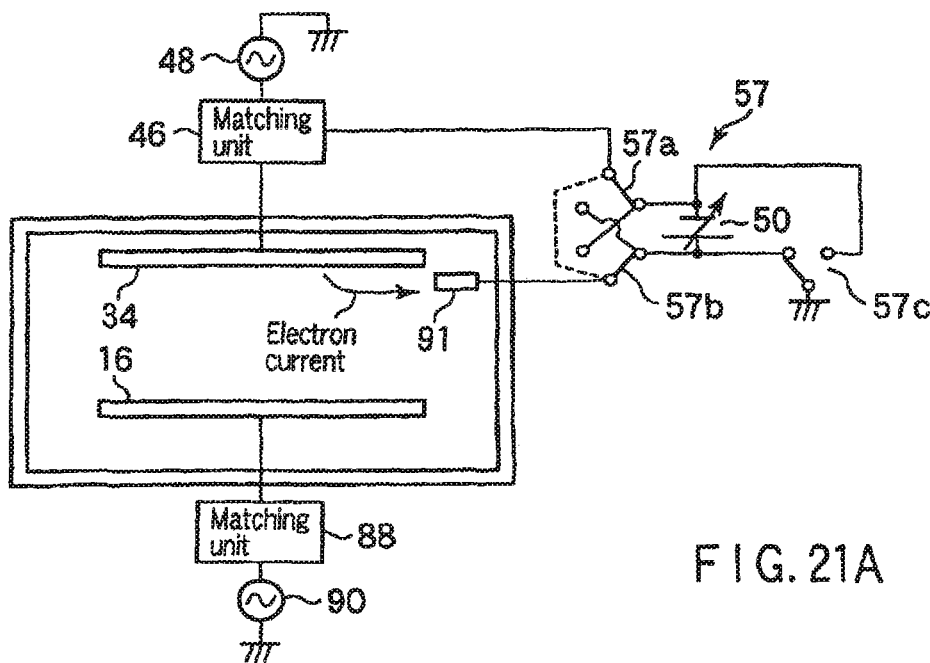
FIGS. 21A and 21B are schematic views showing a state in plasma etching and a state in cleaning, respectively, of the device shown in FIG. 20.

During plasma etching, the structure shown in FIG. 20 is set as shown in FIG. 21A, in which the first switch 57a of the connection switching mechanism 57 is connected to the negative terminal of the variable DC power supply 50, so the negative terminal of the variable DC power supply 50 is connected to the upper electrode 34. Further, the second switch 57b is connected to the positive terminal of the variable DC power supply 50, and the third switch 57c is connected to the positive terminal of the variable DC power supply 50 (the positive terminal of the variable DC power supply 50 is grounded), so that the GND block 91 is connected to the ground line. In this state, the first RF power supply 48 and variable DC power supply 50 are electrically connected to the upper electrode 34, and plasma is thereby generated. At this time, a DC electron current flows from the upper electrode 34 through plasma into the grounded GND block 91 (a positive ion current flows in the opposite direction). In this case, the surface of the GND block 91 may be covered with deposition of $Y_2O_3$ or a polymer, as described above.

Figure 21B:
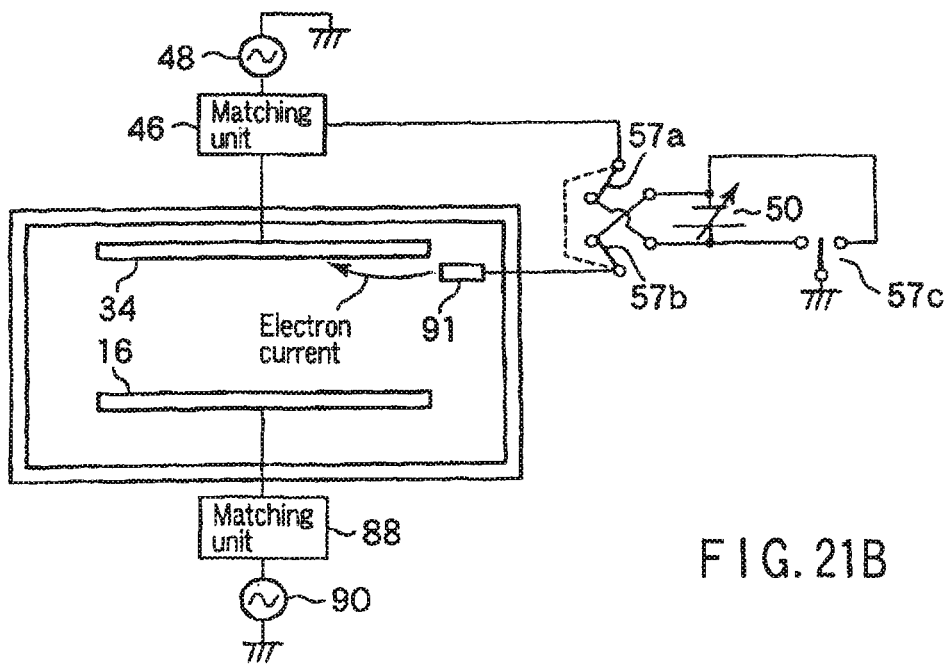

On the other hand, for cleaning, as shown in FIG. 21B, the first switch 57a of the connection switching mechanism 57 is switched to the positive terminal of the variable DC power supply 50, the second switch 57b is switched to the negative terminal of the variable DC power supply 50, and the third switch 57c is set to be in a disconnected state. In this state, the first RF power supply 48 is electrically connected to the upper electrode 34, and cleaning plasma is thereby generated, while a DC voltage is applied to the GND block 91 from the negative terminal of the variable DC power supply 50 and to the upper electrode 34 from the positive terminal of the variable DC power supply 50. Due to the potential difference between these members, a DC electron current flows from the GND block 91 into the upper electrode 34, while positive ions flow into the GND block 91. Accordingly, the DC voltage can be adjusted to control the energy of positive ions incident on the GND block 91, so that the surface of the GND block 91 is sputtered by ions to remove deposition sticking to the surface of the GND block 91. In this case, the variable DC power supply 50 appears to be in a floating state, but, in general, a power supply is provided with a frame ground line, thus is safe.

In the example described above, although the third switch 57c is in the disconnected state, the positive terminal of the variable DC power supply 50 may be kept in the connected state (the positive terminal of the variable DC power supply 50 is grounded). In this state, the first RF power supply 48 is electrically connected to the upper electrode 34, and cleaning plasma is thereby generated, while a DC voltage is applied from the negative terminal of the variable DC power supply 50 to the GND block 91. As a consequence, a DC electron current flows from the GND block 91 into the upper electrode 34 through plasma, while positive ions flow into the GND block 91. Also in this case, the DC voltage can be adjusted to control the energy of positive ions incident on the GND block 91, so that the surface of the GND block 91 is sputtered by ions to remove deposition sticking to the surface of the GND block 91.

In the examples shown in FIGS. 17 and 20, although a DC voltage is applied to the GND block 91 during cleaning, an AC voltage may be alternatively applied. Further, in the example shown in FIG. 17, although the variable DC power supply 50 for applying a DC voltage to the upper electrode is used for applying a voltage to the GND block 91, another power supply may be used for applying the voltage. Furthermore, in the examples shown in FIGS. 17 and 20, although the GND block 91 is grounded during plasma etching, while a negative DC voltage is applied to the GND block 91 during cleaning, this is not limiting. For example, during plasma etching, a negative DC voltage may be applied to the GND block 91. The term, "during cleaning" may be replaced with "during ashing" in the explanation described above. Furthermore, where the variable DC power supply 50 is formed of a bipolar power supply, it does not require any complex switching operation, such as that of the connection switching mechanism 57 described above.

The switching operations of the switching mechanism 53 of the example shown in FIG. 17 and the connection switching mechanism 57 of the example shown in FIG. 20 are performed in accordance with commands sent from the control section 95.

In order to simply prevent the GND block 91 from losing the grounding performance in the sense of DC, due to deposition of $Y_2O_3$ or a polymer on the GND block 91 in plasma generation, it is effective to partly cover the GND block 91 with another member, and to move them relative to each other so as to expose a new surface of the GND block 91. Specifically, the arrangement shown in FIG. 22 may be adopted, in which the GND block 91 is set to have a relatively large area, and the surface of the GND block 91 to be in contact with plasma is partly covered with a mask member 111 movable in the arrow direction. This cover plate 111 is movable, so that a portion to be exposed to plasma can be changed on the surface of the GND block 91. In this case, although a driving mechanism disposed in the chamber 10 may cause a problem about particle generation, it cannot be serious because the frequency of use of the driving mechanism is as low as once in 100 hours. Further, for example, the arrangement shown in FIG. 23 may be effective, in which a columnar GND block 191 is rotatably disposed, and the outer periphery surface of the GND block 191 is covered with a mask member 112, so that it is partially exposed. Where the GND block 191 is rotated, the portion to be exposed to plasma can be changed. In this case, a driving mechanism may be disposed outside the chamber 10. Each of the mask members 111 and 112 may be formed of a member having a high plasma resistance property, such as an aluminum plate covered with a ceramic, such as $Y_2O_3$, formed by thermal spray.

In order to simply prevent the GND block 91 from losing the grounding performance in the sense of DC due to deposition, it is also effective to partly cover the GND block 91 with another member, which is to be gradually etched by plasma, so that a part of the surface of the GND block 91, which has not lost conductivity, is always exposed. For example, the arrangement shown in FIG. 24A may be adopted, in which the surface of the GND block 91 is partly covered with a stepped cover film 113 disposed to leave an initially exposed surface 91c that provides a grounding performance. In this case, after a plasma process is performed for, e.g., 200 hours, the initially exposed surface 91c of the GND block 91 loses conductivity, as shown in FIG. 24B. However, the stepped cover film 113 is designed to have a thin portion such that it has been etched by this time, so that a new exposed surface 91d of the GND block 91 appears. The new exposed surface 91d provides a grounding performance. This cover film 113 has the effect of preventing a wall surface material from being deposited on the GND block 91, as well as the effect of reducing ions incident on the GND block 91 to prevent contamination thereof.

Figure 25:
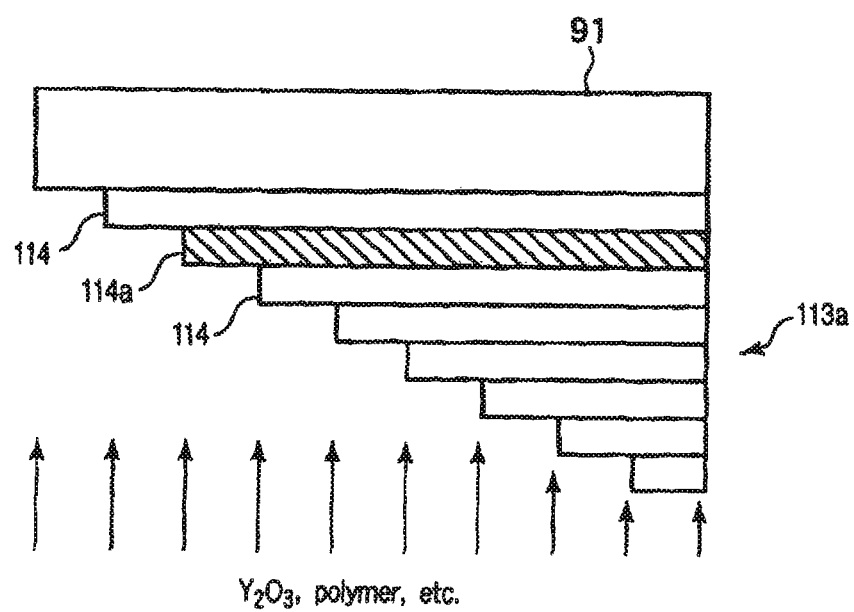
FIG. 25 is a schematic view showing another example of the GND block having a function to prevent it from losing the grounding performance in the sense of DC.

In practical use, as shown in FIG. 25, it is preferable to use a cover film 113a in which a number of thin layers 114 are stacked while the layers are gradually shifted. In this case, where one layer 114 disappears due to etching by plasma in a time Te, and an exposed surface of the GND block 91 loses conductivity due to contamination in a time Tp, the thickness of the layer 114 is set to satisfy Te<Tp, so that a conductive surface is always ensured on the GND block 91. The number of layers 114 is preferably set to make the service life of the GND block 91 longer than the frequency of maintenance. Further, in order to improve the maintenance performance, one layer 114a is provided with a different color from the others, as shown in FIG. 25, so that it is possible to know the time to replace the GND block 91 with a new one, by this film 114a, for example, when the surface area of this film 114a exceeds a certain value.

Each of the cover films 113 and 113a is preferably formed of a film to be suitably etched by plasma, such as a photo-resist film.

Figure 26:
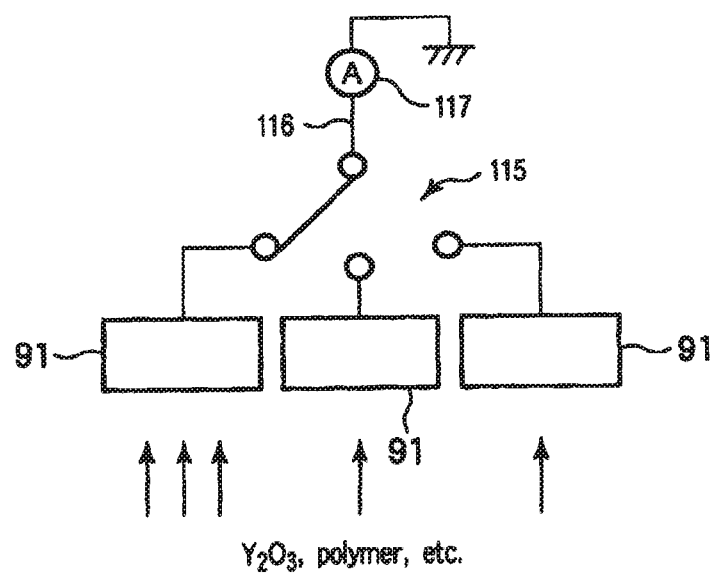
FIG. 26 is a schematic view showing another example of the GND block having a function to prevent it from losing the grounding performance in the sense of DC.

In order to simply prevent the GND block 91 from losing the grounding performance in the sense of DC due to deposition, it may be also adopted to dispose a plurality of GND blocks 91, so that they are switched in turn to exercise a grounding performance. For example, as shown in FIG. 26, three GND blocks 91 are disposed and only one of them is selectively grounded by a shift switch 115. Further, a current sensor 117 is disposed on a common ground line 116 to monitor a DC current flowing therethrough. The current sensor 117 is used to monitor a current flowing through a grounded GND block 91, and when the current value becomes lower than a predetermined value, it is determined that this GND block 91 cannot exercise the grounding performance, and thus the connection is switched from this one to another GND block 91. The number of GND blocks 91 is suitably selected from a range of about 3 to 10.

Figure 27:
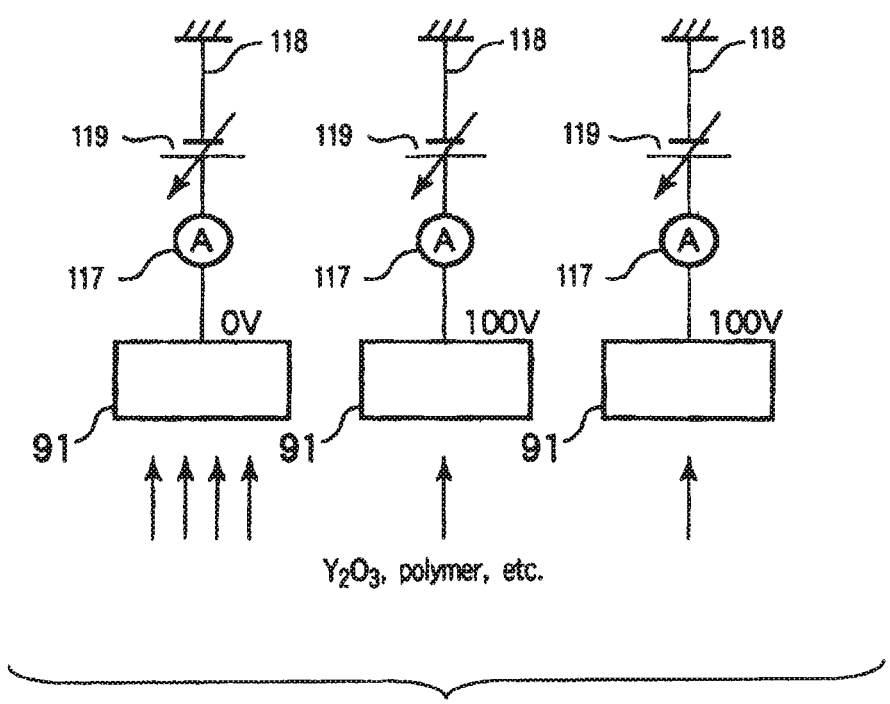
FIG. 27 is a schematic view showing another example of the GND block having a function to prevent it from losing the grounding performance in the sense of DC.

In the example described above, a GND block not grounded is in an electrically floating state, but such a GND block may be supplied with an electric potential for protection to protect a GND block in an idle state, in place of use of the shift switch 115. FIG. 27 shows an example designed in this aspect. As shown in FIG. 27, each of ground lines 118 respectively connected to GND blocks 91 is provided with a variable DC power supply 119. In this case, the voltage of a GND block 91 to exercise a grounding performance is set at 0V by controlling the voltage of the corresponding variable DC power supply 119. Further, the voltage of each of the other GND blocks 91 is set at, e.g., 100V to prevent an electric current from flowing therethrough by controlling the voltage of the corresponding variable DC power supply 119. When the current value detected thereby becomes lower than a predetermined value at the current sensor 117 on the ground line 118 connected to a GND block 91 to exercise a grounding performance, it is determined that this GND block 91 cannot exercise the grounding performance. Accordingly, the voltage of the variable DC power supply 119 corresponding to another GND block 91 is controlled to be a value for this GND block 91 to exercise a grounding performance.

As described above, where the application voltage from a DC power supply 119 is set at a negative value of about −1 kV, the GND block 91 connected thereto can function as an electrode to apply a DC voltage to plasma. However, if this value is too large, the plasma is affected. Further, the voltage applied to the GND block 91 can be controlled to obtain a cleaning effect on the GND block 91.

Next, a detailed explanation will be given of plasma obtained by superposing the RF power and DC voltage applied to the upper electrode 34, according to this embodiment.

FIG. 28 is a view showing the electron temperature distribution of plasma, where the horizontal axis denotes the electron temperature and the vertical axis denotes the plasma intensity. In order to obtain high density plasma, it is effective to use an RF power with a relatively high frequency that ions cannot follow, such as 13.56 MHz or more, as described above. However, in the case of the electron temperature distribution of plasma (RF plasma) obtained by an RF power application, an intensity peak appears within an excitation domain having lower electron temperature, as indicated by a line A (case A) in FIG. 28. As the power is increased to obtain a higher plasma density, the intensity becomes higher within a dissociation domain having middle electron temperature. As a consequence, dissociation of a fluorocarbon gas (CxFy), such as $C_4F_8$ gas, used as the etching process gas, proceeds, thereby deteriorating etching characteristics.

On the other hand, the electron temperature distribution of plasma (DC plasma) obtained by a DC voltage application is indicated by a line B (case B) in FIG. 28. In this case, the plasma density is almost equal to that corresponding to the line A (case A), but an intensity peak appears within an ionization domain having higher electron temperature, while essentially no distribution part is present within the excitation domain or dissociation domain. Where a DC voltage is superposed on an RF power of 13.56 MHz or more, a high plasma density can be obtained without increasing the power level of the RF power. Further, the plasma thus formed is polarized such that the electron temperature has intensity peaks within the excitation domain and ionization domain. This brings about ideal plasma that can reduce dissociation of the process gas with the same plasma density.

This arrangement will be specifically explained further with reference to FIG. 29. FIG. 29 is a view showing the electron temperature distribution of plasma obtained by solely using an RF power, in comparison with that obtained by superposing a DC voltage on an RF power. In FIG. 29, a line C shows a case where an RF power with a frequency of 60 MHz was applied at 2,400 W to the upper electrode 34, while an RF power with a frequency of 2 MHz for attracting ions was applied at 1,000 W to the lower electrode or susceptor 16. On the other hand, a line D shows a case where RF powers of 60 MHz and 2 MHz were also respectively applied to the upper electrode 34 and susceptor 16, and a DC voltage was further applied to the upper electrode 34. In the case of the line D, the RF power and DC voltage applied to the upper electrode 34 were respectively set at 300 W and −900V to obtain the same plasma density as that of the case of the line C. As shown in FIG. 29, where the DC voltage is superposed, high density plasma is formed at this same density while being polarized with almost no part of the electron temperature distribution within the dissociation domain. In this case, the electron temperature distribution can be controlled to obtain a more suitable plasma state by changing the frequency and power level of the RF power and the value of the DC voltage, both of which are applied to the upper electrode 34.

As described above, as the frequency of the RF power applied to the upper electrode 34 is lower, the plasma has a higher energy and $V_{dc}$ is increased. In this case, dissociation of the process gas is promoted, thus the control margin concerning the DC voltage application becomes narrower. However, where the frequency of the RF power applied to the upper electrode 34 is set at 40 MHz or more, e.g., 60 MHz, the plasma has a lower energy, and thus the control margin concerning the DC voltage application becomes broader. Accordingly, the frequency of the RF power applied to the upper electrode 34 is preferably set at 40 MHz or more.

Figure 30A:
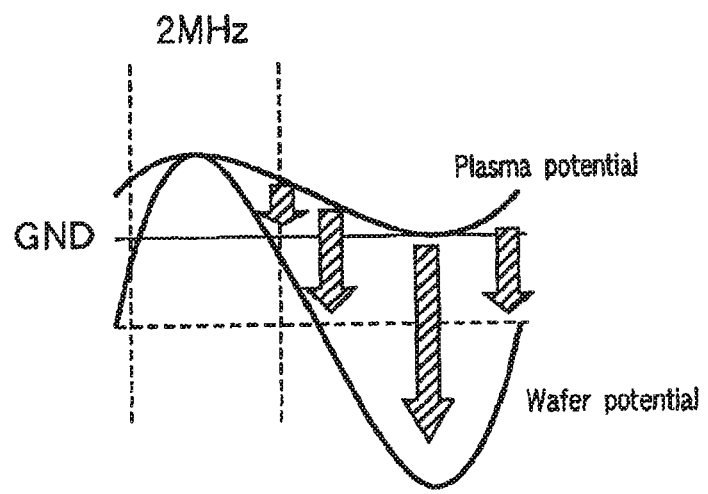
FIGS. 30A and 30B are views for explaining following ability of ions where the bias RF power has a frequency of 2 MHz and a frequency of 13.56 MHz, respectively.
Figure 30B:
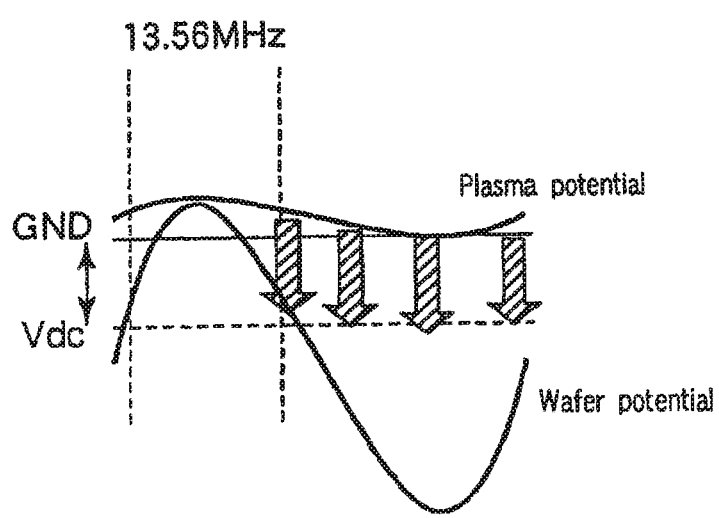
Figure 31:
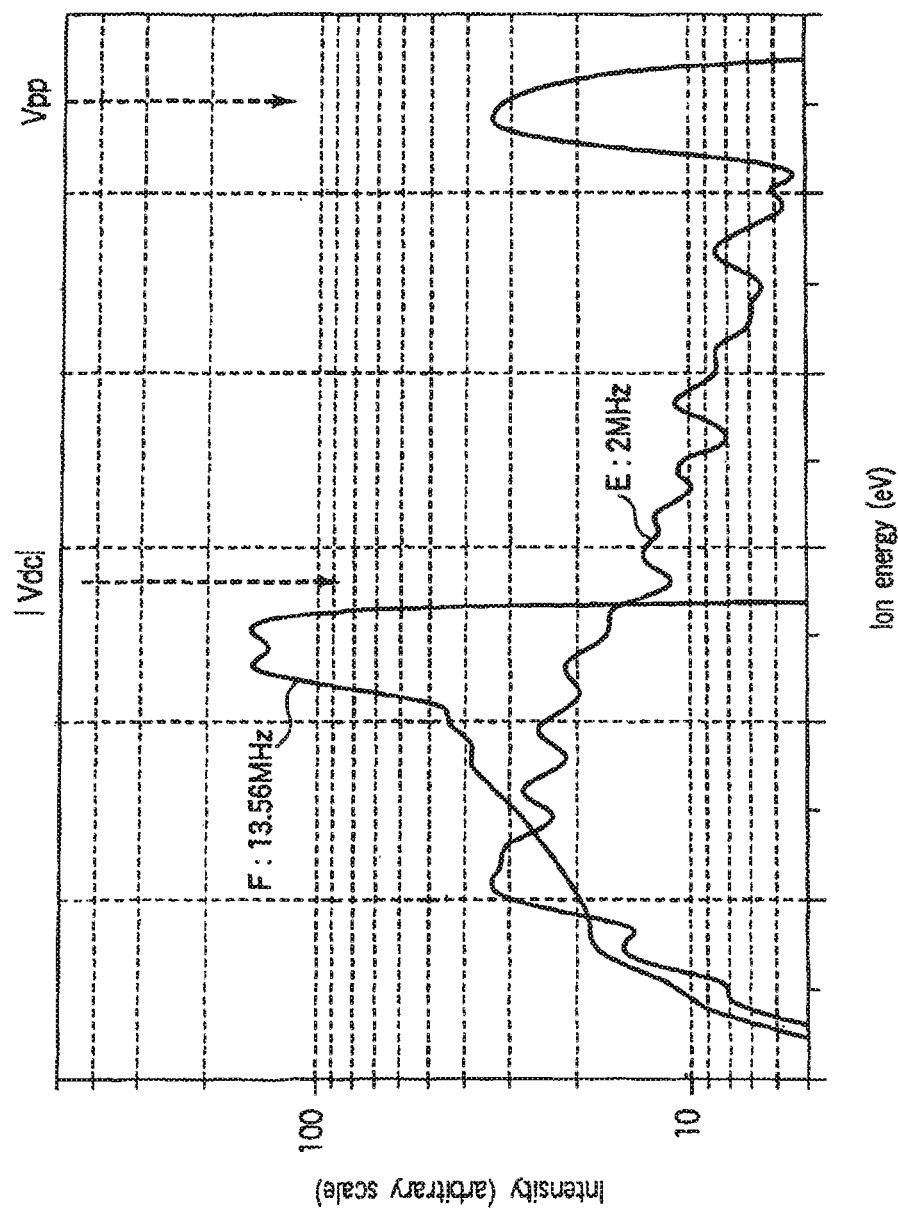
FIG. 31 is a view showing ion energy distributions where the bias RF power has a frequency of 2 MHz and a frequency of 13.56 MHz.

Next, an explanation will be given of a bias RF power for attracting ions, applied to the lower electrode or susceptor 16. The RF power applied from second RF power supply 90 to the susceptor 16 is a bias RF power for attracting ions, which can provide different effects depending on whether the frequency (RF application frequency) is less than 10 MHz or 10 MHz or more. Specifically, where the RF application frequency is less than 10 MHz, e.g., 2 MHz, ions can follow the RF application frequency, in general. In this case, as shown in FIG. 30A, the ion energy incident on the wafer corresponds to the wafer potential, which varies in accordance with the RF power voltage waveform. On the other hand, where the bias RF frequency is 10 MHz or more, e.g., 13.56 MHz, ions cannot follow the RF application frequency, in general. In this case, as shown in FIG. 30B, the ion energy incident on the wafer depends not on the wafer potential, but on $V_{dc}$. In the case of a frequency (e.g., 2 MHz) that ions can follow, as shown in FIG. 30A, the ion maximum energy corresponds to Vpp. Further, at a portion where the difference between the plasma potential and wafer potential is smaller, the ion energy becomes smaller. In this case, as indicated by a line E in the ion energy distribution shown in FIG. 31, the ion energy on the wafer is polarized and broader. On the other hand, in the case of a frequency (e.g., 13.56 MHz) that ions cannot follow, as shown in FIG. 30B, the ion energy corresponds to $V_{dc}$ without reference to the wafer potential. In this case, as indicated by a line F in FIG. 31, the ion energy on the wafer takes on the maximum value near a portion corresponding to $V_{dc}$, while almost no ions have a higher energy than $V_{dc}$.

Accordingly, a frequency of less than 10 MHz that ions can follow is suitable where higher ion energy is required to increase productivity. On the other hand, a frequency of 10 MHz or more that ions cannot follow is suitable where lower ion energy is required, such as a case where the surface roughness of a mask is critical. Accordingly, the frequency of the bias RF power is preferably selected in accordance with the intended purpose.

In the examples described above, a DC voltage is applied to exercise the sputtering function on the upper electrode 34, plasma pressing function, electron supply function, and so forth, but an AC voltage can provide the same effects. However, the frequency of the AC voltage is set to be smaller than the frequency of an RF power for plasma generation. In either of the cases using the DC voltage and AC voltage, the voltage may be pulsed or modulated, such as AM modulation or FM modulation.

Incidentally, there is a case where a low dielectric constant barrier layer made of SiC is used as an underlying etching-stopper layer to etch a Low-k film or etching target layer on the upper side. According to the prior art, it is difficult to ensure a sufficient etching selectivity at this time. In this respect, the plasma etching apparatus according to this embodiment is used to perform etching, while a DC voltage is superposed with a first RF power applied to the upper electrode 34, so as to effectively exercise the functions described above. As a consequence, a Low-k film, such as an SiOC film, used as an insulating film can be etched at a high etching selectivity relative to an underlying etching-stopper layer.

FIGS. 32A and 32B show a wafer sectional structure used as a typical etching target in this etching. As shown in FIG. 32A, this wafer W includes an underlying film or SiC layer 201, an insulating film or SiOC family film 202, an $SiO_2$ film 203, and an anti-reflection film or BARC 204 stacked from the under side in this order. Further, an etching mask or ArF resist 205 patterned in a predetermined shape is disposed on the anti-reflection film 204. The SiOC family film 202 is a Low-k film containing Si, O, C, and H as components, the representatives of which are, e.g., SiLK (Trade name; Dow Chemical Ltd.), MSQ of SOD-SiOCH (methyl-silsesquisiloxane), CORAL of CVD-SiOCH (Trade name; Novellus Systems Ltd.), and Black Diamond (Trade name; Applied Materials Ltd.). In place of the SiOC family film 202, the etching target may be another Low-k film, such as an organic Low-k film, e.g., a PAE family film, HSQ family film, PCB family film, or CF family film; or an inorganic Low-k film, e.g., an SiOF family film.

The underlying film or SiC layer 101 may be formed of, e.g., BLOk (Trade name; Applied Materials Ltd.).

As shown in FIG. 32B, this wafer W is etched by plasma of a fluorocarbon (CF family) gas to form a recess (trench or hole) 211 in accordance with the mask pattern of the ArF resist 205. In this plasma etching, a DC voltage is superposed to the upper electrode 34 to ensure a sufficient selectivity between the underlying layer or SiC layer 201 and the etching target layer or SiOC family film 202. In this case, the DC voltage applied from the variable DC power supply 50 to the upper electrode 34 is preferably set to be 0 to −1,500V. Further, the etching conditions are preferably set as follows: for example, the pressure inside the chamber=1.3 to 26.7 Pa; RF power (upper electrode/lower electrode)=0 to 3,000 W/100 to 5,000 W; the process gas=a mixture gas of $C_4F_8$, $N_2$, and Ar; the flow-rate ratio of $C_4F_8/N_2/Ar$=4 to 20/100 to 500/500 to 1,500 mL/min.

In an experiment, a sample of a multi-layer structure was prepared, as shown in FIG. 32A, and etched by the apparatus shown in FIG. 1. Using the ArF resist 205 having a via (hole) pattern as a mask, the SiOC family film 202 was etched until the underlying film or SiC layer 201 was exposed, to form a via. The etching was performed under the following etching conditions 1 and 2, and comparison was made in etching characteristics between a case where a DC voltage of −900V was applied to the upper electrode 34 (present examples 1 and 2), and a case where no DC voltage was applied (comparative examples 1 and 2). Table 1 shows the results.

<Etching Conditions 1>
Pressure inside the chamber=6.7 Pa;
RF power (upper electrode/lower electrode)=400 W/1,500 W;
Process gas flow rates of $C_4F_8/Ar/N_2$=6/1,000/180 mL/min:
Distance between the upper and lower electrodes=35 mm;
Process time=25 to 35 seconds:
Back pressure (helium gas: central portion/edge portion)=2,000/5,332 Pa;
Upper electrode 34 temperature=60° C.;
Chamber 10 sidewall temperature=60° C.; and
Susceptor 16 temperature=0° C.
<Etching Conditions 2>
The conditions were set to be the same as those of the etching conditions 1 except for RF power (upper electrode/lower electrode)=800 W/2,500 W.

As shown in Table 1, in either of the cases using the etching conditions 1 and the etching conditions 2, the present examples 1 and 2 with a DC voltage of −900V applied to the upper electrode 34 greatly improved both of the selectivity relative to SiC and the selectivity relative to resist, as compared with the comparative examples 1 and 2 with no DC voltage application, under the same conditions.

Further, in these cases, the etching rate was remarkably improved while the CD (Critical Dimension) at the via top portion was prevented from expanding. According to the conventional etching technique, it is difficult to realize both of improvement in the etching rate and control of the CD (i.e., preventing CD expansion). By contrast, it has been confirmed that the application of a DC voltage described above can realize both of them.

TABLE 1

|  |  | Comparative example 1 (DC 0 V) | Present example 1 (DC −900 V) |
|---|---|---|---|
| Etching conditions 1 | SiOC etching rate (nm/min) | 262 | 433 |
|  | Selectivity relative to SiC | 4.8 | 15.1 |
|  | CD (nm) | 153 | 149 |
|  | Selectivity relative to resist | 3.4 | 96.3 |

|  |  | Comparative example 2 (DC 0 V) | Present example 2 (DC −900 V) |
|---|---|---|---|
| Etching conditions 2 | SiOC etching rate (nm/min) | 487 | 589 |
|  | Selectivity relative to SiC | 2.9 | 6.3 |
|  | CD (nm) | 153 | 141 |
|  | Selectivity relative to resist | 6.6 | 11.9 |

TABLE 2

|  | Power on upper side (W) | | |
|---|---|---|---|
|  | 200 | 400 | 800 |
| Etching rate (nm/min) | 229 | 433 | 436 |
| Selectivity relative to SiC | 33.8 | 15.1 | 9.3 |
| CD (nm) | 151 | 149 | 155 |
| Selectivity relative to resist | 10.2 | 96.3 | 7.1 |

Further, it has also been confirmed from comparison between the conditions 1 and conditions 2 in this Table 1, that the effect of improving the selectivity relative to SiC obtained by superposing a DC voltage to the upper electrode 34 can be enhanced where the RF power (upper electrode/lower electrode) is smaller.

Then, using the etching conditions 1 or etching conditions 2 as references, some of the conditions were changed and etching characteristics thus obtained were examined.

Table 2 shows etching characteristics obtained by changing the RF power applied to the upper electrode 34 with reference to the etching conditions 1. As shown in this Table 2, the etching rate was improved while the selectivity relative to SiC became smaller, with increase in the RF power applied to the upper electrode 34. On the other hand, under these conditions, change in the RF power applied to the upper electrode 34 less affected the CD, and the selectivity relative to resist was prominently excellent when the RF power was 400 W. Judging from the result described above, it has been confirmed that the RF power applied to the upper electrode 34 is preferably set at a value within a range of about 200 to 800 W.

Table 3 shows etching characteristics obtained by changing the RF power applied to the lower electrode or susceptor 16 with reference to the etching conditions 2. As shown in this Table 3, the etching rate was greatly improved while the selectivity relative to SiC tended to be less improved, with increase in the RF power applied to the lower electrode (susceptor 16). On the other hand, under these conditions, change in the RF power applied to the lower electrode less affected the CD, and the selectivity relative to resist was improved with increase in the RF power. Judging from the result described above, it has been confirmed that the RF power applied to the lower electrode is preferably set at a value within a range of about 1,500 to 3,800 W.

Table 4 shows etching characteristics obtained by changing the process pressure with reference to the etching conditions 2. As shown in this Table 4, the etching rate decreased and the etching was thereby stopped where the process pressure was set to be too high under the etching conditions 2 in which the RF power (upper electrode/lower electrode) was as relatively large as 800/2,500 W. Accordingly, it has been confirmed that the process pressure is preferably set at a value within a range of about 4 to 20 Pa.

Further, in light of the result shown in Table 4 as well as the results shown in Tables 2 and 3, it is thought preferable that the etching rate and the selectivity relative to SiC obtained by superposing a DC voltage are controlled by adjusting the RF power.

TABLE 3

|  | Power on lower side (W) | | |
| --- | --- | --- | --- |
|  | 1,500 | 2,500 | 3,800 |
| Etching rate (nm/min) | 436 | 589 | 676 |
| Selectivity relative to SiC | 9.3 | 6.3 | 3.8 |
| CD (nm) | 155 | 141 | 157 |
| Selectivity relative to resist | 7.1 | 11.9 | 41 |

TABLE 4

|  | Pressure (Pa) | | |
| --- | --- | --- | --- |
|  | 4 | 6.7 | 20 |
| Etching rate (nm/min) | 394 | 589 | 154 |
| Selectivity relative to SiC | 3.8 | 6.3 | Etching stop |
| CD (nm) | 151 | 141 | 6.3 |
| Selectivity relative to resist | 9.1 | 11.9 | 34.3 |

Table 5 shows etching characteristics obtained by changing the Ar flow rate with reference to the etching conditions 2. As shown in this Table 5, although the influence of change in the Ar flow-rate ratio was not clear, the selectivity relative to SiC was improved by adding a certain amount of Ar, under the etching conditions 2 in which the RF power (upper electrode/lower electrode) was as relatively large as 800/2,500 W. In this case, it has been confirmed that the Ar is preferably added at 1,000 mL/min or less.

Then, a sample of a multi-layer structure was prepared, as shown in FIG. 32A, and etched, using the ArF resist 205 having a line-and-space trench pattern as a mask. In this case, the SiOC family film 202 was etched until the underlying SiC layer 201 was exposed, to form a trench. The etching was 2-step etching of main etching and over etching performed under the following etching conditions, and comparison was made in etching characteristics between a case where a DC voltage of −900V was applied to the upper electrode 34 (a present example 3), and a case where no DC voltage was applied (a comparative example 3). Table 6 shows the results.

<Main Etching Conditions>
Pressure inside the chamber=26.7 Pa;
RF power (upper electrode/lower electrode)=300 W/1,000 W;
Process gas flow rates of $CF_4/N_2/Ar/CHF_3$=180/100/180/50 mL/min;
Distance between the upper and lower electrodes=35 mm;
Process time=10 seconds:
Back pressure (central portion/edge portion)=2,000/5,332 Pa:
Upper electrode 34 temperature=60° C.:
Chamber 10 sidewall temperature=60° C.; and
Susceptor 16 temperature=20° C.

<Over Etching Conditions>
Pressure inside the chamber=4.0 Pa;
RF power (upper electrode/lower electrode)=1,000 W/1,000 W;
Process gas flow rates of $C_4F_8/N_2/Ar$=6/260/1,000 mL/min;
Over etching amount=30%;
Distance between the upper and lower electrodes=35 mm; and
Other conditions are the same as the main etching conditions.

TABLE 5

|  | Ar flow rate (mL/min) | | | |
| --- | --- | --- | --- | --- |
|  | 0 | 300 | 600 | 1,000 |
| Etching rate (nm/min) | 574 | 646 | 574 | 589 |
| Selectivity relative to SiC | 3.3 | 5.8 | 6.8 | 6.3 |
| CD (nm) | 153 | 149 | 149 | 141 |
| Selectivity relative to resist | 7.8 | 11.6 | 13.2 | 11.9 |

TABLE 6

|  | Comparative example 3 (DC 0 V) | Present example 3 (DC −900 V) |
| --- | --- | --- |
| SiOC etching rate (nm/min) | 660.6 | 1104.6 |
| Selectivity relative to SiC | 11.7 | 15 |
| CD (nm) | 117 | 114.6 |
| LER (nm) | 7.64 | 4.88 |
| Selectivity relative to resist | 2.3 | 3.1 |

The SiOC etching rate and the selectivity relative to resist were obtained only by the main etching step.

As shown in Table 6, in the case of the present example 3 with a DC voltage of −900V applied to the upper electrode 34, the selectivity relative to SiC was 15, which was greatly improved, as compared with the comparative example 3 with no DC voltage application, in which the selectivity relative to SiC was 11.7.

Further, under the etching conditions described above, with a DC voltage of −900V applied to the upper electrode 34, not only the selectivity relative to SiC, but also the selectivity relative to resist was improved, as shown in Table 6. Further, the etching rate of the SiOC family film 102 was greatly improved along with control to prevent the CD corresponding to the width of the trench from increasing. Further, the roughness of the line defining the etched trench (line etching roughness, LER) became much lower.

Figure 33A:
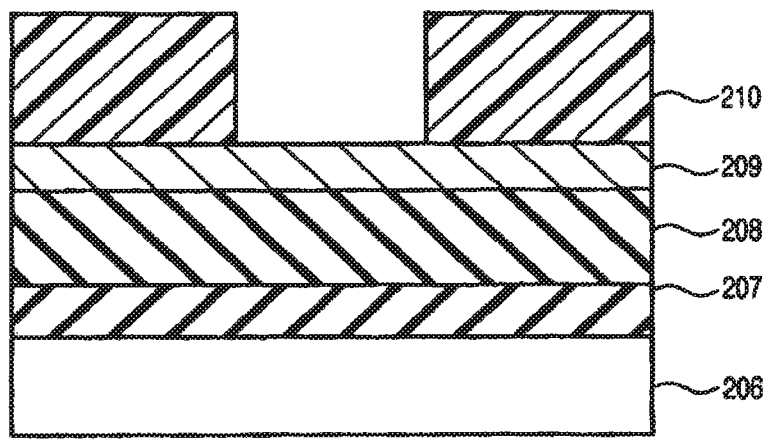
FIGS. 33A and 33B are schematic views showing another example of a wafer sectional structure, which can be etched by the plasma etching apparatus shown in FIG. 1.
Figure 33B:
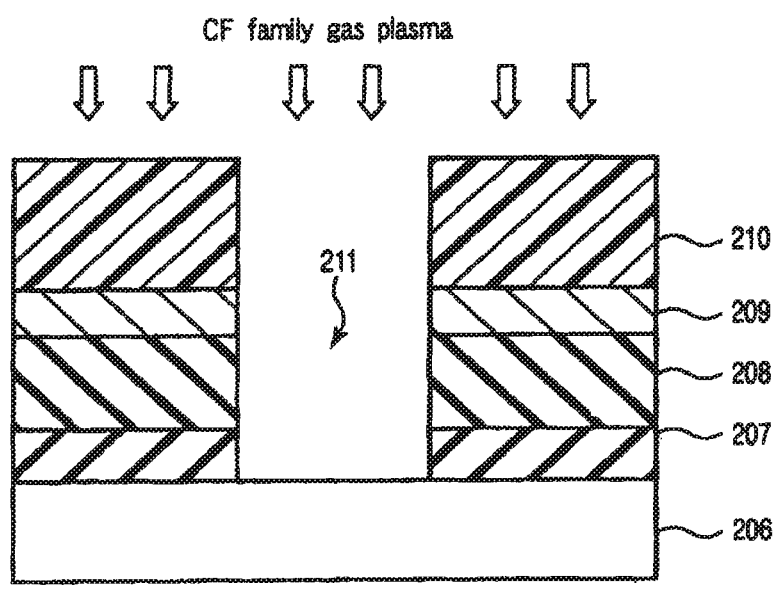

In the examples described above, the SiOC family film 202 is etched relative to the underlying SiC layer 201, but the same effects described above can be obtained in another etching target. For example, the sectional structure shown in FIG. 33A includes a silicon substrate 206, on which a silicon nitride film (SiN) 207, an $SiO_2$ film 208 formed by CVD using TEOS (tetraethylorthosilicate) as a source material, an anti-reflection film (BARC) 209, and a patterned resist mask 210 made of, e.g., ArF are disposed. In this sectional structure, as shown in FIG. 33B, the $SiO_2$ film 208 is etched relative to the underlying silicon nitride film 207. Also in this case, the same effects described above can be obtained by applying a DC voltage to the upper electrode 34.

Further, in the examples described above, the SiOC family film 202 is an etching target (in the main etching or in the main etching and over etching), and the DC voltage application is utilized for the effect of improving the selectivity relative to the underlying layer. Accordingly, the DC voltage application may be used solely in the over etching of a 2-step process, such that the main etching is performed under normal conditions until a recess being formed reaches a position near the underlying layer, and then it is switched to the over etching.

Embodiment 2

Next, an explanation will be given of an embodiment 2 of the present invention.

Figure 34:
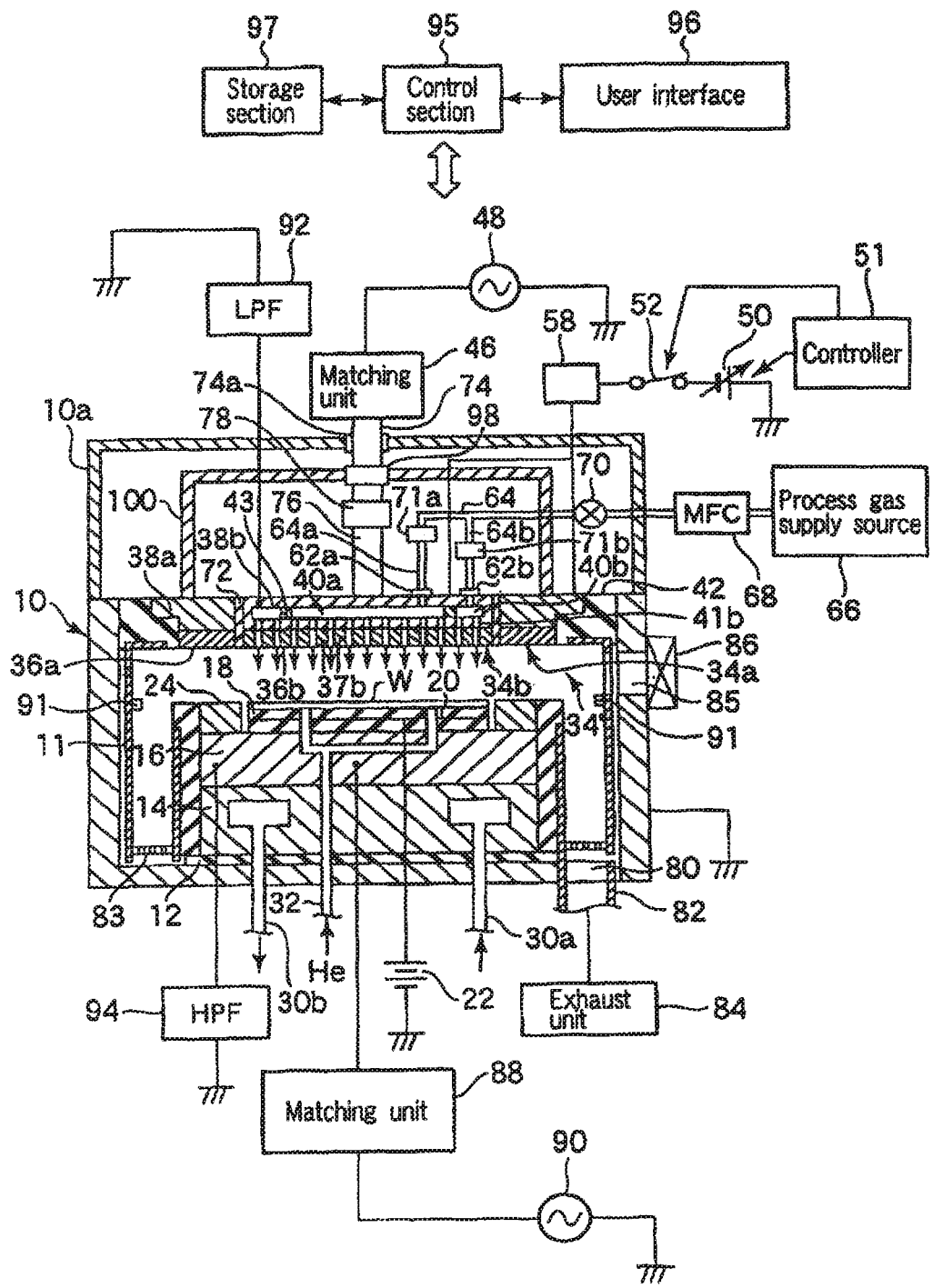
FIG. 34 is a sectional view schematically showing a plasma etching apparatus according to an embodiment 2 of the present invention.

FIG. 34 is a sectional view schematically showing a plasma etching apparatus according to an embodiment 2 of the present invention. In FIG. 34, the constituent elements the same as those shown in FIG. 1 are denoted by the same reference symbols, and a repetitive description thereon will be omitted.

In place of the upper electrode 34 of the embodiment 1, this embodiment includes an upper electrode 34' having the following structure. Specifically, the upper electrode 34' comprises an outer upper electrode 34a and an inner upper electrode 34b. The outer upper electrode 34a has a ring shape or doughnut shape and is disposed to face a susceptor 16 at a predetermined distance. The inner upper electrode 34b has a circular plate shape and is disposed radially inside the outer upper electrode 34a while being insulated therefrom. In terms of plasma generation, the outer upper electrode 34a mainly works for it, and the inner upper electrode 34b assists it.

Figure 35:
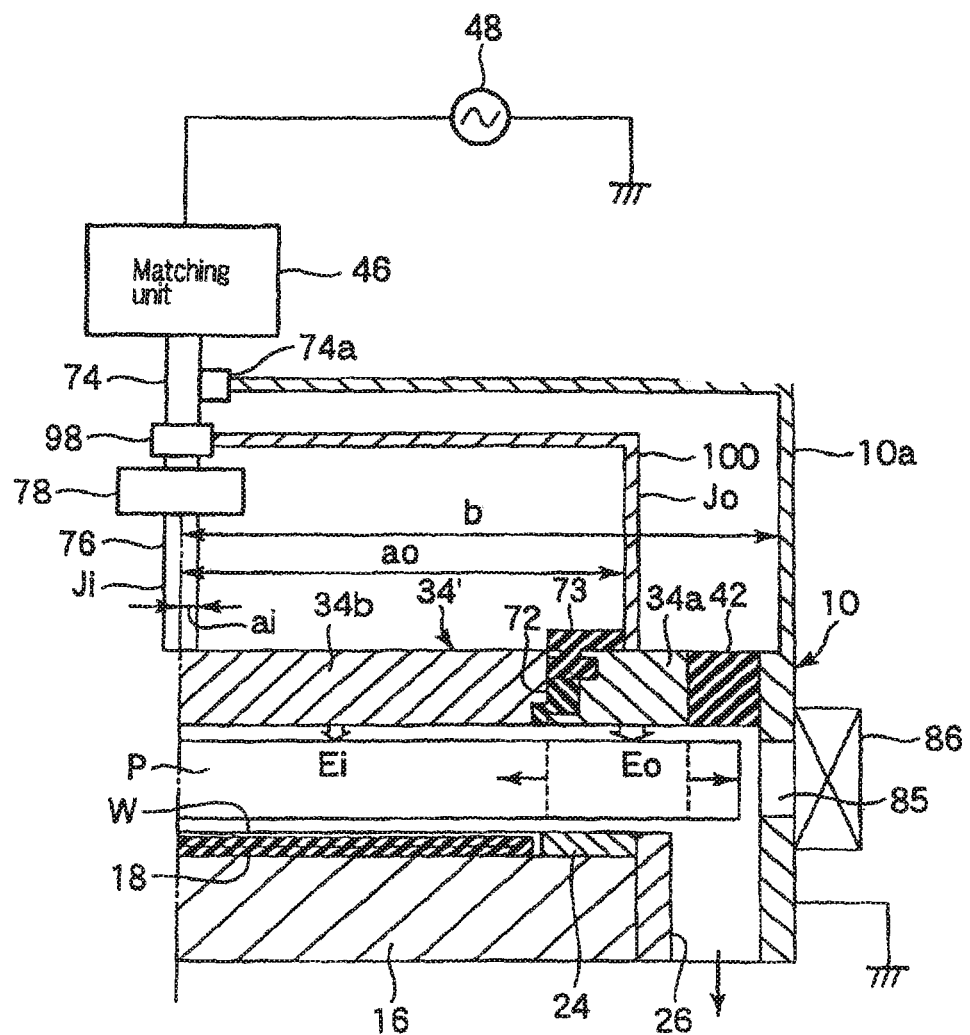
FIG. 35 is a sectional view schematically showing a main portion of the plasma etching apparatus shown in FIG. 34.

FIG. 35 is an enlarged partial side view showing a main part of the plasma etching apparatus. As shown in FIG. 35, the outer upper electrode 34a is separated from the inner upper electrode 34b by an annular gap (slit) of, e.g., 0.25 to 2.0 mm, in which a dielectric body 72 made of, e.g., quartz is disposed. A ceramic body 73 is further disposed in this gap, but this may be omitted. The two electrodes 34a and 34b with the dielectric body 72 sandwiched therebetween form a capacitor. The capacitance $C_{72}$ of this capacitor is set or adjusted to be a predetermined value, on the basis of the size of the gap and the dielectric constant of the dielectric body 72. An insulating shield member 42 made of, e.g., alumina ($Al_2O_3$) and having a ring shape is airtightly interposed between the outer upper electrode 34a and the sidewall of a chamber 10.

The outer upper electrode 34a includes an electrode plate 36a, and an electrode support 38a detachably supporting the electrode plate 36a. The electrode support 38a is made of a conductive material, such as aluminum with an anodization-processed surface. The electrode plate 36a is preferably made of a conductor or semiconductor, such as silicon or SiC, having a low resistivity to generate a small Joule heat. The outer upper electrode 34a is electrically connected to a first RF power supply 48 the same as that of the embodiment 1 through a matching unit 46, an upper feed rod 74, a connector 98, and a feed cylinder 100, the same as those of the embodiment 1. The output terminal of the matching unit 46 is connected to the top of the upper feed rod 74.

The feed cylinder 100 has a cylindrical or conical shape, or a shape similar to it, and is formed of a conductive plate, such as an aluminum plate or copper plate. The bottom end of the feed cylinder 100 is connected to the outer upper electrode 34a continuously in an annular direction. The top of the feed cylinder 100 is electrically connected to the bottom of the upper feed rod 74 through the connector 98. Outside the feed cylinder 100, the sidewall of the chamber 10 extends upward above the height level of the upper electrode 34' and forms a cylindrical grounded conductive body 10a. The top of the cylindrical grounded conductive body 10a is electrically insulated from the upper feed rod 74 by a tube-like insulating member 74a. According to this design, the load circuit extending from the connector 98 comprises a coaxial path formed of the feed cylinder 100 and outer upper electrode 34a and the cylindrical grounded conductive body 10a, wherein the feed cylinder 100 and outer upper electrode 34a function as a waveguide.

As shown in FIG. 34, the inner upper electrode 34b includes an electrode plate 36b having a number of gas delivery holes 37b, and an electrode support 38b detachably supporting the electrode plate 36b. The electrode support 38b is made of a conductor material, such as aluminum with an anodization-processed surface. The electrode support 38b has two gas diffusion cells, i.e., a central gas diffusion cell 40a and a peripheral gas diffusion cell 40b, formed therein and separated by an annular partition member 43, such as an O-ring. The central gas diffusion cell 40a and peripheral gas diffusion cell 40b are connected to the gas delivery holes 37b through a number of gas flow channels 41b extending downward. The central gas diffusion cell 40a, some of a number of gas flow channels 41b disposed therebelow, and some of a number of gas delivery holes 37b connected thereto constitute a central showerhead. The peripheral gas diffusion cell 40b, some of a number of gas flow channels 41b disposed therebelow, and some of a number of gas delivery holes 37b connected thereto constitute a peripheral showerhead.

The gas diffusion cells 40a and 40b are supplied with a process gas from a common process gas supply source 66 at a predetermined flow-rate ratio. More specifically, a gas supply line 64 is extended from the process gas supply source 66 and divided into two branch lines 64a and 64b connected to the gas diffusion cells 40a and 40b. The branch lines 64a and 64b are connected to gas feed ports 62a and 62b formed in the electrode support 38b, so that the process gas is supplied through the gas feed ports 62a and 62b into the gas supply cells 40a and 40b. The branch lines 64a and 64b are provided with flow rate control valves 71a and 71b disposed thereon, respectively. The conductance values of the flow passages from the process gas supply source 66 to the gas diffusion cells 40a and 40b are equal to each other. Accordingly, the flow-rate ratio of the process gas supplied into the central gas supply cell 40a and peripheral gas supply cell 40b is arbitrarily adjusted by adjusting the flow rate control valves 71a and 71b. The gas supply line 64 is provided with a mass-flow controller (MFC) 68 and a switching valve 70 disposed thereon, as in the embodiment 1. The flow-rate ratio of the process gas supplied into the central gas diffusion cell 40a and peripheral gas diffusion cell 40b is thus adjusted. As a consequence, the ratio (FC/FE) between the gas flow rate FC from the central showerhead and the gas flow rate FE from the peripheral showerhead is arbitrarily adjusted. The flow rates per unit area may be set different, for the process gas delivered from the central showerhead and peripheral showerhead. Further, gas types or gas mixture ratios may be independently or respectively selected, for the process gas delivered from the central showerhead and peripheral showerhead.

The electrode support 38b of the inner upper electrode 34b is electrically connected to the first RF power supply 48 the same as that of the embodiment 1 through the matching unit 46, upper feed rod 74, connector 98, and lower feed rod 76, as in the embodiment 1. The lower feed rod 76 is provided with a variable capacitor 78 disposed thereon, for variably adjusting capacitance. The variable capacitor 78 can adjust the balance between the outer electric field intensity and inner electric field intensity, as described later.

The upper electrode 34' is also connected to a variable DC power supply 50, as in the embodiment 1. Specifically, the variable DC power supply 50 is connected to the outer upper electrode 34a and inner upper electrode 34b through a filter 58. The polarity, voltage, and current of the variable DC power supply 50, and the on/off of an on/off switch 52 are controlled by a controller 51, as in the embodiment 1. Although the embodiment 1 includes a filter built in the matching unit 46, this embodiment includes the filter 58 independently of the matching unit 46.

When an etching process is performed in the plasma etching apparatus having this structure, an etching target or semiconductor wafer W is transferred into the chamber 10 and placed on the susceptor 16, as in the embodiment 1. Then, a process gas for etching is supplied from the process gas supply source 66 into the central gas diffusion cell 40a and peripheral gas diffusion cell 40b at predetermined flow rates and flow-rate ratio to deliver the gas into the chamber 10 through the gas delivery holes 37b. At the same time, the exhaust unit 84 is used to exhaust the chamber 10 to maintain the pressure therein at a set value, as in the embodiment 1.

While the etching gas is supplied into the chamber 10, an RF power for plasma generation (60 MHz) is applied from the first RF power supply 48 to the upper electrode 34' at a predetermined power level, and an RF for ion attraction (2 MHz) is applied from the second RF power supply 90 to the lower electrode or susceptor 16 at a predetermined power level. Further, a predetermined voltage is applied from the variable DC power supply 50 to the outer upper electrode 34a and inner upper electrode 34b. Furthermore, a DC voltage is applied from the DC power supply 22 to the electrode 20 of the electrostatic chuck 18 to fix the semiconductor wafer W on the susceptor 16.

The etching gas delivered from the gas delivery holes 37b of the inner upper electrode 34b is turned into plasma by glow discharge between the upper electrode 34' and lower electrode or susceptor 16. Radicals and ions generated in this plasma are used to etch the target surface of the semiconductor wafer W.

In this plasma etching apparatus, the upper electrode 34' is supplied with an RF power within a range covering higher frequencies (form 5 to 10 MHz or more at which ions cannot follow). As a consequence, the plasma density is increased with a preferable dissociation state, so that high density plasma is generated even under a low pressure condition, as in the embodiment 1.

In the upper electrode 34', the inner upper electrode 34b is also used as a showerhead directly across the semiconductor wafer W, such that the flow-rate ratio of the gas delivered from the central showerhead and peripheral showerhead can be arbitrarily adjusted. As a consequence, the spatial distribution of gas molecular or radical density can be controlled in the radial direction, so as to arbitrarily control the spatial distribution of an etching characteristic on the basis of radicals.

Further, as described later, the upper electrode 34' is operated as an RF electrode for plasma generation, such that the outer upper electrode 34a mainly works for it, and the inner upper electrode 34b assists it. The ratio of electric field intensity applied to electrons directly below the RF electrodes 34a and 34b can be adjusted by these electrodes. As a consequence, the spatial distribution of plasma density can be controlled in the radial direction, so as to arbitrarily and finely control the spatial property of a reactive ion etching characteristic.

The control over the spatial distribution of plasma density has substantially no influence on the control over the spatial distribution of radical density. The control over the spatial distribution of plasma density is performed by varying the ratio of electric field intensity or input power between the outer upper electrode 34a and inner upper electrode 34b. On the other hand, the control over the spatial distribution of radical density is performed by varying the ratio of process gas flow rate, gas density, or gas mixture between the central showerhead and peripheral showerhead. The process gas delivered from the central showerhead and peripheral showerhead is dissociated in an area directly below the inner upper electrode 34b. Accordingly, even if the balance of electric field intensity between the inner upper electrode 34b and outer upper electrode 34a is changed, it does not have a large influence on the balance of radical generation amount or density between the central showerhead and peripheral showerhead, because both showerheads belong to the inner upper electrode 34b (within the same area). Thus, the spatial distribution of plasma density and the spatial distribution of radical density can be controlled substantially independently of each other.

Further, the plasma etching apparatus according to this embodiment is arranged such that most or the majority of plasma is generated directly below the outer upper electrode 34a, which mainly works for plasma generation, and then diffuses to the position directly below the inner upper electrode 34b. Accordingly, the showerhead or inner upper electrode 34b is less attacked by ions from the plasma. This effectively prevents the gas delivery holes 37b of the electrode plate 36b from being progressively sputtered, thereby remarkably prolonging the service life of the electrode plate 36b, which is a replacement part. On the other hand, the outer upper electrode 34a for generating most or the majority of plasma has no gas delivery holes at which electric field concentration occurs. As a consequence, the outer upper electrode 34a is less attacked by ions, and thus there arises no such a problem in that the outer upper electrode 34a shortens the service life.

Next, with reference to FIGS. 35 and 36, a more detailed explanation will be given of the control over the spatial distribution of plasma density, which is performed by varying the ratio of electric field intensity or input power between the outer upper electrode 34a and inner upper electrode 34b.

As described above, FIG. 35 shows a main portion of the plasma etching apparatus according to this embodiment (particularly, a main portion of plasma generating means). FIG. 36 shows an equivalent circuit of a main portion of plasma generating means. The structure of the showerheads is not shown in FIG. 35, while the resistance of respective portions is not shown in FIG. 36.

As described above, the load circuit extending from the connector 98 comprises a coaxial path formed of the outer upper electrode 34a and feed cylinder 100 and the cylindrical grounded conductive body 10a, wherein the outer upper electrode 34a and feed cylinder 100 function as a waveguide $J_0$. Where the radius (outer radius) of the feed cylinder 100 is $a_0$, and the radius of the cylindrical grounded conductive body 10a is b, the characteristic impedance or inductance $L_0$ of this coaxial path is approximated by the following formula (1).

$$L_0 = K \times ln(b/a_0) \tag{1}$$

In this formula, K is a constant determined by the mobility and dielectric constant of a waveguide.

On the other hand, the load circuit extending from the connector 98 also comprises a coaxial path formed of the lower feed rod 76 and the cylindrical grounded conductive body 10a, wherein the former member (76) functions as a waveguide $J_i$. Although the inner upper electrode 34b is present on the extension of the lower feed rod 76, the impedance of lower feed rod 76 is dominant, because the difference in diameters between them is very large. Where the radius (outer radius) of the lower feed rod 76 is $a_i$, the characteristic impedance or inductance $L_i$ of this coaxial path is approximated by the following formula (2).

$$L_i = K \times ln(b/a_i) \qquad (2)$$

As can be understood from the above formulas (1) and (2), the inner waveguide $J_i$ for transmitting RF to the inner upper electrode 34b provides an inductance $L_i$ in the same manner as a conventionally ordinary RF system. On the other hand, the outer waveguide $J_O$ for transmitting RF to the outer upper electrode 34a provides a very small inductance $L_O$ because of a very large radius. As a consequence, in the load circuit extending from the connector 98 toward the side opposite to the matching unit 46, RF is transmitted more easily through the outer waveguide $J_O$ having a lower impedance (a smaller voltage drop). The outer upper electrode 34a is thereby supplied with a larger RF power $P_O$, so the electric field intensity $E_O$ obtained at the bottom surface (plasma contact surface) of the outer upper electrode 34a becomes higher. On the other hand, RF is transmitted less easily through the inner waveguide $J_i$ having a higher impedance (a larger voltage drop). The inner upper electrode 34b is thus supplied with an RF power $P_i$ smaller than the RF power $P_O$ supplied to the outer upper electrode 34a, so the electric field intensity $E_i$ obtained at the bottom surface (plasma contact surface) of the inner upper electrode 34b becomes lower than the electric field intensity $E_O$ on the outer upper electrode 34a side.

As described above, according to this upper electrode 34', electrons are accelerated by a stronger electric field $E_O$ directly below the outer upper electrode 34a, while electrons are accelerated by a weaker electric field $E_O$ directly below the inner upper electrode 34b. In this case, most or the majority of plasma P is generated directly below the outer upper electrode 34a, while a subsidiary part of the plasma P is generated directly below the inner upper electrode 34b. Then, the high density plasma generated directly below the outer upper electrode 34a diffuses radially inward and outward, so the plasma density becomes more uniform in the radial direction within the plasma process space between the upper electrode 34' and susceptor 16.

In the coaxial path formed of the outer upper electrode 34a and feed cylinder 100 and the cylindrical grounded conductive body 10a, the maximum transmission power $P_{max}$ depends on the radius $a_O$ of the feed cylinder 100 and the radius b of the cylindrical grounded conductive body 10a, and is given by the following formula (3).

$$P_{max}/E_O^2 max = a_O^2 [ln(b/a_O)]^2/2Z_0 \qquad (3)$$

In the above formula, $Z_0$ is the input impedance of this coaxial path viewing from the matching unit 46, and $E_{Omax}$ is the maximum electric field intensity of the RF transmission system.

In the formula (3), the maximum transmission power $P_{max}$ takes on the maximum value when $(b/a_O) \approx 1.65$. Accordingly, in order to improve the power transmission efficiency of the outer waveguide $J_O$, the ratio $(b/a_O)$ of the radius of the cylindrical grounded conductive body 10a relative to the radius of the feed cylinder 100 is most preferably set at about 1.65. This ratio is preferably set to be at least within a range of 1.2 to 2.0, and more preferably within a range of 1.5 to 1.7.

Figure 37:
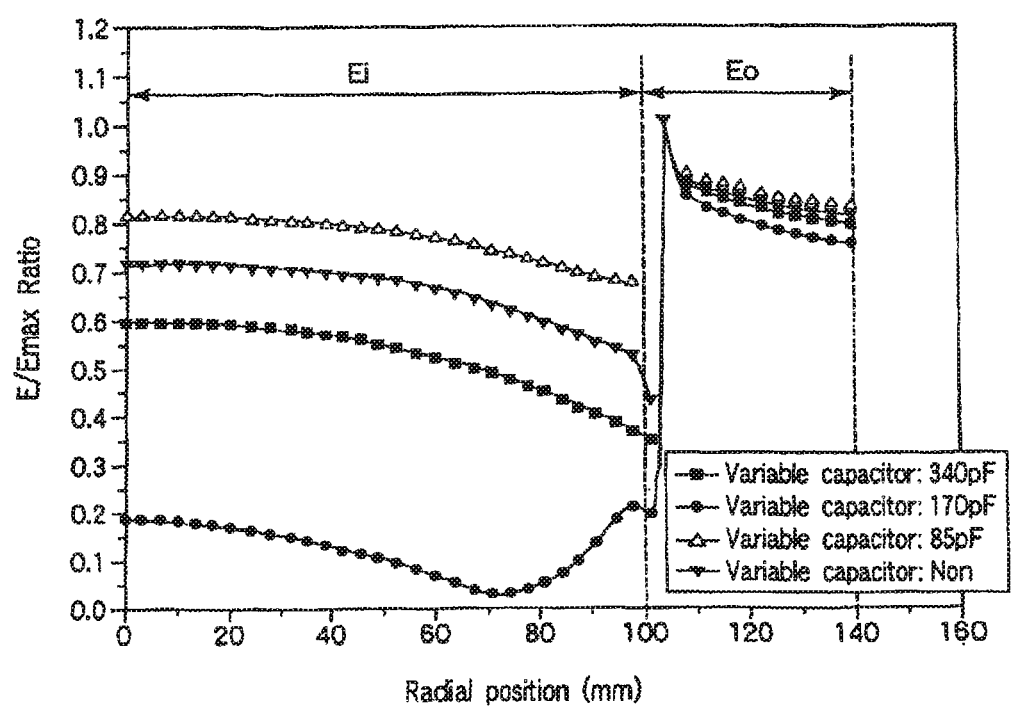
FIG. 37 is a view showing the relationship between the capacitance value of a variable capacitor and electric field intensity ratio in the plasma etching apparatus shown in FIG. 34.

In order to arbitrarily and finely control the spatial distribution of plasma density, it is preferable to adjust the ratio or balance between the outer electric field intensity $E_O$ directly below the outer upper electrode 34a (or the input power $P_O$ into the outer upper electrode 34a side) and the inner electric field intensity $E_i$ directly below the inner upper electrode 34b (or the input power $P_i$ into the inner upper electrode 34b side). The lower feed rod 76 is provided with the variable capacitor 78 disposed thereon as means for adjusting the ratio or balance. FIG. 37 shows the relationship between the capacitance $C_{78}$ of this variable capacitor 78 and the ratio of the input power $P_i$ into the inner upper electrode 34b relative to the total input power. As shown in FIG. 37, the capacitance $C_{78}$ of the variable capacitor 78 is adjusted to increase or decrease the impedance or reactance of the inner waveguide $J_i$, thereby changing the relative ratio between the voltage drop through the outer waveguide $J_O$ and the voltage drop through the inner waveguide $J_i$. As a consequence, it is possible to adjust the ratio between the outer electric field intensity $E_O$ (outer input power $P_O$) and the inner electric field intensity $E_i$ (inner input power $P_i$).

In general, the ion sheath impedance that causes an electric potential drop of plasma is capacitive. In the equivalent circuit shown in FIG. 36, it is assumed that the sheath impedance capacitance directly below the outer upper electrode 34a is $C_{po}$, and the sheath impedance capacitance directly below the inner upper electrode 34b is $C_{pi}$. Further, the capacitance $C_{72}$ of the capacitor formed between the outer upper electrode 34a and inner upper electrode 34b cooperates with the capacitance $C_{78}$ of the variable capacitor 78 in changing the balance between the outer electric field intensity $E_O$ (outer input power $P_O$) and inner electric field intensity $E_i$ (inner input power $P_i$). The capacitance $C_{72}$ is preferably set or adjusted to optimize the variable capacitor's 78 function of adjusting the balance of electric field intensity (input power).

On the other hand, as in the embodiment 1, a DC voltage is applied from the variable DC power supply 50 through the filter 58 to the outer upper electrode 34a and inner upper electrode 34b. As a consequence, the spatial distribution of plasma density is controlled, as described above. At the same time, it is possible to exercise the same effects as those in the embodiment 1, i.e., the sputtering function due to a deeper $V_{dc}$, the plasma pressing function due to a larger plasma sheath length, the electron supply function onto the wafer W, the plasma potential adjustment function, and the plasma density increase function.

As described above, the effects obtained by the upper electrode 34' formed of two parts. i.e., the outer upper electrode 34a and inner upper electrode 34b, are combined with the effects obtained by application of a predetermined DC voltage to the upper electrode 34', so the plasma control can be more preferably realized.

In the example shown in FIG. 34, a DC voltage is applied to both of the outer upper electrode 34a and inner upper electrode 34b. Alternatively, a DC voltage may be applied to either one of them.

Figure 38:
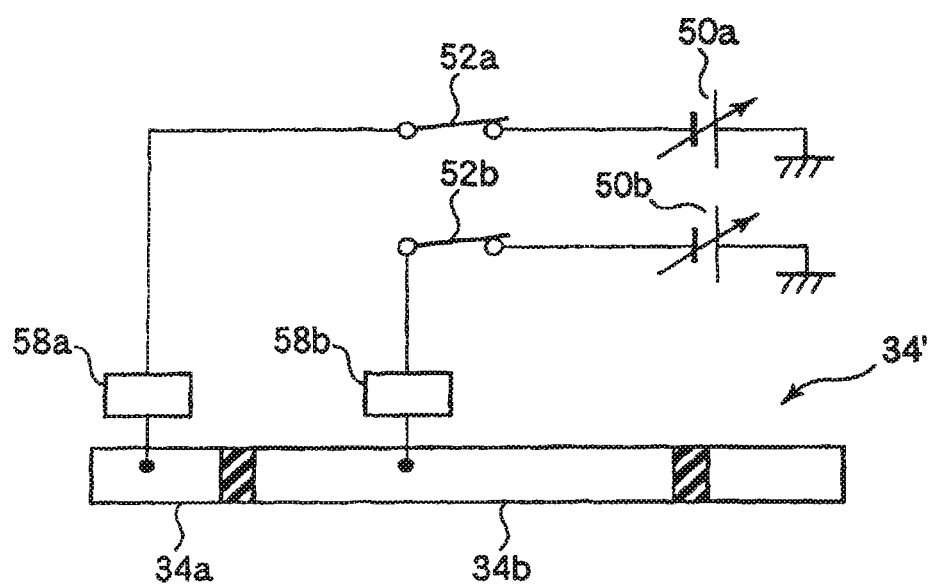
FIG. 38 is a view showing a modification of the arrangement to apply a DC voltage to the upper electrode in the plasma etching apparatus shown in FIG. 34.

In the example shown in FIG. 34, a DC voltage is applied from one variable DC power supply 50 to both of the outer upper electrode 34a and inner upper electrode 34b. Alternatively, as shown in FIG. 38, two variable DC power supplies 50a and 50b may be used to apply DC voltages to the outer upper electrode 34a and inner upper electrode 34b, respectively, through switches 52a and 52b, and filters 58a and 58b. In this case, the DC voltages applied to the outer upper electrode 34a and inner upper electrode 34b can be independently controlled, thereby performing the plasma control in a better manner.

Figure 39:
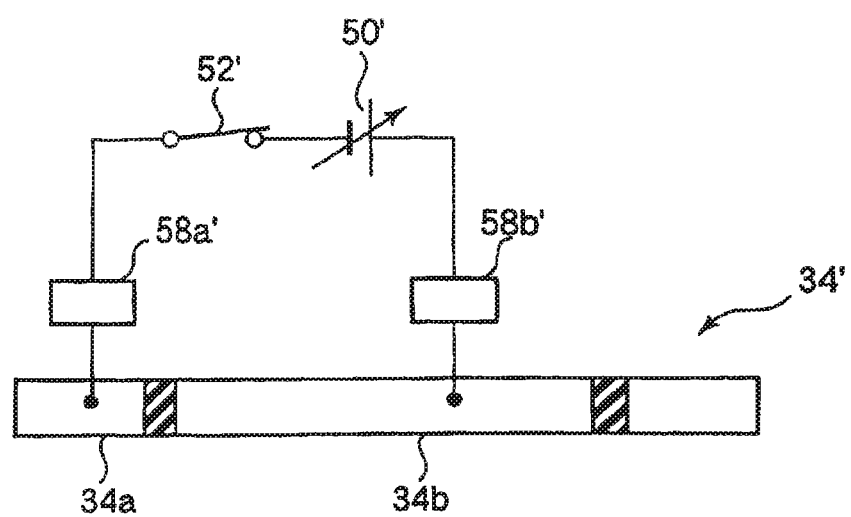
FIG. 39 is a view showing another modification of the arrangement to apply a DC voltage to the upper electrode in the plasma etching apparatus shown in FIG. 34.

Further, as shown in FIG. 39, a variable DC power supply 50' may be interposed between the outer upper electrode 34a and inner upper electrode 34b. In this case, one of the terminals is connected to the outer upper electrode 34a and the other terminal is connected to the inner upper electrode 34b. As a consequence, in addition to the effects described above, the plasma density ratio between the inner upper electrode 34b and outer upper electrode 34a can be more finely adjusted to improve the etching characteristic control planarly on the wafer. In FIG. 39, a reference symbol 52' denotes an on/off switch, and reference symbols 58a' and 58b' denote filters.

Where the plasma etching apparatus according to the embodiment 2 is used to etch an insulating film (for example, Low-k film) disposed on a wafer W, the following combination of gases is particularly preferably used as a process gas.

Specifically, where over etching is performed under via-etching conditions, a combination of $C_5F_8$, Ar, and $N_2$ may be preferably used as a process gas. In this case, the selectivity of an insulating film relative to an underlying film (SiC, SiN, etc.) can become larger.

Alternatively, where trench etching conditions are used, $CF_4$ or a combination of ($C_4F_8$, $CF_4$, Ar, $N_2$, and $O_2$) may be preferably used as a process gas. In this case, the selectivity of an insulating film relative to a mask can become larger.

Alternatively, where HARC etching conditions are used, a combination of ($C_4F_6$, $CF_4$, Ar, and $O_2$), ($C_4F_6$, $C_3F_8$, Ar, and $O_2$), or ($C_4F_6$, $CH_2F_2$, Ar, and $O_2$) may be preferably used as a process gas. In this case, the etching rate of an insulating film can become higher.

The process gas is not limited to the examples described above, and another combination of (CxHyFz gas/an additive gas such as $N_2$ or $O_2$/a dilution gas) may be used.

In the embodiment 1 and embodiment 2, the first RF power and second RF power may have frequencies, as follows. Specifically, the frequency of the first RF power may be one of 13.56 MHz, 27 MHz, 40 MHz, 60 MHz, 80 MHz, 100 MHz, and 160 MHz, while the frequency of the second RF power may be one of 380 kHz, 800 kHz, 1 MHz, 2 MHz, 3.2 MHz, and 13.56 MHz. They are suitably combined in accordance with a process to be performed.

The embodiments described above are exemplified by plasma etching apparatuses, but they may be applied to other apparatuses that utilize plasma to process a semiconductor substrate, such as a plasma film formation apparatus.

Embodiment 3

Next, an explanation will be given of an embodiment 3 of the present invention.

In the embodiment 3, the constituent elements common to those of the embodiments 1 and 2 are denoted by the same reference symbols.

Figure 40:
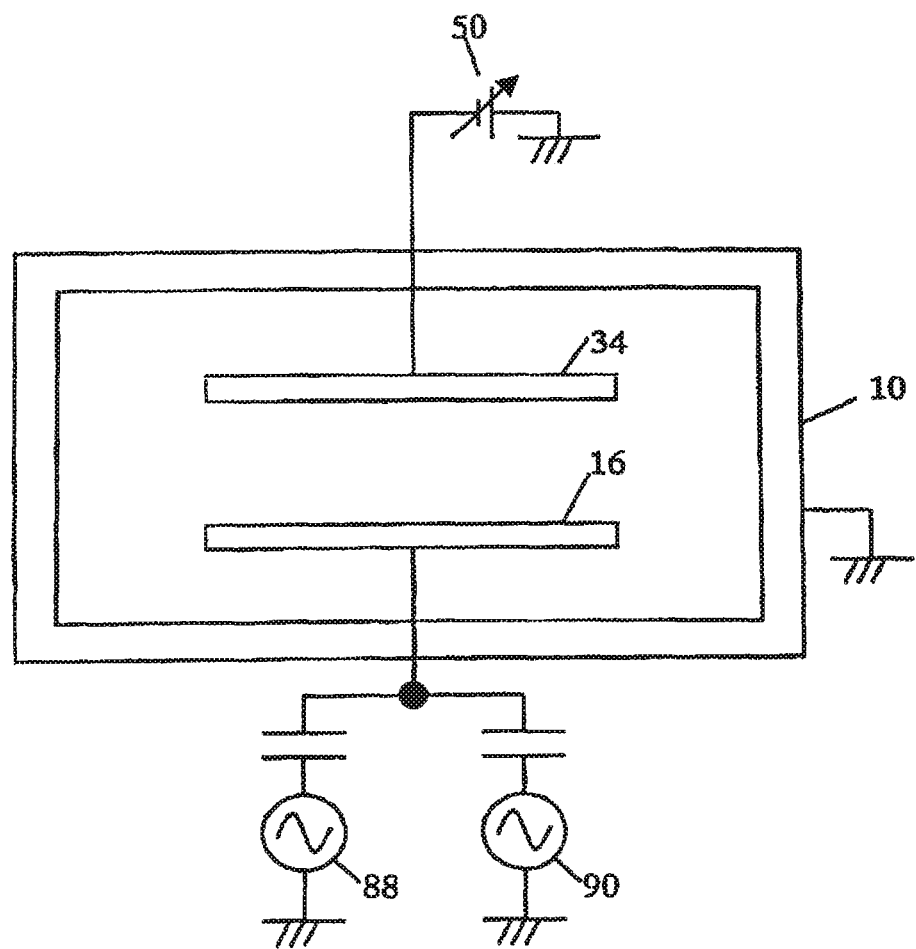
FIG. 40 is a sectional view schematically showing a plasma etching apparatus according to an embodiment 3 of the present invention.

FIG. 40 is a sectional view schematically showing a plasma etching apparatus according to the embodiment 3 of the present invention.

This plasma etching apparatus is of the type that applies two RF powers with different frequencies to the lower side. Specifically, a radio frequency (RF) power with, e.g., 40 MHz for plasma generation from a first RF power supply 88 and a radio frequency (RF) with, e.g., 2 MHz for ion attraction from a second RF power supply 90 are applied to a lower electrode or susceptor 16. Further, as shown in FIG. 40, a variable DC power supply 50 is connected to an upper electrode 34 to apply a predetermined direct current (DC) voltage. With reference to FIG. 41, this plasma etching apparatus will be explained in more detail.

This plasma etching apparatus is structured as a parallel-plate plasma etching apparatus of the capacitive coupling type. The apparatus includes a cylindrical chamber (process chamber) 10, which is made of, e.g., aluminum with an anodization-processed surface. The chamber 10 is protectively grounded.

A columnar susceptor pedestal 14 is disposed on the bottom of the chamber 10 through an insulating plate 12 made of, e.g., a ceramic. A susceptor 16 made of, e.g., aluminum is disposed on the susceptor pedestal 14. The susceptor 16 is used as a lower electrode, on which a target substrate, such as a semiconductor wafer W, is placed.

The susceptor 16 is provided with an electrostatic chuck 18 on the top, for holding the semiconductor wafer W by an electrostatic attraction force. The electrostatic chuck 18 comprises an electrode 20 made of a conductive film, and a pair of insulating layers or insulating sheets sandwiching the electrode 20. The electrode 20 is electrically connected to a direct current (DC) power supply 22. The semiconductor wafer W is attracted and held on the electrostatic chuck 18 by an electrostatic attraction force, e.g., a Coulomb force, generated by a DC voltage applied from the DC power supply 22.

A conductive focus ring (correction ring) 24 made of, e.g., silicon is disposed on the top of the susceptor 16 to surround the electrostatic chuck 18 (and the semiconductor wafer W) to improve etching uniformity. A cylindrical inner wall member 26 made of, e.g., quartz is attached to the side of the susceptor 16 and susceptor pedestal 14.

The susceptor pedestal 14 is provided with a cooling medium space 28 formed therein and annularly extending therethrough. A cooling medium set at a predetermined temperature, such as cooling water, is circulated within the cooling medium space 28 from a chiller unit (not shown) through lines 30a and 30b. The temperature of the cooling medium is set to control the process temperature of the semiconductor wafer W placed on the susceptor 16.

Further, a heat transmission gas, such as He gas, is supplied from a heat transmission gas supply unit (not shown), through a gas supply line 32, into the interstice between the top surface of the electrostatic chuck 18 and the bottom surface of the semiconductor wafer W.

An upper electrode 34 is disposed above the lower electrode or susceptor 16 in parallel with the susceptor. The space between the electrodes 16 and 34 is used as a plasma generation space. The upper electrode 34 defines a surface facing the semiconductor wafer W placed on the lower electrode or susceptor 16, and thus this facing surface is in contact with the plasma generation space.

The upper electrode 34 is supported at the top of the chamber 10 by an insulating shield member 42. The upper electrode 34 includes an electrode plate 36 defining the facing surface opposite the susceptor 16 and having a number of gas delivery holes 37, and an electrode support 38 detachably supporting the electrode plate 36. The electrode support 38 is made of a conductive material, such as aluminum with an anodization-processed surface, and has a water-cooling structure. The electrode plate 36 is preferably made of a conductor or semiconductor having a low resistivity and thus generating less Joule heat. Further, in order to reinforce a resist film, as described later, the electrode plate 36 is preferably made of a silicon-containing substance. In light of these factors, the electrode plate 36 is preferably made of silicon or SiC. The electrode support 38 has a gas diffusion cell 40 formed therein, which is connected to the gas delivery holes 37 through a number of gas flow channels 41 extending downward.

Further, the electrode support 38 has a gas feed port 62 formed therein for feeding a process gas into the gas diffusion cell 40. The gas feed port 62 is connected to a process gas supply source 66 through a gas supply line 64. The gas supply line 64 is provided with a mass-flow controller (MFC) 68 and a switching valve 70 disposed thereon in this order from the upstream. A process gas for etching, such as a fluorocarbon gas (CxFy), e.g., $C_4F_8$ gas, is supplied from the process gas supply source 66 through the gas supply line 64 into the gas diffusion cell 40. Then, the process gas flows through the gas flow channels 41 and is delivered from the gas delivery holes 37 into the plasma generation space, as in a shower device. Accordingly, in other words, the upper electrode 34 functions as a showerhead for supplying a process gas.

The upper electrode 34 is electrically connected to a variable DC power supply 50 through a low-pass filter (LPF) 48. The variable DC power supply 50 may be formed of a bipolar power supply. The electric feeding of the variable DC power supply 50 is set on/off by an on/off switch 52. The polarity, current, and voltage of the variable DC power supply 50, and the on/off switch 52 are controlled by a controller (control unit) 51.

The low-pass filter (LPF) 48 is configured to trap the RF from first and second RF power supplies, as described later, and is preferably formed of an LR filter or LC filter The sidewall of the chamber 10 extends upward above the height level of the upper electrode 34 and forms a cylindrical grounded conductive body 10a. The cylindrical grounded conductive body 10a includes a top or ceiling wall.

The lower electrode or susceptor 16 is electrically connected to a first RF power supply 88 through a matching unit 87, and to a second RF power supply 90 through a matching unit 89. The first RF power supply 88 outputs an RF power with a frequency of 27 MHz or more, such as 40 MHz.

The second RF power supply 90 outputs an RF power with a frequency of 13.56 MHz or less, such as 2 MHz.

The matching units 87 and 89 are arranged to match the load impedance with the internal (or output) impedance of the first and second RF power supplies 88 and 90, respectively. When plasma is generated within the chamber 10, the matching units 87 and 89 perform control for the load impedance and the internal impedance of the first and second RF power supplies 88 and 90 to apparently agree with each other.

An exhaust port 80 is formed at the bottom of the chamber 10, and is connected to an exhaust unit 84 through an exhaust line 82. The exhaust unit 84 includes a vacuum pump, such as a turbo molecular pump, to reduce the pressure inside the chamber 10 to a predetermined vacuum level. A transfer port 85 for a semiconductor wafer W is formed in the sidewall of the chamber 10, and is opened/closed by a gate valve 86 attached thereon. A deposition shield 11 is detachably disposed along the inner wall of the chamber 10 to prevent etching by-products (deposition) from being deposited on the wall. In other words, the deposition shield 11 constitutes a chamber wall. A deposition shield 11 is also disposed around the inner wall member 26. An exhaust plate 83 is disposed at the bottom of the chamber 10 between the deposition shield 11 on the chamber wall and the deposition shield 11 on the inner wall member 26. The deposition shield 11 and exhaust plate 83 are preferably made of an aluminum body covered with a ceramic, such as $Y_2O_3$.

A conductive member (GND block) 91 is disposed on a portion of the deposition shield 11 that constitutes the chamber inner wall, at a height essentially the same as the wafer W, and is connected to ground in the sense of DC. This arrangement provides the effect of preventing abnormal electric discharge, as described later.

Respective portions of the plasma etching apparatus are connected to and controlled by a control section (overall control unit) 95. The control section 95 is connected to a user interface 96 including, e.g., a keyboard and a display, wherein the keyboard is used for a process operator to input commands for operating the plasma etching apparatus, and the display is used for showing visualized images of the operational status of the plasma processing apparatus.

Further, the control section 95 is connected to a storage section 97 that stores control programs for the control section 95 to control the plasma etching apparatus so as to perform various processes, and programs or recipes for respective components of the plasma etching apparatus to perform processes in accordance with process conditions. Recipes may be stored in a hard disk or semiconductor memory, or stored in a computer readable portable storage medium, such as a CDROM or DVD, to be attached to a predetermined position in the storage section 97.

A required recipe is retrieved from the storage section 97 and executed by the control section 95 in accordance with an instruction or the like through the user interface 96. As a consequence, the plasma etching apparatus can perform a predetermined process under the control of the control section 95. It should be noted that each of the plasma processing apparatuses (plasma etching apparatuses) according to embodiments of the present invention includes such a control section 95.

When an etching process is performed in the plasma etching apparatus described above, the gate valve 86 is first opened, and a semiconductor wafer W to be etched is transferred into the chamber 10 and placed on the susceptor 16. Then, a process gas for etching is supplied from the process gas supply source 66 into the gas diffusion cell 40 at a predetermined flow rate, and then supplied into the chamber 10 through the gas flow channels 41 and gas delivery holes 37. At the same time, the interior of the chamber 10 is exhausted by the exhaust unit 84 to set the pressure inside the chamber 10 to be a predetermined value within a range of, e.g., 0.1 to 150 Pa. The process gas may be selected from various gases conventionally employed, and preferably is a gas containing a halogen element, a representative of which is a fluorocarbon gas (CxFy), such as $C_4F_8$ gas. Further, the process gas may contain another gas, such as Ar gas or $O_2$ gas.

While the etching gas is supplied into the chamber 10, an RF power for plasma generation is applied from the first RF power supply 88 to the lower electrode or susceptor 16 at a predetermined power level. Also, an RF for ion attraction is applied from the second RF power supply 90 to the lower electrode or susceptor 16 at a predetermined power level. On the other hand, a predetermined DC voltage is applied from the variable DC power supply 50 to upper electrode 34. Further, a DC voltage is applied from the DC power supply 22 to the electrode 20 of the electrostatic chuck 18 to fix the semiconductor wafer W on the susceptor 16.

The process gas delivered from the gas delivery holes 37 formed in the electrode plate 36 of the upper electrode 34 is turned into plasma by glow discharge caused by the RF power applied across the upper electrode 34 and the lower electrode or susceptor 16. Radicals and ions generated in this plasma are used to etch the target surface of the semiconductor wafer W.

In this plasma etching apparatus, the lower electrode or susceptor 16 is supplied with an RF power within a range covering high frequencies (for example, 10 MHz or more) from the first RF power supply. As a consequence, the plasma density is increased with a preferable state, so that high density plasma is generated even under a low pressure condition.

In this embodiment, when the plasma is thus generated, a DC voltage with a predetermined polarity and value is applied from the variable DC power supply 50 to the upper electrode 34. At this time, the application electrode or upper electrode 34 is preferably set to have a self bias voltage $V_{dc}$ on the surface, at a level for obtaining a predetermined (moderate) sputtering effect onto the surface, i.e., the surface of the electrode plate 36. In other words, the application voltage from the variable DC power supply 50 is preferably controlled by the controller 51 to increase the absolute value of $V_{dc}$ on the surface of the upper electrode 34. Where an RF is applied from the first RF power supply 88 to generate plasma, polymers may be deposited on the upper electrode 34. However, since a suitable DC voltage is applied from the variable DC power supply 50, polymers deposited on the upper electrode 34 are sputtered, thereby cleaning up the surface of the upper electrode 34. Further, an optimum quantity of polymers can be supplied onto the semiconductor wafer W, thereby canceling the surface roughness of the photo-resist film. Where the voltage applied from the variable DC power supply 50 is adjusted to sputter the body of the upper electrode 34, the electrode material can be supplied onto the surface of the semiconductor wafer W. In this case, the photo-resist film is provided with carbide formed on the surface, and is thereby reinforced. Further, the sputtered electrode material reacts with F contained in a fluorocarbon family process gas and is exhausted, thereby reducing the F ratio in plasma for the photo-resist film to be less etched. Particularly, where the electrode plate 36 is made of a silicon-containing material, such as silicon or SiC, sputtered silicon from the surface of the electrode plate 36 reacts with polymers, so the photo-resist film is provided with SiC formed on the surface, and is thereby remarkably reinforced. In addition to this, Si is highly reactive with F, and the effects described above are enhanced. Accordingly, a silicon-containing material is preferably used as a material of the electrode plate 36. It should be noted that, in this case, the application current or application power may be controlled in place of the application voltage from the variable DC power supply 50.

Figure 42A:
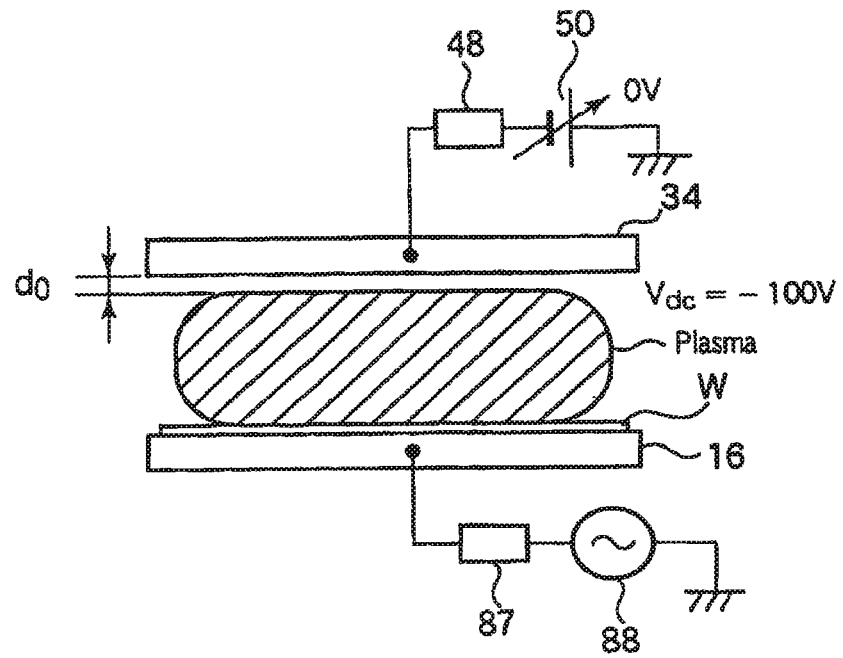
FIGS. 42A and 42B are views showing change in $V_{dc}$ and plasma sheath length where a DC voltage is applied to the upper electrode in the plasma etching apparatus shown in FIG. 41.
Figure 42B:
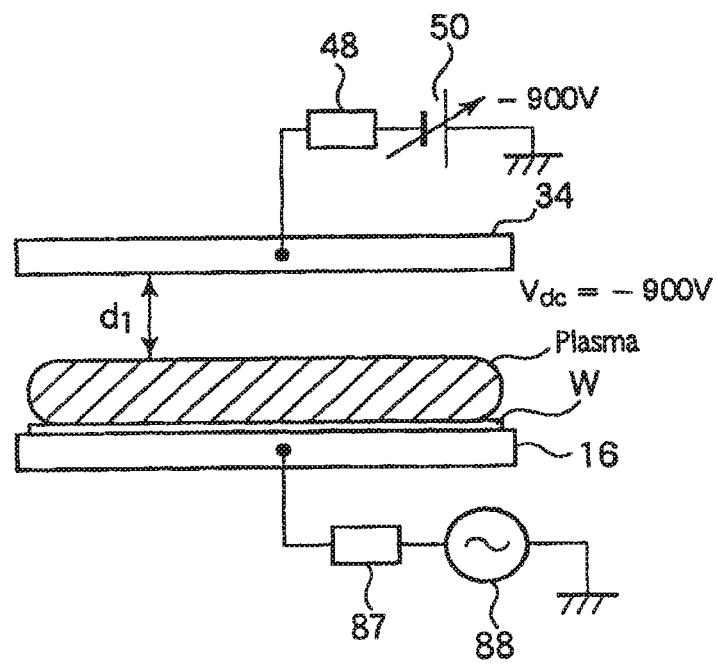
Figure 43B:
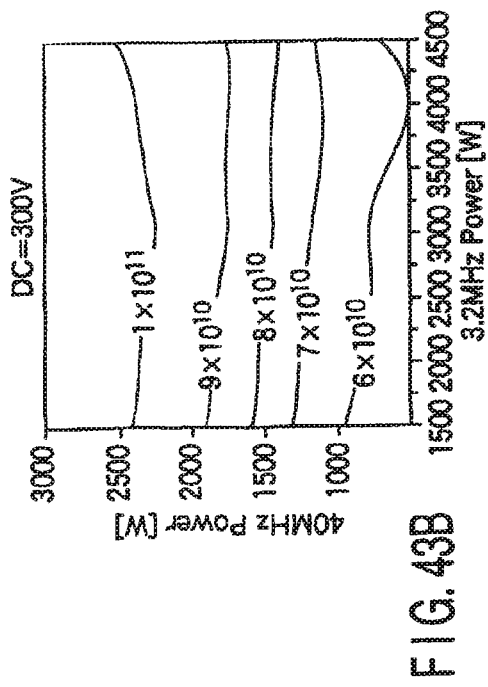
FIGS. 43A to 43D are views showing change in electron density where the DC voltage applied is set at different values under HARC etching conditions in the plasma etching apparatus shown in FIG. 41.
Figure 43D:
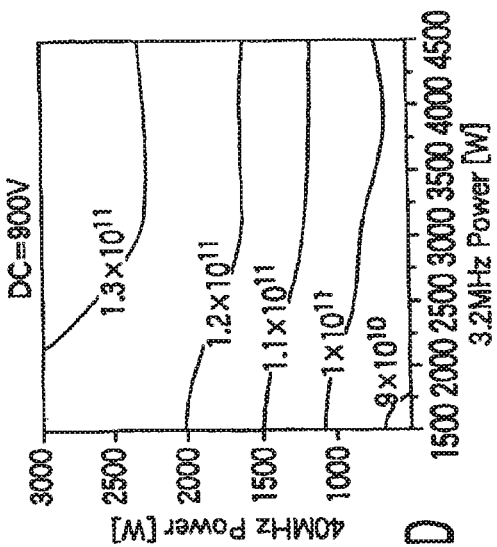
Figure 43A:
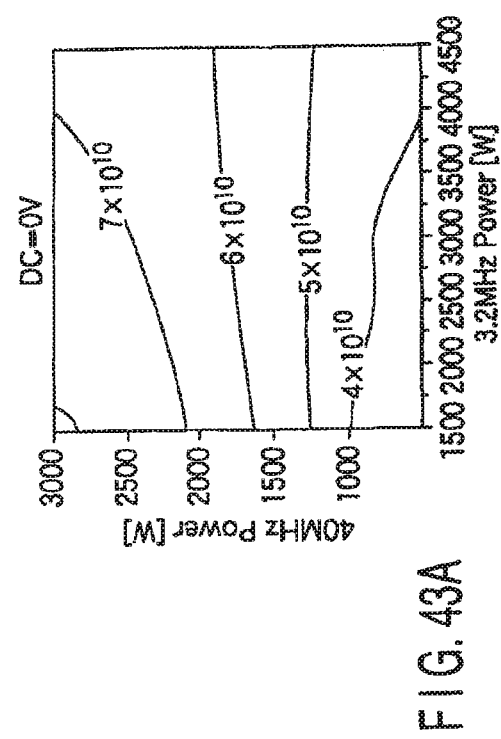
Figure 43C:
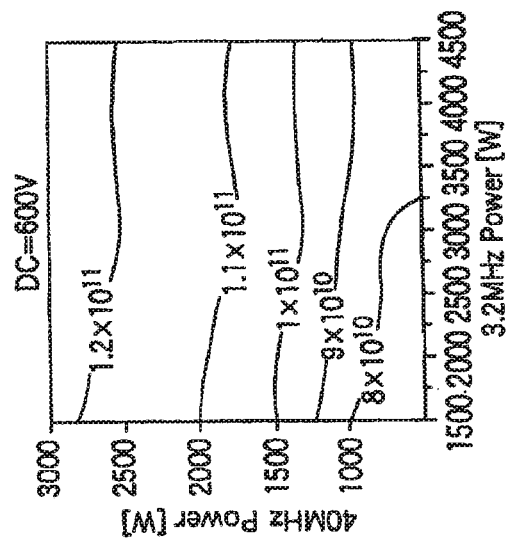
Figure 44A:
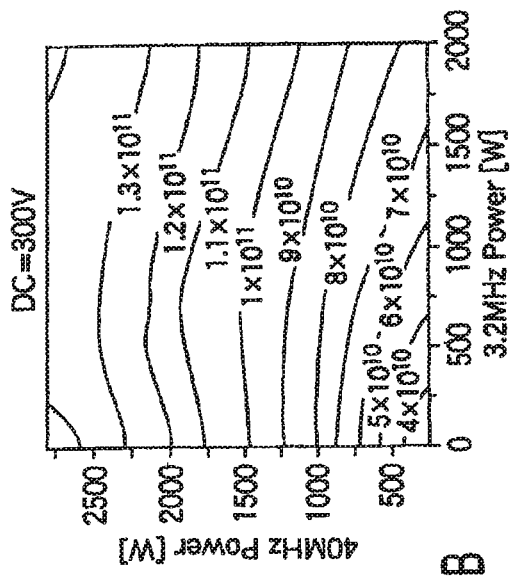
FIGS. 44A to 44D are views showing change in electron density where the DC voltage applied is set at different values under VIA etching conditions in the plasma etching apparatus shown in FIG. 41.
Figure 44B:
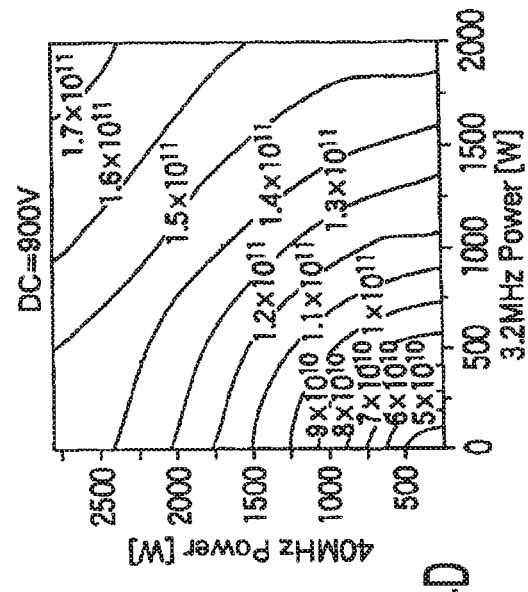
Figure 44C:
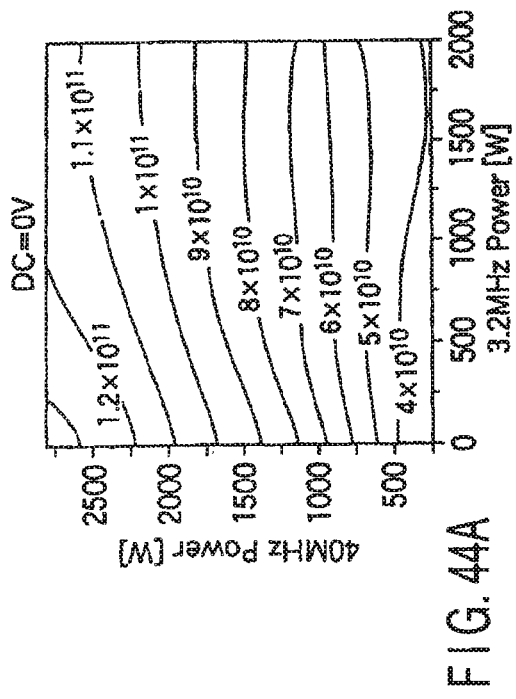
Figure 44D:
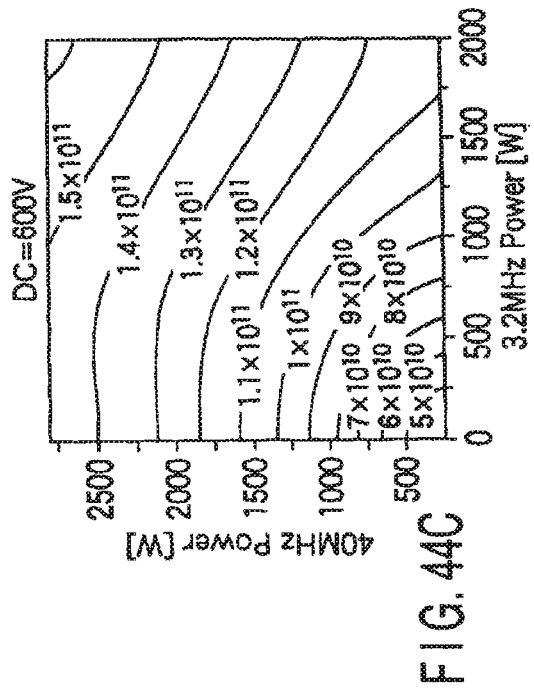

The DC voltage thus applied to the upper electrode 34 to make a deep self bias voltage $V_{dc}$, as described above, increases the length of a plasma sheath formed on the upper electrode 34, as shown in FIGS. 42A and 42B. As the length of the plasma sheath is increased, the plasma is further pressed by that much. For example, where no DC voltage is applied to the upper electrode 34, $V_{dc}$ on the upper electrode side becomes, e.g., −100V. In this case, the plasma sheath has a small length $d_0$, as shown in FIG. 42A. On the other hand, where a DC voltage of −900V is applied to the upper electrode 34, $V_{dc}$ on the upper electrode side becomes −900V. In this case, since the length of the plasma sheath is in proportion to ¾ of the absolute value of $V_{dc}$, the plasma sheath has a larger length $d_1$, and the plasma is pressed by that much, as shown in FIG. 42B. Where the length of the plasma sheath is thus increased to suitably press the plasma, the effective residence time above the semiconductor wafer W is decreased. Further, the plasma concentrates above the wafer W with less diffusion, thereby reducing the dissociation space. In this case, dissociation of a fluorocarbon family process gas is suppressed for the photo-resist film to be less etched. Accordingly, the application voltage from the variable DC power supply 50 is preferably controlled by the controller 51, such that the length of the plasma sheath on the upper electrode 34 is increased to a level for forming desired pressed plasma. It should be noted that, also in this case, the application current or application power may be controlled in place of the application voltage from the variable DC power supply 50.

Further, when the plasma is formed, electrons are generated near the upper electrode 34. When a DC voltage is applied from the variable DC power supply 50 to the upper electrode 34, electrons are accelerated in the vertical direction within the process space due to the potential difference between the applied DC voltage value and plasma potential. In other words, the variable DC power supply 50 can be set at a desired polarity, voltage value, and current value, to irradiate the semiconductor wafer W with electrons. The radiated electrons reform the composition of the mask or photo-resist film to reinforce the film. Accordingly, the application voltage value and application current value from the variable DC power supply 50 can be used to control the quantity of electrons generated near the upper electrode 34 and the acceleration voltage for accelerating the electrons toward the wafer W, so that the photo-resist film is reinforced in a predetermined manner.

Particularly, where the photo-resist film on the semiconductor wafer W is a photo-resist film (which will be referred to as an ArF resist film) for an ArF excimer laser (with a wavelength of 193 nm), the ArF resist film changes its polymer structure through reactions shown in the chemical formulas (1) and (2) described with reference to the embodiment 1, and is then irradiated with electrons, thereby arriving at the structure shown on the right side of the chemical formula (3) described with reference to the embodiment 1. In this case, by the irradiation with electrons, the composition of the ArF resist film is reformed (resist cross-linkage reaction), as shown in a portion d of the chemical formula (3). Since this portion d has a function of greatly enhancing the etching resistance property (plasma resistance property), the etching resistance property of the ArF resist film remarkably increases. As a consequence, the surface roughness of the ArF resist film is suppressed, and the etching selectivity of an etching target layer relative to the ArF resist film is increased.

Accordingly, the application voltage value or current value from the variable DC power supply 50 is preferably controlled by the controller 51 to enhance the etching resistance property of the photo-resist film (particularly, ArF resist film) by irradiation with electrons.

Further, as described above, when a DC voltage is applied to the upper electrode 34, electrons generated near the upper electrode 34 in plasma generation are accelerated in the vertical direction within the process space. The polarity, voltage value, and current value of the variable DC power supply 50 can be set at predetermined conditions, so that electrons reach into holes formed on the semiconductor wafer W. As a consequence, the shading effect is suppressed to obtain a good processed shape without bowing, while improving the uniformity of the processed shape.

It is assumed that electron current amount $I_{DC}$ due to the DC voltage is used as the quantity of electrons incident on the wafer W, where the acceleration voltage of electrons is controlled. In this case, where $I_{ion}$ is ion current amount incident on the wafer from plasma, it is preferable to satisfy $I_{DC} > (\frac{1}{2})I_{ion}$. Since $I_{ion} = Z\rho v_{ion} e$ (where, Z is charge number, p is current velocity density, $v_{ion}$ is ion velocity, and e is electron charge amount $1.6 \times 10^{-19}$C), and $\rho$ is in proportion to electron density Ne, $I_{ion}$ is in proportion to Ne.

As described above, the DC voltage applied to the upper electrode 34 can be controlled, so as to exercise the sputtering function onto the upper electrode 34 and the plasma pressing function, as well as the supply function of supplying a large quantity of electrons generated at the upper electrode 34 to the semiconductor wafer W, as described above. This arrangement makes it possible to reinforce the photo-resist film, supply optimum polymers, and suppress dissociation of the process gas. As a consequence, the surface roughness of the photo-resist is suppressed, and the etching selectivity of an etching target layer relative to the photo-resist film is increased. Further, the CD of an opening portion formed in the photo-resist film is prevented from expanding, thereby realizing pattern formation with high accuracy. Particularly, these effects are more enhanced by controlling the DC voltage to suitably exercise the three functions described above, i.e., the sputtering function, plasma pressing function, and electron supply function.

It should be noted that, it depends on process conditions or the like to determine which one of the functions described above is predominant. The voltage applied from the variable DC power supply 50 is preferably controlled by the controller 51 to exercise one or more of the functions to effectively obtain the corresponding effects.

The DC voltage applied to the upper electrode 34 can be adjusted to control the plasma potential. In this case, etching by-products can be prevented from being deposited on the upper electrode 34, the deposition shield 11 forming a part of the chamber wall, the inner wall member 26, and the insulating shield member 42.

If etching by-products are deposited on the upper electrode 34 or the deposition shield 11 forming the chamber wall, a problem may arise in that the process characteristics change or particles are generated. Particularly, there is involving sequentially etching a multi-layered film, in which an Si-organic film (SiOC), SiN film, $SiO_2$ film, and photo-resist are laminated on a semiconductor wafer W in this order. In this case, since suitable etching conditions are different for the respective films, a memory effect may occur in that a previous process leaves some effect that affects a subsequent process.

The amount of deposition of etching by-products described above depends on the potential difference between the plasma and the upper electrode 34, chamber wall, or the like. Accordingly, deposition of etching products can be suppressed by controlling the plasma potential.

As described above, the voltage applied from the variable DC power supply 50 to the upper electrode 34 can be controlled to lower the plasma potential. As a consequence, etching by-products can be prevented from being deposited on the upper electrode 34, the deposition shield 11 forming a part of the chamber wall, and the insulating members (members 26 and 42) inside the chamber 10. The plasma potential Vp is preferably set at a value within a range of $80V \leq Vp \leq 200V$.

Further, the applied DC voltage contributes to formation of plasma, as another effect obtained by the DC voltage applied to the upper electrode 34. In this case, the plasma density can be higher and the etching rate is thereby increased.

This is so, because, the negative DC voltage applied to the upper electrode hinders electrons from entering the upper electrode and thus suppresses extinction of electrons. Further, where the negative DC voltage accelerates ions onto the upper electrode, electrons are emitted from the electrode. These electrons are accelerated at a high velocity due to the difference between the plasma potential and application voltage value, and ionize neutral gas (turn the gas into plasma), thereby increasing the electron density (plasma density).

The reason for this will be explained, with reference to experiments.

Figure 45:
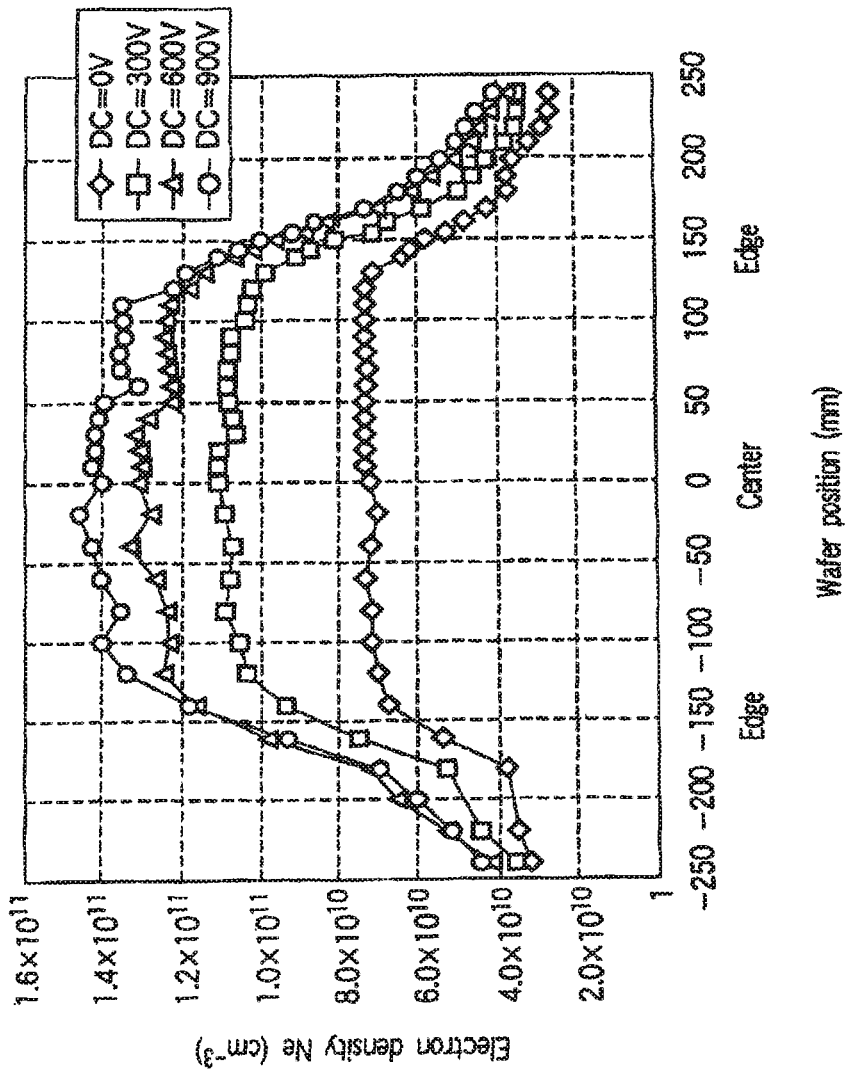
FIG. 45 is a view showing electron density distributions in the wafer radial direction where the HARC etching mentioned above employs a first RF power of 3,000 W and a second RF power of 4,000 W.

FIGS. 43A to 43D are views showing the relationship between the RF power output and electron density distribution. In this experiment, the absolute value of the negative DC voltage applied to the upper electrode was set at different values of 0V, 300V, 600V, and 900V, under HARC etching conditions in which the first RF power and the second RF power applied to the lower electrode or susceptor 16 had frequencies of 40 MHz and 3.2 MHz, respectively, and the pressure was set at 4 Pa. FIGS. 44A to 44D are views showing relationship between the RF power output and electron density distribution. In this experiment, the absolute value of the negative DC voltage applied to the upper electrode was set at different values of 0V, 300V, 600V, and 900V, under VIA etching conditions in which the two RF powers had frequencies the same as those described above, and the pressure was set at 6.7 Pa. As shown in FIGS. 43A to 44D, with increase in the absolute value of the application DC voltage, the electron density (plasma density) increased. FIG. 45 is a view showing electron density distributions in the wafer radial direction where the first RF power was set at 3,000 W and the second RF power was set at 4,000 W under the HARC etching mentioned above. As shown in FIG. 45, with increase in the absolute value of the application DC voltage, the electron density increased.

Further, when plasma is generated, the DC voltage applied to the upper electrode 34 from the variable DC power supply 50 increases the plasma density particularly at the central portion in trench etching. As in trench etching conditions, where the pressure inside the chamber 10 is high and the etching gas is a negative gas, the plasma density tends to be lower at the central portion of the chamber 10. However, since the DC voltage applied to the upper electrode 34 increases the plasma density at the central portion, the plasma density can be controlled to make the plasma density uniform.

The reason for this will be explained, with reference to experiments.

In the apparatus shown in FIG. 41, the electron density (plasma density) distribution in the wafer radial direction was measure in cases where the upper electrode was supplied with no DC voltage and where it was supplied with −600 W, both under trench etching conditions. In order to set the trench etching conditions, a semiconductor wafer was loaded into the chamber and placed on the susceptor, and then a process gas comprising $CF_4$ gas, $CHF_3$ gas, Ar gas, and $N_2$ gas was supplied into the chamber, the pressure inside the chamber was set at 26.6 Pa, and the lower electrode or susceptor was supplied with a first RF power with 40 MHz at 300 W and a second RF power with 3.2 MHz at 1,000 W. FIG. 46 shows the results of this experiment. As shown in FIG. 46, where no DC voltage was applied, the electron density was lower at the wafer central portion than the other portions. On the other hand, where the DC voltage was applied, the electron density was increased at the wafer central portion and became uniform. Further, where the DC voltage was applied, the electron density was increased as a whole.

As described above, the DC voltage applied to the upper electrode 34 can be controlled, so as to effectively exercise at least one of the above-described sputtering function onto the upper electrode 34, plasma pressing function, electron supply function, plasma potential control function, electron density (plasma density) increase function, and plasma density control function.

As described above, an explanation has been given of functions and effects of the direct current (DC) voltage applied to the upper electrode 34.

Incidentally, in this embodiment, a DC voltage is applied to the upper electrode of a plasma etching apparatus in which a first radio frequency (RF) power for plasma generation and a second radio frequency (RF) power for ion attraction are applied to the lower electrode, i.e., an apparatus of the type that applies two RF powers with different frequencies to the lower side. Plasma etching apparatuses of the type that applies two RF powers with different frequencies to the lower side have the following advantages, as compared to the other plasma etching apparatus of the capacitive coupling type.

First, as in this embodiment, where an RF power for plasma generation is applied to the lower electrode, plasma is generated near the wafer, and dissociation of the process gas is suppressed because plasma is prevented from widely diffusing. As a consequence, even where the pressure inside the process chamber is high and the plasma density is low, the etching rate on the wafer can be increased. Further, even where the RF power for plasma generation has a high frequency, it is possible to ensure relatively large ion energy and thus attain a high efficiency. By contrast, in apparatuses of the type that applies an RF power for plasma generation to the upper electrode, plasma is generated near the upper electrode. In this case, it is difficult to increase the etching rate on the wafer, if the pressure inside the process chamber is high and the plasma density is low.

In addition, as in this embodiment, where an RF power for plasma generation and an RF power for ion attraction are independently applied to the lower electrode, the function of generating plasma and the function of attracting ions, both necessary for plasma etching, can be independently controlled. By contrast, in apparatuses of the type that applies an RF power with one frequency to the lower electrode, the function of generating plasma and the function of attracting ions cannot be independently controlled. In this case, it is difficult to satisfy etching conditions where high micro-fabrication is required.

As described above, according to a plasma etching apparatus of the type that applies two RF powers with different frequencies to the lower side, plasma is generated near the wafer and is prevented from widely diffusing, and the function of generating plasma and the function of attracting ions can be independently controlled. Further, where a DC voltage is applied to the upper electrode in this etching apparatus, the apparatus can also exercise at least one of the upper electrode sputtering function, plasma pressing function, electron supply (to a wafer) function, plasma potential control function, plasma density increase function, and plasma density control function. As a consequence, it is possible to provide a plasma etching apparatus with high performance, which is more suitable for recent etching micro-fabrication.

The DC voltage application to the upper electrode 34 may be selectively performed. Under etching conditions which require the DC voltage application to the upper electrode 34, the variable DC power supply 50 and the relay switch 52 shown in FIG. 41 are set in the ON-state. On the other hand, under etching conditions which do no require the DC voltage application to the upper electrode 34, the variable DC power supply 50 and relay switch 52 are set in the OFF-state.

Figure 47:
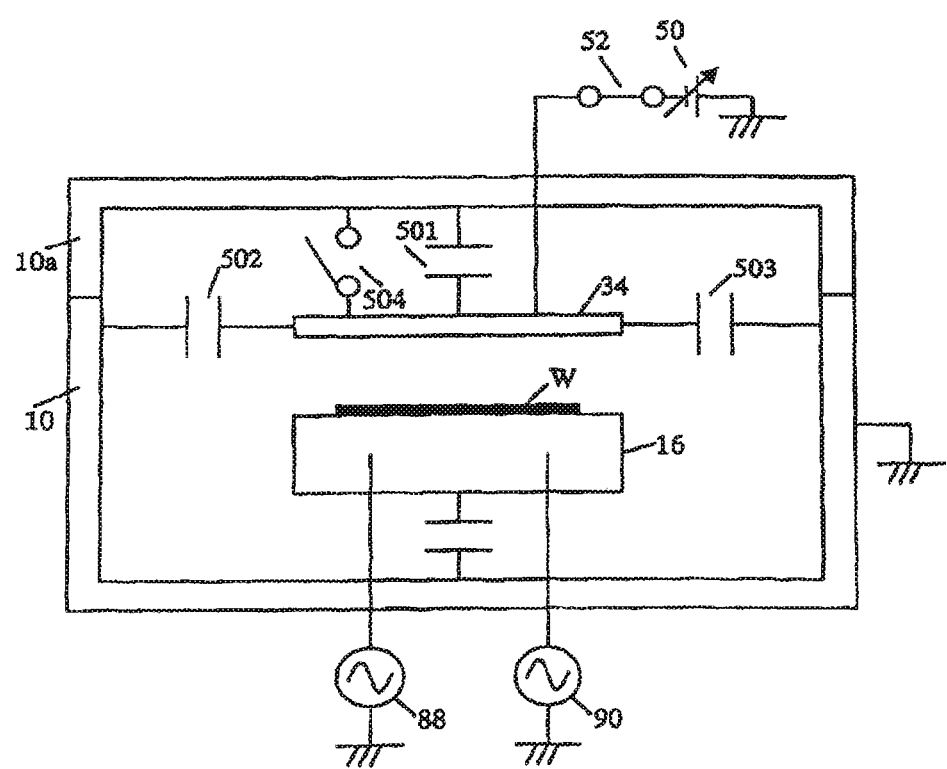
FIG. 47 is a view showing an electrical state of the upper electrode in the plasma etching apparatus shown in FIG. 41.
Figure 48:
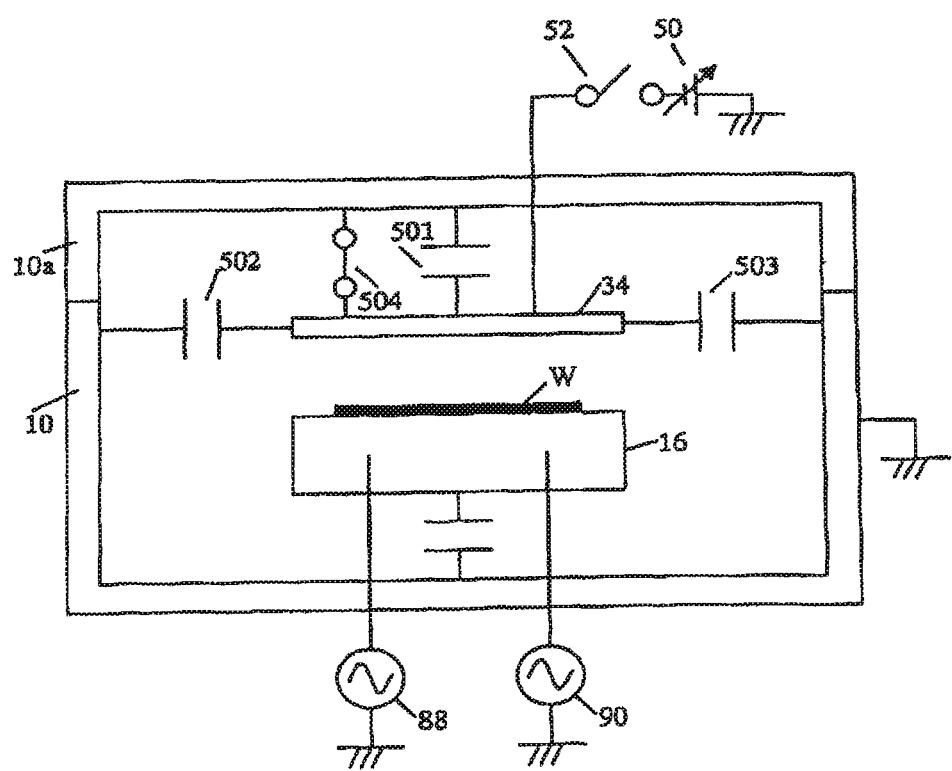
FIG. 48 is a view showing an electrical state of the upper electrode in the plasma etching apparatus shown in FIG. 41.

Further, if the upper electrode 34 is grounded when a DC voltage is applied to the upper electrode 34, the DC voltage application has no effect. Thus, the upper electrode 34 needs to be in a floating state in the sense of DC at this time. FIG. 47 shows a schematic view of this structure. In FIG. 47, a dielectric body is disposed at each of the portions that electrically form capacitors 501, 502, and 503, so that upper electrode 34 is set in a floating state in the sense of DC by the dielectric body from the process chamber 10 and grounded conductive body 10a. RF powers applied from the RF power supplies 88 and 89 to the lower electrode 16 reach the upper electrode 34 through the process space, and then reach the grounded process chamber 10 and grounded conductive body 10a through the capacitors 501, 502, and 503.

Where the variable DC power supply 50 and relay switch 52 are set in the OFF-state to apply no DC voltage to the upper electrode 34, the upper electrode 34 may be arranged to be switchable between the grounded state and floating state in the sense of DC. In the example shown in FIG. 48, where no DC voltage is applied to the upper electrode 34, the grounded conductive body 10a is short-circuited with the upper electrode 34 by a switch (switching unit) 504 to set the upper electrode 34 in a grounded state. However, at this time, the switch (switching unit) 504 may be turned off to set the upper electrode 34 in a floating state in the sense of DC.

Figure 49:
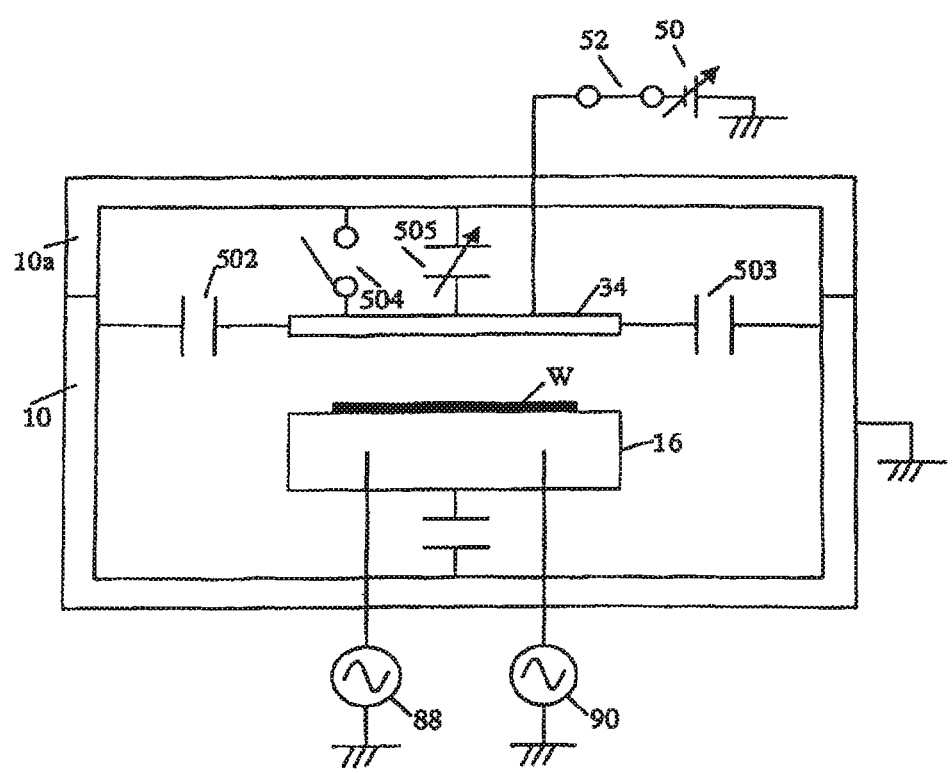
FIG. 49 is a view showing an electrical state of the upper electrode in the plasma etching apparatus shown in FIG. 41.

Further, as shown in FIG. 49, the portion electrically forming the capacitor 501 may be structured such that the capacitance is electrically variable. With this arrangement, the potential on the upper electrode can be variably adjusted.

Figure 50:
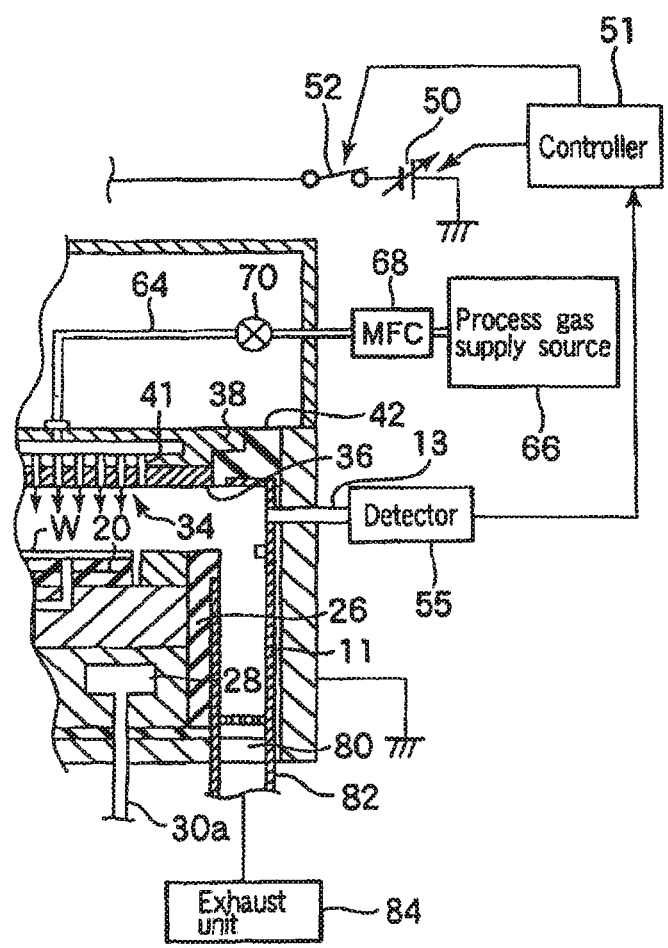
FIG. 50 is a sectional view showing a modification of the plasma etching apparatus shown in FIG. 41, provided with a detector for detecting plasma.

Further, as shown in FIG. 50, a detector 55 may be disposed to detect the plasma state through, e.g., a plasma detection window 10a, so that the controller 51 can control the variable DC power supply 50 based on the detection signal. As a consequence, it is possible to automatically apply a DC voltage to the upper electrode 34, so as to effectively exercise the functions described above. Alternatively, a detector for detecting the sheath length or a detector for detecting the electron density may be disposed, so that the controller 51 can control the variable DC power supply 50 based on the detection signal.

As regards a plasma etching apparatus of the type that applies two RF powers with different frequencies to the lower side, and further applies a DC voltage to the upper electrode, where the apparatus is used to etch an insulating film (for example, Low-k film) disposed on a wafer W, the following combination of gases is particularly preferably used as a process gas.

Specifically, where over etching is performed under via-etching conditions, a combination of ($C_5F_8$, Ar, and $N_2$), ($C_4F_8$, Ar, and $N_2$), ($C_4F_8$, Ar, $N_2$, and $O_2$), or ($C_4F_8$, Ar, $N_2$, and CO) may be preferably used as a process gas. In this case, the selectivity of an insulating film relative to an underlying film (SiC, SiN, etc.) can become larger.

Alternatively, where trench etching conditions are used, $CF_4$ or a combination of ($CF_4$ and Ar) or ($N_2$ and H2) may be preferably used as a process gas. In this case, the selectivity of an insulating film relative to a mask can become larger.

Alternatively, where conditions for etching an organic anti-reflection film on an insulating film are used, $CF_4$ or a combination of ($CF_4$ and $C_3F_8$), ($CF_4$ and $C_4F_8$), or ($CF_4$ and $C_4F_6$) may be preferably used as a process gas.

Alternatively, where HARC etching conditions are used, a combination of ($C_4F_6$, $CF_4$, Ar, and $O_2$), ($C_4F_6$, $C_3F_8$, Ar, and $O_2$), ($C_4F_6$, $C_4F_8$, Ar, and $O_2$), ($C_4F_6$, C2F6, Ar, and $O_2$), ($C_4F_8$, Ar, and $O_2$), or ($C_4F_8$, Ar, and $O_2$) may be preferably used as a process gas. In this case, the etching rate of an insulating film can become higher.

The process gas is not limited to the examples described above, and another combination of (CxHyFz gas/additive gas such as $N_2$ or $O_2$/dilution gas) may be used.

Incidentally, where a DC voltage is applied to the upper electrode 34, electrons may accumulate on the upper electrode 34 and thereby cause abnormal electric discharge between the upper electrode 34 and the inner wall of the chamber 10. In order to suppress such abnormal electric discharge, this embodiment includes the GND block (conductive member) 91 as a part grounded in the sense of DC, which is disposed on the deposition shield 11 that constitutes the chamber wall. The GND block 91 is exposed to plasma, and is electrically connected to a conductive portion in the deposition shield 11. The DC voltage current applied from the variable DC power supply 50 to the upper electrode 34 flows through the process space to the GND block 91, and is then grounded through the deposition shield 11. The GND block 91 is made of a conductor, and preferably a silicon-containing substance, such as Si or SiC. The GND block 91 may be preferably made of C. The GND block 91 allows electrons accumulated in the upper electrode 34 to be released, thereby preventing abnormal electric discharge. The GND block 91 preferably has a protruding length of 10 mm or more.

Further, in order to prevent abnormal electric discharge, it may be effective to use a method of superposing very short periodic pulses of the opposite polarity, as shown in FIG. 13, by a suitable means, with the DC voltage applied to the upper electrode 34, so as to neutralize electrons.

Figure 52:
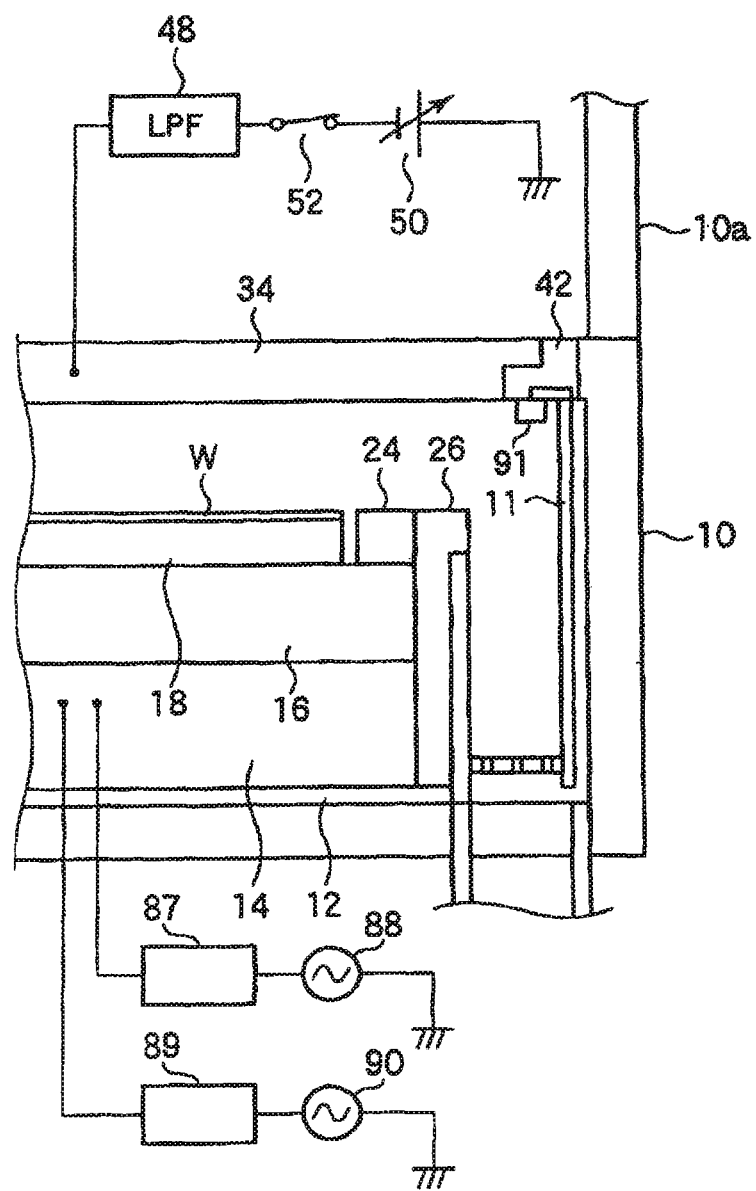
FIG. 52 is a schematic view showing another layout of the GND block.

The position of the GND block 91 is not limited to that shown in FIG. 41, as long as it is disposed in the plasma generation area. For example, as shown in FIG. 51, the GND block 91 may be disposed on the susceptor 16 side, e.g., around the susceptor 16. Alternatively, as shown in FIG. 52, the GND block 91 may be disposed near the upper electrode 34, e.g., as a ring disposed outside the upper electrode 34. However, when plasma is generated, $Y_2O_3$ or a polymer that covers the deposition shield 11 or the like flies out and may be deposited on the GND block 91. In this case, the GND block 91 cannot maintain the grounding performance any more in the sense of DC, and thus hardly exercises the effect of preventing abnormal electric discharge. Accordingly, it is important to prevent such deposition. For this reason, the GND block 91 is preferably located at a position remote from members covered with $Y_2O_3$ or the like, but preferably near parts made of an Si-containing substance, such as Si or quartz ($SiO_2$). For example, as shown in FIG. 16A according to the embodiment 1, an Si-containing member 93 is preferably disposed near the GND block 91. In this case, the length L of a portion of the Si-containing member 93 below the GND block 91 is preferably set to be equal to or longer than the protruding length M of the GND block 91. Further, in order to prevent the function from being deteriorated due to deposition of $Y_2O_3$ or a polymer, as shown in FIG. 16B, it is effective to form a recess 91a in the GND block 91 where flying substances are hardly deposited. It is also effective to increase the surface are of the GND block 91, so that it cannot be entirely covered with $Y_2O_3$ or a polymer. Further, in order to suppress deposition, it is effective to increase the temperature. In this respect, the upper electrode 34 is supplied with an RF power for plasma generation, and thus increases the temperature around it. Accordingly, the GND block 91 is preferably disposed near the upper electrode 34, as shown in FIG. 52, to increase the temperature and thereby prevent deposition. Particularly in this case, the GND block 91 is preferably disposed as a ring outside the upper electrode 34, as shown in FIG. 52.

Figure 53:
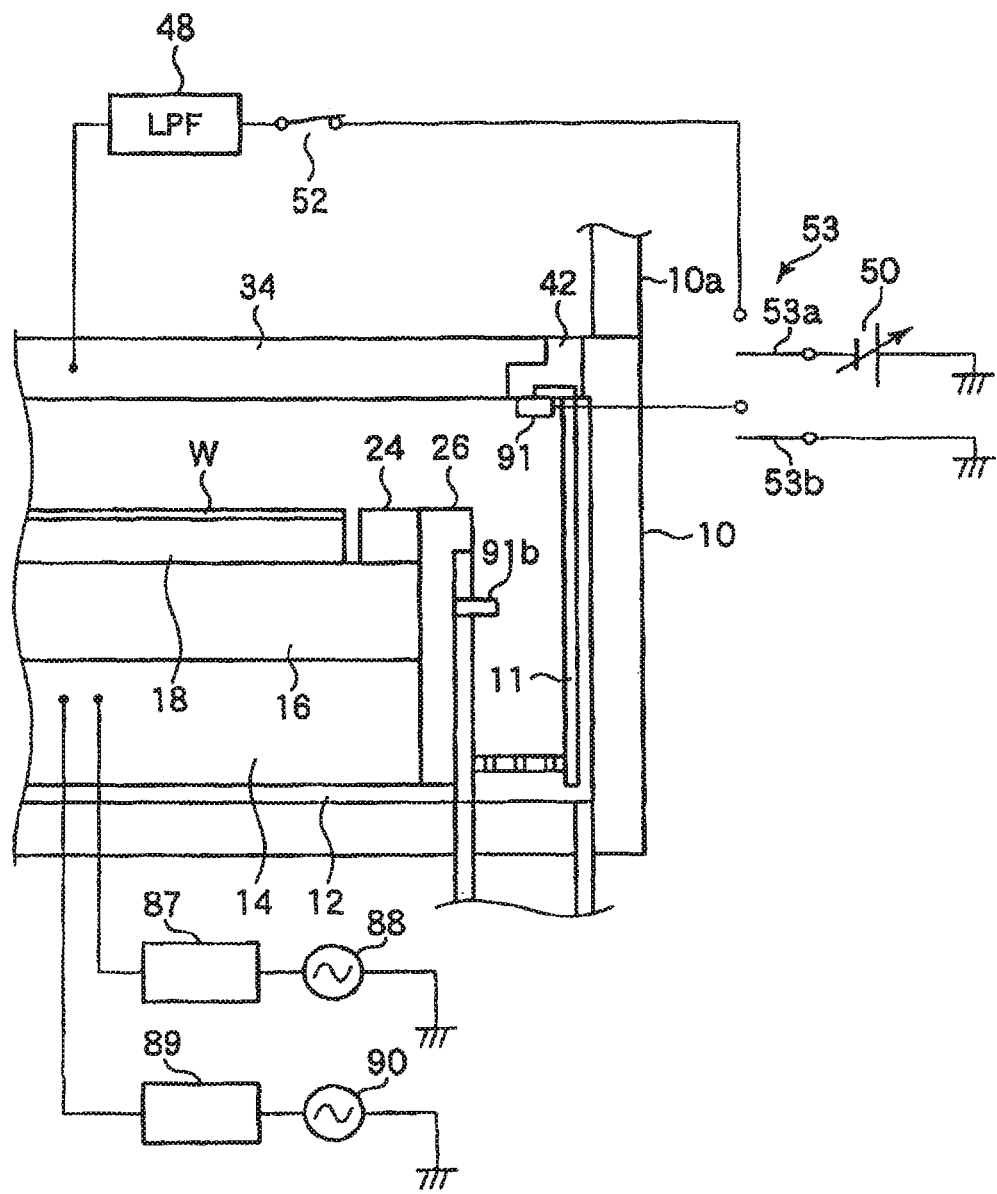
FIG. 53 is a schematic view showing an example of a device that can remove deposition on the GND block.

In order to more effectively remove the influence of deposition on the GND block 91, due to $Y_2O_3$ or a polymer flying out from the deposition shield 11 and so forth, it is effective to make a negative DC voltage applicable to the GND block 91, as shown in FIG. 53. Specifically, where a negative DC voltage is applied to the GND block 91, deposition sticking thereto is sputtered or etched, so as to clean the surface of the GND block 91. In the structure shown in FIG. 53, a switching mechanism 53 is configured to switch the connection of the GND block 91 between the variable DC power supply 50 and a ground line, so that a voltage can be applied to the GND block 91 from the variable DC power supply 50. Further, a grounded conductive auxiliary member 91b is disposed to receive flow of a DC electron current generated by a negative DC voltage applied to the GND block 91. The switching mechanism 53 includes a first switch 53a to switch the connection of the variable DC power supply 50 between the matching unit 46 and GND block 91, and a second switch 53b to turn on/off the connection of the GND block 91 to the ground line. In the structure shown in FIG. 53, the GND block 91 is disposed as a ring outside the upper electrode 34, while the conductive auxiliary member 91b is disposed around the susceptor 16. Although this arrangement is preferable, another arrangement may be adopted.

Figure 54A:
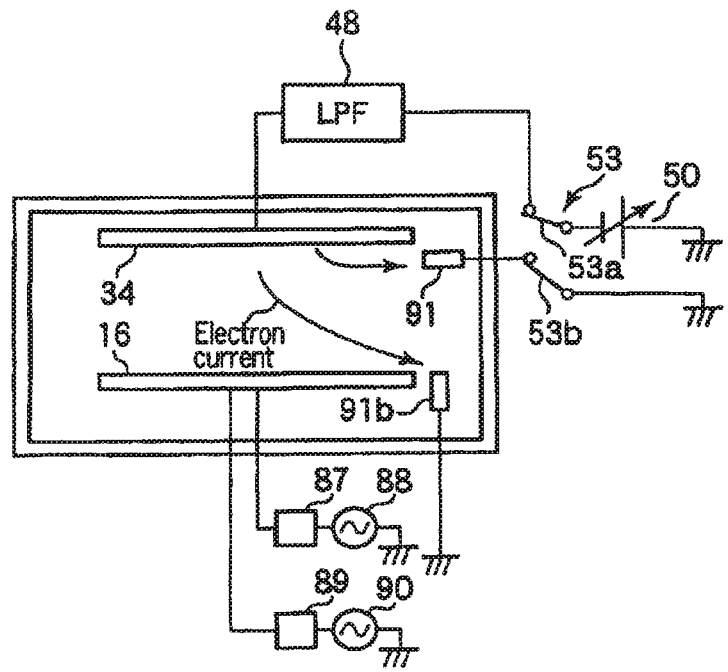
FIGS. 54A and 54B are schematic views showing a state in plasma etching and a state in cleaning, respectively, of the device shown in FIG. 53.

During plasma etching, the structure shown in FIG. 53 is typically set as shown in FIG. 54A, in which the first switch 53a of the switching mechanism 53 is connected to the upper electrode 34, so the variable DC power supply 50 is connected to the upper electrode 34, while the second switch 53b is in the ON-state, so the GND block 91 is connected to the ground line. In this state, the first RF power supply 48 and variable DC power supply 50 are electrically connected to the upper electrode 34, and plasma is thereby generated. At this time, a DC electron current flows from the upper electrode 34 through plasma into the grounded GND block 91 and conductive auxiliary member 91b (a positive ion current flows in the opposite direction). In this case, the surface of the GND block 91 may be covered with deposition of $Y_2O_3$ or a polymer, as described above.

Figure 54B:
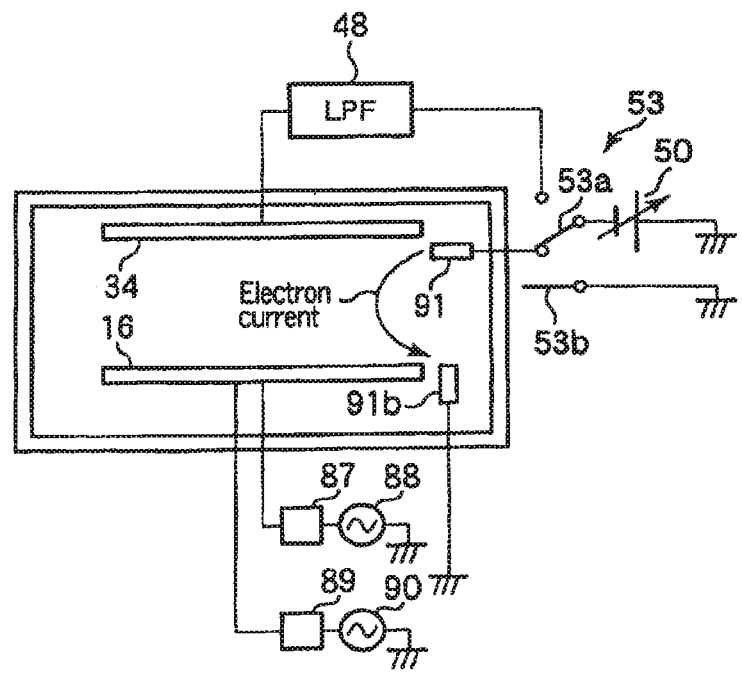

Accordingly, cleaning is then performed to remove this deposition. For this cleaning, as shown in FIG. 54B, the first switch 53a of the switching mechanism 53 is switched to the GND block 91, and the second switch 53b is turned off. In this state, the first RF power supply 48 is electrically connected to the upper electrode 34, and cleaning plasma is thereby generated, while a negative DC voltage is applied from the variable DC power supply 50 to the GND block 91. As a consequence, a DC electron current flows from the GND block 91 into the conductive auxiliary member 91b. On the other hand, positive ions flow into the GND block 91. Accordingly, the DC voltage can be adjusted to control the energy of positive ions incident on the GND block 91, so that the surface of the GND block 91 is sputtered by ions to remove deposition sticking to the surface of the GND block 91.

Further, as shown in FIG. 55, the second switch 53b may be set in the OFF state during a partial period of plasma etching, so that the GND block 91 is in a floating state. At this time, a DC electron current flows from the upper electrode 34 through plasma into the conductive auxiliary member 91b (a positive ion current flows in the opposite direction). In this case, the GND block 91 is given a self bias voltage, which provides energy for positive ions to be incident on the GND block 91, thereby cleaning the GND block 91.

During the cleaning described above, the application DC voltage can be small, and thus the DC electron current is also small at this time. Accordingly, in the structure shown in FIG. 53, where electric charges due to leakage current can be prevented from accumulating in the GND block 91, the conductive auxiliary member 91b is not necessarily required.

In the structure shown in FIG. 53, for cleaning, the connection of the variable DC power supply 50 is switched from the upper electrode 34 to the GND electrode 91, so that a DC electron current due to application of a DC voltage flows from the GND block 91 to the conductive auxiliary member 91b. Alternatively, it may be adopted that the positive terminal of the variable DC power supply 50 is connected to the upper electrode 34, while the negative terminal is connected to the GND block 91, so that a DC electron current due to application of a DC voltage flows from the GND block 91 to the upper electrode 34. In this case, the conductive auxiliary member is not necessary. FIG. 56 shows such a structure. The structure shown in FIG. 56 includes a connection switching mechanism 57, which is configured to perform connection switching such that, during plasma etching, the negative terminal of the variable DC power supply 50 is connected to the upper electrode 34, while the GND block 91 is connected to the ground line. Further, in this switching, during cleaning, the positive terminal of the variable DC power supply 50 is connected to the upper electrode 34, while the negative terminal is connected to the GND block 91. This connection switching mechanism 57 includes a first switch 57a to switch the connection of the variable DC power supply 50 to the upper electrode 34 between the positive terminal and negative terminal, a second switch 57b to switch the connection of the variable DC power supply 50 to the GND block 91 between the positive terminal and negative terminal, and a third switch 57c to set the positive terminal or negative terminal of the variable DC power supply 50 to be grounded. The first switch 57a and second switch 57b are arranged to form an interlock switch structure. Specifically, when the first switch 57a is connected to the positive terminal of the variable DC power supply 50, the second switch 57b is connected to the negative terminal of the DC power supply. Further, when the first switch 57a is connected to the negative terminal of the variable DC power supply 50, the second switch 57b is set in the OFF state.

Figure 57A:
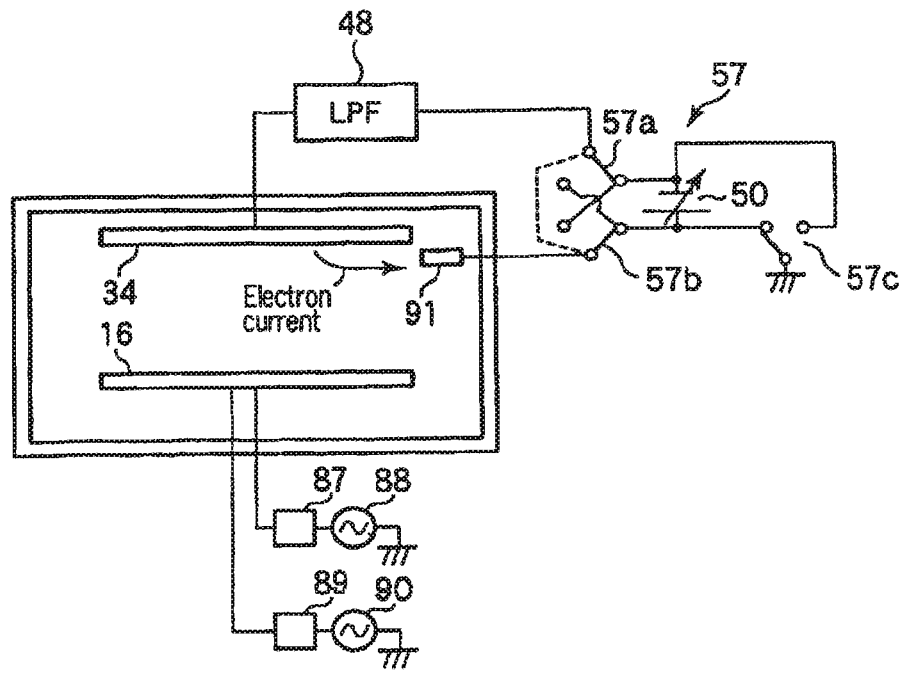
FIGS. 57A and 57B are schematic views showing a state in plasma etching and a state in cleaning, respectively, of the device shown in FIG. 56.

During plasma etching, the structure shown in FIG. 56 is set as shown in FIG. 57A, in which the first switch 57a of the connection switching mechanism 57 is connected to the negative terminal of the variable DC power supply 50, so the negative terminal of the variable DC power supply 50 is connected to the upper electrode 34. Further, the second switch 57b is connected to the positive terminal of the variable DC power supply 50, and the third switch 57c is connected to the positive terminal of the variable DC power supply 50 (the positive terminal of the variable DC power supply 50 is grounded), so that the GND block 91 is connected to the ground line. In this state, the first RF power supply 48 and variable DC power supply 50 are electrically connected to the upper electrode 34, and plasma is thereby generated. At this time, a DC electron current flows from the upper electrode 34 through plasma into the grounded GND block 91 (a positive ion current flows in the opposite direction). In this case, the surface of the GND block 91 may be covered with deposition of $Y_2O_3$ or a polymer, as described above.

Figure 57B:
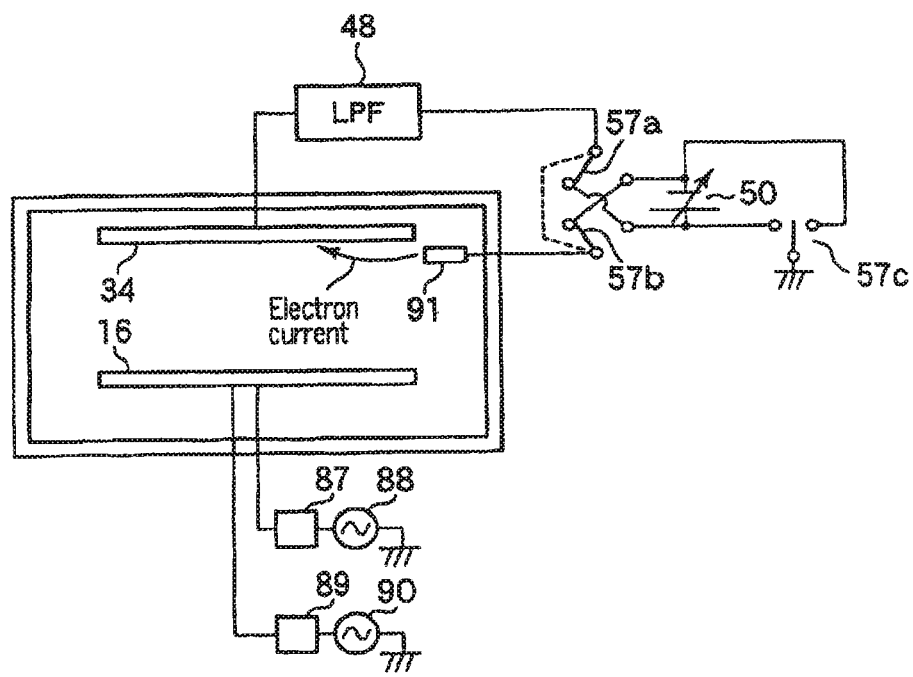

On the other hand, for cleaning, as shown in FIG. 57B, the first switch 57a of the connection switching mechanism 57 is switched to the positive terminal of the variable DC power supply 50, the second switch 57b is switched to the negative terminal of the variable DC power supply 50, and the third switch 57c is set to be in a disconnected state. In this state, the first RF power supply 48 is electrically connected to the upper electrode 34, and cleaning plasma is thereby generated, while a DC voltage is applied to the GND block 91 from the negative terminal of the variable DC power supply 50 and to the upper electrode 34 from the positive terminal of the variable DC power supply 50. Due to the potential difference between these members, a DC electron current flows from the GND block 91 into the upper electrode 34, while positive ions flow into the GND block 91. Accordingly, the DC voltage can be adjusted to control the energy of positive ions incident on the GND block 91, so that the surface of the GND block 91 is sputtered by ions to remove deposition sticking to the surface of the GND block 91. In this case, the variable DC power supply 50 appears to be in a floating state, but, in general, a power supply is provided with a frame ground line, thus is safe.

In the example described above, although the third switch 57c is in the disconnected state, the positive terminal of the variable DC power supply 50 may be kept in the connected state (the positive terminal of the variable DC power supply 50 is grounded). In this state, the first RF power supply 48 is electrically connected to the upper electrode 34, and cleaning plasma is thereby generated, while a DC voltage is applied from the negative terminal of the variable DC power supply 50 to the GND block 91. As a consequence, a DC electron current flows from the GND block 91 into the upper electrode 34 through plasma, while positive ions flow into the GND block 91. Also in this case, the DC voltage can be adjusted to control the energy of positive ions incident on the GND block 91, so that the surface of the GND block 91 is sputtered by ions to remove deposition sticking to the surface of the GND block 91.

In the examples shown in FIGS. 53 and 56, although a DC voltage is applied to the GND block 91 during cleaning, an AC voltage may be alternatively applied. Further, in the example shown in FIG. 53, although the variable DC power supply 50 for applying a DC voltage to the upper electrode is used for applying a voltage to the GND block 91, another power supply may be used for applying the voltage. Furthermore, in the examples shown in FIGS. 53 and 56, although the GND block 91 is grounded during plasma etching, while a negative DC voltage is applied to the GND block 91 during cleaning, this is not limiting. For example, during plasma etching, a negative DC voltage may be applied to the GND block 91. The term, "during cleaning" may be replaced with "during ashing" in the explanation described above. Furthermore, where the variable DC power supply 50 is formed of a bipolar power supply, it does not require any complex switching operation, such as that of the connection switching mechanism 57 described above.

The switching operations of the switching mechanism 53 of the example shown in FIG. 53 and the connection switching mechanism 57 of the example shown in FIG. 56 are performed in accordance with commands sent from the control section 95.

Figure 22:
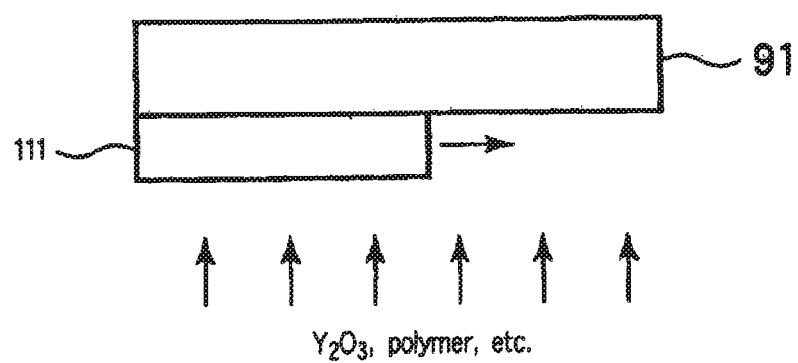
FIG. 22 is a schematic view showing an example of the GND block having a function to prevent it from losing the grounding performance in the sense of DC.
Figure 23:
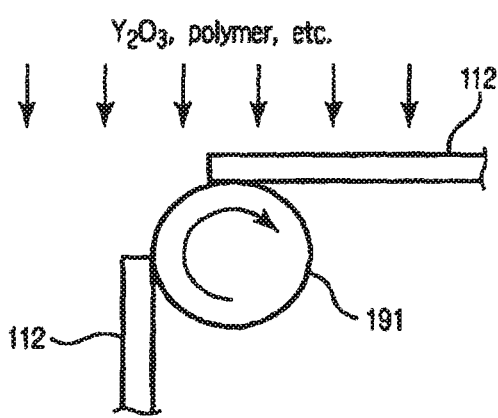
FIG. 23 is a schematic view showing another example of the GND block having a function to prevent it from losing the grounding performance in the sense of DC.

In order to simply prevent the GND block 91 from losing the grounding performance in the sense of DC, due to deposition of $Y_2O_3$ or a polymer on the GND block 91 in plasma generation, it is effective to partly cover the GND block 91 with another member, and to move them relative to each other so as to expose a new surface of the GND block 91. Specifically, as shown in FIG. 22 according to the embodiment 1, it may be adopted that the GND block 91 is set to have a relatively large area, and the surface of the GND block 91 to be in contact with plasma is partly covered with a mask member 111 movable in the arrow direction. This cover plate 111 is movable, so that a portion to be exposed to plasma can be changed on the surface of the GND block 91. In this case, although a driving mechanism disposed in the chamber 10 may cause a problem about particle generation, it cannot be serious because the frequency of use of the driving mechanism is as low as once in 100 hours. Further, for example, as shown in FIG. 23 according to the embodiment 1, it may be effective that a columnar GND block 191 is rotatably disposed, and the outer periphery surface of the GND block 191 is covered with a mask member 112, so that it is partially exposed. Where the GND block 191 is rotated, the portion to be exposed to plasma can be changed. In this case, a driving mechanism may be disposed outside the chamber 10. Each of the mask members 111 and 112 may be formed of a member having a high plasma resistance property, such as an aluminum plate covered with a ceramic, such as $Y_2O_3$, formed by thermal spray.

In order to simply prevent the GND block 91 from losing the grounding performance in the sense of DC due to deposition, it is also effective to partly cover the GND block 91 with another member, which is to be gradually etched by plasma, so that a part of the surface of the GND block 91, which has not lost conductivity, is always exposed. For example, as shown in FIG. 24A according to the embodiment 1, it may be adopted that the surface of the GND block 91 is partly covered with a stepped cover film 113 disposed to leave an initially exposed surface 91c that provides a grounding performance. In this case, after a plasma process is performed for, e.g., 200 hours, the initially exposed surface 91c of the GND block 91 loses conductivity, as shown in FIG. 24B according to the embodiment 1. However, the stepped cover film 113 is designed to have a thin portion such that it has been etched by this time, so that a new exposed surface 91d of the GND block 91 appears. The new exposed surface 91d provides a grounding performance. This cover film 113 has the effect of preventing a wall surface material from being deposited on the GND block 91, as well as the effect of reducing ions incident on the GND block 91 to prevent contamination thereof.

In practical use, as shown in FIG. 25 according to the embodiment 1, it is preferable to use a cover film 113a in which a number of thin layers 114 are stacked while the layers are gradually shifted. In this case, where one layer 114 disappears due to etching by plasma in a time Te, and an exposed surface of the GND block 91 loses conductivity due to contamination in a time Tp, the thickness of the layer 114 is set to satisfy Te<Tp, so that a conductive surface is always ensured on the GND block 91. The number of layers 114 is preferably set to make the service life of the GND block 91 longer than the frequency of maintenance. Further, in order to improve the maintenance performance, one layer 114a is provided with a different color from the others, as shown in FIG. 25, so that it is possible to know the time to replace the GND block 91 with a new one, by this film 114a, for example, when the surface area of this film 114a exceeds a certain value.

Each of the cover films 113 and 113a is preferably formed of a film to be suitably etched by plasma, such as a photo-resist film.

In order to simply prevent the GND block 91 from losing the grounding performance in the sense of DC due to deposition, it may be also adopted to dispose a plurality of GND blocks 91, so that they are switched in turn to exercise a grounding performance. For example, as shown in FIG. 26 according to the embodiment 1, three GND blocks 91 are disposed and only one of them is selectively grounded by a shift switch 115. Further, a current sensor 117 is disposed on a common ground line 116 to monitor a DC current flowing therethrough. The current sensor 117 is used to monitor a current flowing through a grounded GND block 91, and when the current value becomes lower than a predetermined value, it is determined that this GND block 91 cannot exercise the grounding performance, and thus the connection is switched from this one to another GND block 91. The number of GND blocks 91 is suitably selected from a range of about 3 to 10.

In the example described above, a GND block not grounded is in an electrically floating state, but such a GND block may be supplied with an electric potential for protection to protect a GND block in an idle state, in place of use of the shift switch 115. FIG. 27 according to the embodiment 1 shows an example designed in this aspect. As shown in FIG. 27, each of ground lines 118 respectively connected to GND blocks 91 is provided with a variable DC power supply 119. In this case, the voltage of a GND block 91 to exercise a grounding performance is set at 0V by controlling the voltage of the corresponding variable DC power supply 119. Further, the voltage of each of the other GND blocks 91 is set at, e.g., 100V to prevent an electric current from flowing therethrough by controlling the voltage of the corresponding variable DC power supply 119. When the current value detected thereby becomes lower than a predetermined value at the current sensor 117 on the ground line 118 connected to a GND block 91 to exercise a grounding performance, it is determined that this GND block 91 cannot exercise the grounding performance. Accordingly, the voltage of the variable DC power supply 119 corresponding to another GND block 91 is controlled to be a value for this GND block 91 to exercise a grounding performance.

As described above, where the application voltage from a DC power supply 119 is set at a negative value of about −1 kV, the GND block 91 connected thereto can function as an electrode to apply a DC voltage to plasma. However, if this value is too large, the plasma is affected. Further, the voltage applied to the GND block 91 can be controlled to obtain a cleaning effect on the GND block 91.

In this embodiment, the first RF power and second RF power may have frequencies, as follows. Specifically, the frequency of the first RF power may be one of 13.56 MHz, 27 MHz, 40 MHz, 60 MHz, 80 MHz, 100 MHz, and 160 MHz, while the frequency of the second RF power may be one of 380 kHz, 800 kHz, 1 MHz, 2 MHz, 3.2 MHz, and 13.56 MHz. They are suitably combined in accordance with a process to be performed.

The embodiment described above is exemplified by a plasma etching apparatus, but it may be applied to other apparatuses that utilize plasma to process a semiconductor substrate, such as a plasma film formation apparatus.

Embodiment 4

Next, an explanation will be given of an embodiment 4 of the present invention.

Figure 58:
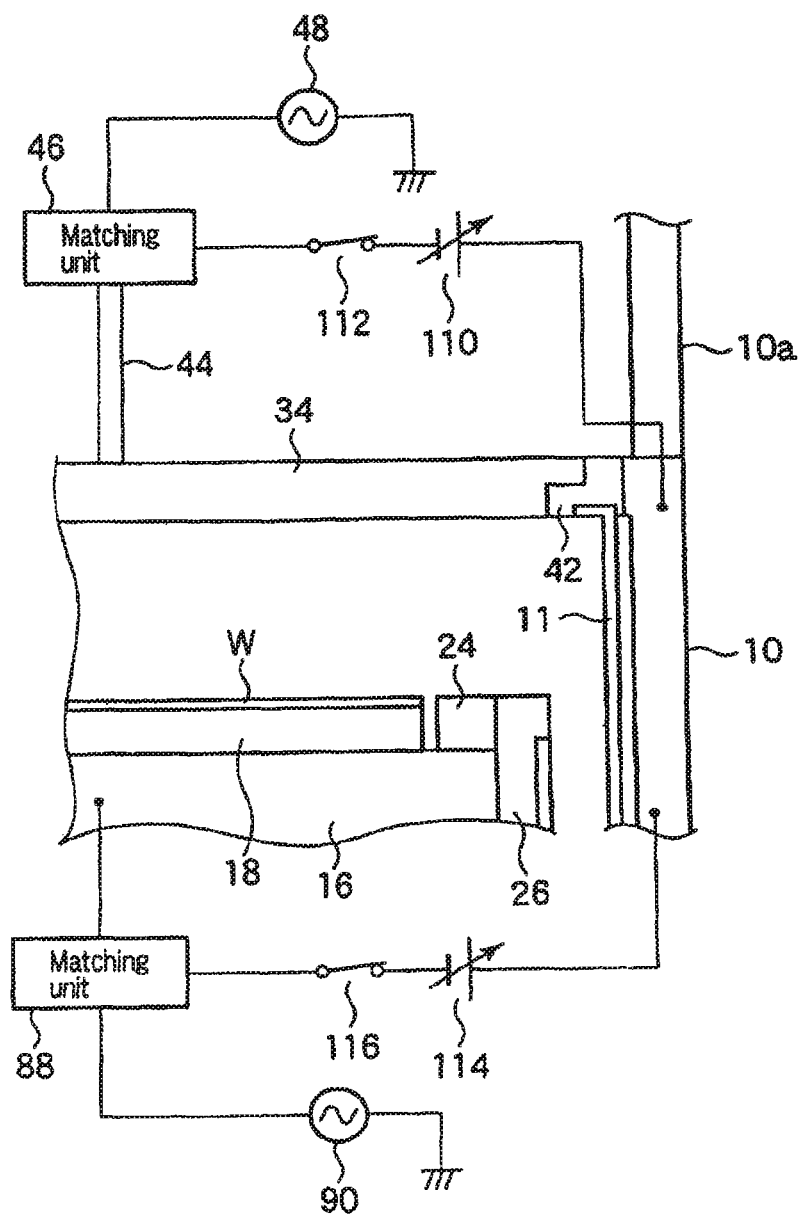
FIG. 58 is a sectional view schematically showing a main portion of a plasma etching apparatus according to an embodiment 4 of the present invention.

FIG. 58 is a sectional view schematically showing a main portion of a plasma etching apparatus according to the embodiment 4 of the present invention. In FIG. 58, the constituent elements common to those in FIG. 1 are denoted by the same reference symbols.

In this embodiment, a variable DC power supply 110 is connected to an upper electrode 34 and a wall of a chamber 10 (ground potential), and a variable DC power supply 114 is connected to a susceptor 16 and the wall of the chamber 10. Specifically, in the variable DC power supply 110, one of the terminals is connected to the upper electrode 34 and the other terminal is connected to the wall of the chamber 10. In the variable DC power supply 114, one of the terminals is connected to the susceptor 16 and the other terminal is connected to the wall of the chamber 10. The variable DC power supplies 110 and 114 are turned on/off by on/off switches 112 and 116, respectively.

The variable DC power supplies 110 and 114, and the on/off switches 112 and 116 are controlled by a controller (not shown). The matching unit 88 includes the same filter as the filter 58 of the matching unit 46, and the variable DC power supply 114 is connected to the susceptor 16 through this filter.

When plasma is generated in the plasma etching apparatus with this structure, as in the embodiment 1, predetermined DC voltages are applied, respectively, from the variable DC power supply 110 to the upper electrode 34, and from the variable DC power supply 114 to the susceptor 16. In this case, since a DC voltage is applied to the upper electrode 34, the same effects as those in the embodiment 1 can be obtained by the DC voltage application. In addition, since a DC voltage is applied to the susceptor 16, the potential difference between the plasma potential and wafer becomes larger, thereby increasing the ion energy to attain a high etching rate. Further, a focus ring 24 around the wafer is electrically connected to the susceptor 16 in the sense of DC, so as to optimize DC application amount to the susceptor 16. As a consequence, the etching rate can be modified to compensate for a decrease at the wafer edge, so as to perform etching with good planar uniformity on the wafer. This brings about an increase in the number of chips produced from one wafer.

In this embodiment, the polarity of the variable DC power supplies 110 and 114 may be reversed. In place of the DC voltages, AC voltages may be applied. The voltages may be pulsed or modulated, such as AM modulation or FM modulation.

Embodiment 5

Next, an explanation will be given of an embodiment 5 of the present invention.

Figure 59:
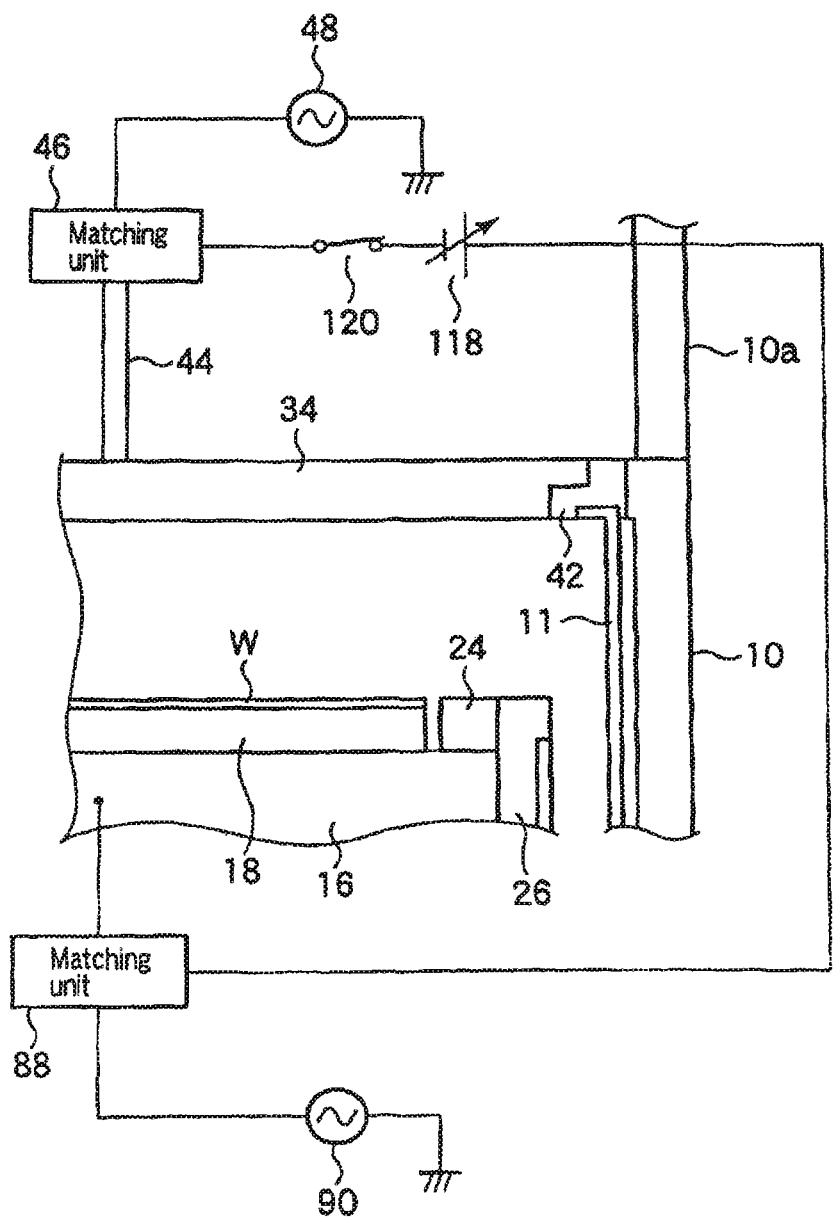
FIG. 59 is a sectional view schematically showing a main portion of a plasma etching apparatus according to an embodiment 5 of the present invention.

FIG. 59 is a sectional view schematically showing a main portion of a plasma etching apparatus according to the embodiment 5 of the present invention. In FIG. 59, the constituent elements common to those in FIG. 1 are denoted by the same reference symbols.

In this embodiment, a variable DC power supply 118 is connected to an upper electrode 34 and a lower electrode or susceptor 16 respectively through filters disposed in matching units 46 and 88. Specifically, in the variable DC power supply 118, one of the terminals is connected to the upper electrode 34 and the other terminal is connected to the lower electrode or susceptor 16. The variable DC power supply 118 is turned on/off by an on/off switch 120. The variable DC power supply 118 and the on/off switch 120 are controlled by a controller (not shown).

When plasma is generated in the plasma etching apparatus with this structure, as in the embodiment 1, a predetermined DC voltage is applied from the variable DC power supply 118 to the upper electrode 34 and the susceptor 16. In this case, since a DC voltage is applied to the upper electrode 34, the same effects as those in the embodiment 1 can be obtained by the DC voltage application. In addition, since an electric field linearly extends from the upper electrode 34 to a wafer W, electrons on the electrode can be efficiency accelerated toward the wafer. Further, since both electrodes are separated from the chamber wall in the sense of DC, the potential difference between the electrodes does not directly influence the plasma potential. As a consequence, it is possible to prevent abnormal electric discharge from being caused at, e.g., the chamber wall. Further, there is no need to provide the chamber wall with a GND block.

In this embodiment, the polarity of the variable DC power supply 118 may be reversed. In place of the DC voltage, an AC voltage may be applied. The voltages may be pulsed or modulated, such as AM modulation or FM modulation.

Embodiment 6

Next, an explanation will be given of an embodiment 6 of the present invention.

Figure 60:
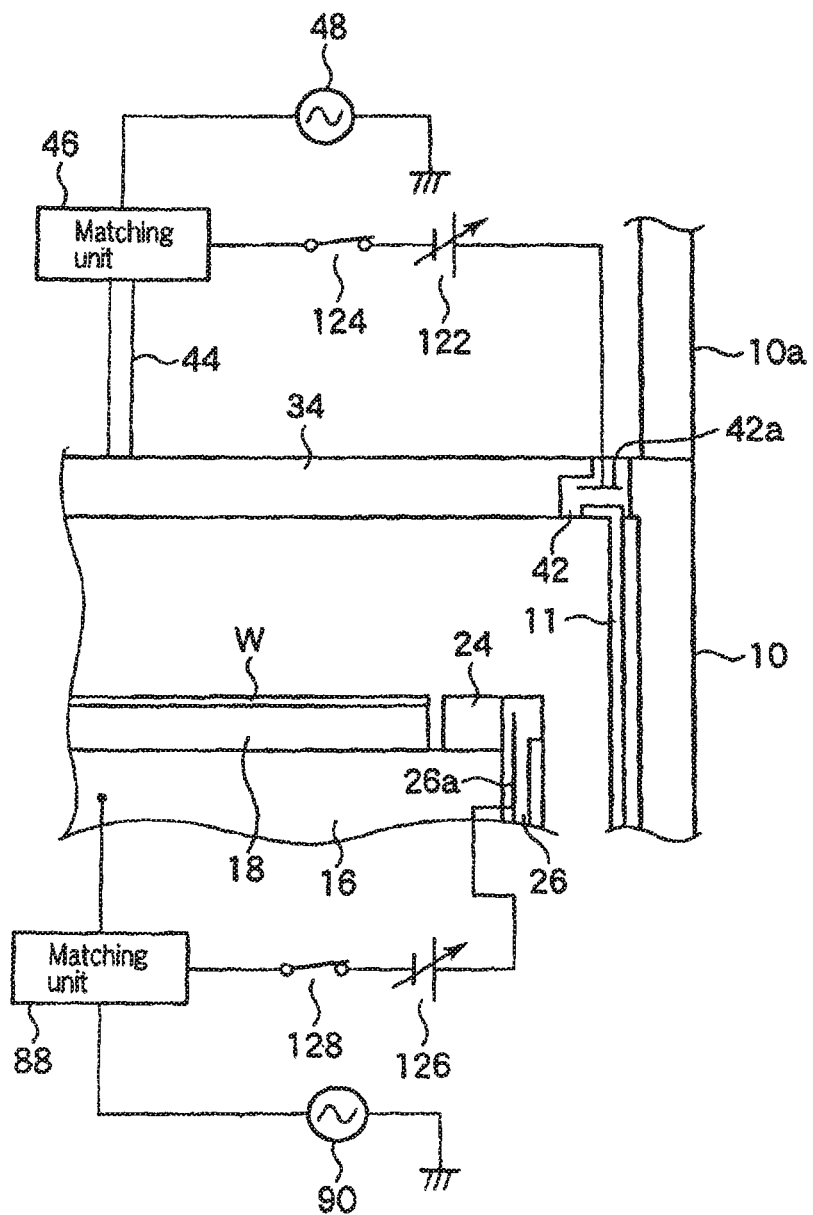
FIG. 60 is a sectional view schematically showing a main portion of a plasma etching apparatus according to an embodiment 6 of the present invention.

FIG. 60 is a sectional view schematically showing a main portion of a plasma etching apparatus according to the embodiment 6 of the present invention. In FIG. 60, the constituent elements common to those in FIG. 1 are denoted by the same reference symbols.

In this embodiment, a conductive body 42a is embedded in an insulating shield member 42, and a variable DC power supply 122 is connected to an upper electrode 34 and the conductive body 42a. Further, a conductive body 26a is embedded in an insulating inner wall member 26, and a variable DC power supply 126 is connected to a susceptor 16 and the conductive body 26a. Specifically, in the variable DC power supply 122, one of the terminals is connected to the upper electrode 34 and the other terminal is connected to the conductive body 42a. In the variable DC power supply 126, one of the terminals is connected to the susceptor 16 and the other terminal is connected to the conductive body 26a. The variable DC power supplies 122 and 126 are turned on/off by on/off switches 124 and 128, respectively.

The variable DC power supplies 122 and 126, and the on/off switches 124 and 128 are controlled by a controller (not shown). The variable DC power supply 126 is connected to the susceptor 16 through a filter disposed in a matching unit 88, as in the embodiment 4.

When plasma is generated in the plasma etching apparatus with this structure, as in the embodiment 1, a predetermined DC voltage is applied from the variable DC power supply 122 to the upper electrode 34 and conductive body 42a. Further, a predetermined DC voltage is applied from the variable DC power supply 126 to the susceptor 16 and conductive body 26a. In this case, since a DC voltage is applied to the upper electrode 34, the same effects as those in the embodiment 1 can be obtained by the DC voltage application. In addition, the application voltage can be optimized, so that ions are accelerated by the difference between the plasma potential and each of potentials penetrating the insulating shield member 42 and inner wall member 26. As a consequence, deposited substances (deposition) are prevented from accumulating on the insulating shield member 42 and insulating inner wall member 26.

In this embodiment, the polarity of the variable DC power supplies 122 and 126 may be reversed. In place of the DC voltages, AC voltages may be applied. The voltages may be pulsed or modulated, such as AM modulation or FM modulation.

Embodiment 7

Next, an explanation will be given of an embodiment 7 of the present invention.

Figure 61:
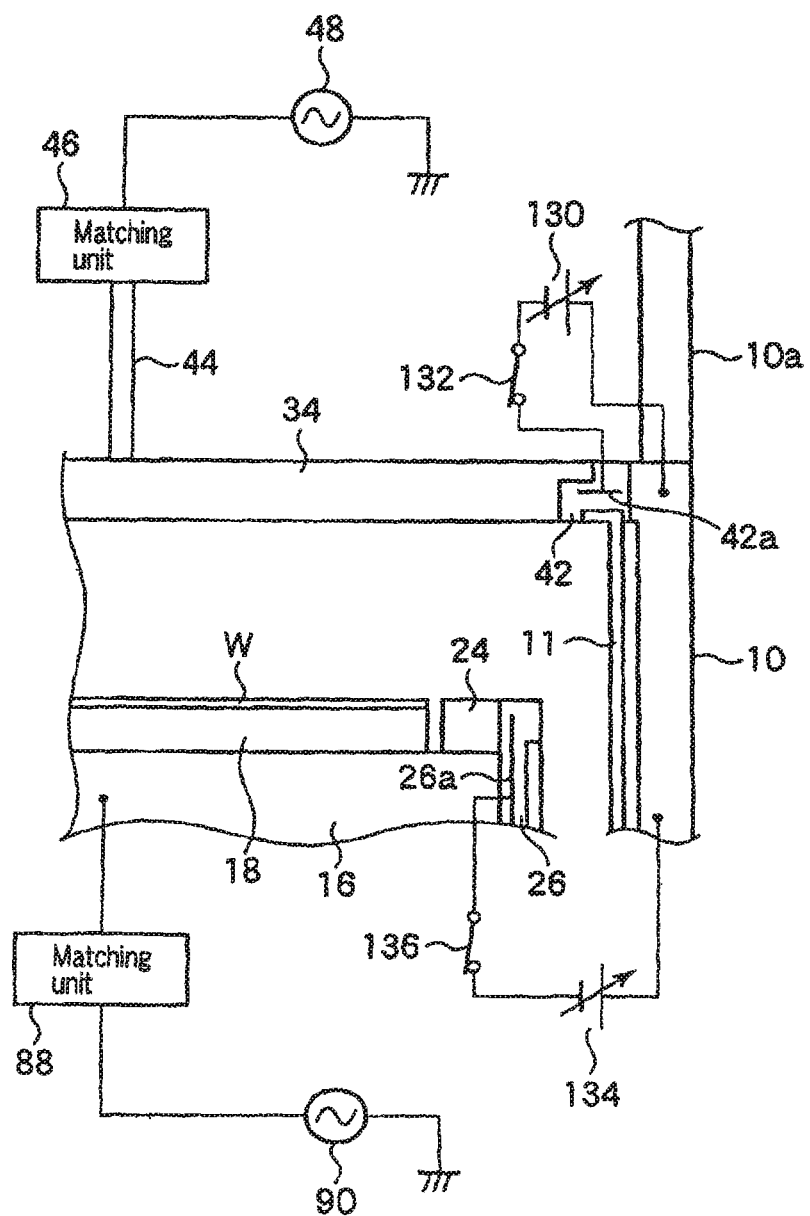
FIG. 61 is a sectional view schematically showing a main portion of a plasma etching apparatus according to an embodiment 7 of the present invention.

FIG. 61 is a sectional view schematically showing a main portion of a plasma etching apparatus according to the embodiment 7 of the present invention. In FIG. 61, the constituent elements common to those in FIGS. 1 and 60 are denoted by the same reference symbols.

In this embodiment, a conductive body 42a is embedded in an insulating shield member 42, and a conductive body 26a is embedded in an insulating inner wall member 26, as in the embodiment 6. A variable DC power supply 130 is connected to the conductive body 42a and the wall of the chamber 10 (ground potential), and a variable DC power supply 134 is connected to the conductive body 26a and the wall of the chamber 10 (ground potential). Specifically, in the variable DC power supply 130, one of the terminals is connected to the conductive body 42a and the other terminal is connected to the wall of the chamber 10. In the variable DC power supply 134, one of the terminals is connected to the conductive body 26a and the other terminal is connected to the wall of the chamber 10. The variable DC power supplies 130 and 134 are turned on/off by on/off switches 132 and 136, respectively. The variable DC power supplies 130 and 134, and the on/off switches 132 and 136 are controlled by a controller (not shown).

When plasma is generated in the plasma etching apparatus with this structure, as in the embodiment 1, a predetermined DC voltage is applied from the variable DC power supply 130 to the conductive body 42a. Further, a predetermined DC voltage is applied from the variable DC power supply 134 to the conductive body 26a. At this time, the application voltage can be optimized to change potentials penetrating the insulating shield member 42 and inner wall member 26, so that an ion acceleration voltage is generated by the difference between the plasma potential and each of these potentials. As a consequence, due to ion energy incident on the insulating shield member 42 and inner wall member 26, deposited substances (deposition) are prevented from accumulating on the insulating shield member 42 and insulating inner wall member 26.

In this embodiment, the polarity of the variable DC power supplies 130 and 134 may be reversed. In place of the DC voltages, AC voltages may be applied. The voltages may be pulsed or modulated, such as AM modulation or FM modulation.

Embodiment 8

Next, an explanation will be given of an embodiment 8 of the present invention.

Figure 62:
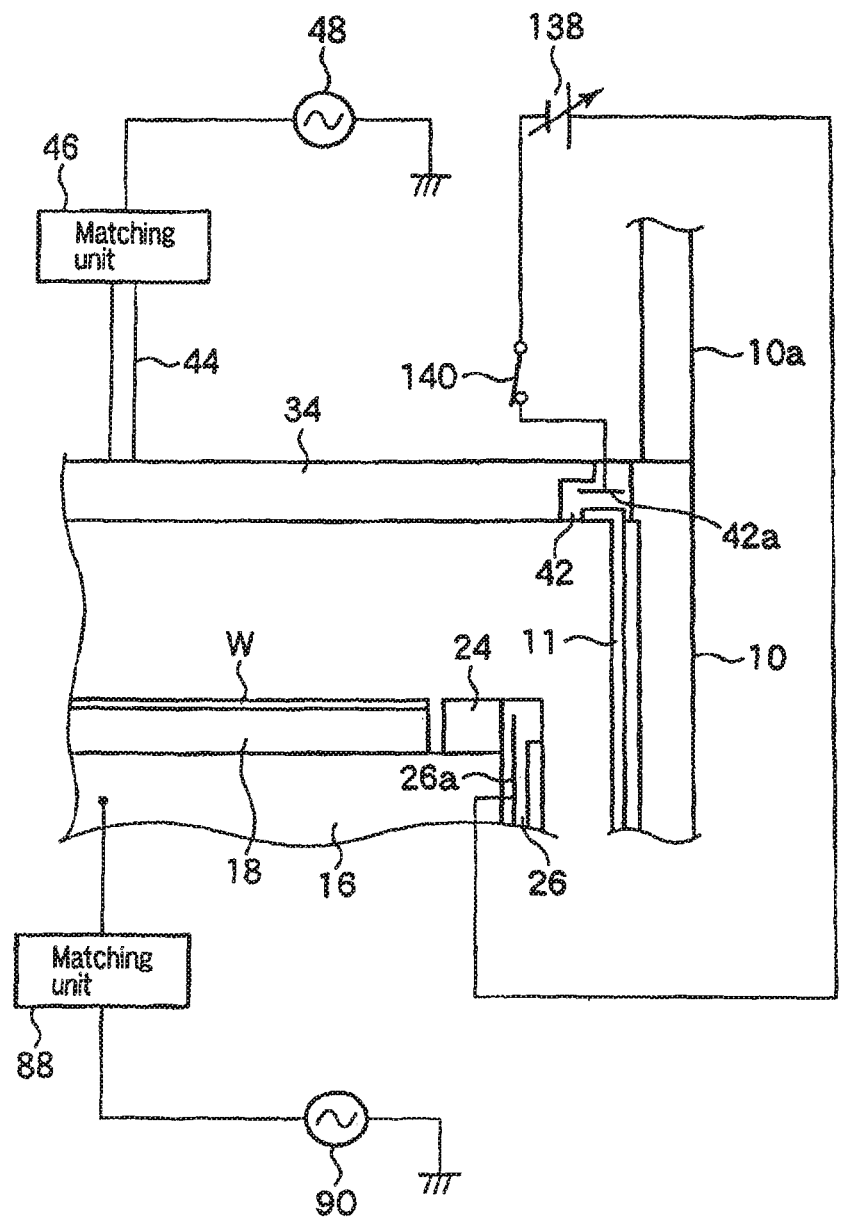
FIG. 62 is a sectional view schematically showing a main portion of a plasma etching apparatus according to an embodiment 8 of the present invention.

FIG. 62 is a sectional view schematically showing a main portion of a plasma etching apparatus according to the embodiment 8 of the present invention. In FIG. 62, the constituent elements common to those in FIGS. 1 and 60 are denoted by the same reference symbols.

In this embodiment, a conductive body 42a is embedded in an insulating shield member 42, and a conductive body 26a is embedded in an insulating inner wall member 26, as in the embodiment 7. A variable DC power supply 138 is connected to the conductive body 42a and the conductive body 26a. Specifically, in the variable DC power supply 138, one of the terminals is connected to the conductive body 42a and the other terminal is connected to the conductive body 26a. The variable DC power supply 138 is turned on/off by an on/off switch 140. The variable DC power supply 138 and the on/off switch 140 are controlled by a controller (not shown).

When plasma is generated in the plasma etching apparatus with this structure, as in the embodiment 1, a predetermined DC voltage is applied from the variable DC power supply 138 to the conductive body 42a and the conductive body 26a. At this time, the application voltage can be optimized to change potentials on the surfaces of the insulating shield member 42 and inner wall member 26, so that ions are accelerated by the difference between the plasma potential and each of these potentials. As a consequence, deposited substances (deposition) are prevented from accumulating on the insulating shield member 42 and insulating inner wall member 26. Further, since the insulating shield member 42 and inner wall member 26 are supplied with opposite polarities, electrons and ions are accelerated toward the electrodes to confine the plasma.

In this embodiment, the polarity of the variable DC power supply 138 may be reversed. In place of the DC voltage, an AC voltage may be applied. The voltages may be pulsed or modulated, such as AM modulation or FM modulation.

Embodiment 9

Next, an explanation will be given of an embodiment 9 of the present invention.

Figure 63:
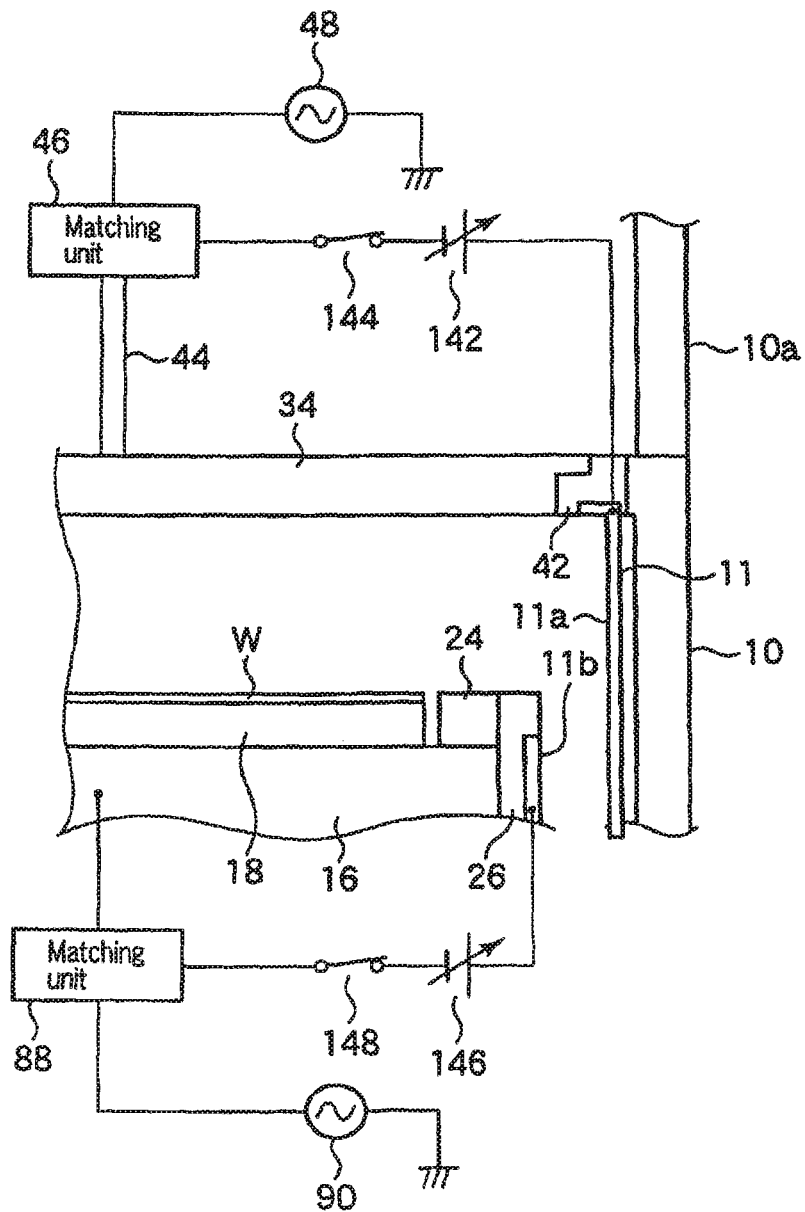
FIG. 63 is a sectional view schematically showing a main portion of a plasma etching apparatus according to an embodiment 9 of the present invention.

FIG. 63 is a sectional view schematically showing a main portion of a plasma etching apparatus according to the embodiment 9 of the present invention. In FIG. 63, the constituent elements common to those in FIG. 1 are denoted by the same reference symbols.

In this embodiment, a deposition shield 11, which is a floating wall, includes a deposition shield 11a and a deposition shield 11b insulated from each other. A variable DC power supply 142 is connected to an upper electrode 34 and the deposition shield 11a. Further, a variable DC power supply 146 is connected to a lower electrode or susceptor 16 and the deposition shield 11b. Specifically, in the variable DC power supply 142, one of the terminals is connected to the upper electrode 34 and the other terminal is connected to the deposition shield 11a. In the variable DC power supply 146, one of the terminals is connected to the susceptor 16 and the other terminal is connected to the deposition shield 11b. The variable DC power supplies 142 and 146 are turned on/off by on/off switches 144 and 148, respectively.

The variable DC power supplies 142 and 146, and the on/off switches 144 and 148 are controlled by a controller (not shown). The variable DC power supply 146 is connected to the susceptor 16 through a filter disposed in a matching unit 88, as in the embodiment 4.

When plasma is generated in the plasma etching apparatus with this structure, as in the embodiment 1, a predetermined DC voltage is applied from the variable DC power supply 142 to the upper electrode 34 and deposition shield 11a. Further, a predetermined DC voltage is applied from the variable DC power supply 146 to the susceptor 16 and deposition shield 11b. In this case, since a DC voltage is applied to the upper electrode 34, the same effects as those in the embodiment 1 can be obtained by the DC voltage application. Further, since the deposition shield 11, upper electrode 34, and lower electrode or susceptor 16 are separated from the ground, the potential difference between the deposition shield 11 and upper electrode 34, and the potential difference between the deposition shield 11 and susceptor 16 are naturally determined by the application voltage values. Accordingly, it is possible to obtain the effect of preventing arc discharge without exposing a grounded portion to the plasma. In addition, ions are accelerated by the potential difference between them, so that deposited substances (deposition) are prevented from accumulating on the deposition shield 11. Furthermore, the effect of confining the plasma can be obtained by optimizing the potential directions and voltages to form a potential difference in the exhaust space.

In this embodiment, the polarity of the variable DC power supplies 142 and 146 may be reversed. In place of the DC voltages, AC voltages may be applied. The voltages may be pulsed or modulated, such as AM modulation or FM modulation.

Embodiment 10

Next, an explanation will be given of an embodiment 10 of the present invention.

Figure 64:
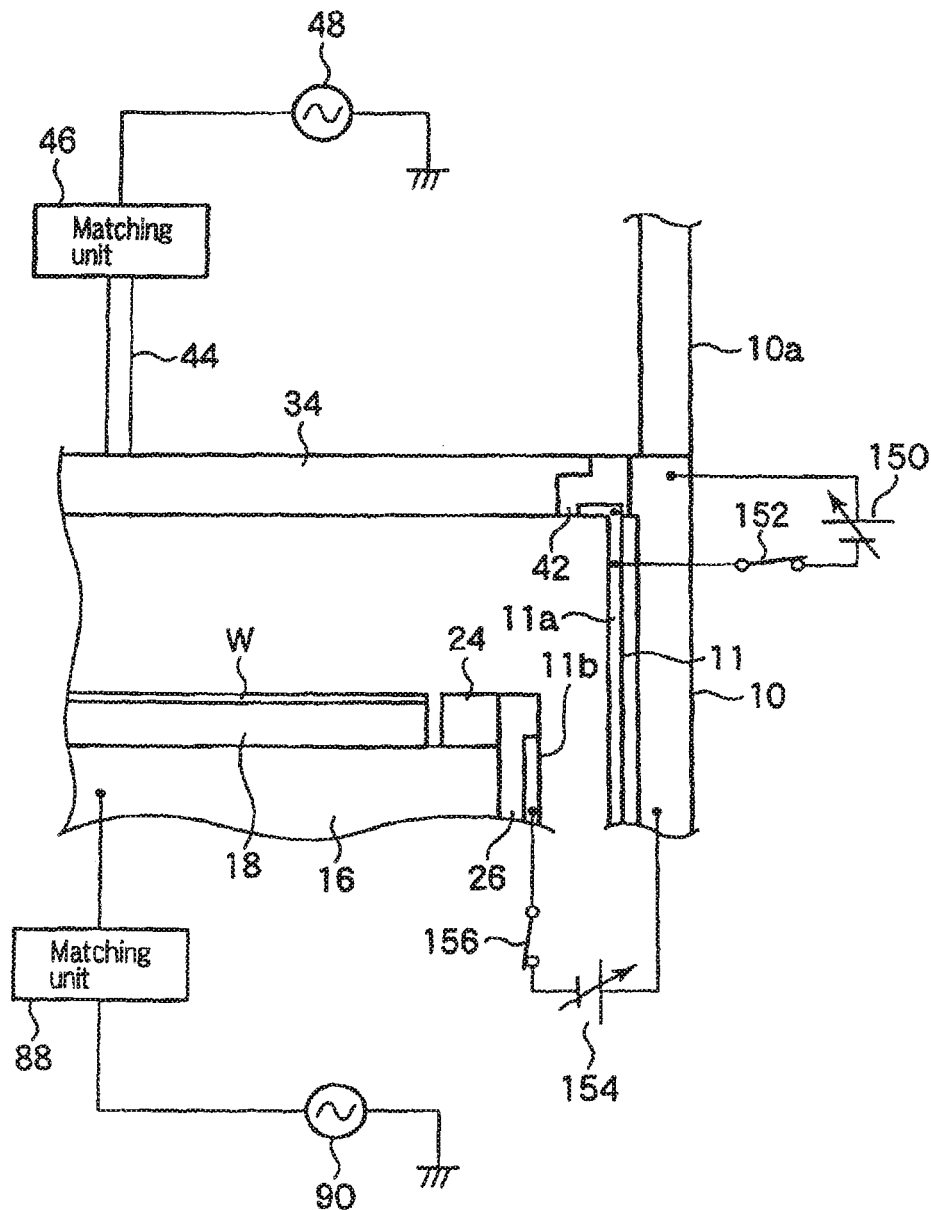
FIG. 64 is a sectional view schematically showing a main portion of a plasma etching apparatus according to an embodiment 10 of the present invention.

FIG. 64 is a sectional view schematically showing a main portion of a plasma etching apparatus according to the embodiment 10 of the present invention. In FIG. 64, the constituent elements common to those in FIGS. 1 and 63 are denoted by the same reference symbols.

In this embodiment, a deposition shield 11, which is a floating wall, includes a deposition shield 11a and a deposition shield 11b insulated from each other, as in the embodiment 9. A variable DC power supply 150 is connected to the deposition shield 11a and the wall of the chamber 10, and a variable DC power supply 154 is connected to the deposition shield 11b and the wall of the chamber 10. Specifically, in the variable DC power supply 150, one of the terminals is connected to the deposition shield 11a and the other terminal is connected to the wall of the chamber 10. In the variable DC power supply 154, one of the terminals is connected to the deposition shield 11b and the other terminal is connected to the wall of the chamber 10. The variable DC power supplies 150 and 154 are turned on/off by on/off switches 152 and 156, respectively. The variable DC power supplies 150 and 154, and the on/off switches 152 and 156 are controlled by a controller (not shown).

When plasma is generated in the plasma etching apparatus with this structure, as in the embodiment 1, a predetermined DC voltage is applied from the variable DC power supply 150 to the deposition shield 11a, which is a floating wall, and the wall of the chamber 10, which is a grounded wall. Further, a predetermined DC voltage is applied from the variable DC power supply 154 to the deposition shield 11b, which is a floating wall, and the wall of the chamber 10, which is a grounded wall. In this case, the deposition shield 11 is supplied with an optimum potential to obtain an ion acceleration voltage, so that deposited substances (deposition) are prevented from accumulating on the deposition shield 11. Further, the voltages applied to the outer deposition shield 11a and inner deposition shield 11b are optimized to prevent electrons from spreading, so that the effect of confining the plasma can be obtained. In the example shown in FIG. 64, an electric field is applied in a lateral direction to prevent the plasma from expanding downward.

In this embodiment, the polarity of the variable DC power supplies 150 and 154 may be reversed. In place of the DC voltages, AC voltages may be applied. The voltages may be pulsed or modulated, such as AM modulation or FM modulation.

Embodiment 11

Next, an explanation will be given of an embodiment 11 of the present invention.

Figure 65:
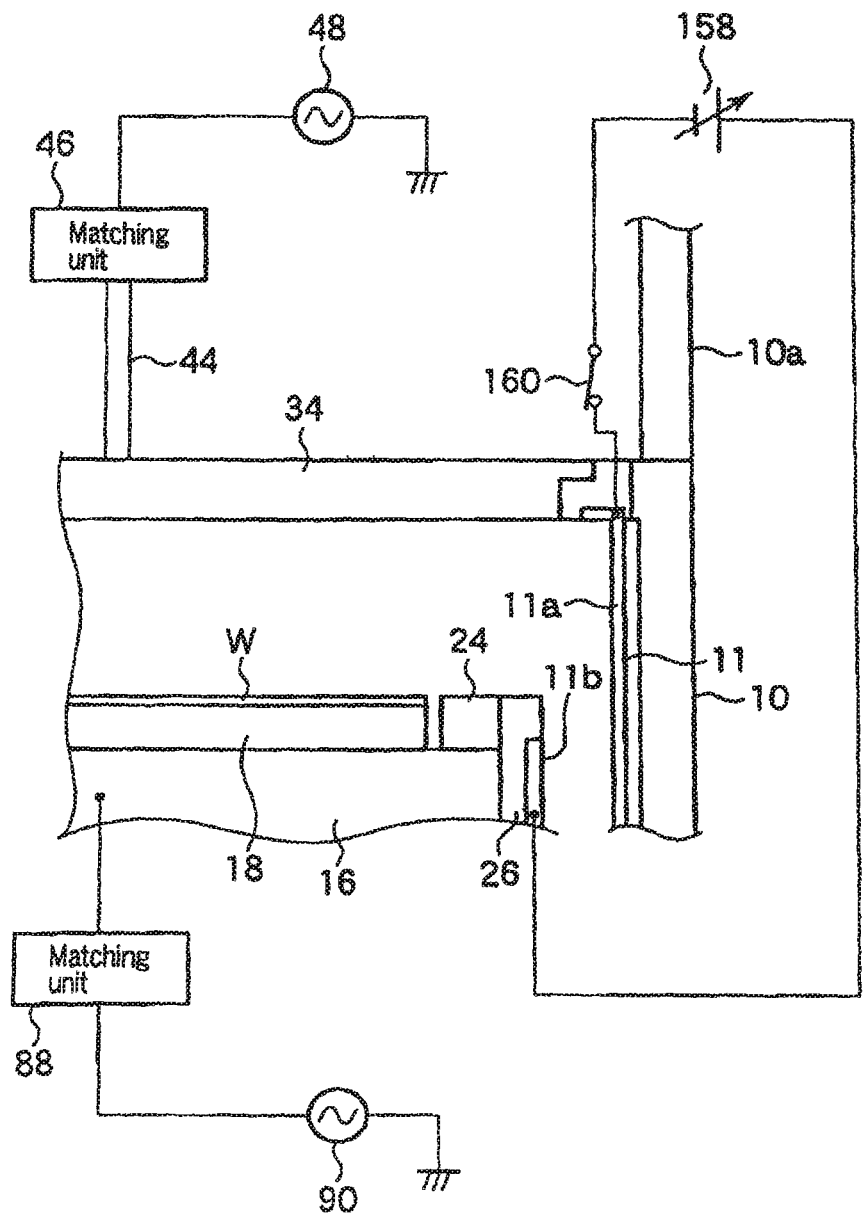
FIG. 65 is a sectional view schematically showing a main portion of a plasma etching apparatus according to an embodiment 11 of the present invention.

FIG. 65 is a sectional view schematically showing a main portion of a plasma etching apparatus according to the embodiment 11 of the present invention. In FIG. 65, the constituent elements common to those in FIGS. 1 and 63 are denoted by the same reference symbols.

In this embodiment, a deposition shield 11, which is a floating wall, includes a deposition shield 11a and a deposition shield 11b insulated from each other, as in the embodiment 9. A variable DC power supply 158 is connected to the deposition shield 11a and the deposition shield 11b. Specifically, in the variable DC power supply 158, one of the terminals is connected to the deposition shield 11a and the other terminal is connected to the deposition shield 11b. The variable DC power supply 158 is turned on/off by an on/off switch 160. The variable DC power supply 158 and the on/off switch 160 are controlled by a controller (not shown).

When plasma is generated in the plasma etching apparatus with this structure, as in the embodiment 1, a predetermined DC voltage is applied from the variable DC power supply 158 to the deposition shield 11a and the deposition shield 11b. At this time, a potential difference is formed between the two or more deposition shields to accelerate ions, so that deposited substances (deposition) are prevented from accumulating on the insulating shield member 42 and insulating inner wall member 26. Further, an electric field is applied in a direction perpendicular to the exhaust direction, so that ions and electrons are caused to collide with the deposition shield and are thereby extinguished, i.e., the effect of confining the plasma can be obtained in other words.

In this embodiment, the polarity of the variable DC power supply 158 may be reversed. In place of the DC voltage, an AC voltage may be applied. The voltages may be pulsed or modulated, such as AM modulation or FM modulation.

Embodiment 12

Next, an explanation will be given of an embodiment 12 of the present invention.

Figure 66:
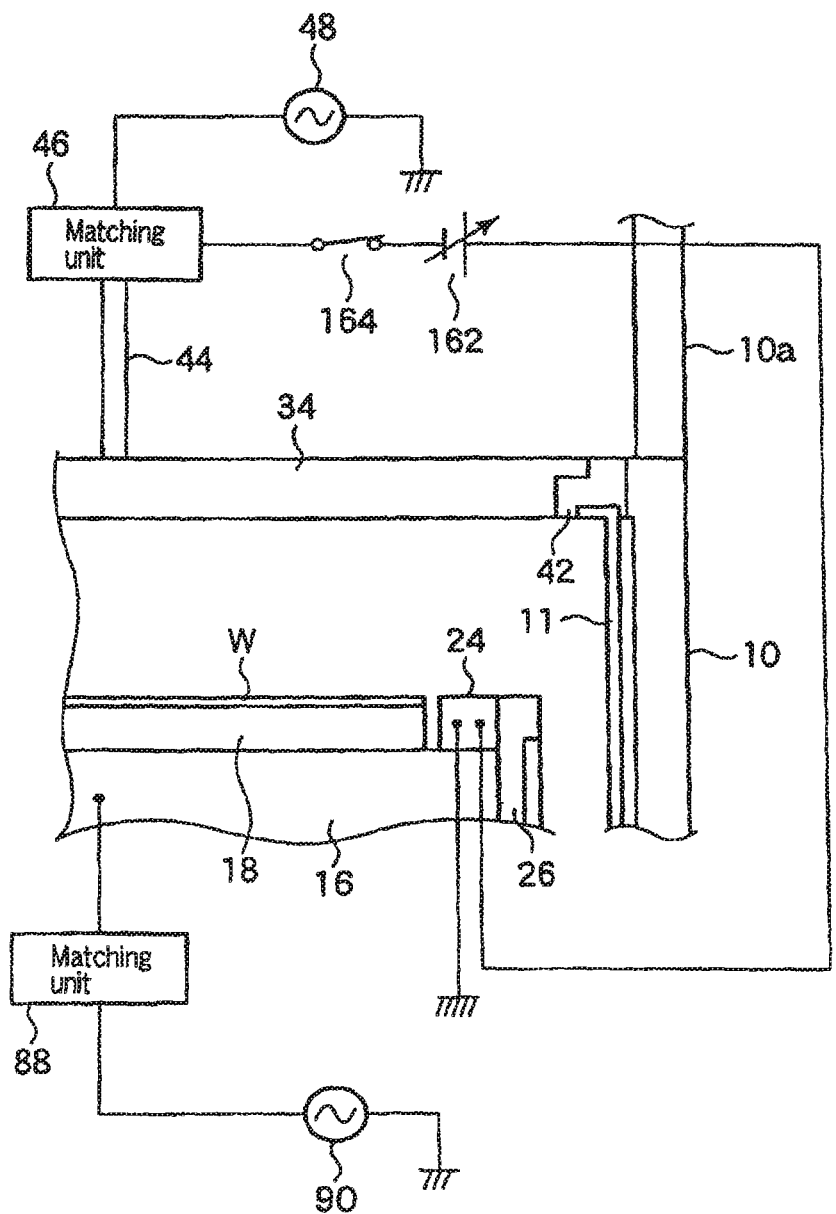
FIG. 66 is a sectional view schematically showing a main portion of a plasma etching apparatus according to an embodiment 12 of the present invention.

FIG. 66 is a sectional view schematically showing a main portion of a plasma etching apparatus according to the embodiment 12 of the present invention. In FIG. 66, the constituent elements common to those in FIG. 1 are denoted by the same reference symbols.

In this embodiment, a variable DC power supply 162 is connected to an upper electrode 34 and a conductive focus ring (correction ring) 24. Specifically, in the variable DC power supply 162, one of the terminals is connected to the upper electrode 34 and the other terminal is connected to the focus ring 24 placed on a lower electrode or susceptor 16. The variable DC power supply 162 is turned on/off by an on/off switch 164. The variable DC power supply 162 and the on/off switch 164 are controlled by a controller (not shown). The conductive focus ring 24 is electrically grounded.

When plasma is generated in the plasma etching apparatus with this structure, as in the embodiment 1, a predetermined DC voltage is applied from the variable DC power supply 162 to the upper electrode 34 and the focus ring 24. In this case, since a DC voltage is applied to the upper electrode 34, the same effects as those in the embodiment 1 can be obtained by the DC voltage application. In addition, a predetermined voltage can be applied to perform etching with good planar uniformity on a wafer.

In this embodiment, the polarity of the variable DC power supply 162 may be reversed. In place of the DC voltage, an AC voltage may be applied. The voltages may be pulsed or modulated, such as AM modulation or FM modulation.

Embodiment 13

Next, an explanation will be given of an embodiment 13 of the present invention.

Figure 67:
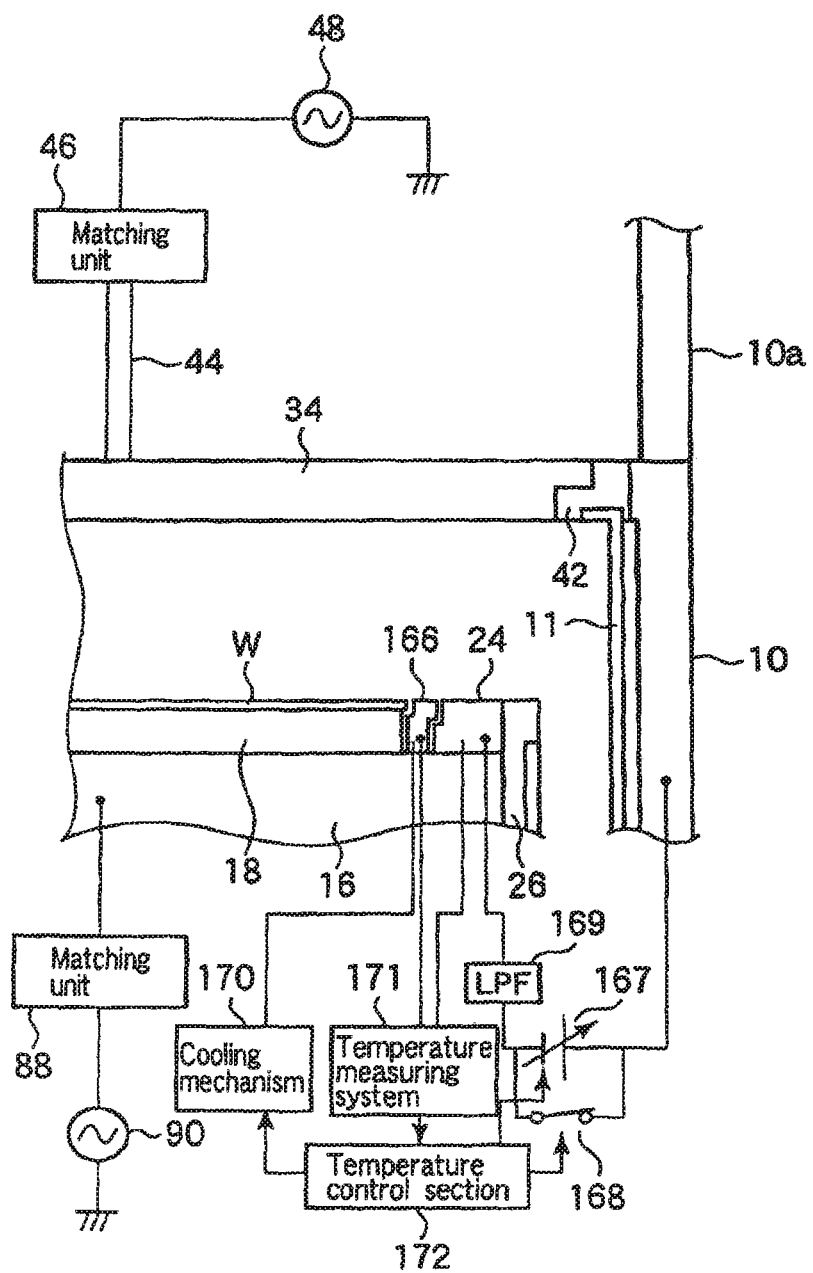
FIG. 67 is a sectional view schematically showing a main portion of a plasma etching apparatus according to an embodiment 13 of the present invention.

FIG. 67 is a sectional view schematically showing a main portion of a plasma etching apparatus according to the embodiment 13 of the present invention. In FIG. 67, the constituent elements common to those in FIG. 1 are denoted by the same reference symbols.

In this embodiment, a cooling ring 166 is disposed between a correction ring or focus ring 24 and an electrostatic chuck 18, at a position adjacent to a wafer W. A variable DC power supply 167 is connected to the focus ring 24 and the wall of a chamber 10. Specifically, in the variable DC power supply 167, one of the terminals is connected to the focus ring 24 and the other terminal is connected to the wall of the chamber 10. A low-pass filter (LPF) 169 is disposed on a feed line connecting the power supply 167 to the focus ring 24. A switch 168 is connected in parallel with the variable DC power supply 167. The cooling ring 166 is cooled by a cooling mechanism 170. The temperature of the cooling ring 166 and focus ring 24 is measured by a temperature measuring system 171. A temperature control section 172 is configured to receive a signal from the temperature measuring system 171, and to output control signals to the cooling mechanism 170, variable DC power supply 167, and switch 168. As a consequence, the temperature of the cooling ring 166 and focus ring 24 can be controlled. For example, the cooling mechanism may have a structure in which a heat transfer gas, such as He gas, is supplied to a position between the cooling ring 166 and susceptor. In this case, the supply pressure of the heat transfer gas is adjusted to change the transfer rate of cold from a cooling medium circulating within the susceptor 16, so as to control the temperature of the cooling ring.

When plasma is generated in the plasma etching apparatus with this structure, as in the embodiment 1, the edge portion of the wafer W is cooled by the cooling ring 166, so that the edge portion suffers less deposition. Further, a DC voltage is applied to the focus ring 24, so that the etching characteristics are prevented from being deteriorated due to decrease in the temperature.

A detailed explanation will be given of this structure.

Figure 68:
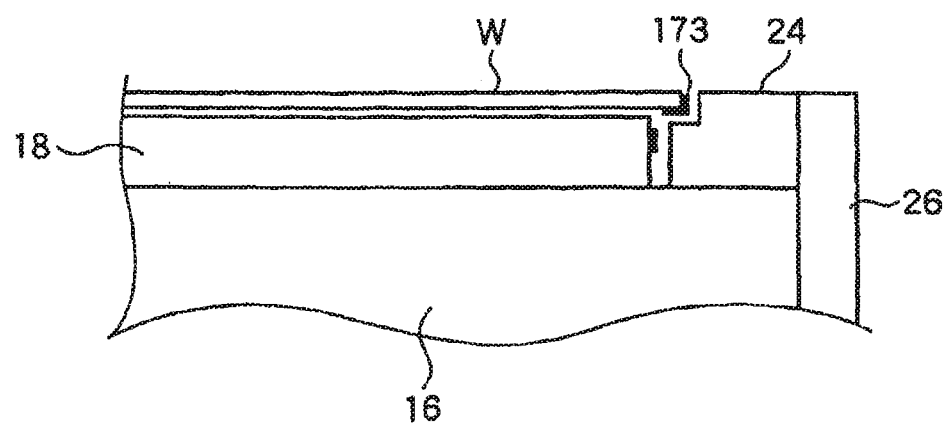
FIG. 68 is a sectional view schematically showing a main portion of a conventional plasma etching apparatus, selected for comparison with the plasma etching apparatus according to the embodiment 13 of the present invention.

In general, plasma processing apparatuses include a focus ring 24 around and adjacent to a wafer W, as shown in FIG. 68. During a plasma process, the temperature of the focus ring 24 increases, and deposition 173 sticks to the edge portion and bottom of the wafer W. Where the focus ring 24 is cooled to prevent deposition from sticking, some etching characteristics (particularly, resist etching rate) are deteriorated, in spite of decrease in deposition, i.e., there is a trade-off relationship between the deposition and etching characteristics.

In this respect, according to this embodiment, the cooling ring 166 is cooled to a temperature lower than the wafer W, and thus deposition sticks to the cooling ring 166 in place of the edge portion of the wafer W, so that the edge portion and bottom of the wafer W can suffer less deposition. On the other hand, a DC voltage is applied to the focus ring 24, and thus the temperature of the focus ring 24 increases. As a consequence, the temperature of the space near the wafer edge is prevented from being lowered by the cooling ring 166, so that the etching characteristics are prevented from being deteriorated.

Figure 69:
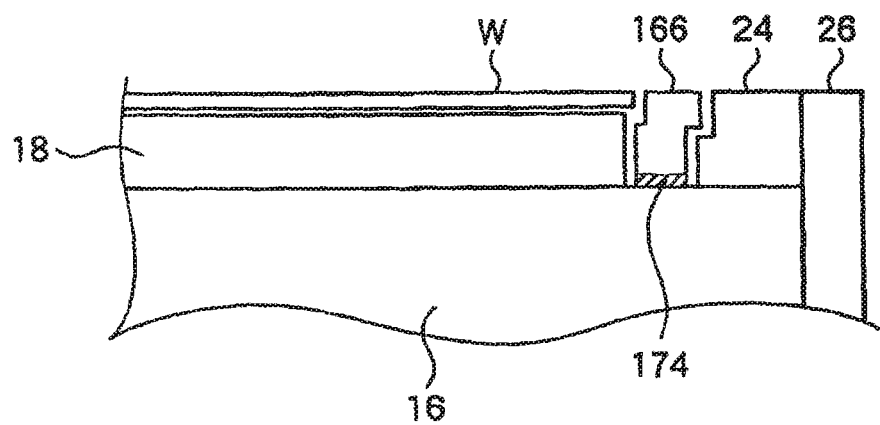
FIG. 69 is a sectional view schematically showing a main portion of a modification of the plasma etching apparatus according to the embodiment 13 of the present invention.
Figure 70:
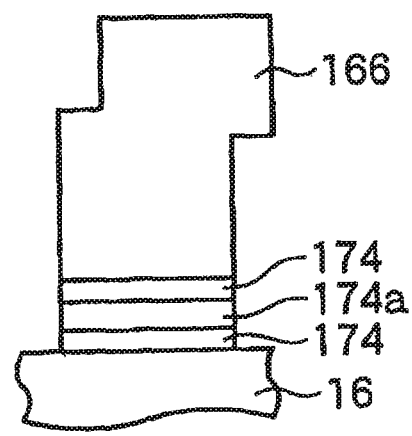
FIG. 70 is a sectional view schematically showing a main portion of another modification of the plasma etching apparatus according to the embodiment 13 of the present invention.

In this embodiment, the temperature control is not necessarily required, as long as the temperature of the cooling ring 166 is lower than that of the edge portion of the wafer W. Alternatively, only the temperature of the focus ring 24 may be measured and controlled. Accordingly, as shown in FIG. 69, a body with high thermal conductivity, such as a silicone rubber member 174, may be disposed between the cooling ring 166 and susceptor 16 for the cooling member 166 to be more easily cooled. If possible, as shown in FIG. 70, this structure is preferably arranged such that silicone rubber members 174 are disposed to sandwich a member 174a made of a dielectric body, such as AlN, that does not easily transmit an RF power but easily transmits heat. In this case, the cooling ring 166 is least affected by heating due to an RF power to perform the cooling better.

Figure 71:
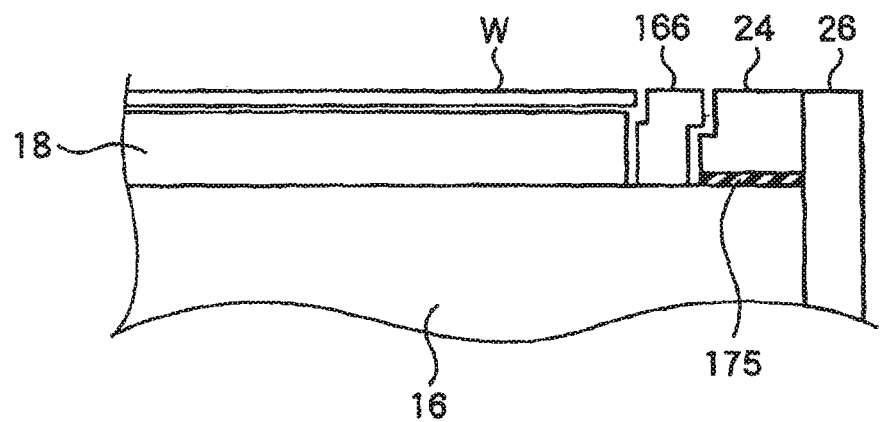
FIG. 71 is a sectional view schematically showing a main portion of another modification of the plasma etching apparatus according to the embodiment 13 of the present invention.

Further, as shown in FIG. 71, the focus ring 24 and susceptor 16 may be insulated from each other by an insulating member 175, so that a DC voltage is applied to the focus ring 24 without being affected by an RF power. In this case, the low-pass filter (LPF) 169 may be omitted.

Figure 72:
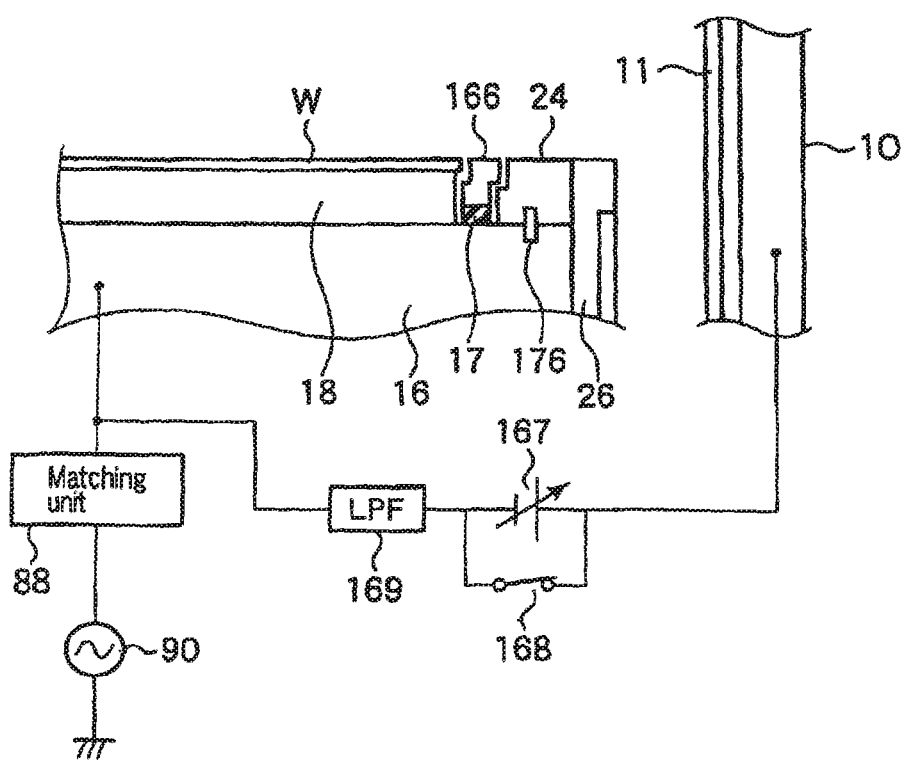
FIG. 72 is a sectional view schematically showing a main portion of another modification of the plasma etching apparatus according to the embodiment 13 of the present invention.

Further, as shown in FIG. 72, a DC voltage may be applied to the focus ring 24 through the susceptor 16. In this case, the focus ring 24 is electrically connected to the susceptor 16 by, e.g., contact pins 176, so that a DC voltage is applied to the susceptor 16 through the feed line of the RF power supply 90. If a temperature increase due to an RF power applied through the susceptor 16 is not negligible, a dielectric body member 17 may be disposed between the cooling ring 166 and susceptor 16, as shown in FIG. 72. In this case, an RF power to the cooling ring 166 is cut off, and thus the temperature thereof is prevented from increasing.

Figure 73:
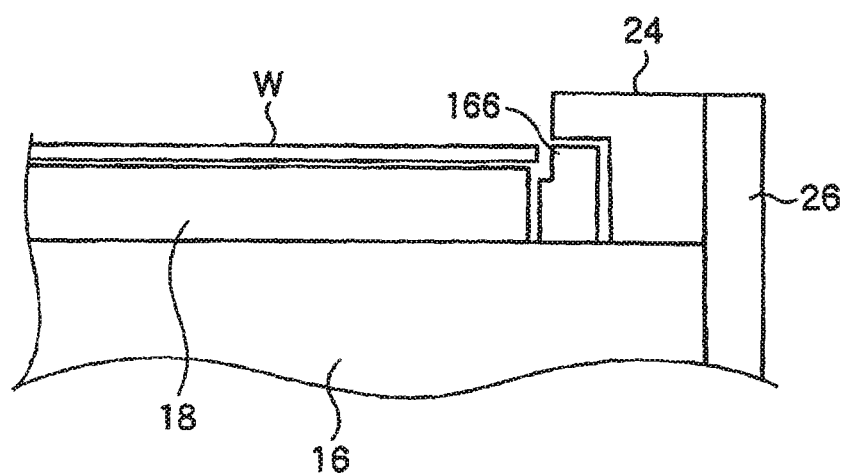
FIG. 73 is a sectional view schematically showing a main portion of another modification of the plasma etching apparatus according to the embodiment 13 of the present invention.

Furthermore, as shown in FIG. 73, a focus ring 24 may be disposed above a cooling ring 166.

In this embodiment, the polarity of the DC voltage applied to the focus ring 24 may be reversed. In place of the DC voltage, an AC voltage may be applied. The voltages may be pulsed or modulated, such as AM modulation or FM modulation. Further, if deterioration in etching characteristics is acceptable, the cooling ring 166 may be disposed without any voltage application to the focus ring 24 to obtain some of the effects described above.

Embodiment 14

Next, an explanation will be given of an embodiment 14 of the present invention.

Figure 74:
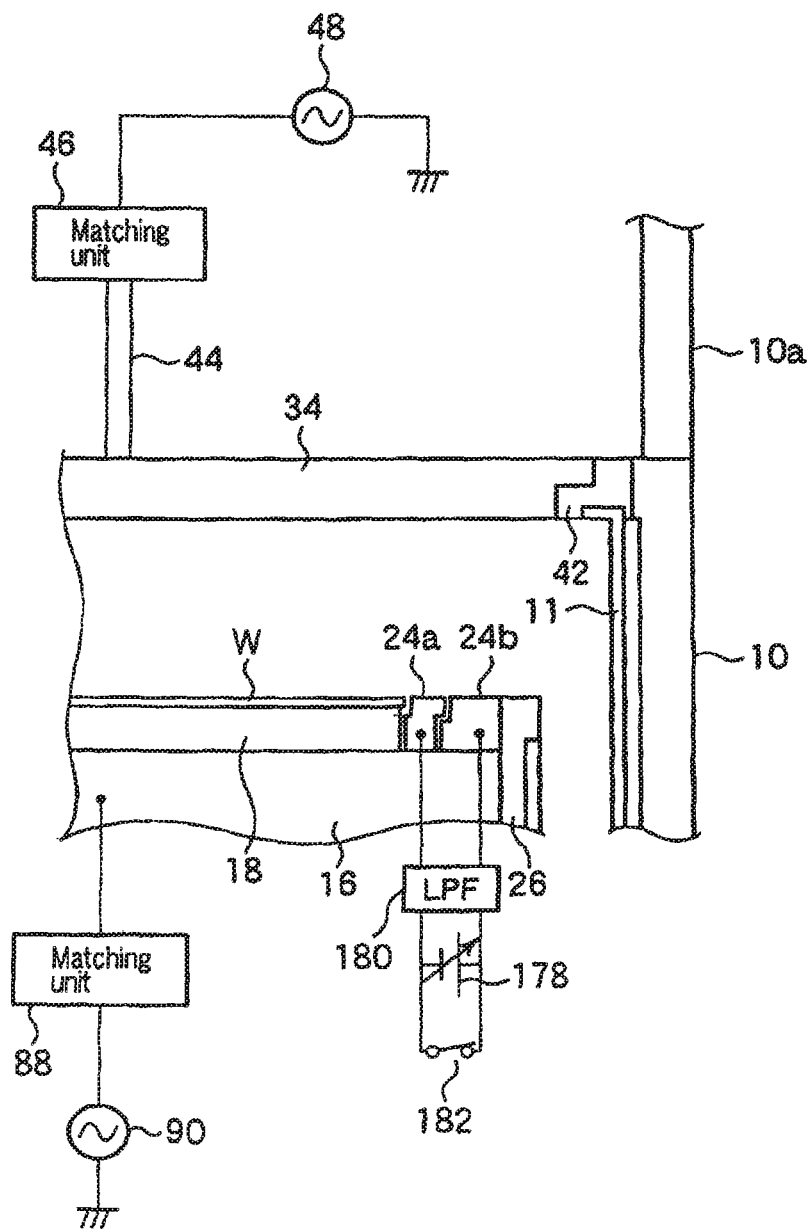
FIG. 74 is a sectional view schematically showing a main portion of a plasma etching apparatus according to an embodiment 14 of the present invention.

FIG. 74 is a sectional view schematically showing a main portion of a plasma etching apparatus according to the embodiment 14 of the present invention. In FIG. 74, the constituent elements common to those in FIG. 1 are denoted by the same reference symbols.

In this embodiment, a correction ring or focus ring is formed of a first focus ring 24a on the inner side adjacent to an electrostatic chuck 18, and a second focus ring 24b on the outer side. A variable DC power supply 178 is connected to the first focus ring 24a and the second focus ring 24b.

Specifically, in the variable DC power supply 178, one of the terminals is connected to the first focus ring 24a and the other terminal is connected to the second focus ring 24b. A low-pass filter (LPF) 180 is disposed on a feed line extending from the power supply 178. A switch 182 is connected in parallel with the variable DC power supply 178.

When plasma is generated in the plasma etching apparatus with this structure, as in the embodiment 1, a DC voltage is applied from the variable DC power supply 178 to the first focus ring 24a on the inner side and the second focus ring 24b on the outer side. At this time, the potentials (voltage directions) applied to the first focus ring 24a on the inner side and the second focus ring 24b on the outer side are different, and the values thereof are variable. Accordingly, plasma can be controlled around a wafer W, so that the process characteristics are prevented from being deteriorated at the edge portion of the wafer W. For example, it is possible to prevent decrease in etching rate and deflection in etching shape at the edge portion of the wafer W.

In the plasma etching apparatus according to this embodiment, a cooling mechanism such as that shown in the embodiment 13 may be disposed to cool the first focus ring 24a. In this case, the first focus ring 24a functions as a cooling ring, so that the edge portion and bottom of the wafer W can suffer less deposition. Further, the temperature of the first and second focus rings 24a and 24b may be measured as in the embodiment 13. In this case, the voltage and polarity of the variable DC power supply can be controlled by a temperature control section to set the temperature at a predetermined value, as in the embodiment 13. Where a cooling mechanism is used, cooling of the first focus ring 24a may be controlled.

Further, as shown in FIG. 75, a first focus ring 24a and a second focus ring 24b may be disposed on the lower and upper sides, respectively, near the edge portion of the wafer W. This arrangement can provide the same effects as those described above.

In this embodiment, the polarity of the DC voltage applied to the first and second focus rings 24a and 24b may be reversed. In place of the DC voltage, an AC voltage may be applied. The voltages may be pulsed or modulated, such as AM modulation or FM modulation.

Embodiment 15

Next, an explanation will be given of an embodiment 15 of the present invention.

Figure 76:
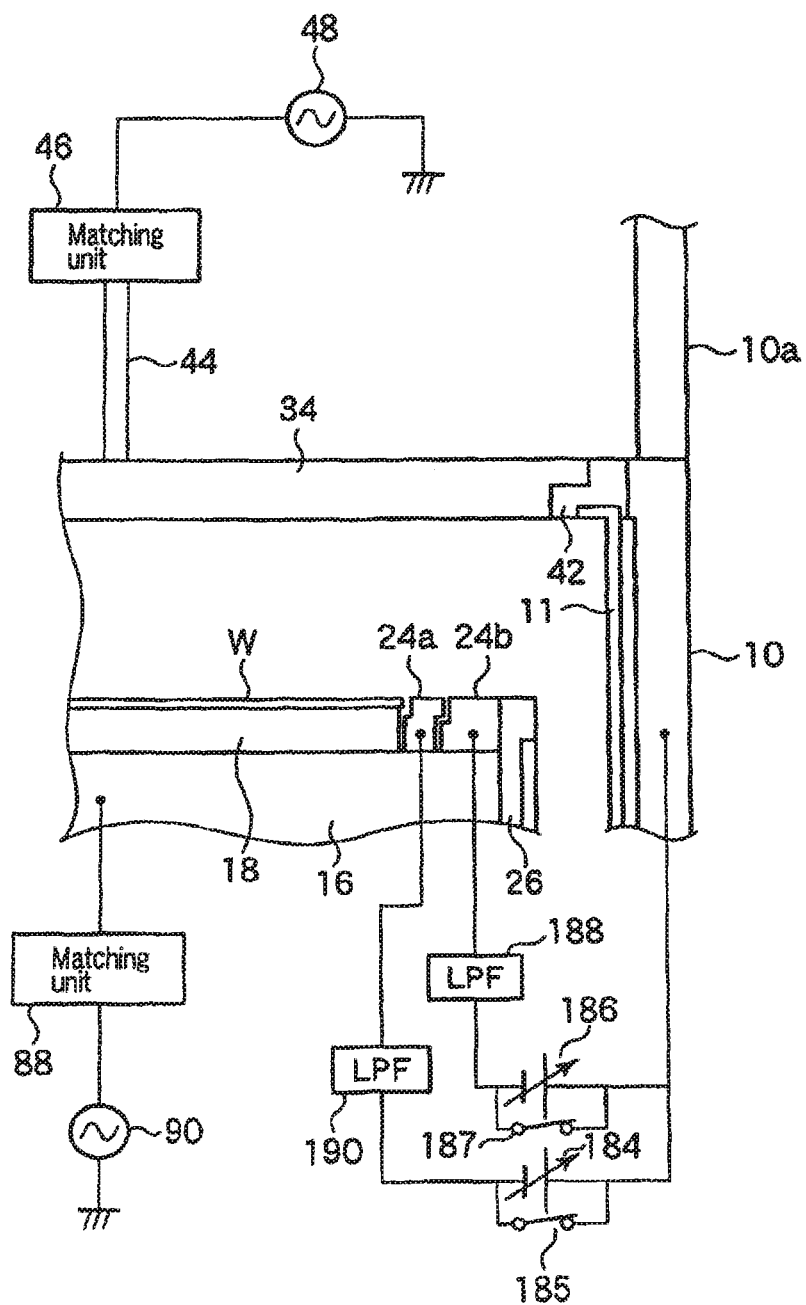
FIG. 76 is a sectional view schematically showing a main portion of a plasma etching apparatus according to an embodiment 15 of the present invention.

FIG. 76 is a sectional view schematically showing a main portion of a plasma etching apparatus according to the embodiment 15 of the present invention. In FIG. 76, the constituent elements common to those in FIGS. 1 and 74 are denoted by the same reference symbols.

In this embodiment, a correction ring or focus ring is formed of a first focus ring 24a on the inner side adjacent to an electrostatic chuck 18, and a second focus ring 24b on the outer side, as in the embodiment 14. A first variable DC power supply 184 and a second variable DC power supply 186 are connected to the first focus ring 24a and the second focus ring 24b, respectively. Specifically, in the first variable DC power supply 184, one of the terminals is connected to the first focus ring 24a and the other terminal is connected to the wall of the chamber 10. In the second variable DC power supply 186, one of the terminals is connected to the second focus ring 24b and the other terminal is connected to the wall of the chamber 10. A first low-pass filter (LPF) 188 and a second low-pass filter (LPF) 190 are disposed on feed lines extending from the first and second variable DC power supplies 184 and 186, respectively. Switches 185 and 187 are connected in parallel with the first variable DC power supply 184 and the second variable DC power supply 186, respectively.

When plasma is generated in the plasma etching apparatus with this structure, as in the embodiment 1, DC voltages are independently applied from the first variable DC power supply 184 and the second variable DC power supply 186 to the first focus ring 24a on the inner side and the second focus ring 24b on the outer side. At this time, the voltages (voltage directions) applied to the rings 24a and 24b can be different, and the values thereof are independently variable. Accordingly, plasma can be controlled around a wafer W with higher accuracy than in the embodiment 14, so that the process characteristics are prevented from being deteriorated at the edge portion of the wafer W. For example, it is possible to more effectively prevent decrease in etching rate and deflection in etching shape at the edge portion of the wafer W.

In the plasma etching apparatus according to this embodiment, a cooling mechanism such as that shown in the embodiment 13 may be disposed to cool the first focus ring 24a. In this case, the first focus ring 24a functions as a cooling ring, so that the edge portion and bottom of the wafer W can suffer less deposition. Further, the temperature of the first and second focus rings 24a and 24b may be measured as in the embodiment 13. In this case, the voltage and polarity of the variable DC power supplies can be controlled by a temperature control section to set the temperature at a predetermined value, as in the embodiment 13. Where a cooling mechanism is used, cooling of the first focus ring 24a may be controlled.

Figure 77:
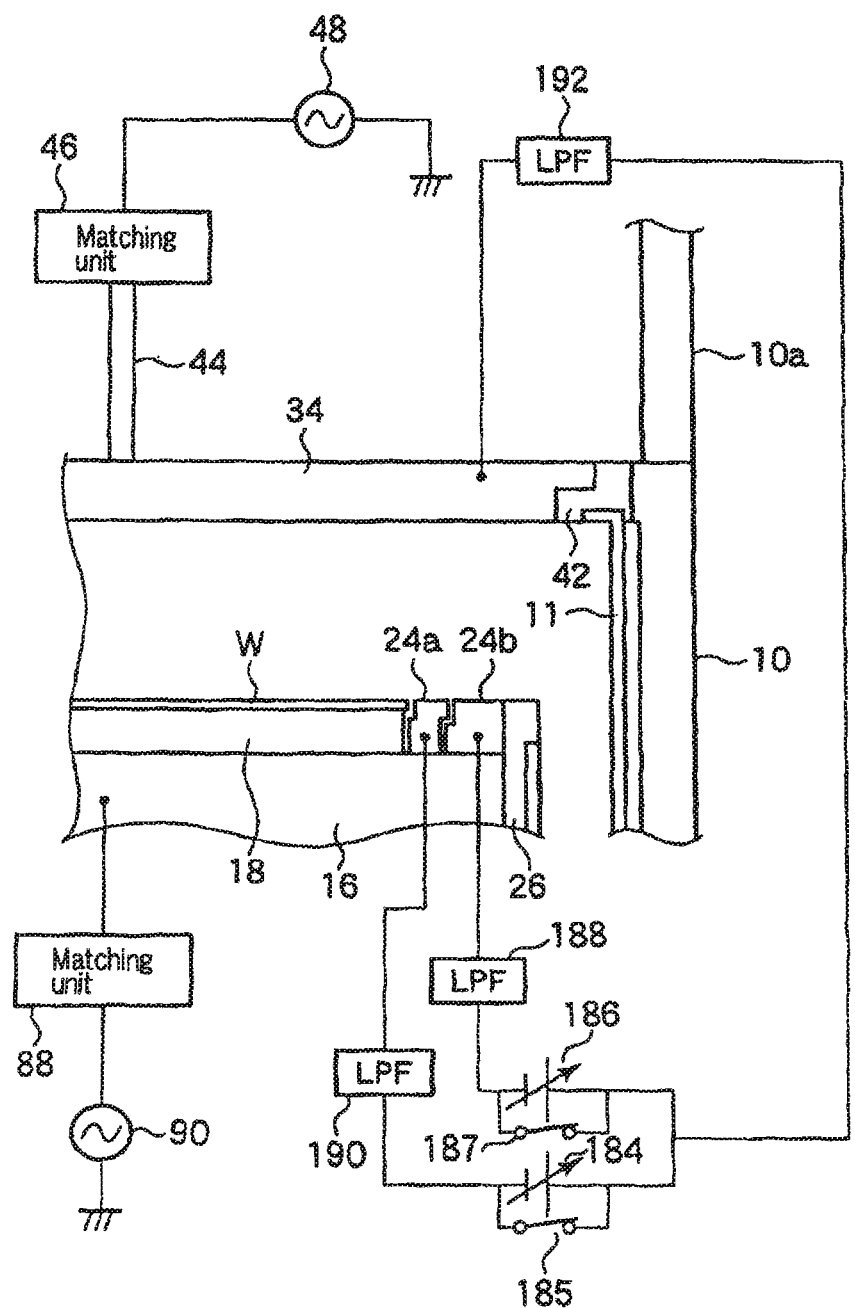
FIG. 77 is a sectional view schematically showing a main portion of a modification of the plasma etching apparatus according to the embodiment 15 of the present invention.
Figure 78:
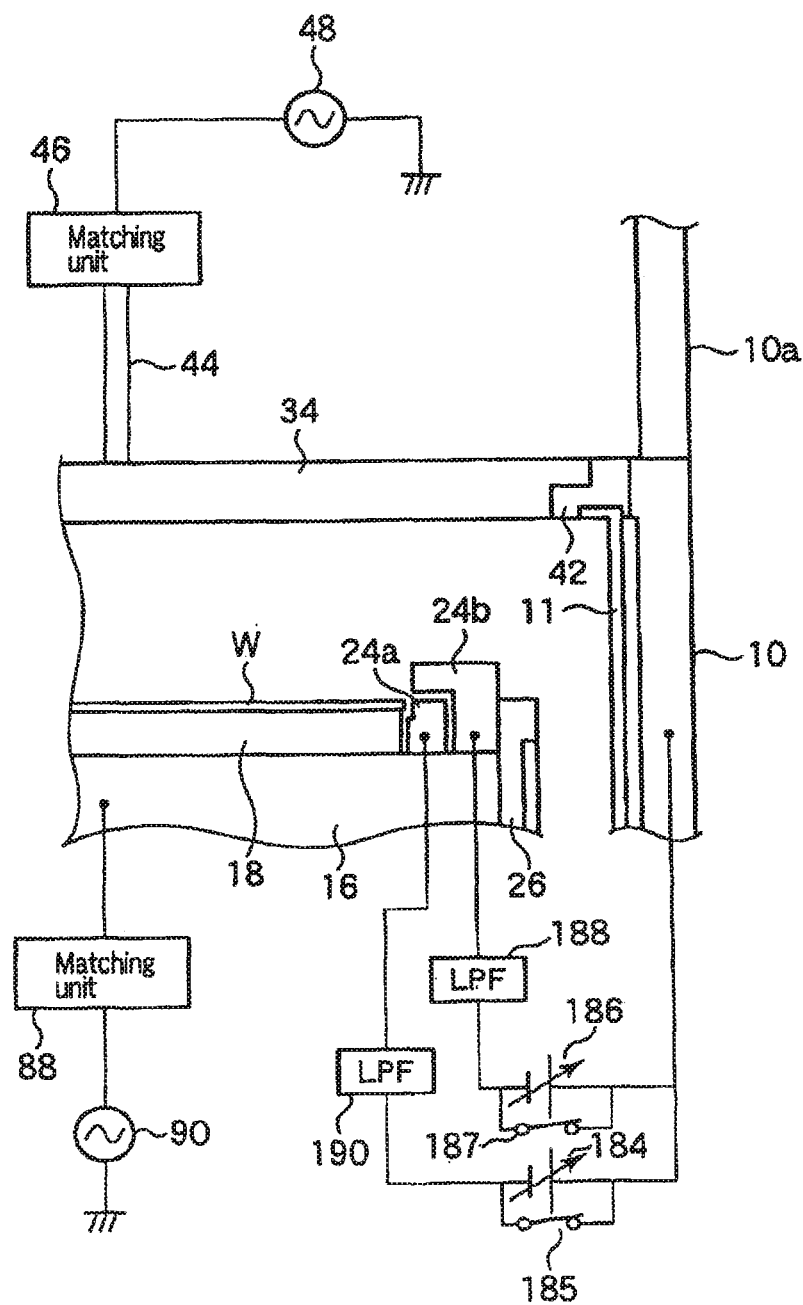
FIG. 78 is a sectional view schematically showing a main portion of another modification of the plasma etching apparatus according to the embodiment 15 of the present invention.

Further, as shown in FIG. 77, the other terminals of the first variable power supply 184 and second variable power supply 186 may be connected to the upper electrode 34 through a low-pass filter (LPF) 192. Furthermore, as shown in FIG. 78, a first focus ring 24a and a second focus ring 24b may be disposed on the lower and upper sides, respectively, near the edge portion of the wafer W. This arrangement can provide the same effects as those described above.

In this embodiment, the polarity of the DC voltages applied to the first and second focus rings 24a and 24b may be reversed. In place of the DC voltages, AC voltages may be applied. The voltages may be pulsed or modulated, such as AM modulation or FM modulation.

Embodiment 16

Next, an explanation will be given of an embodiment 16 of the present invention.

Figure 79:
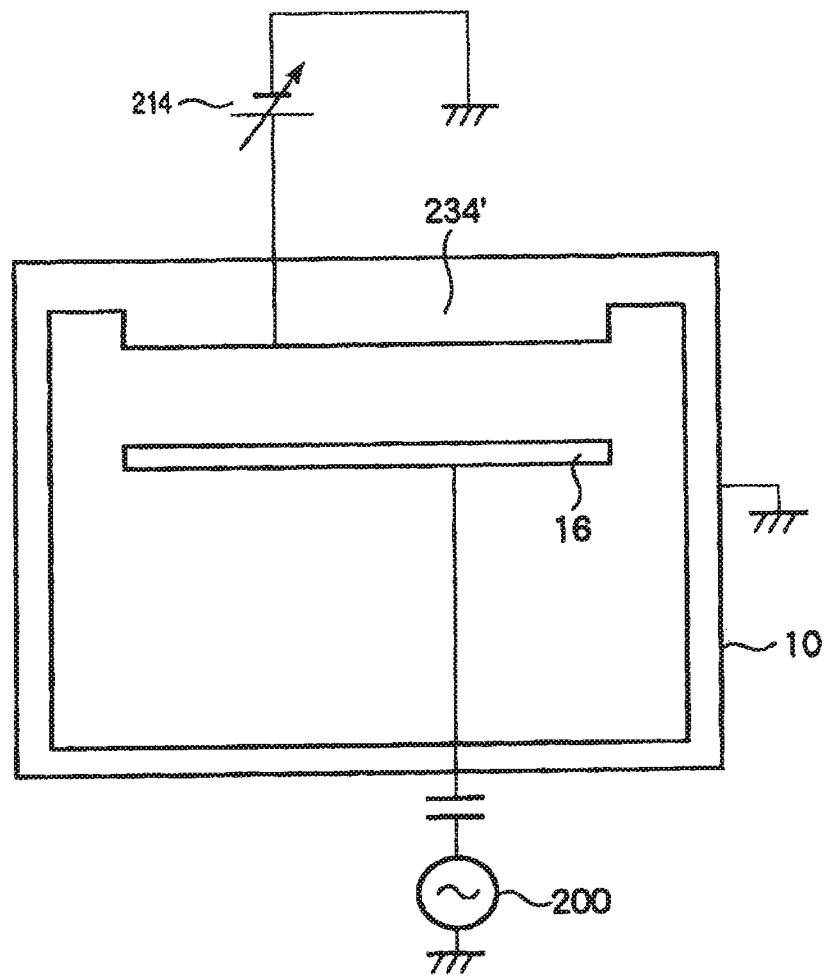
FIG. 79 is a sectional view showing a plasma etching apparatus according to an embodiment 16 of the present invention.

FIG. 79 is a sectional view schematically showing a plasma etching apparatus according to the embodiment 16 of the present invention.

This plasma etching apparatus is of the type that applies an RF power with one frequency to the lower side. Specifically, a radio frequency (RF) power with, e.g., 13.56 MHz for plasma generation is applied from a first RF power supply 200 to a lower electrode or susceptor 16. Further, as shown in FIG. 79, a variable DC power supply 214 is connected to an upper electrode 234' to apply a predetermined direct current (DC) voltage. Although FIG. 79 does not show details, the structure of the plasma etching apparatus according to this embodiment, except for applying an RF power with one frequency to the lower side, is the same as that of the plasma etching apparatus according to the embodiment 3, which is of the type that applies two RF powers with different frequencies to the lower side.

Also in the plasma etching apparatus according to this embodiment, since a DC voltage is applied from the variable DC power supply 214 to the upper electrode 234', the same effects as those in the plasma etching apparatus according to the embodiment 3 can be obtained. Specifically, it is possible to exercise at least one of (1) the effect of increasing the absolute value of a self-bias voltage to the first electrode to sputter the first electrode surface, (2) the effect of expanding the plasma sheath on the first electrode side to press the plasma, (3) the effect of irradiating the target substrate with electrons generated near the first electrode, (4) the effect of controlling the plasma potential, (5) the effect of increasing the electron (plasma) density, and (6) the effect of increasing the plasma density at the central portion.

Further, as described in the embodiments 1 to 3, the apparatus structure and method in relation to the DC voltage application to the upper electrode may be utilized in the plasma etching apparatus according to this embodiment. For example, as a matter of course, the conductive member according to the embodiment 3, and the switches explained with reference to FIGS. 47 to 49 and the combinations of process gases according to the embodiment 3 may be utilized in the plasma etching apparatus according to this embodiment.

Further, as described in the embodiments 4 to 15, the apparatus structure and method in relation to the DC voltage application to the upper electrode or a member other than the upper electrode may be utilized in the plasma etching apparatus according to this embodiment.

Embodiment 17

Next, an explanation will be given of an embodiment 17 of the present invention.

Figure 80:
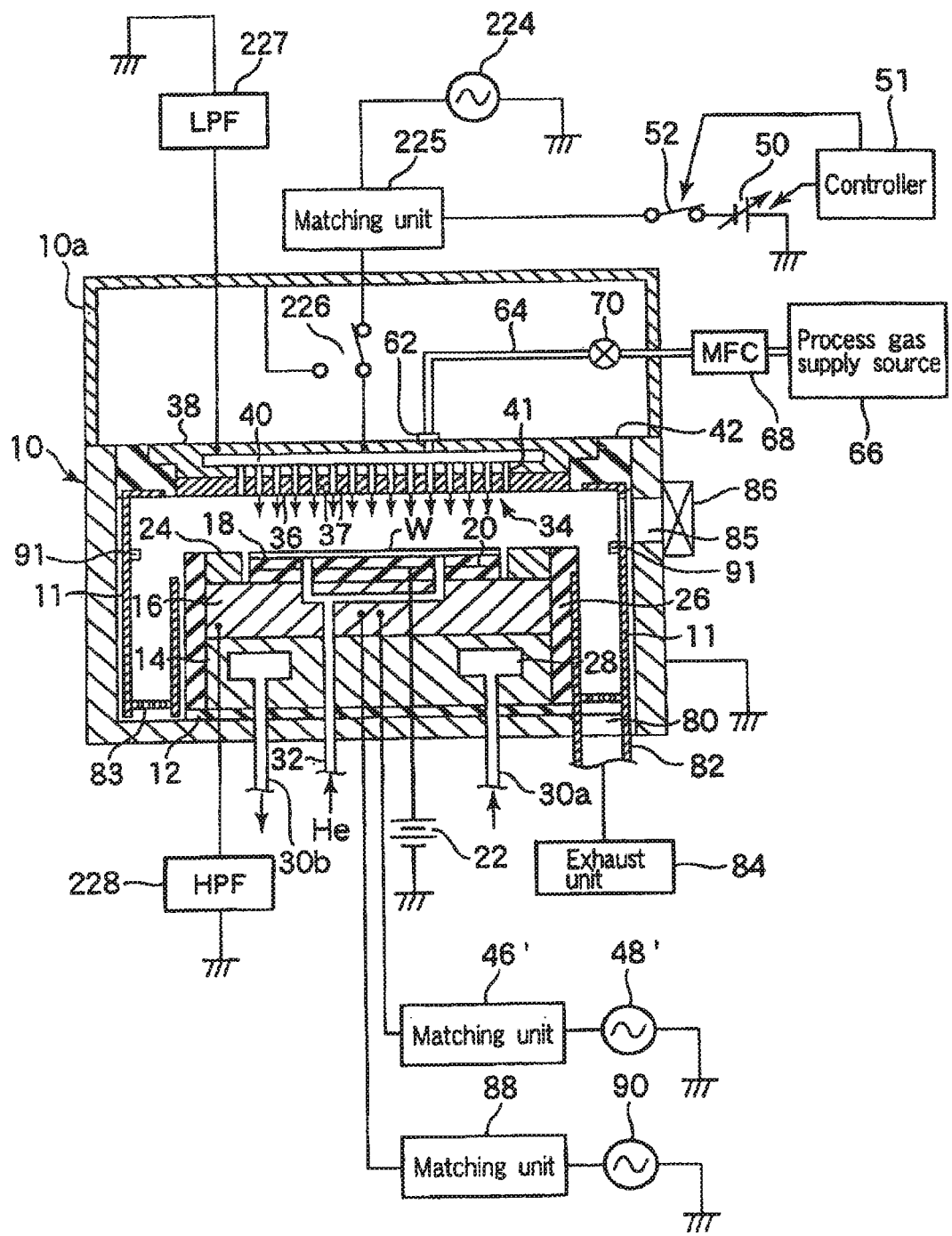
FIG. 80 is a sectional view showing a plasma etching apparatus according to an embodiment 17 of the present invention.

FIG. 80 is a sectional view schematically showing a plasma etching apparatus according to the embodiment 17 of the present invention.

This plasma etching apparatus is of the type that applies an RF power with a frequency to the upper side, and applies two RF powers with different frequencies to the lower side. Specifically, a first radio frequency (RF) power from a first RF power supply 48' and a second radio frequency (RF) from a second RF power supply 90 are applied to a lower electrode or susceptor 16. On the other hand, a third RF power is applied from the third RF power supply 224 to an upper electrode 34. Further, as shown in FIG. 80, a variable DC power supply 50 is connected to an upper electrode 34 to apply a predetermined direct current (DC) voltage. In this plasma etching apparatus, the third RF power supply is preferably an RF power supply that outputs an RF power for plasma generation. On the other hand, the first RF power supply and second RF power supply are preferably RF power supplies that output RF powers for ion attraction.

Also in the plasma etching apparatus according to this embodiment, since a DC voltage is applied from the variable DC power supply 50 to the upper electrode 34, the same effects as those in the plasma etching apparatus according to the embodiment 3 can be obtained. Specifically, it is possible to exercise at least one of (1) the effect of increasing the absolute value of a self-bias voltage to the first electrode to sputter the first electrode surface, (2) the effect of expanding the plasma sheath on the first electrode side to press the plasma, (3) the effect of irradiating the target substrate with electrons generated near the first electrode, (4) the effect of controlling the plasma potential, (5) the effect of increasing the electron (plasma) density, and (6) the effect of increasing the plasma density at the central portion.

Further, as described in the embodiments 1 to 3, the apparatus structure and method in relation to the DC voltage application to the upper electrode may be utilized in the plasma etching apparatus according to this embodiment. For example, as a matter of course, the conductive member and the combinations of process gases according to the embodiment 1 may be utilized in the plasma etching apparatus according to this embodiment.

Further, as described in the embodiments 4 to 15, the apparatus structure and method in relation to the DC voltage application to the upper electrode or a member other than the upper electrode may be utilized in the plasma etching apparatus according to this embodiment.

As shown in FIG. 80, a switch 226 may be disposed to switch the upper electrode 34 to be connected to ground and to be connected to the third RF power supply 224 and variable DC power supply 50. Reference symbols 227 and 228 denote a low-pass filter and a high-pass filter, respectively.

The present invention has been explained with reference to the embodiments, but they are not limiting. Accordingly, the present invention may be applied to various modifications or combinations of the apparatus structures or methods according to the embodiments.

For example, as described in the embodiments 4 to 15, the apparatus structure and method in relation to the DC voltage application to the upper electrode or a member other than the upper electrode may be utilized in the plasma etching apparatus according to the embodiments 2 and 3.

Figure 82:
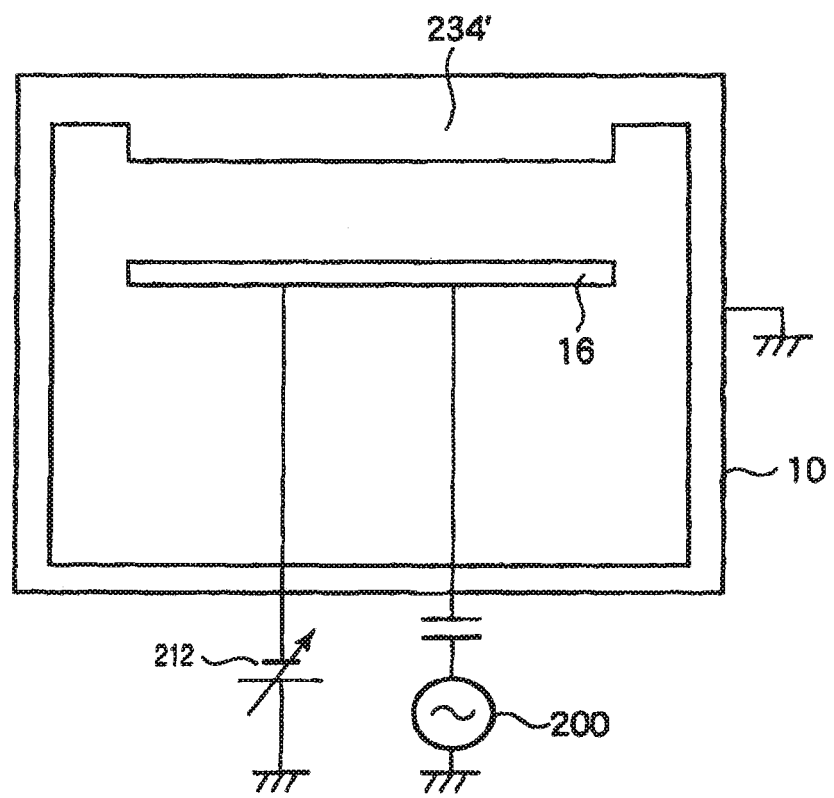
FIG. 82 is a sectional view showing a plasma etching apparatus of another type to which the present invention is applicable.

Further, as shown in FIG. 81, it may be adopted that an RF power with a frequency of, e.g., 60 MHz for plasma generation from a first RF power supply 48', an RF power with a frequency of 2 MHz for ion attraction from a second RF power supply 90', and further a DC voltage from a DC power supply 198 are all applied to the lower electrode or susceptor 16. Alternatively, as shown in FIG. 82, in place of the variable DC power supply 214 connected to the upper electrode shown in FIG. 79, a variable DC power supply 212 connected to the lower electrode may be disposed. The DC voltage application according to the embodiments 1 to 15 may be utilized in the apparatuses shown in FIG. 81 or 82.

The present invention has been described with reference to plasma etching apparatuses, but it may be applied to an apparatus of another type that utilize plasma to process a semiconductor substrate, such as a plasma film formation apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing apparatus comprising:
 a process container that forms a process space to accommodate a target substrate;
 a vacuum pump connected to an exhaust port of the process container to vacuum-exhaust gas from inside the process container;
 an exhaust plate interposed between the process space and the exhaust port to rectify a flow of exhaust gas;
 a first electrode and a second electrode disposed opposite each other within the process container, the first electrode being an upper electrode and the second electrode being a lower electrode and configured to support the target substrate through a mount face;

a first RF power supply configured to apply a first RF power to the first electrode;

a second RF power supply configured to apply a second RF power to the second electrode;

a DC power supply configured to apply a DC voltage to the first electrode;

a process gas supply source configured to supply a process gas into the process container;

a shield part covering an inner wall of the process container; and a conductive member disposed within the process container and grounded to release through plasma a current caused by the DC voltage applied from the DC power supply to the first electrode, the conductive member being disposed above the second electrode, as a ring around the first electrode, and the conductive member being supported by the process container or the shield part and protruding inward therefrom so as for the conductive member to be exposed to the plasma within the process space;

a switching mechanism configured to switch from a first state where the conductive member is connected to a ground potential portion to a second state where the conductive member is connected to a negative potential portion or set in floating; and a control section configured to control the switching mechanism to perform switching between the first state and the second state in accordance with a preset control program, wherein the switching mechanism includes a first switch to switch connection of the first electrode between a positive terminal and a negative terminal of the DC power supply, a second switch to switch the connection of the conductive member between the positive terminal and the negative terminal of the DC power supply, and a third switch to switch the positive terminal and the negative terminal of the DC power supply between a grounded state and a non-grounded state.

2. The plasma processing apparatus according to claim 1, wherein the switching mechanism forms the first state such that the negative terminal of the DC power supply is connected to the first electrode by the first switch, and the positive terminal of the DC power supply is grounded together with the conductive member by the second switch and the third switch.

3. The plasma processing apparatus according to claim 2, wherein the switching mechanism forms the second state such that the positive terminal of the DC power supply is connected to the first electrode by the first switch, the negative terminal of the DC power supply is connected to the conductive member by the second switch, and the positive terminal and the negative terminal of the DC power supply are not grounded by the third switch.

4. The plasma processing apparatus according to claim 1, wherein the first RF power is set for exciting plasma, and the second RF power is set for attracting ions.

5. The plasma processing apparatus according to claim 1, wherein the DC power supply is connected to the first electrode through an on/off switch and a filter configured to trap radio frequencies derived from the first and second RF powers.

6. The plasma processing apparatus according to claim 1, wherein the shield part is formed of a conductive internal body and an insulator covering the conductive internal body, and the conductive member is grounded through the conductive internal body of the shield part.

7. The plasma processing apparatus according to claim 1, wherein the conductive member includes a silicon-containing substance.

8. The plasma processing apparatus according to claim 1, wherein the conductive member protrudes toward inside the process space with a protruding length of 10 mm or more.

9. The plasma processing apparatus according to claim 1, wherein further comprising a third RF power supply configured to apply a third RF power to the second electrode.

* * * * *